United States Patent [19]
Daughton et al.

[11] 4,266,294
[45] May 5, 1981

[54] COPY REPRODUCTION MACHINE WITH CONTROLLER SELF CHECK SYSTEM

[75] Inventors: John W. Daughton; Stephen P. Wilczek, both of Fairport; Edward L. Steiner, Macedon, all of N.Y.

[73] Assignee: Xerox Corporation, Stamford, Conn.

[21] Appl. No.: 28,480

[22] Filed: Apr. 9, 1979

Related U.S. Application Data

[63] Continuation of Ser. No. 829,031, Aug. 30, 1977, abandoned.

[51] Int. Cl.³ .................. G06F 11/00; G01R 31/28
[52] U.S. Cl. .................................. 371/24; 364/900
[58] Field of Search ................... 371/22, 24, 71; 364/900; 355/14; 179/175.31 R

[56] References Cited
U.S. PATENT DOCUMENTS

| 3,714,571 | 1/1973 | Walker | 235/302 |
| 3,787,810 | 1/1974 | Wiggins et al. | 179/175.2 R |
| 3,909,609 | 3/1977 | VerSchage et al. | 355/14 |
| 3,909,802 | 9/1975 | Cessarino, Jr. et al. | 235/304.1 |
| 3,916,306 | 10/1975 | Patti | 235/302 |
| 3,976,864 | 8/1976 | Gordon et al. | 235/302 |
| 4,006,320 | 2/1977 | Markl | 179/175.31 R |
| 4,048,481 | 9/1977 | Bailey, Jr. et al. | 235/304.1 |
| 4,062,061 | 12/1977 | Batchelor et al. | 364/900 |
| 4,112,263 | 9/1978 | Lender | 179/175.31 R |

OTHER PUBLICATIONS

Shattuck, Logic Card Test Apparatus, IBM Technical Disclosure Bulletin, vol. 13, No. 3, Aug. 1970, p. 605.
Wooster, Testing of a Unit Containing a Device with Dynamic Storage, Western Electric Technical Digest No. 26, Apr. 1972, p. 65.

Primary Examiner—Charles E. Atkinson
Attorney, Agent, or Firm—Ronald F. Chapuran

[57] ABSTRACT

An electrostatographic type copying or reproduction machine incorporating a programmable controller to operate the various machine components in an integrated manner to produce copies is disclosed. The controller carries a master program bearing machine operating parameters from which an operating program for the specific copy run desired is formed and used to operate the machine components to produce the copies programmed. A multiple prioritized interrupt system is employed to distribute the operating program to the machine.

Self check routines check the operational integrity of the controller prior to start-up of the machine and periodically while the machine is processing copies.

7 Claims, 59 Drawing Figures

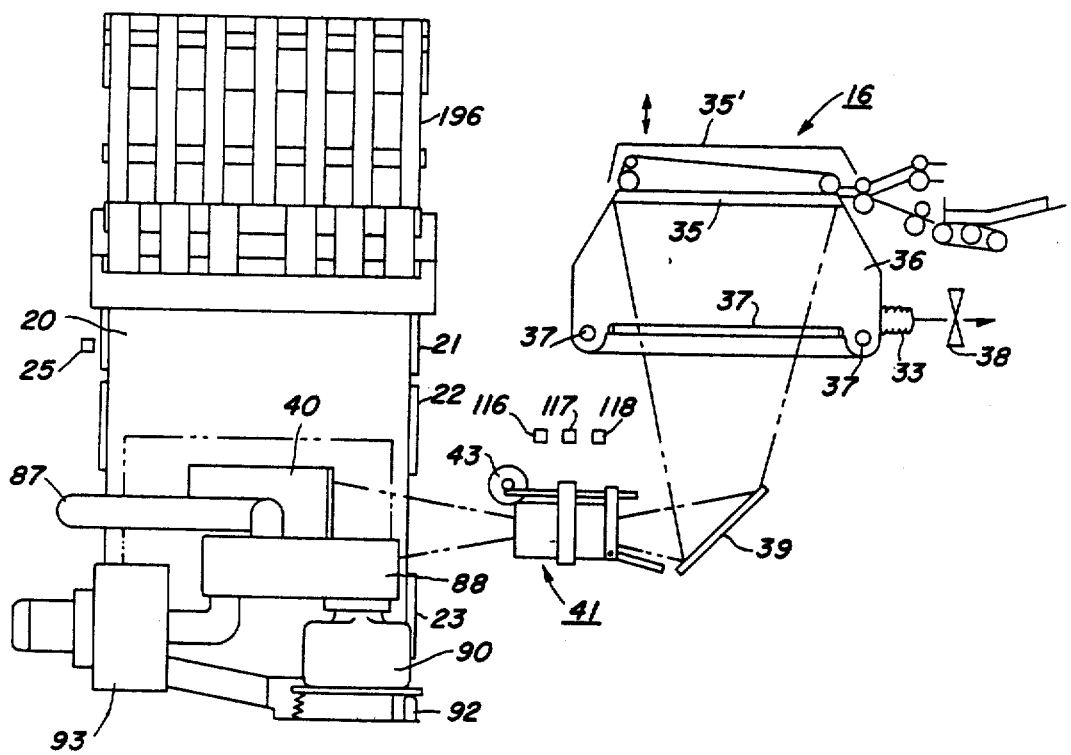

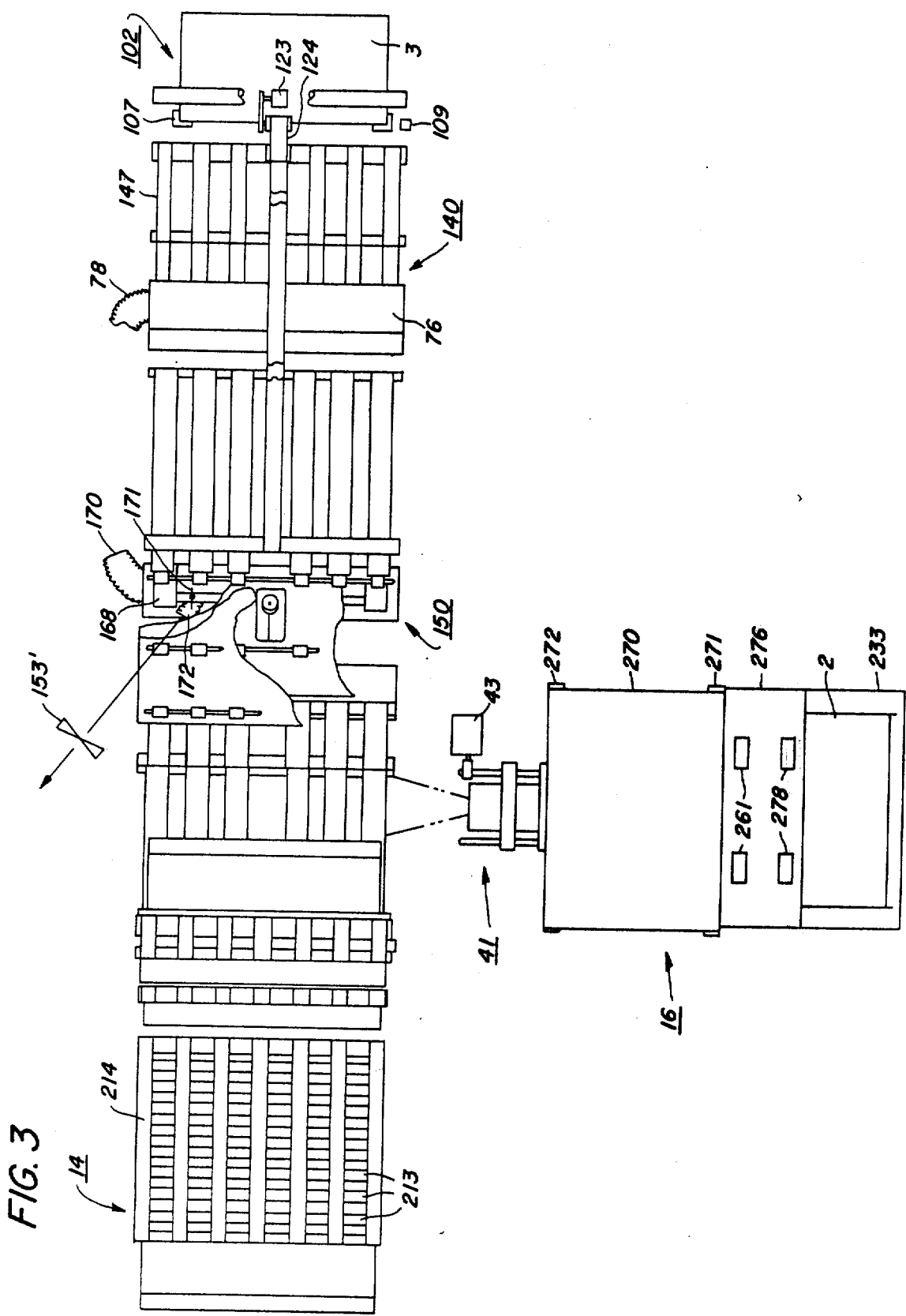

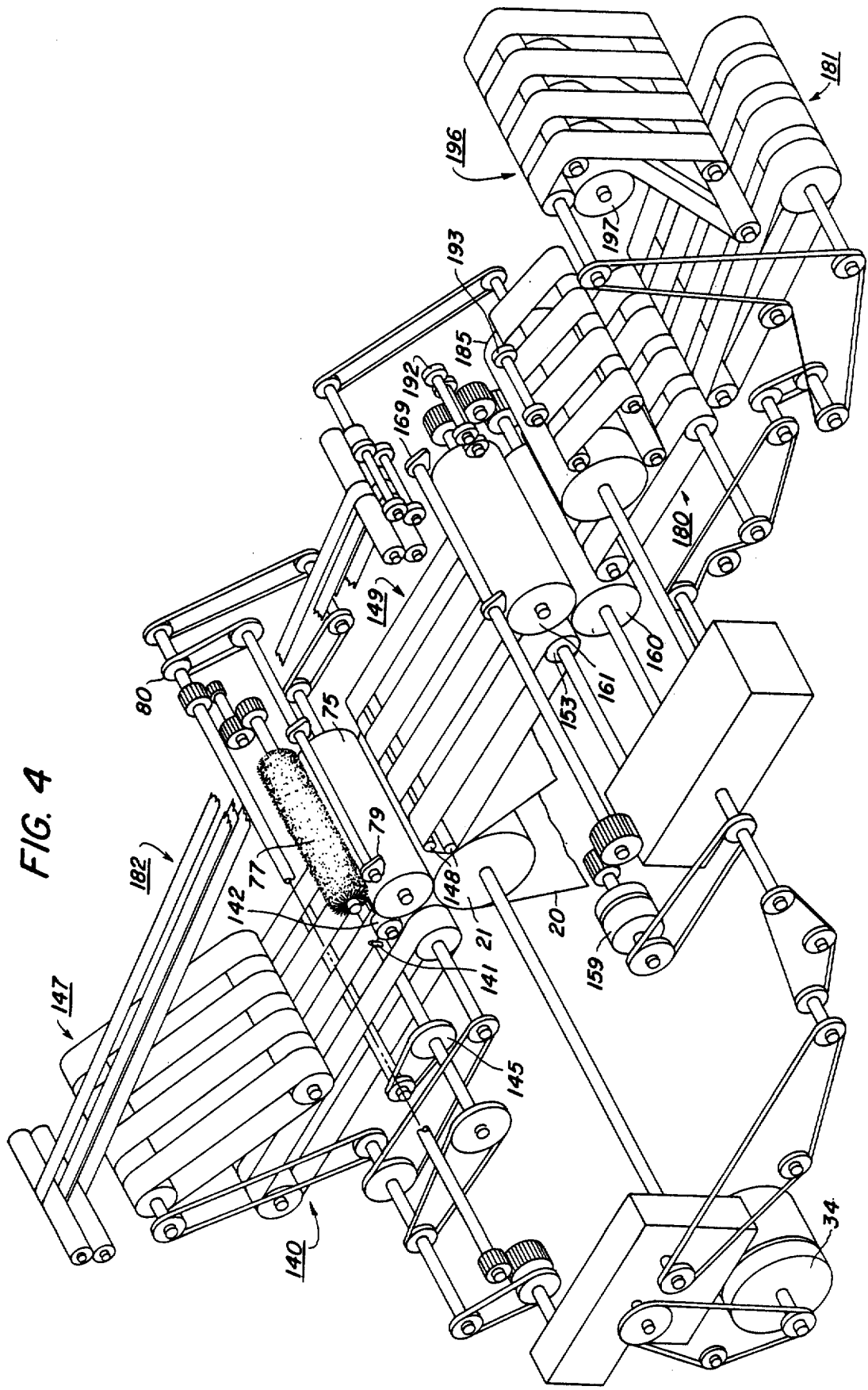

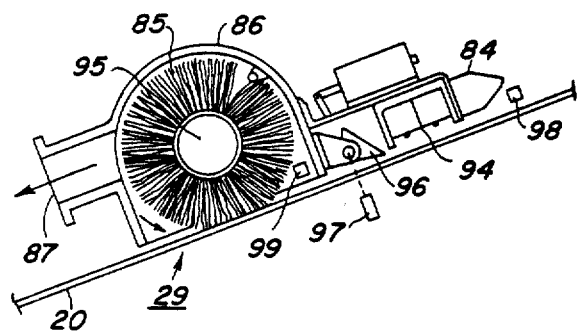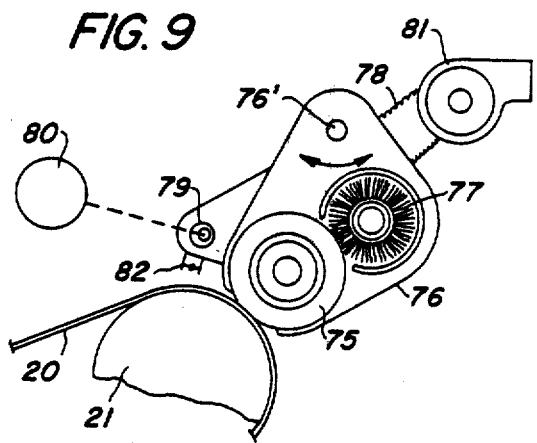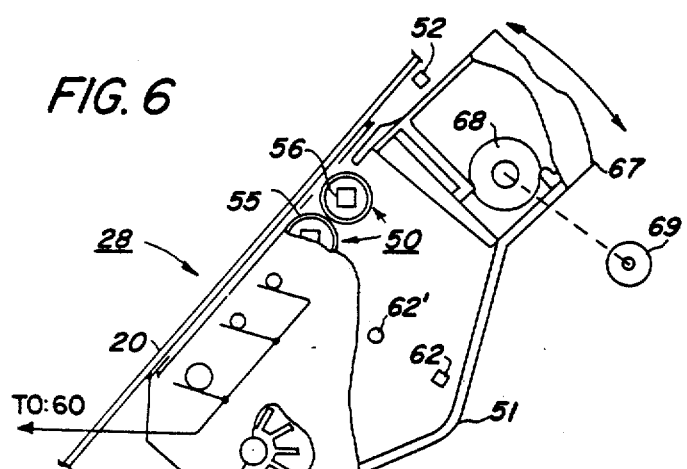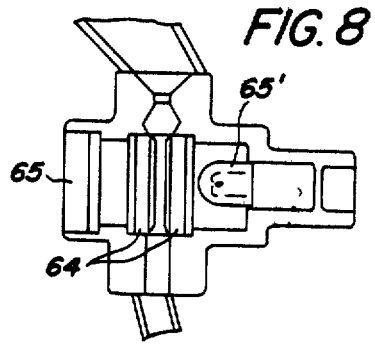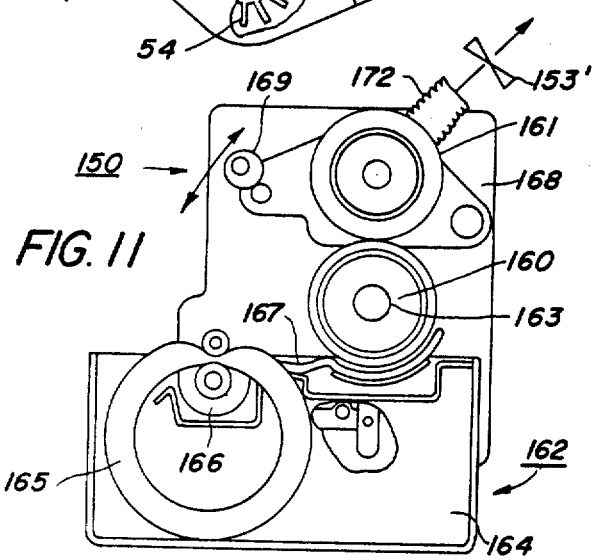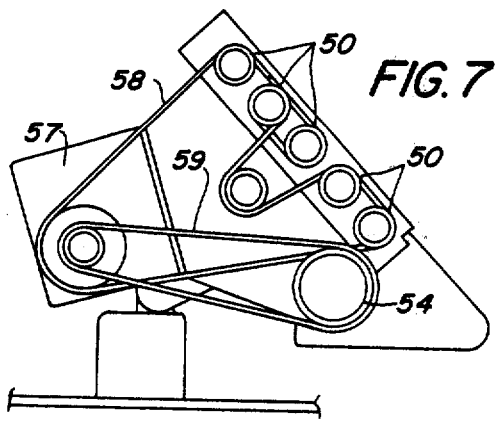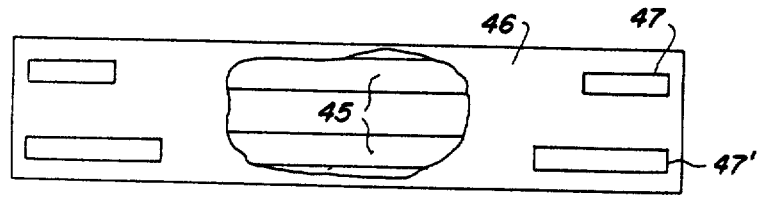

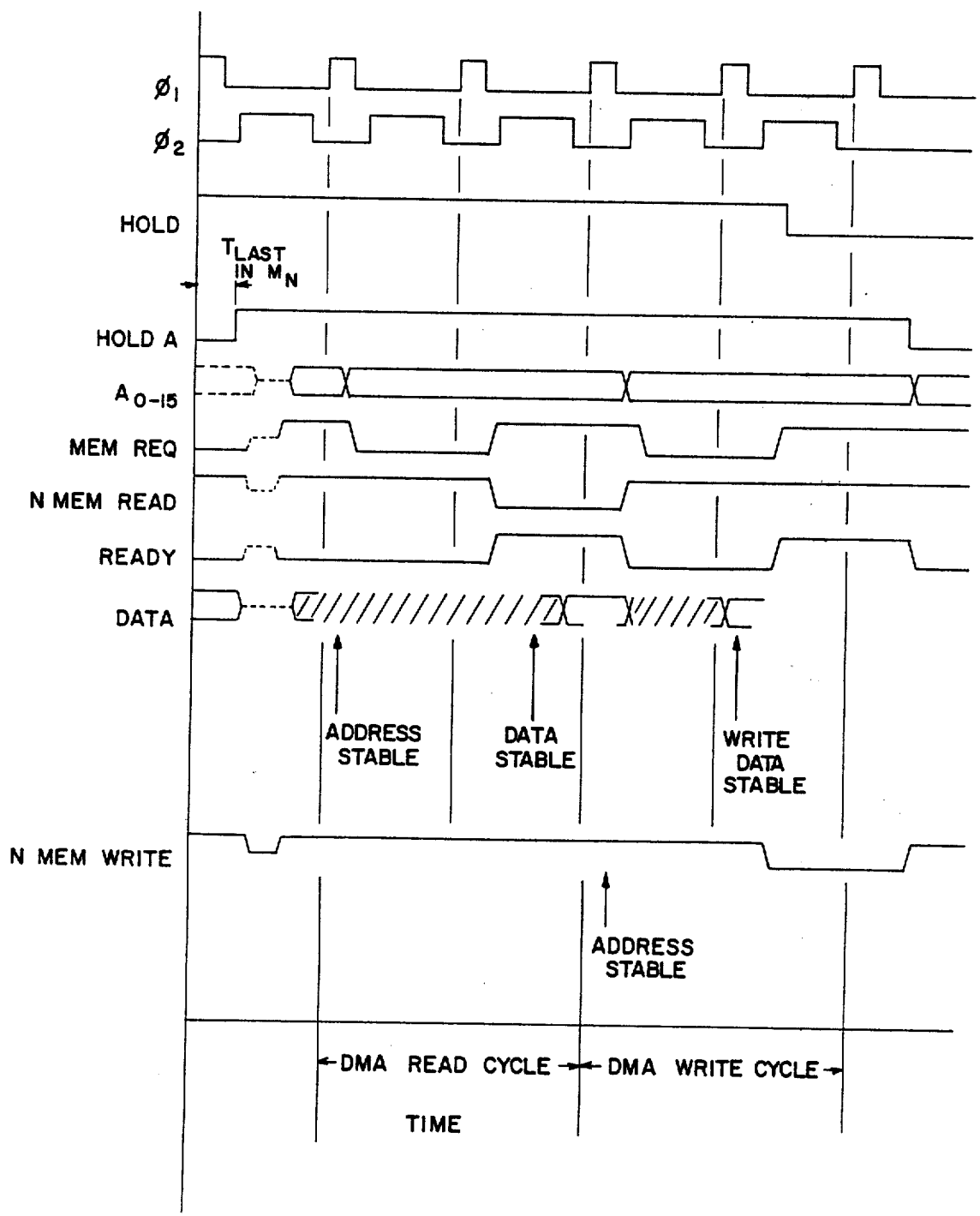

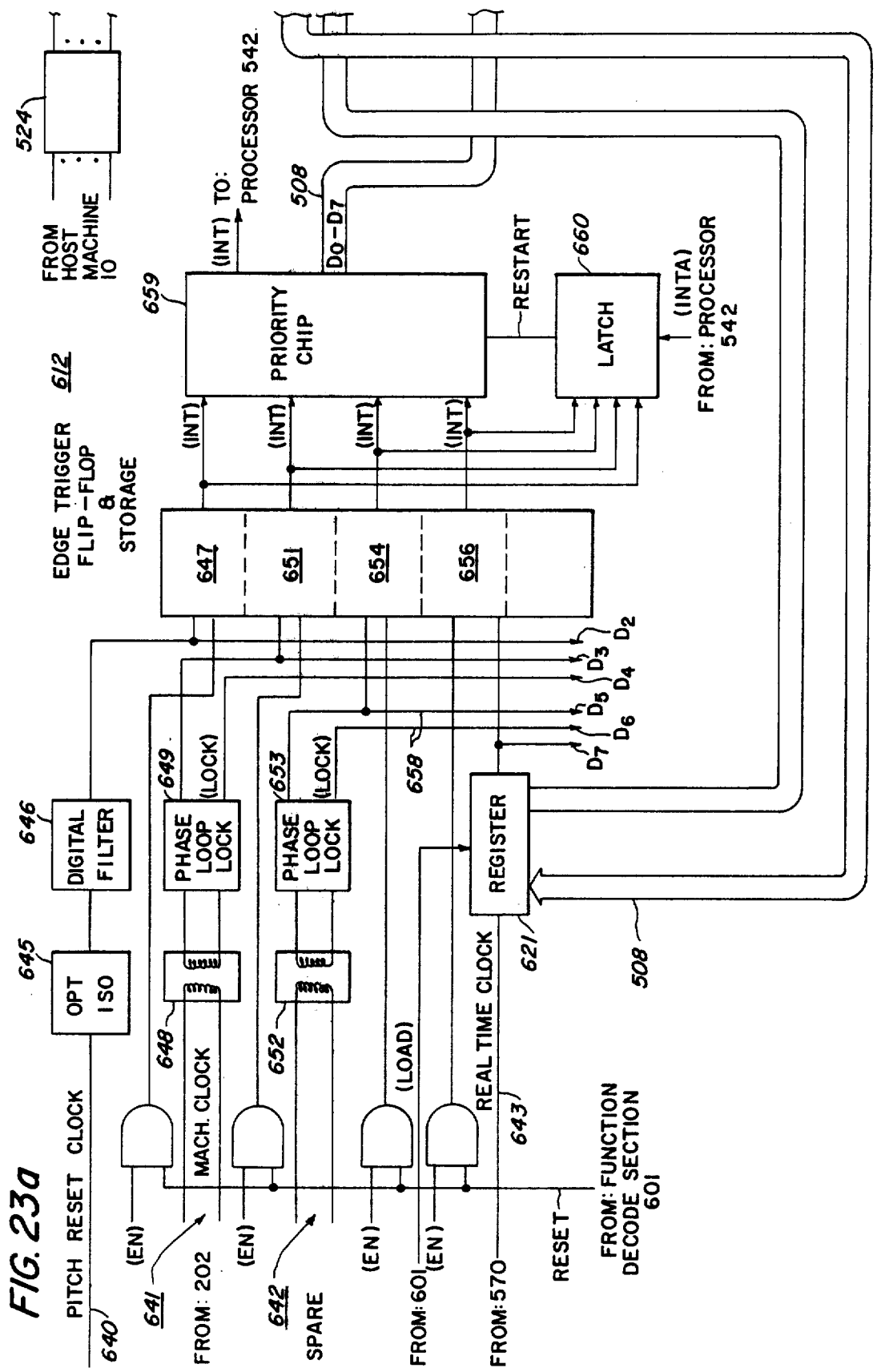

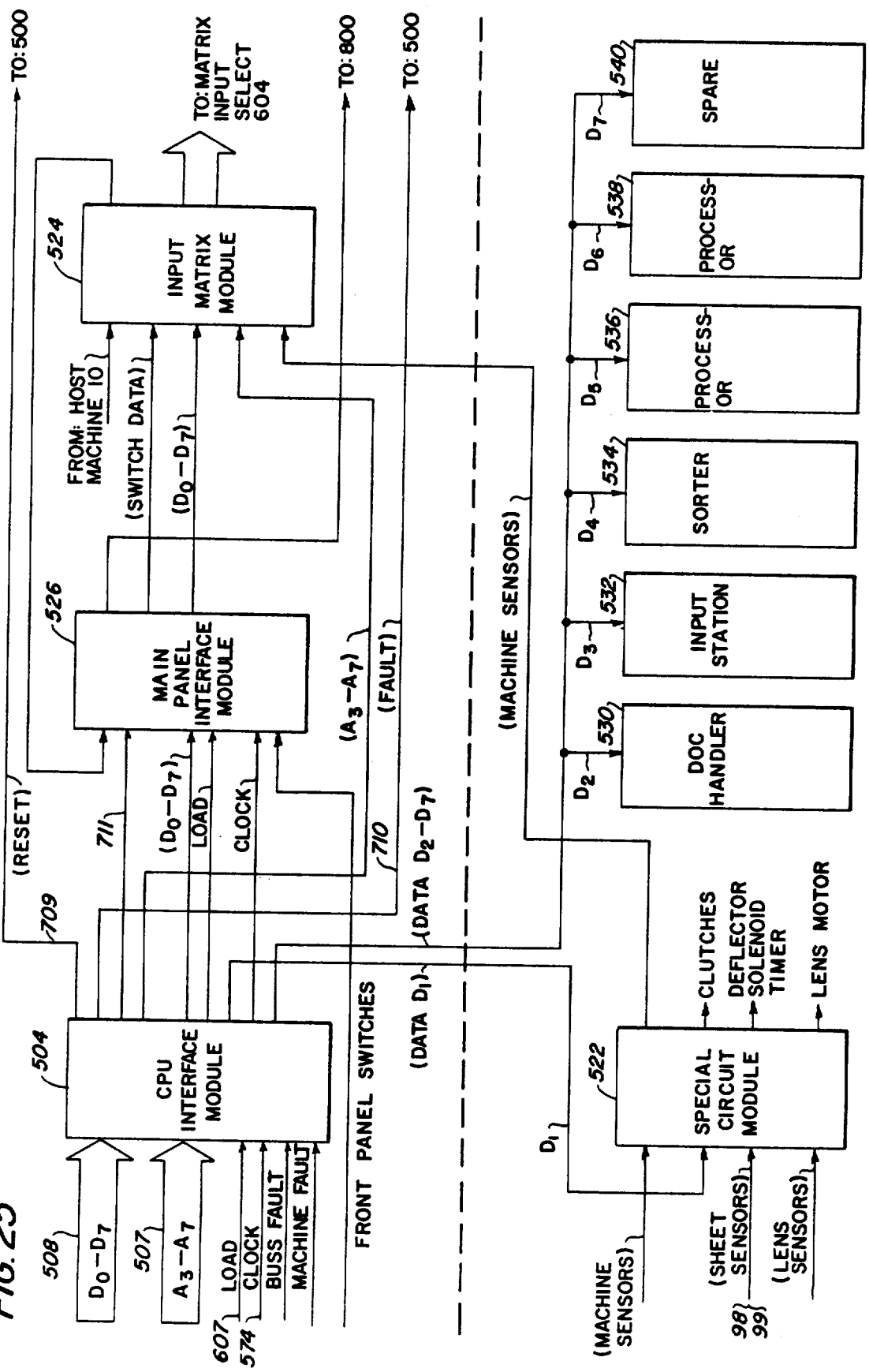

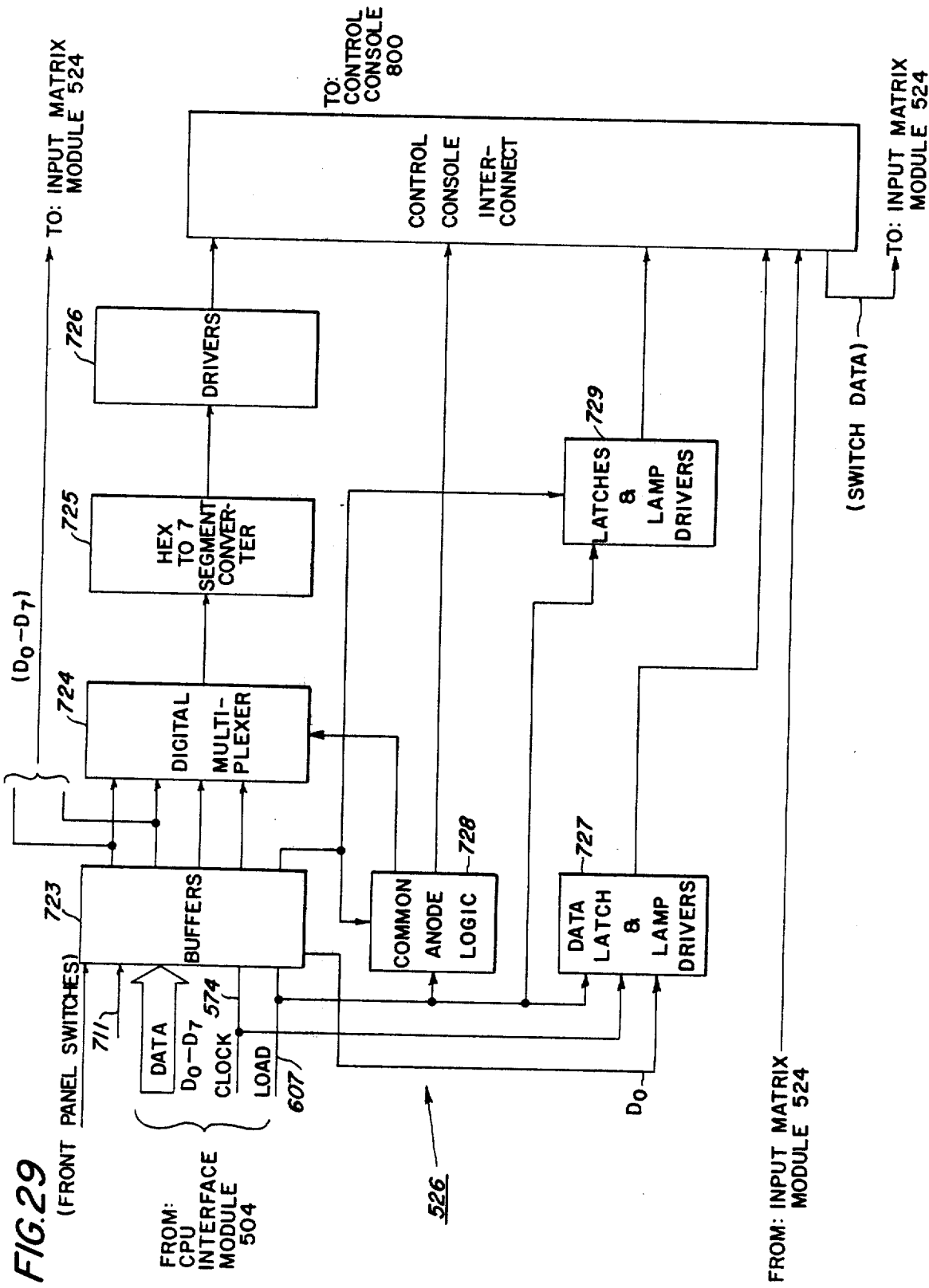

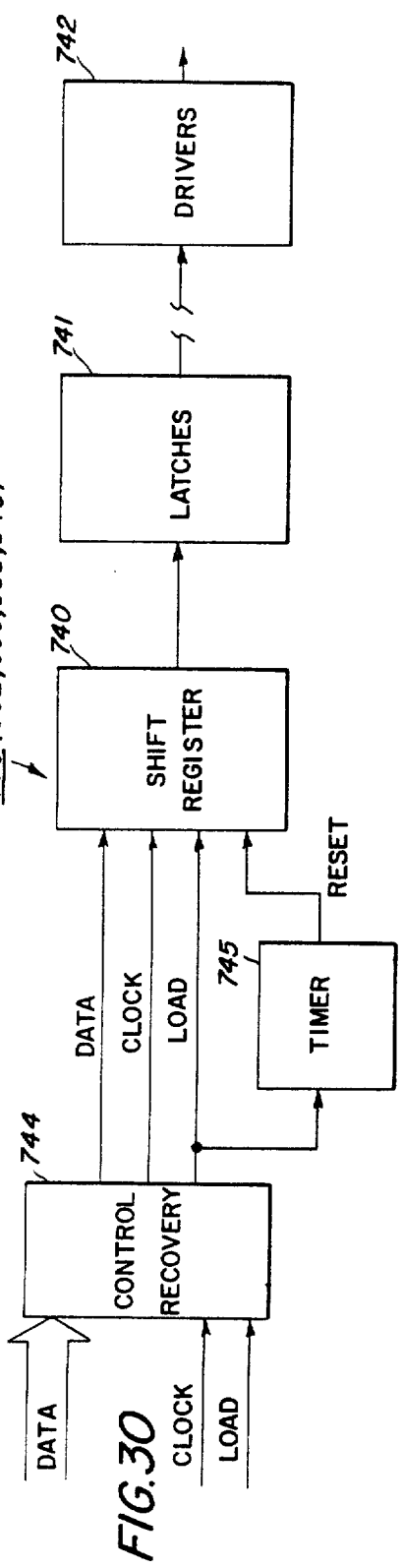

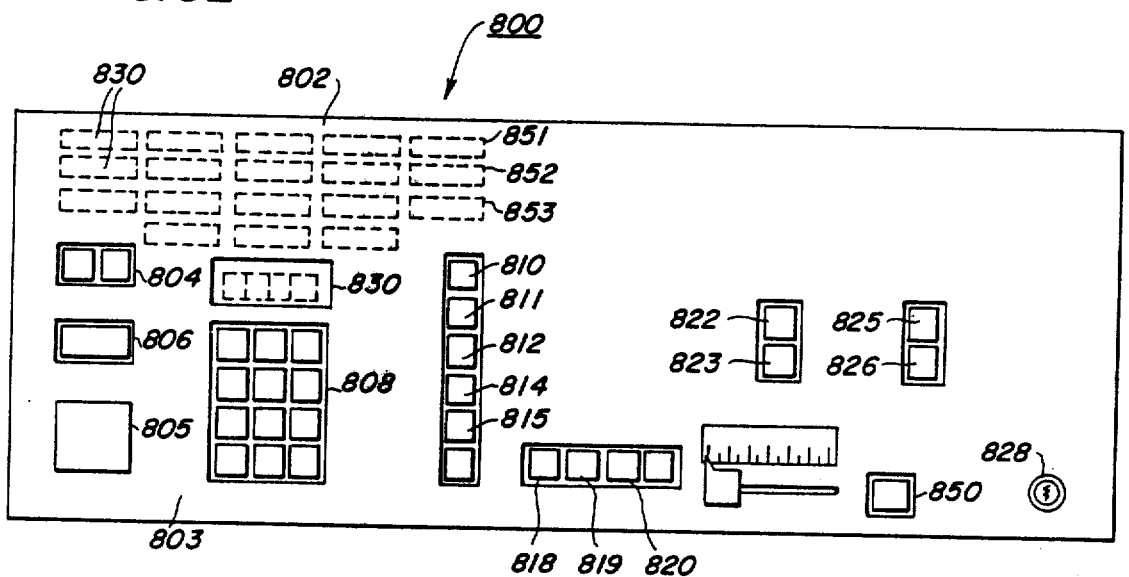

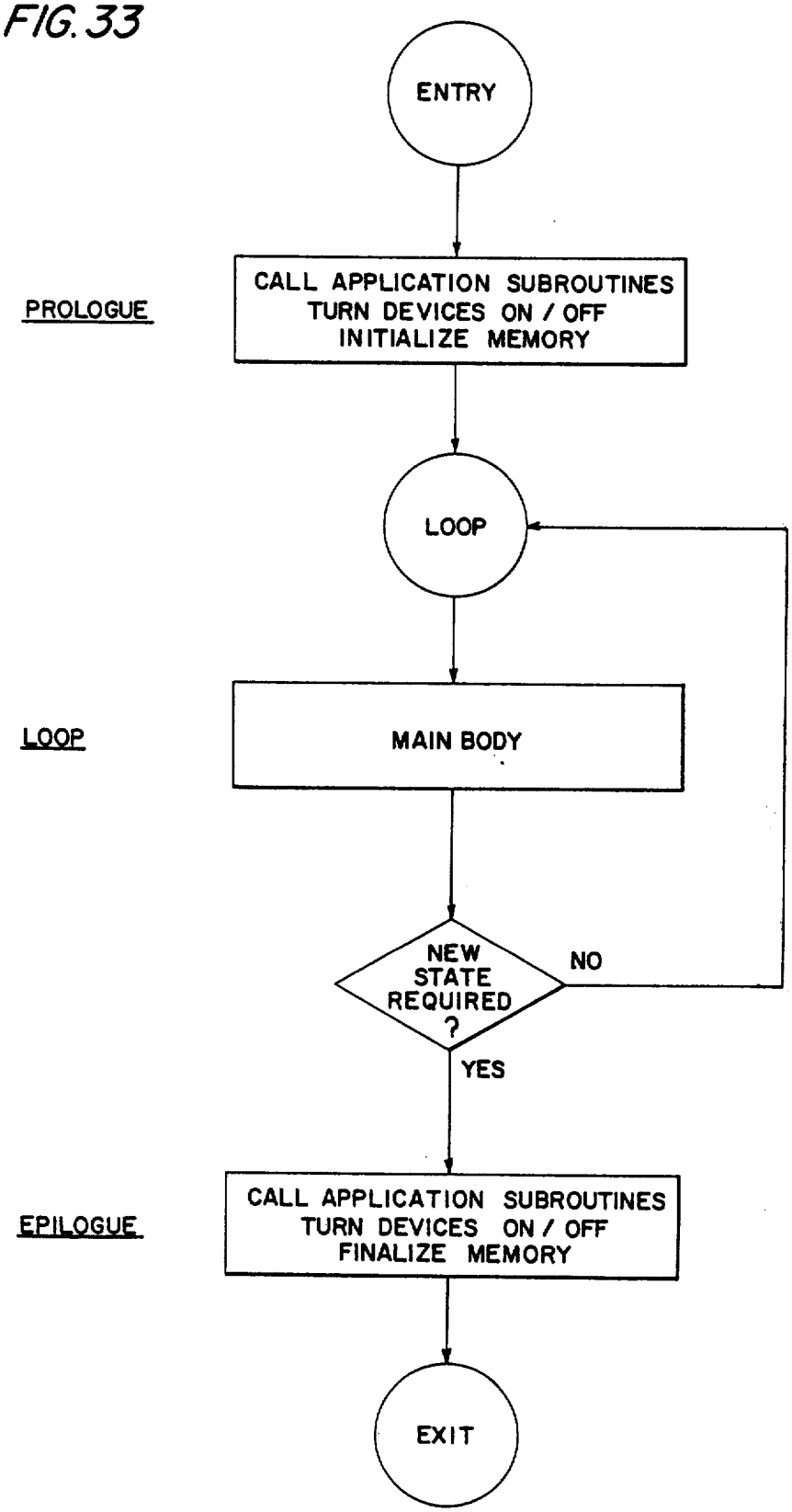

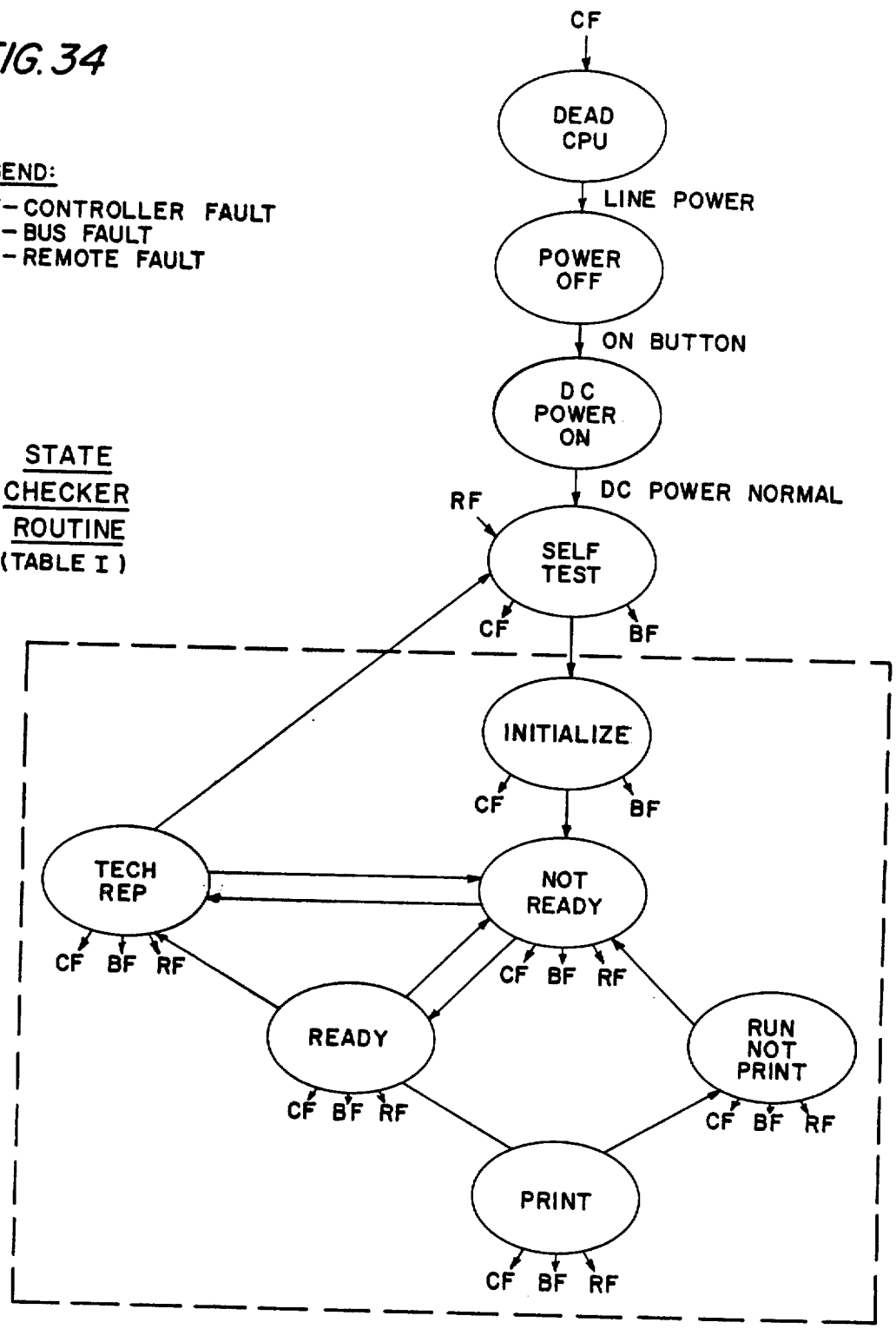

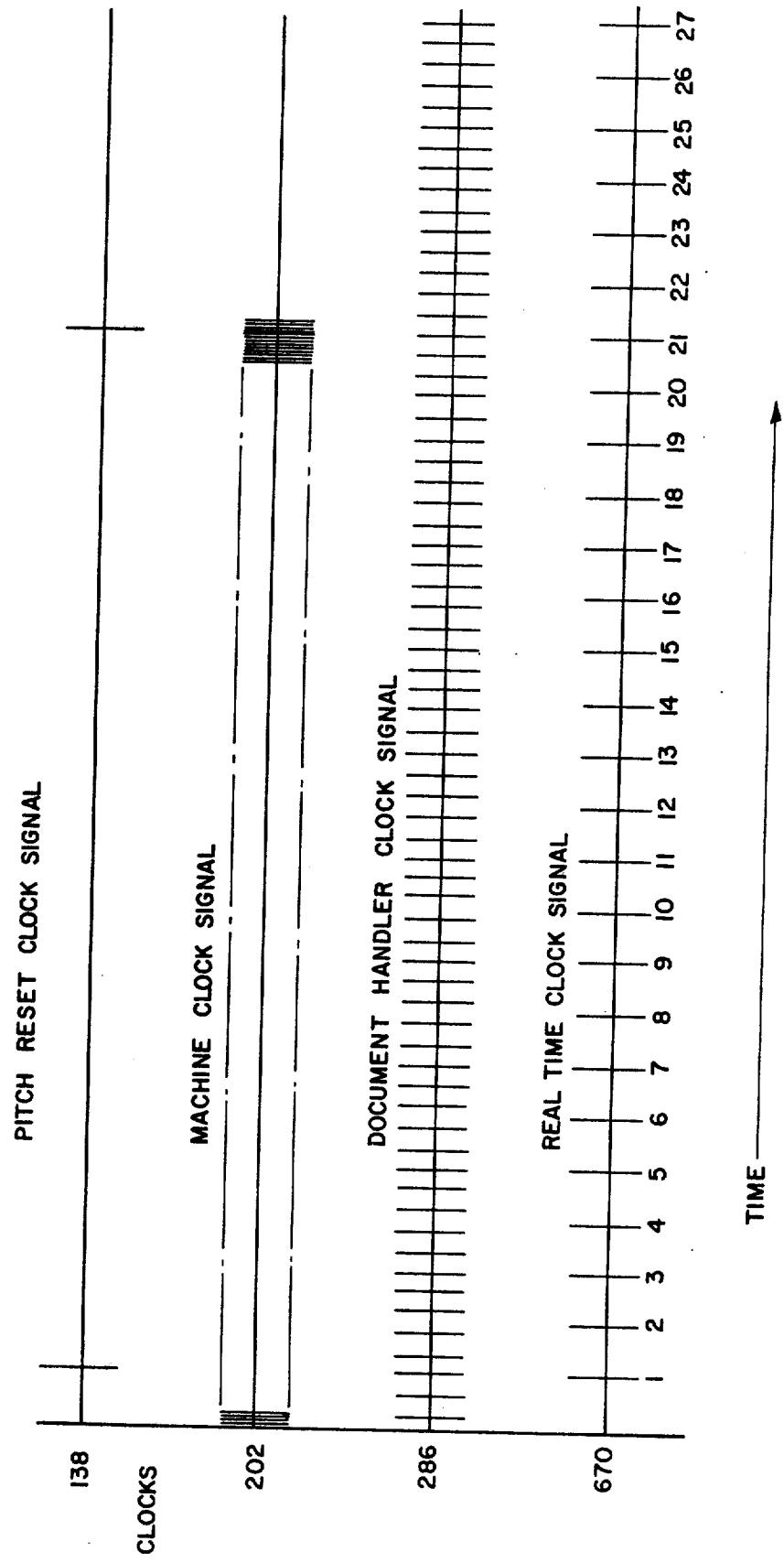

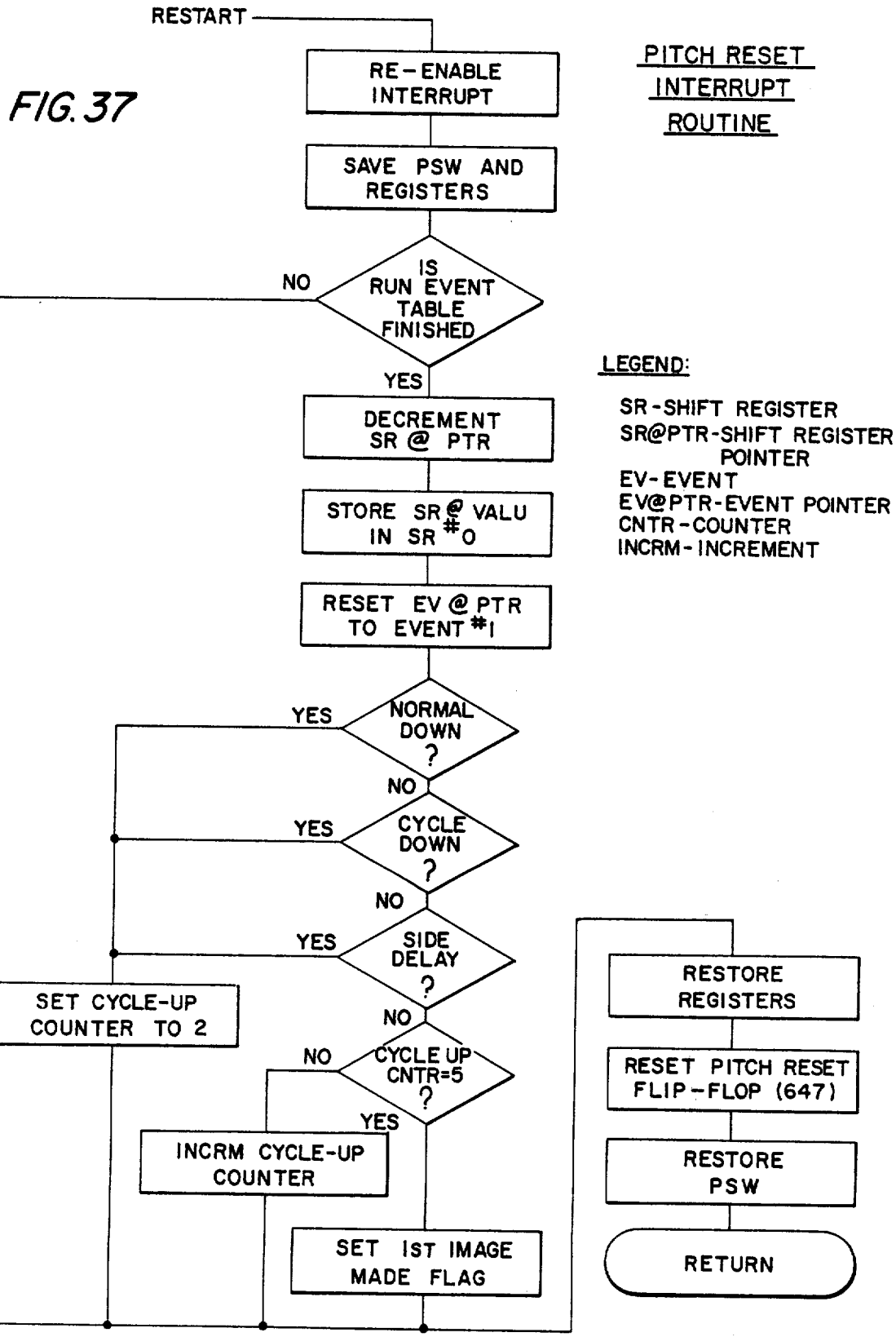

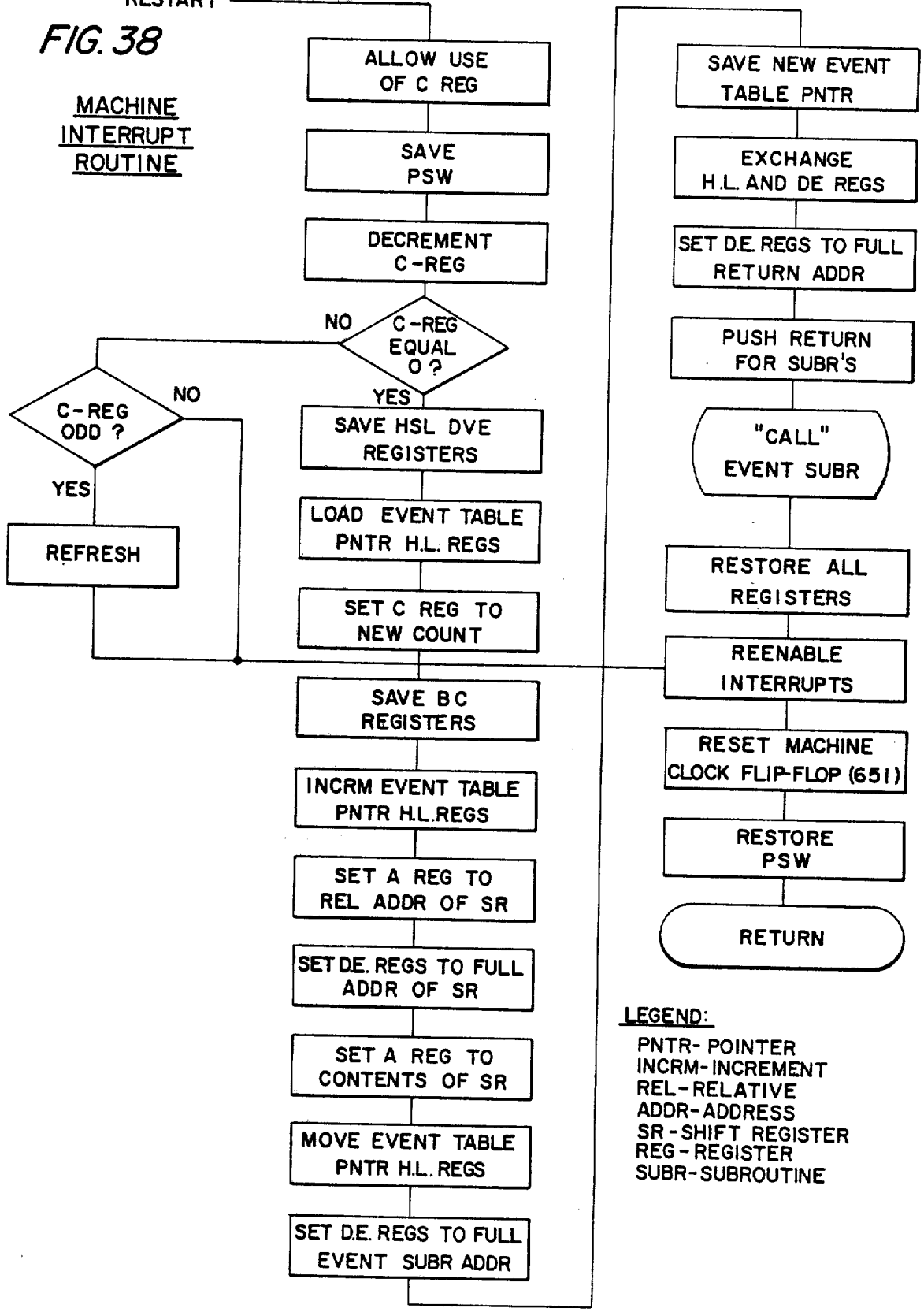

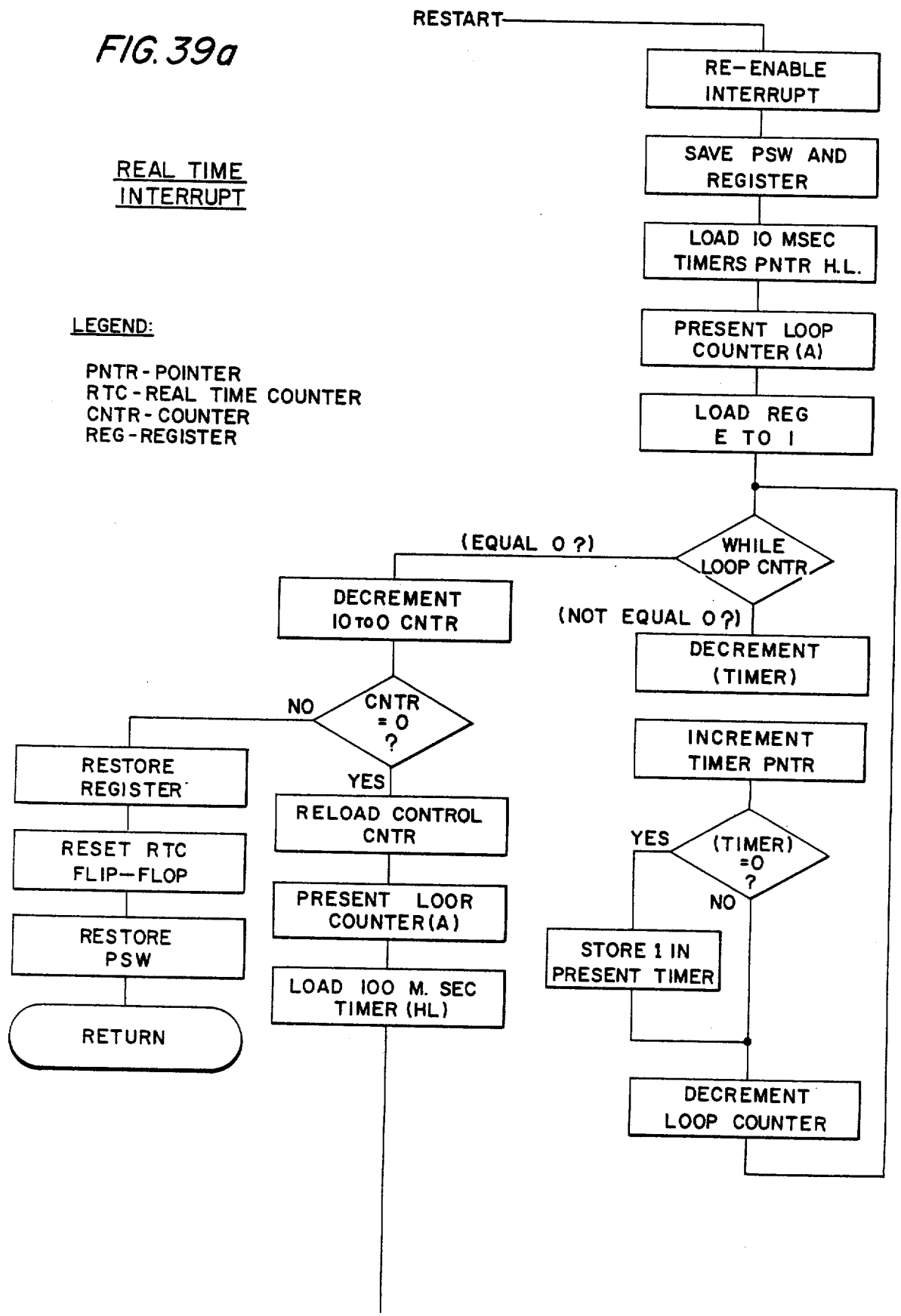

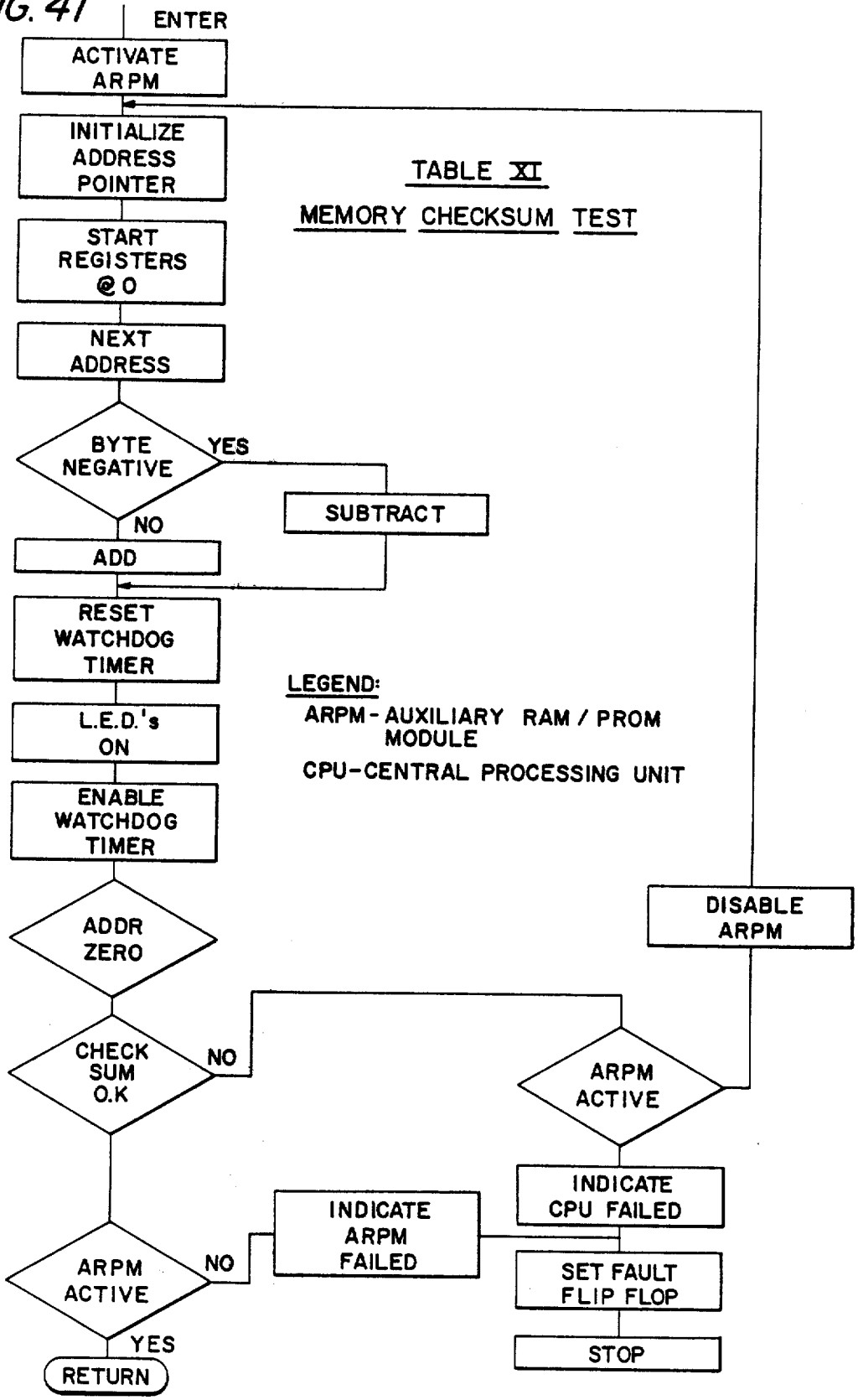

TABLE XII - PART II
RAM MEMORY TEST

LEGEND:
ADDR. - ADDRESS
CMP - COMPARE
CHK - CHECK
ARPM - AUXILLIARY RAM/PROM MODULE

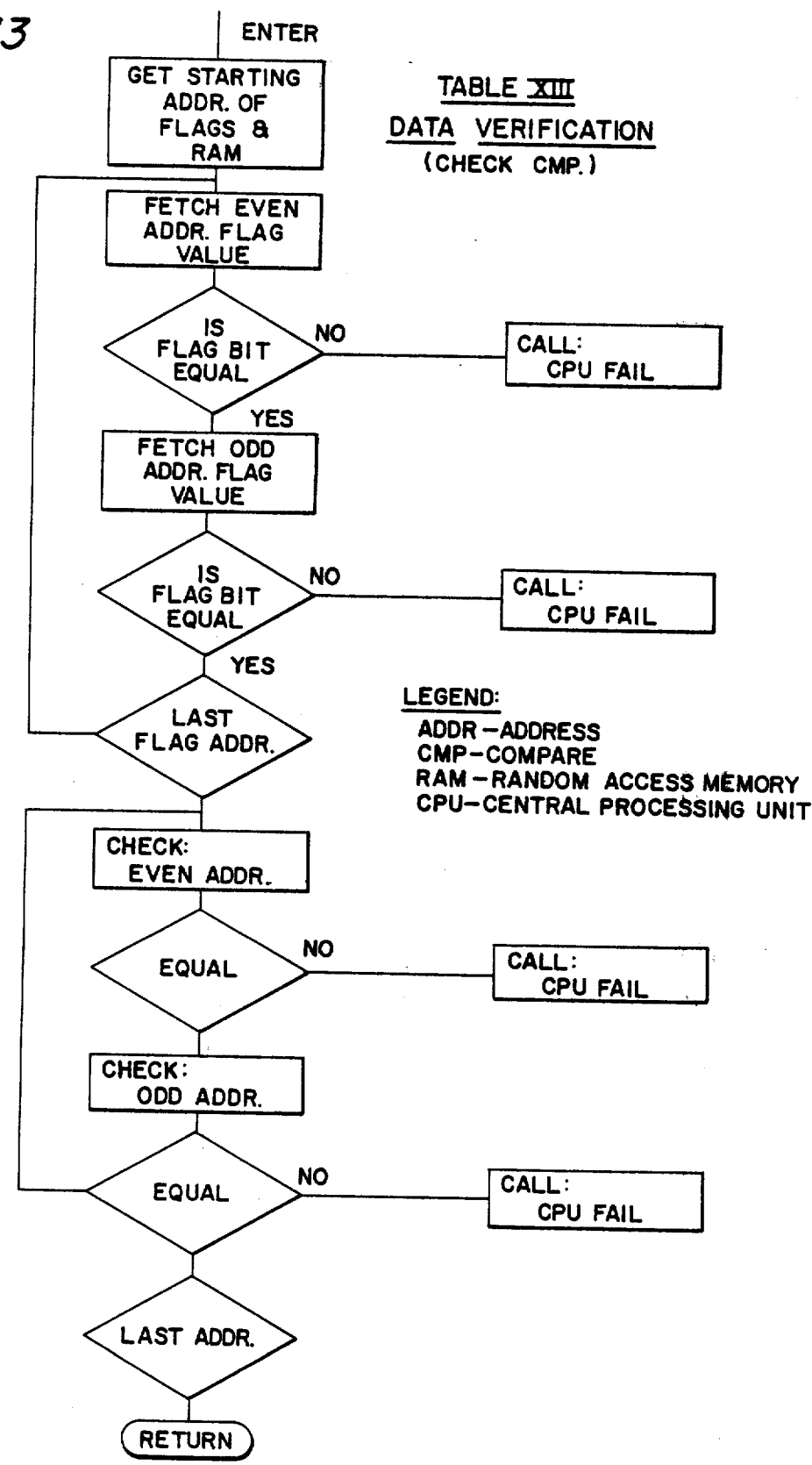

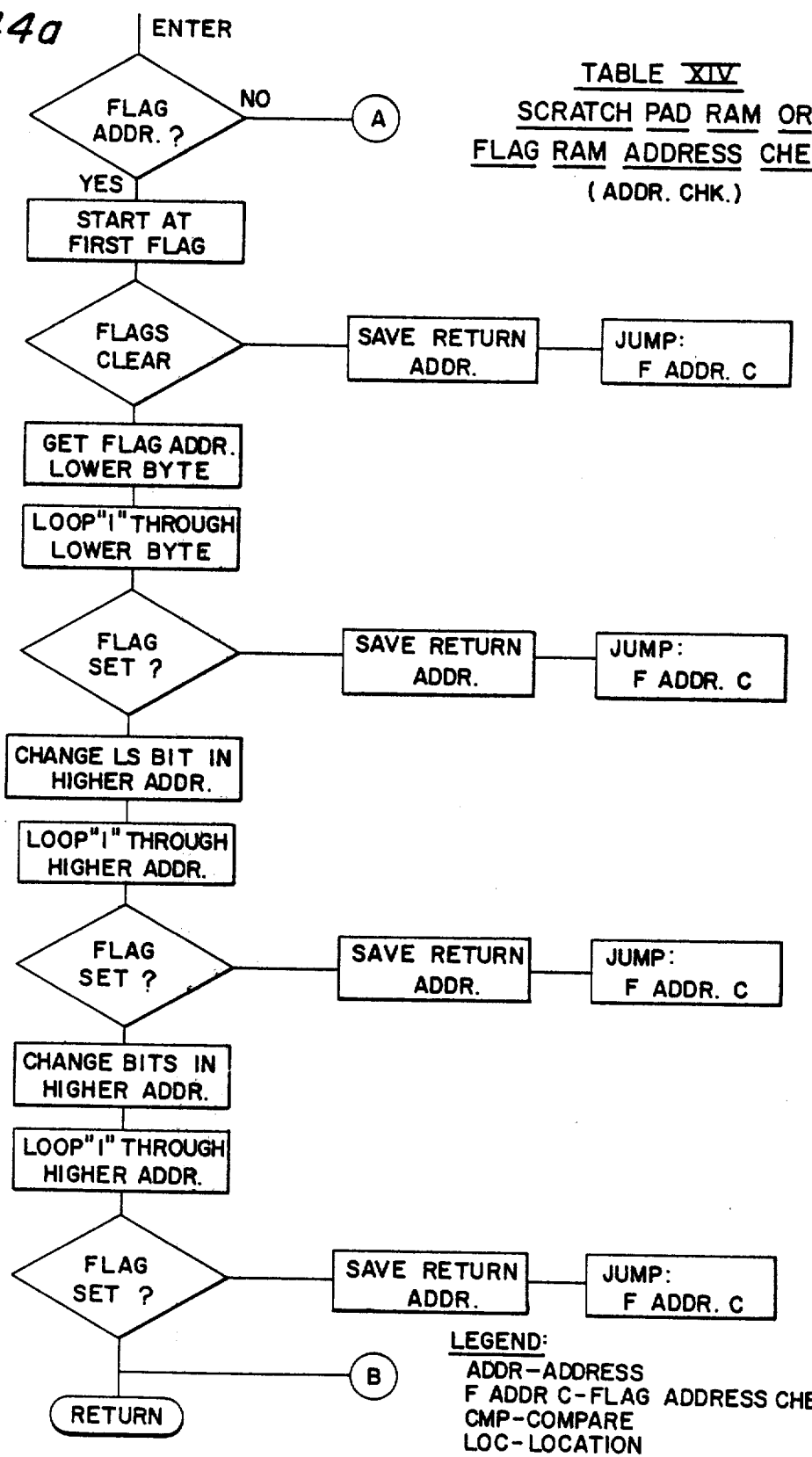

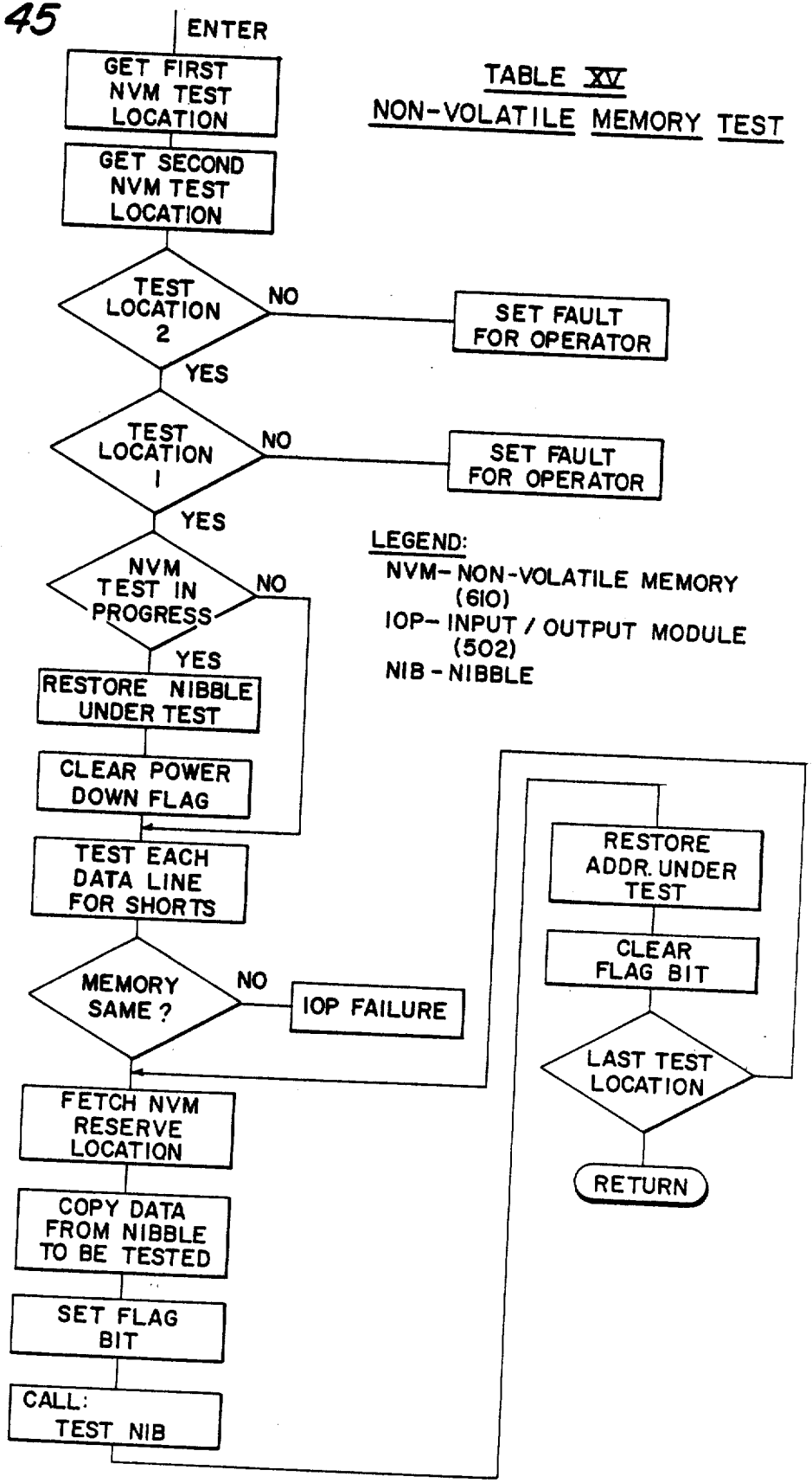

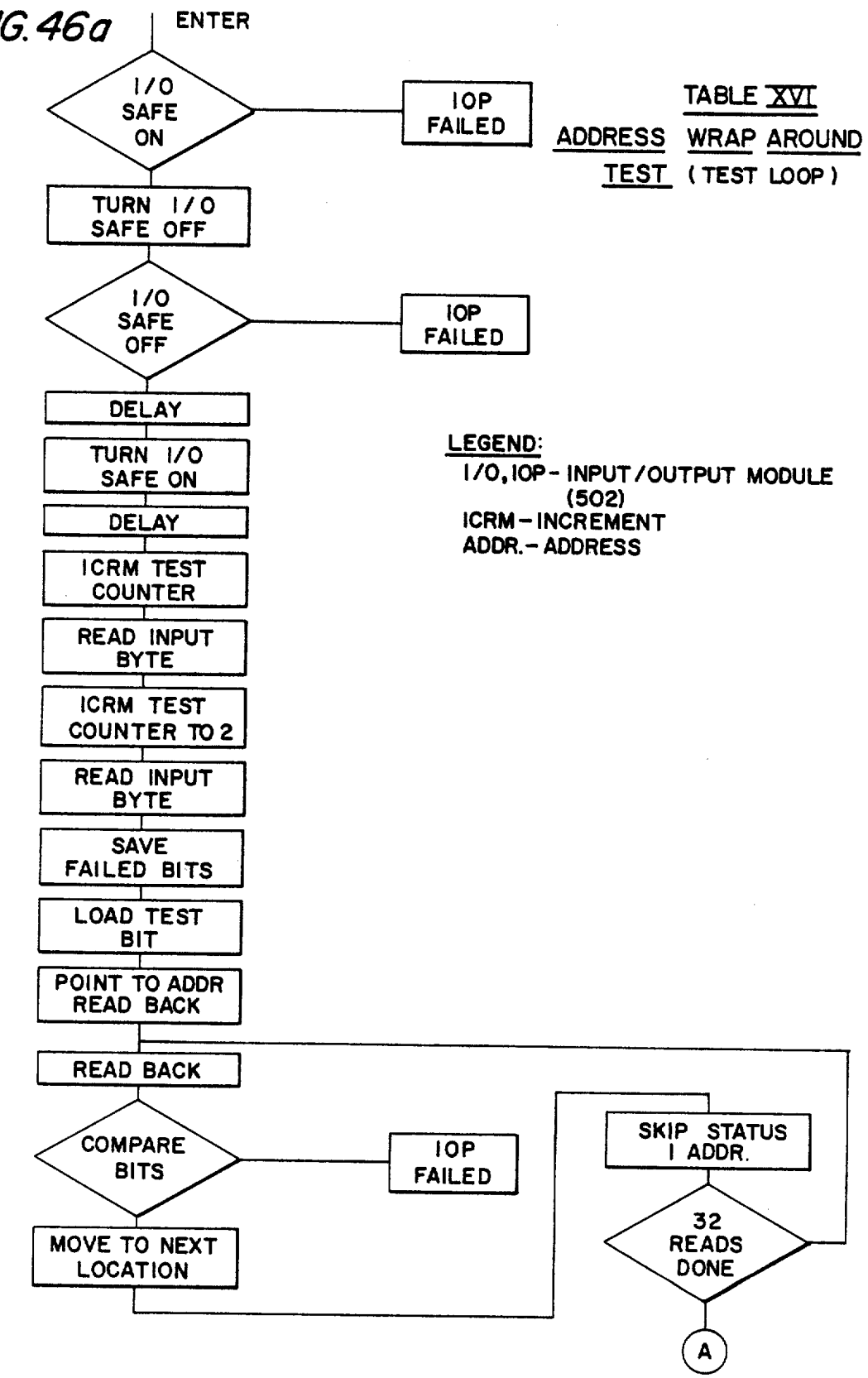

TABLE XVII PART I
CONTROLLER INTERFACE REFRESH TEST
(TEST LOOP 2)

LEGEND:
   ICRM.— INCREMENT
   REG.— REGISTER
   DECRM.— DECREMENT
   ADDR.— ADDRESS
   CTL.— CONTROLLER
   INT.— INTERFACE
   IOP.— INPUT / OUTPUT MODULE (502)

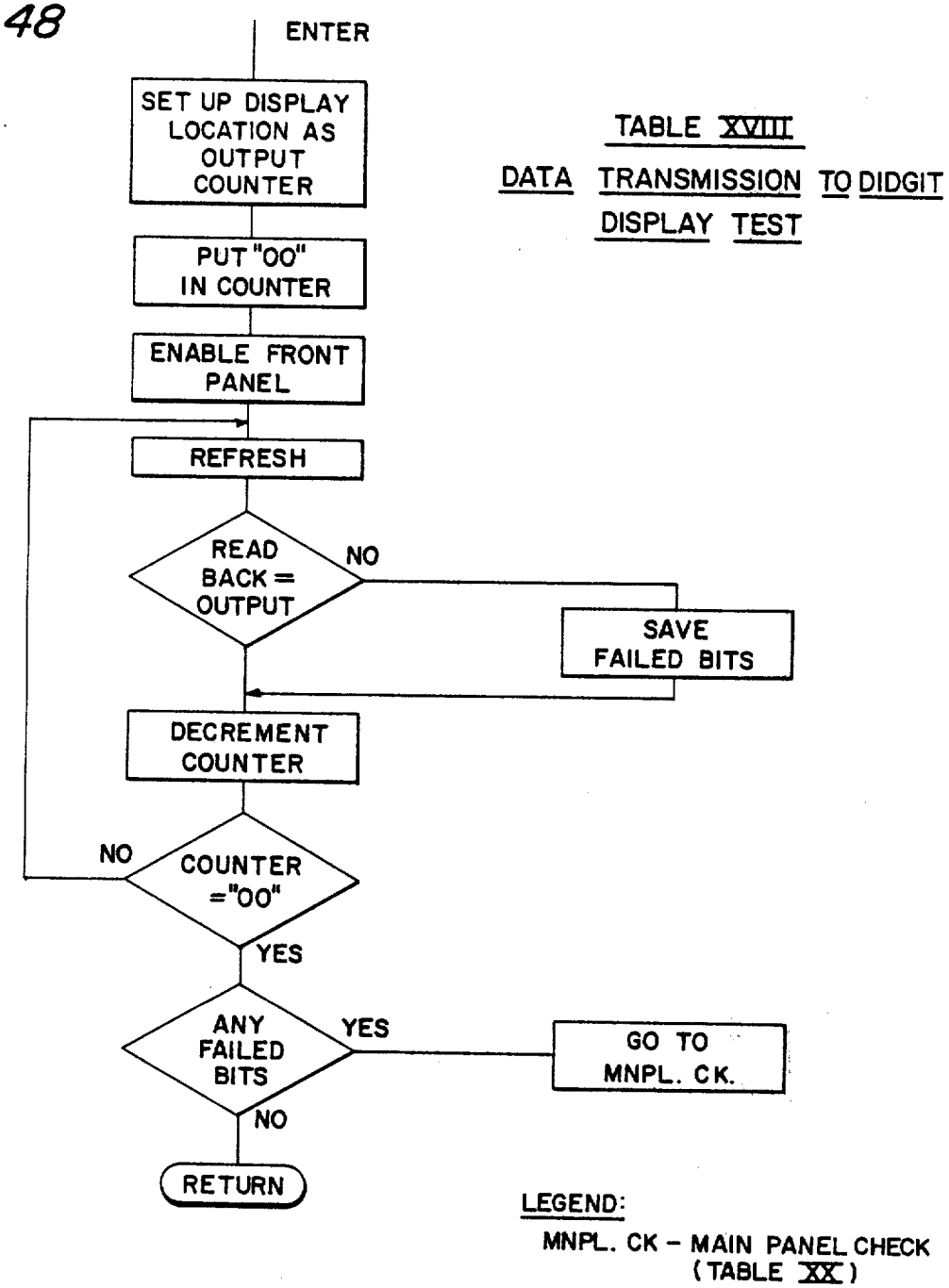

TABLE XIX
STATIC DATA TRANSMISSION
VERIFICATION TEST
(LOOP 4)

LEGEND:
Do - REMOTE OUTPUT Do
MNPL - MAIN PANEL
IO - INPUT / OUTPUT

TABLE XIX

COPY REPRODUCTION MACHINE WITH CONTROLLER SELF CHECK SYSTEM

This is a continuation of application Ser. No. 829,031, filed Aug. 30, 1977 and now abandoned.

BACKGROUND OF THE INVENTION

This invention relates to electrostatographic xerographic type reproduction machines, and more particularly, to an improved control system for such machines.

The advent of higher speed and more complex copiers and reproduction machines has brought with it a corresponding increase in the complexity in the machine control wiring and logic. While this complexity manifests itself in many ways, perhaps the most onerous involves the inflexibility of the typical control logic/wiring systems. For as can be appreciated, simple unsophisticated machines with relatively simple control logic and wiring can be altered and modified easily to incorporate changes, retrofits, and the like. Servicing and repair of the control logic is also fairly simple. On the other hand, some modern high speed machines, which often include sorters, a document handler, choice of copy size, multiple paper trays, jam protection and the like have extremely complex logic systems making even the most minor changes and improvements in the control logic difficult, expensive and time consuming. And servicing or repairing the machine control logic may similarly entail substantial difficulty, time and expense.

To mitigate problems of the type alluded to, a programmable controller may be used, enabling changes and improvements in the machine operation to be made through the expediency of reprogramming the controller. However, the control data which operates the machine and which is stored in the controller memory pending use, must be transferred to the various machine components at the proper time and in the correct sequence without unduly interfering with or intruding unnecessarily upon the other essential functions and operations of the controller.

It is therefore an object of the present invention to provide a new and improved control system for electrostatographic type reproduction machines.

It is a further object of the present invention to provide a self-testing system for the controller of a reproduction machine.

It is an object of the present invention to provide a system for checking the operating condition of the controller in a reproduction machine both before start-up of the machine and periodically during machine operation.

It is an object of the present invention to provide an improved arrangement for verifying the operating integrity of a reproduction machine controller and terminating machine operation in the event a fault is found.

It is a further object of the present invention to provide a system for checking the operational integrity of a copier controller and identifying, in the event a malfunction is found, the offending controller part.

The invention relates to a method of verifying data transmission to an operating component of a copy reproducing machine, the steps comprising: checking said component by inputting test data to said component; reading the data output from said component; comparing the data output of said component with the test data inputted to said component; declaring a machine fault when the data output from said component differs from the test data inputted to said component; and repeating steps a–d periodically.

BRIEF DESCRIPTION OF THE DRAWINGS

Other objects and advantages will be apparent from the ensuing description and drawings in which:

FIG. 2 is a vertical sectional view of the apparatus shown in FIG. 1 along the image plane;

FIG. 3 is a top plane view of the apparatus shown in FIG. 1;

FIG. 4 is an isometric view showing the drive train for the apparatus shown in FIG. 1;

FIG. 5 is an enlarged view showing details of the photoreceptor edge fade-out mechanism for the apparatus shown in FIG. 1;

FIG. 6 is an enlarged view showing details of the developing mechanism for the apparatus shown in FIG. 1;

FIG. 7 is an enlarged view showing details of the developing mechanism drive;

FIG. 8 is an enlarged view showing details of the developability control for the apparatus shown in FIG. 1;

FIG. 9 is an enlarged view showing details of the transfer roll support mechanism for the apparatus shown in FIG. 1;

FIG. 10 is an enlarged view showing details of the photoreceptor cleaning mechanism for the apparatus shown in FIG. 1;

FIG. 11 is an enlarged view showing details of the fuser for the apparatus shown in FIG. 1;

FIG. 18b is a timing chart of Direct Memory access (DMA) Read and Write cycles;

FIG. 19b is a chart illustrating the output wave form of the clock shown in FIG. 19a;

FIGS. 23a and 23b comprise a block diagram of the controller I/O module;

FIG. 25 is a block diagram of the apparatus interface and remote output connections;

FIG. 29 is a block diagram of the input matrix module;

FIG. 30 is a block diagram of a typical remote;

FIG. 31 is a block diagram of the sorter remote;

FIG. 32 is a view of the control console for inputting copy run instructions to the apparatus shown in FIG. 1;

FIG. 33 is a flow chart illustrating a typical machine state;

FIG. 34 is a flow chart of the machine state routine;

FIG. 36 is a chart illustrating the relative timing sequences of the clock interrupt pulses;

FIG. 37 is a flow charge of the pitch interrupt routine;

FIG. 38 is a flow chart of the machine clock interrupt routine;

FIGS. 39a and 39b comprise a flow chart of the real time interrupt routines;

FIG. 41 is a flow chart showing the memory checksum comparison test routine;

FIG. 43 is a flow chart showing the check checker board pattern routine;

FIGS. 44a and 44b are a flow chart showing the ram address check routine;

FIG. 45 is a flow chart showing the non-volatile memory test routine;

FIGS. 46a and 46b are a flow chart showing the address wrap around test routine;

FIG. 48 is a flow chart showing the data transmission to digit display test routine;

DETAILED DESCRIPTION OF THE PREFERRED EMBODIMENT OF THE INVENTION

Figure 1:
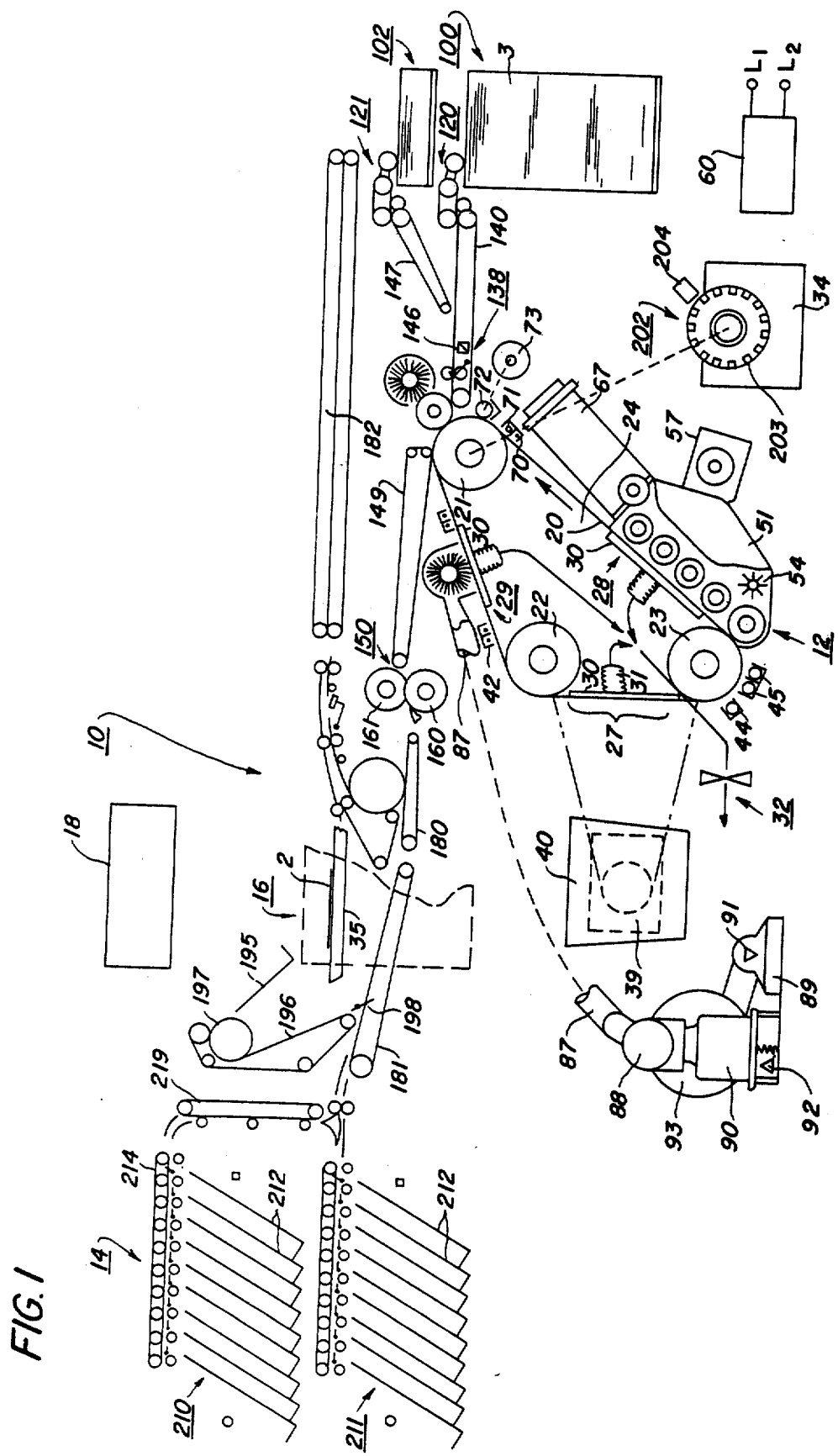
FIG. 1 is a schematic representation of an exemplary reproduction apparatus incorporating the control system of the present invention.

Referring particularly to FIGS. 1-3 of the drawings, there is shown, in schematic outline, an electrostatic reproduction system or host machine, identified by numeral 10, incorporating the control arrangement of the present invention. To facilitate description, the reproduction system 10 is divided into a main electrostatic xerographic processor 12, sorter 14, document handler 16, and controller 18. Other processor, sorter and/or document handler types and constructions, and different combinations thereof may instead be envisioned.

PROCESSOR

Processor 12 utilizes a photoreceptor in the form of an endless photoconductive belt 20 supported in generally triangular configuration by rolls 21, 22, 23. Belt supporting rolls 21, 22, 23 are in turn rotatably journaled on subframe 24.

In the exemplary processor illustrated, belt 20 comprises a photoconductive layer of selenium, which is the light receiving surface and imaging medium, on a conductive substrate. Other photoreceptor types and forms, such as comprising organic materials or of multi-layers or a drum may instead be envisioned. Still other forms may comprise scroll type arrangements wherein webs of photoconductive material may be played in and out of the interior of supporting cylinders.

Suitable biasing means (not shown) are provided on subframe 24 to tension the photoreceptor belt 20 and insure movement of belt 20 along a prescribed operating path. Belt tracking switch 25 (shown in FIG. 2) monitors movement of belt 20 from side to side. Belt 20 is supported so as to provide a trio of substantially flat belt runs opposite exposure, developing, and cleaning stations 27, 28, 29 respectfully. To enhance belt flatness at these stations, vacuum platens 30 are provided under belt 20 at each belt run. Conduits 31 communicate vacuum platens 30 with a vacuum pump 32. Photoconductive belt 20 moves in the direction indicated by the solid line arrow, drive thereto being effected through roll 21, which in turn is driven by main drive motor 34, as seen in FIG. 4.

Processor 12 includes a generally rectangular, horizontal transparent platen 35 on which each original 2 to be copied is disposed. A two or four sided illumination assembly, consisting of internal reflectors 36 and flash lamps 37 (shown in FIG. 2) disposed below and along at least two sides of platen 35, is provided for illuminating the original 2 on platen 35. To control temperatures within the illumination space, the assembly is coupled through conduit 33 with a vacuum pump 38 which is adapted to withdraw overly heated air from the space. To retain the original 2 in place on platen 35 and prevent escape of extraneous light from the illumination assembly, a platen cover 35 may be provided.

The light image generated by the illumination system is projected via mirrors 39, 40 and a variable magnification lens assembly 41 onto the photoreceptive belt 20 at the exposure station 27. Reversible motor 43 is provided to move the main lens and add on lens elements that comprise the lens assembly 41 to different predetermined positions and combinations to provide the preselected image sizes corresponding to push button selectors 818, 819, 820 on operator module 800. (See FIG. 32) Sensors 116, 117, 118 signal the present disposition of lens assembly 41. Exposure of the previously charged belt 20 selectively discharges the photoconductive belt to produce on belt 20 an electrostatic latent image of the original 2. To prepare belt 20 for imaging, belt 20 is uniformly charged to a preselected level by charge corotron 42 upstream of the exposure station 27.

To prevent development of charged but unwanted image areas, erase lamps 44, 45 are provided. Lamp 44, which is referred to herein as the pitch fadeout lamp, is supported in transverse relationship to belt 20, lamp 44 extending across substantially the entire width of belt 20 to erase (i.e. discharge) areas of belt 20 before the first image, between successive images, and after the last image. Lamps 45, which are referred to herein as edge fadeout lamps, serve to erase areas bordering each side of the images. Referring particularly to FIG. 5, edge fadeout lamps 45, which extend transversely to belt 20, are disposed within a housing 46 having a pair of transversely extending openings 47, 47' of differing length adjacent each edge of belt 20. By selectively actuating one or the other of the lamps 45, the width of the area bordering the sides of the image that is erased can be controlled.

Referring to FIGS. 1, 6 and 7, magnetic brush rolls 50 are provided in a developer housing 51 at developing station 28. Housing 51 is pivotally supported adjacent the lower end thereof with interlock switch 52 to sense disposition of housing 51 in operative position adjacent belt 20. The bottom of housing 51 forms a sump within which a supply of developing material is contained. A rotatable auger 54 in the sump area serves to mix the developing material and bring the material into operative relationship with the lowermost of the magnetic brush rolls 50.

As will be understood by those skilled in the art, the electrostatically attractable developing material commonly used in magnetic brush developing apparatus of the type shown comprises a pigmented resinous powder, referred to as toner, and larger granular beads referred to as carrier. To provide the necessary magnetic properties, the carrier is comprised of a magnetizable material such as steel. By virtue of the magnetic fields established by developing rolls 50 and the interrelationship therebetween, a blanket of developing material is formed along the surfaces of developing rolls 50 adjacent the belt 20 and extending from one roll to another. Toner is attracted to the electrostatic latent image from the carrier bristles to produce a visible powder image on the surface of belt 20.

Magnetic brush rolls 50 each comprise a rotatable exterior sleeve 55 with relatively stationary magnet 56 inside. Sleeves 55 are rotated in unison and at substantially the same speed as belt 20 by a developer drive motor 57 through a belt and pulley arrangement 58. A second belt and pulley arrangement 59 drives auger 54.

To regulate development of the latent electrostatic images on belt 20, magnetic brush sleeves 55 are electrically biased. A suitable power supply 60 is provided for this purpose with the amount of bias being regulated by controller 18.

Developing material is returned to the upper portion of developer housing 51 for reuse and is accomplished by utilizing a photocell 62 which monitors the level of developing material in housing 51 and a photocell lamp 62' spaced opposite to the photocell 62 in cooperative relationship therewith. The disclosed machine is also provided with automatic developability control which maintains an optimum proportion of toner-to-carrier material by sensing toner concentration and replenishing toner, as needed. As shown in FIG. 8, the automatic developability control comprises a pair of transparent plates 64 mounted in spaced, parallel arrangement in developer housing 51 such that a portion of the returning developing material passes therebetween. A suitable circuit, not shown, alternately places a charge on the plates 64 to attract toner thereto. Photocell 65 on one side of the plate pair senses the developer material as the material passes therebetween. Lamp 65' on the opposite side of plate pair 64 provides reference illumination. In this arrangement, the returning developing material is alternately attracted and repelled to and from plate 64. The accumulation of toner, i.e. density determines the amount of light transmitted from lamp 65' to photocell 65. Photocell 65 monitors the density of the returning developing material with the signal output therefrom being used by controller 18 to control the amount of fresh or make-up toner to be added to developer housing 51 from toner supply container 67.

To discharge toner from container 67, rotatable dispensing roll 68 is provided in the inlet to developer housing 51. Motor 69 drives roll 68. When fresh toner is required, as determined by the signal from photocell 65, controller 18 actuates motor 69 to turn roll 68 for a timed interval. The rotating roll 68, which is comprised of a relatively porous sponge-like material, carries toner particles thereon into developer housing 51 where it is discharged. Pre-transfer corotron 70 and lamp 71 are provided downstream of magnetic brush rolls 50 to regulate developed image charges before transfer.

A magnetic pick-off roll 72 is rotatably supported opposite belt 20 downstream of pre-transfer lamp 71, roll 72 serving to scavenge leftover carrier from belt 20 preparatory to transfer of the developed image to the copy sheet 3. Motor 73 turns roll 72 in the same direction and at substantially the same speed as belt 20 to prevent scoring or scratching of belt 20. One type of magnetic pick-off roll is shown in U.S. Pat. No. 3,834,804, issued Oct. 10, 1974 to Bhagat et al.

Figure 12:
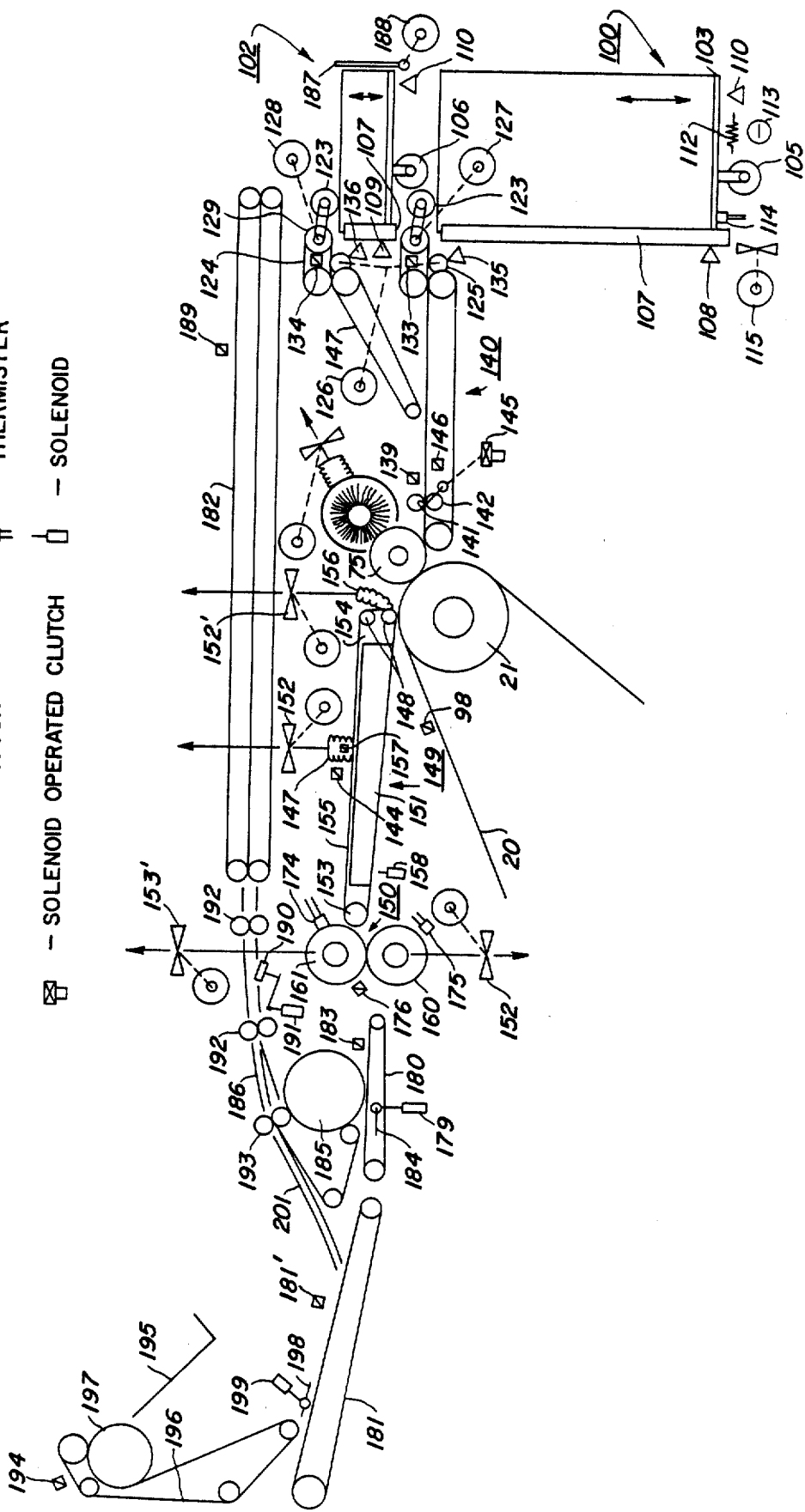
FIG. 12 is a schematic view showing the paper path and sensors of the apparatus shown in FIG. 1.

Referring to FIGS. 4, 9 and 12, to transfer developed images from belt 20 to the copy sheets 3, a transfer roll 75 is provided. Transfer roll 75, which forms part of the copy sheet feed path, is rotatably supported within a transfer roll housing opposite belt support roll 21. Housing 76 is pivotally mounted at 76' to permit the transfer roll assembly to be moved into and out of operative relationship with belt 20. A transfer roll cleaning brush 77 is rotatably journalled in transfer roll housing 76 with the brush periphery in contact with transfer roll 90. Transfer roll 75 is driven through contact with belt 20 while cleaning brush 77 is coupled to main drive motor 34. To remove toner, housing 76 is connected through conduit 78 with vacuum pump 81. To facilitate and control transfer of the developed images from belt 20 to the copy sheets 3, a suitable electrical bias is applied to transfer roll 75.

To permit transfer roll 75 to be moved into and out of operative relationship with belt 20, cam 79 is provided in driving contact with transfer roll housing 76. Cam 79 is driven from motor 34 through an electromagnetically operated one revolution clutch 80. Spring means (not shown) serves to maintain housing 76 in driving engagement with cam 79.

To facilitate separation of the copy sheets 3 from belt 20 following transfer of developed images, a detack corotron 82 is provided. Corotron 82 generates a charge designed to neutralize or reduce the charges tending to retain the copy sheet on belt 20. Corotron 82 is supported on transfer roll housing 76 opposite belt 20 and downstream of transfer roll 75.

Referring to FIGS. 1, 2 and 10, to prepare belt 20 for cleaning, residual charges on belt 20 are removed by discharge lamp 84 and preclean corotron 94. A cleaning brush 85, rotatably supported within an evacuated semicircular shaped brush housing 86 at cleaning station 29, serves to remove residual developer from belt 20. Motor 95 drives brush 85, brush 85 turning in a direction opposite that of belt 20.

Vacuum conduit 87 couples brush housing 86 through a centrifugal type separator 88 with the suction side of vacuum pump 93. A final filter 89 on the outlet of motor 93 traps particles that pass through separator 88. The heavier toner particles separated by separator 88 drop into and are collected in one or more collecting bottles 90. Pressure sensor 91 monitors the condition of final filter 89 while a sensor 92 monitors the level of toner particles in collecting bottles 90.

To obviate the danger of copy sheets remaining on belt 20 and becoming entangled with the belt cleaning mechanism, a deflector 96 is provided upstream of cleaning brush 85. Deflector 96, which is pivotally supported on the brush housing 86, is operated by solenoid 97. In the normal or off position, deflector 96 is spaced from belt 20 (the solid line position shown in the drawings). Energization of solenoid 97 pivots deflector 96 downwardly to bring the deflector leading edge into close proximity to belt 20.

Sensors 98, 99 are provided on each side of deflector 96 for sensing the presence of copy material on belt 20. A signal output from upstream sensor 98 triggers solenoid 97 to pivot deflector 96 into position to intercept the copy sheet on belt 20. The signal from sensor 98 also initiates a system shutdown cycle (mis-strip jam) wherein the various operating components are, within a prescribed interval, brought to a stop. The interval permits any copy sheet present in fuser 150 to be removed, sheet trap solenoid 158 (FIG. 12) having been actuated to prevent the next copy sheet from entering fuser 150 and becoming trapped therein. The signal from sensor 99, indicating failure of deflector 96 to intercept or remove the copy sheet from belt 20, triggers an immediate or hard stop (sheet on selenium jam) of the processor. In such instances the power to drive motor 34 is interrupted to bring belt 20 and the other components driven therefrom to an immediate stop.

Referring particularly to FIGS. 1 and 12, copy sheet 3 comprise precut paper sheets supplied from either main or auxiliary paper trays 100, 102. Each paper tray has a platform or base 103 for supporting in stack-like fashion a quantity of sheets. The tray platforms 103 are supported for vertical up and down movement by motors 105, 106. Side guide pairs 107, in each tray 100, 102 delimit the tray side boundaries, the guide pairs being adjustable toward and away from one another in accommodation of different size sheets. Sensors 108, 109 respond to the position of each side guide pair 107, the output of sensors 108, 109 serving to regulate operation of edge fadeout lamps 45 and fuser cooling valve 171 (FIG. 3). Lower limit switches 110 on each tray prevent overtravel of the tray platform in a downward direction.

A heater 112 is provided below the platform 103 of main tray 100 to warm the tray area and enhance feeding of sheets therefrom. Humidstat 113 and thermostat 114 control operation of heater 112 in response to the temperature/humidity conditions of main tray 100. Fan 115 is provided to circulate air within tray 100.

To advance the sheets 3 from either main or auxiliary tray 100, 102, main and auxiliary sheet feeders 120, 121 are provided. Feeders 120, 121 each include a nudger roll 123 to engage and advance the topmost sheet in the paper tray forward into the nip formed by a feed belt 124 and retard roll 125. Retard rolls 125, which are driven at an extremely low speed by motor 126, cooperate with feed belts 124 to restrict feeding of sheets from trays 100, 102 to one sheet at a time.

Feed belts 124 are driven by main and auxiliary sheet feed motors 127, 128 respectively. Nudger rolls 123 are supported for pivotal movement about the axis of feed belt drive shaft 129 with drive to the nudger rolls taken from drive shaft 129. Stack height sensors 133, 134 are provided for the main and auxiliary trays, the pivoting nudger rolls 123 serving to operate sensors 133, 134 in response to the sheet stack height. Main and auxiliary tray misfeed sensors 135, 136 are provided at the tray outlets.

Main transport 140 extends from main paper tray 100 to a point slightly upstream of the nip formed by photoconductive belt 20 and transfer roll 75. Transport 140 is driven from the main motor 34. To register sheets 3 with the images developed on belt 20, sheet register fingers 141 are provided, fingers 141 being arranged to move into and out of the path of the sheets on transport 140 once each revolution (see also FIG. 4). Registration fingers 141 are driven from main motor 34 through electromagnetic clutch 145. A timing or reset switch 146 is set once on each revolution of sheet register fingers 141. Sensor 139 monitors transport 140 for jams. Further amplification of sheet register system may be found in U.S. Patent No. 3,781,004, issued December 25, 1973 to Buddendeck et al.

Pinch roll pair 142 is interspaced between transport belts that comprise main transport 140 on the downstream side of register fingers 141. Pinch roll pair 142 are driven from main motor 34.

Auxiliary transport 147 extends from auxiliary tray 102 to main transport 140 at a point upstream of sheet register fingers 141. Transport 147 is driven from motor 34.

To maintain the sheets in driving contact with the belts of transports 140, 147, suitable guides or retainers (not shown) may be provided along the belt runs.

The image bearing sheets leaving the nip formed by photoconductive belt 20 and transfer roll 75 are picked off by belts 155 of the leading edge of vacuum transport 149. Belts 155, which are perforated for the admission of vacuum therethrough, ride on forward roller pair 148 and rear roll 153. A pair of internal vacuum plenums 151, 154 are provided, the leading plenum 154 cooperating with belts 155 to pick up the sheets leaving the belt/transfer roll nip. Transport 149 conveys the image bearing sheets to fuser 150. Vacuum conduits 147, 156 communicate plenums 151, 154 with vacuum pumps 152, 152'. A pressure sensor 157 monitors operation of vacuum pump 152. Sensor 144 monitors transport 149 for jams.

To prevent the sheet on transport 149 from being carried into fuser 150 in the event of a jam or malfunction, a trap solenoid 158 is provided below transport 149. Energization of solenoid 158 raises the armature thereof into contact with the lower face of plenum 154 to intercept and stop the sheet moving therepast.

Referring particularly to FIGS. 4, 10 and 12, fuser 150 comprises a lower heated fusing roll 160 and upper pressure roll 161. Rolls 160, 161 are supported for rotation in fuser housing 162. The core of fusing roll 160 is hollow for receipt of heating rod 163 therewithin.

Housing 162 includes a sump 164 for holding a quantity of liquid release agent, herein termed oil. Dispensing belt 165, moves through sump 164 to pick up the oil, belt 165 being driven by motor 166. A blanket-like wick 167 carries the oil from belt 165 to the surface of fusing roll 160.

Pressure roll 161 is supported within an upper pivotal section 168 of housing 162. This enables pressure roll 161 to be moved into and out of operative contact fusing roll 160. Cam shaft 169 in the lower portion of fuser housing 162 serves to move housing section 168 and pressure roll 161 into operative relationship with fusing roll 160 against a suitable bias (not shown). Cam shaft 169 is coupled to main motor 34 through an electromagnetically operated one revolution clutch 159.

Fuser section 168 is evacuated, conduit 170 coupling housing section 168 with vacuum pump 152. The ends of housing section 168 are separated into vacuum compartments opposite the ends of pressure roll 161 thereunder to cool the roll ends where smaller size copy sheets 3 are being processed. Vacuum valve 171 (FIG. 3) in conduit 172 regulates communication of the vacuum compartments with vacuum pump 153' in response to the size sheets as sensed by side guide sensors 108, 109 in paper trays 100, 102.

Fuser roll 160 is driven from main motor 34. Pressure roll 161 is drivingly coupled to fuser roll 160 for rotation therewith.

Thermostat 174 (FIG. 12) in fuser housing 162 controls operation of heating rod 163 in response to temperature. Sensor 175 protects against fuser overtemperature. To protect against trapping of a sheet in fuser 150 in the event of a jam, sensor 176 is provided.

Following fuser 150, the sheet is carried by post fuser transport 180 to either discharge transport 181 or, where duplex or two sided copies are desired, to return transport 182. Sheet sensor 183 monitors passage of the sheets from fuser 150. Transports 180, 181 are driven from main motor 34. Sensor 181' monitors transport 181 for jams. Suitable retaining means may be provided to retain the sheets on transports 180, 181.

A deflector 184, when extended, directs sheets on transport 180 onto conveyor roll 185 and into chute 186 leading to return transport 182. Solenoid 179, when energized raises deflector 184 into the sheet path. Return transprot 182 carries the sheets back to auxiliary tray 102. Sensor 189 monitors transport 182 for jams. The forward stop 187 of tray 102 is supported for oscillating movement. Motor 188 drives stop 187 back and forth tap sheets returned to auxiliary tray 102 into alignment for refeeding.

To invert copy sheets following fusing of the second or duplex image, a displaceable sheet stop 190 is provided adjacent the discharge end of chute 186. Stop 190 is pivotally supported for swinging movement into and out of chute 186. Solenoid 191 is provided to move stop 190 selectively into or out of chute 186. Pinch roll pairs 192, 193 serve to draw the sheet trapped in chute 186 by stop 190 and carry the sheet forward onto discharge transport 181. Further description of the inverter mechanism may be found in U.S. Pat. No. 3,856,295, issued Dec, 24, 1974, to John H. Looney.

Output tray 195 receives unsorted copies. Transport 196 a portion of which is wrapped around a turn around roll 197, serves to carry the finished copies to tray 195. Sensor 194 monitors transport 196 for jams. To route copies into output tray 195, a deflector 198 is provided. Deflector solenoid 199, when energized, turns deflector 198 to intercept sheets on conveyor 181 and route the sheets onto conveyor 196.

When output tray 195 is not used, the sheets are carried by conveyor 181 to sorter 14.

SORTER

Figure 13:
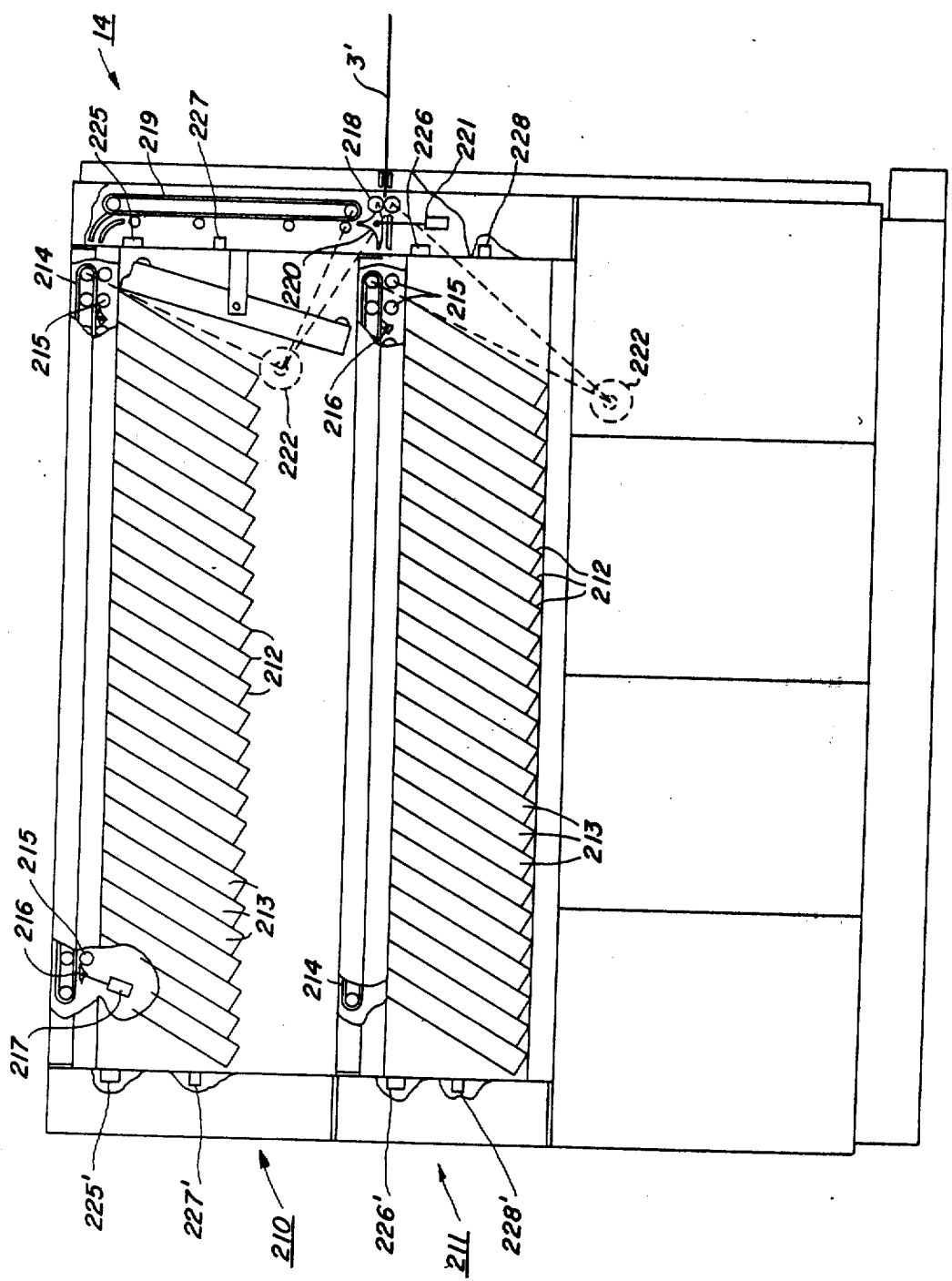
FIG. 13 is an enlarged view showing details of the copy sorter for the apparatus shown in FIG. 1.

Referring particularly to FIG. 13, sorter 14 comprises upper and lower bin arrays 210, 211. Each bin array 210, 211 consists of series of spaced downwardly inclined trays 212, forming a series of individual bins 213 for receipt of finished copies 3'. Conveyors 214 along the top of each bin array, cooperate with idler rolls 215 adjacent the inlet to each bin to transport the copies into juxtaposition with the bins. Individual deflectors 216 at each bin cooperate, when depressed, with the adjoining idler roll 215 to turn the copies into the bin associated therewith. An operating solenoid 217 is provided for each deflector.

A driven roll pair 218 is provided at the inlet to sorter 14. A generally vertical conveyor 219 serves to bring copies 3' to the upper bin array 210. Entrance deflector 220 routes the copies selectively to either the upper or lower bin array 210, 211 respectively. Solenoid 221 operates deflector 220.

Motor 222 is provided for each bin array to drive the conveyors 214 and 219 of upper bin array 210 and conveyor 214 of lower bin array 211. Roll pair 218 is drivingly coupled to both motors.

To detect entry of copies 3' in the individual bins 213, a photoelectric type sensor 225, 226 is provided at one end of each bin array 210, 211 respectively. Sensor lamps 225', 226' are disposed adjacent the other end of the bin array. To detect the presence of copies in the bins 213, a second set of photoelectric type sensors 227, 228 is provided for each bin array, on a level with a tray cutout (not shown). Reference lamps 227', 228' are disposed opposite sensors 227, 228.

DOCUMENT HANDLER

Figure 14:
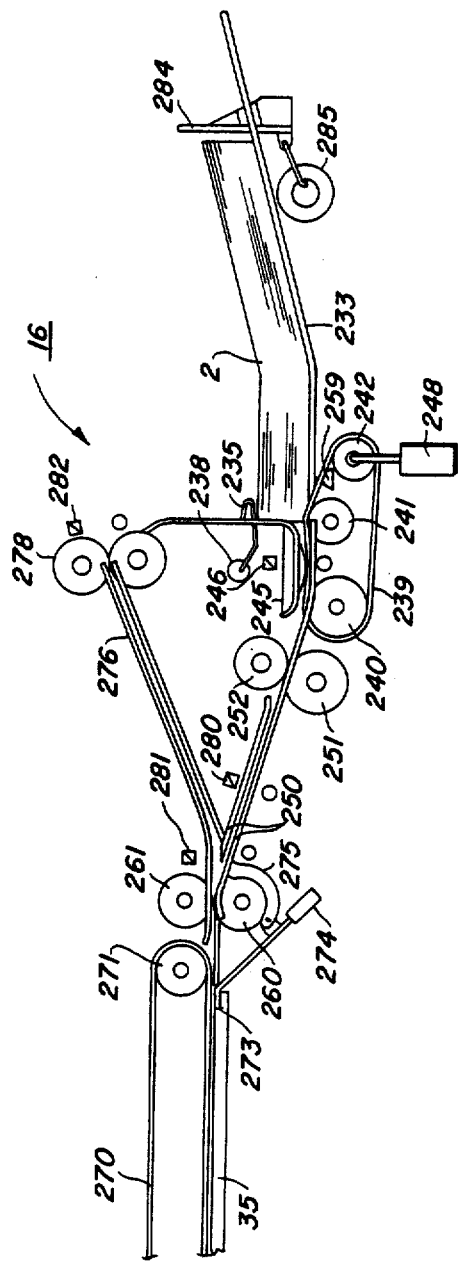
FIG. 14 is a schematic view showing details of the document handler for the apparatus shown in FIG. 1.
Figure 15:
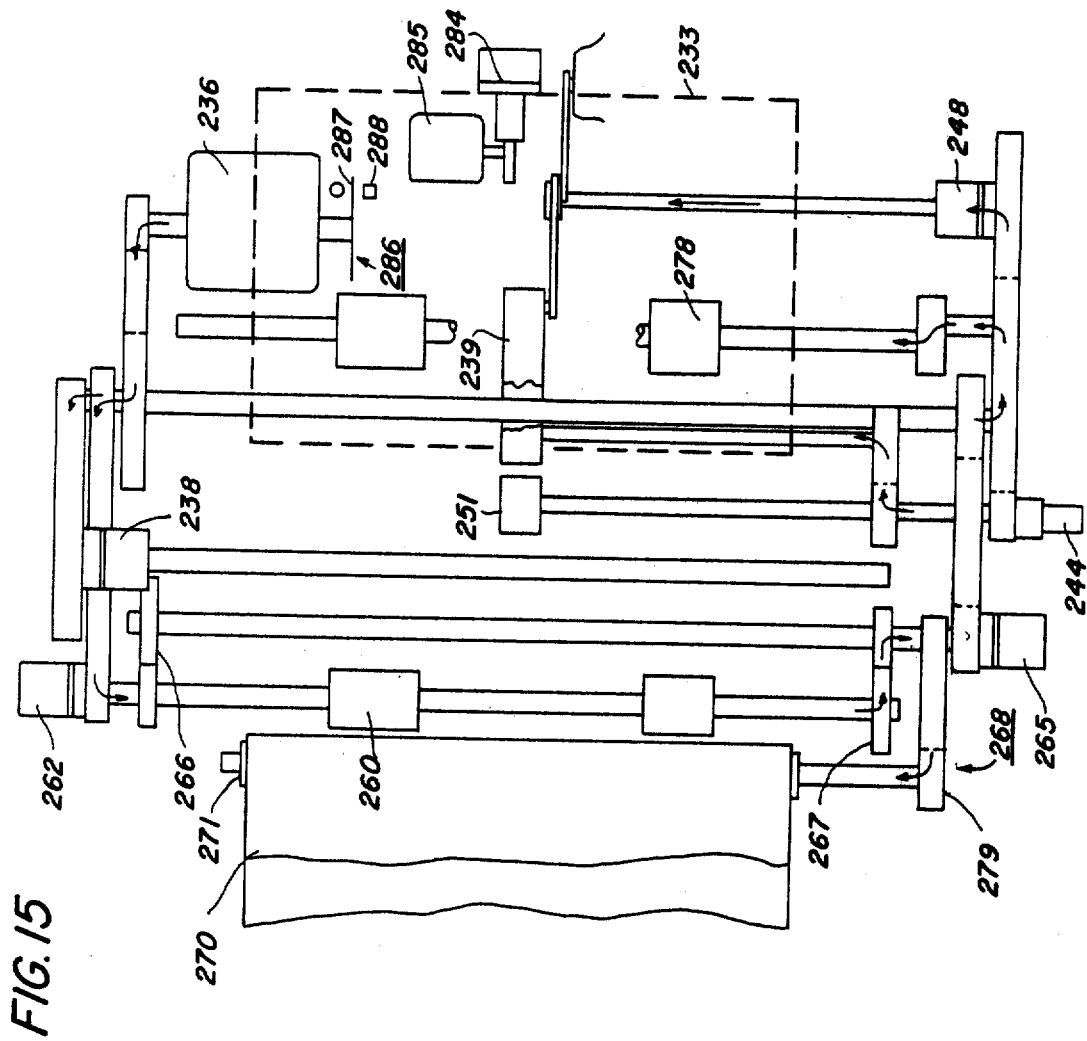
FIG. 15 is a view showing details of the drive mechanism for the document handler shown in FIG. 14.

Referring particulary to FIGS. 14 and 15, document handler 16 includes a tray 233 into which originals or documents 2 to be copied are placed by the operator following which a cover (not shown) is closed. A movable bail or separator 235, driven in an oscillatory path from motor 236 through a solenoid operated one revolution clutch 238, is provided to maintain document separation.

A document feed belt 239 is supported on drive and idler rolls 240, 241 and kicker roll 242 under tray 233, tray 233 being suitably apertured to permit the belt surface to project therewithin. Feedbelt 239 is driven by motor 236 through electromagnetic clutch 244. Guide 245, disposed near the discharge end of feed belt 239, cooperates with belt 239 to form a nip between which the documents pass.

A photoelectric type sensor 246 is disposed adjacent the discharge end of belt 239. Sensor 246 responds on failure of a document to feed within a predetermined interval to actuate solenoid operated clutch 248 which raises kicker roll 242 and increases the surface area of feed belt 239 in contact with the documents. Another sensor 259 located underneath tray 233 provides an output signal when the last document 2 of each set has left the tray 233.

Document guides 250 route the document fed from tray 233 via roll pair 251, 252 to platen 35. Roll 251 is drivingly coupled to motor 236 through electomanetic clutch 244. Contact of roll 251 with roll 252 turns roll 252.

Roll pair 260, 261 at the entrance to platen 35 advance the document onto platen 35, roll 260 being driven through electromagnetic clutch 262 in the forward direction. Contact of roll 260 with roll 261 turns roll 261 in the document feeding direction. Roll 260 is selectively coupled through gearset 268 with motor 236 through electromagnetic clutch 265 so that on engagement of clutch 265 and disengagement of clutch 262, roll 260 and roll 261 therewith turn in the reverse direction to carry the document back to tray 233 via return chute 276. One way clutches 266, 267 permit free wheeling of the roll drive shafts.

The document leaving roll pair 260, 261 is carried by platen feed belt 270 onto platen 35, belt 270 being comprised of a suitable flexible material having an exterior surface xerographic white. Belt 270 is carried about drive and idler rolls 271, 272. Roll 271 is drivingly coupled to motor 236 for rotation in either a forward or reverse direction through clutches 262, 265. Engagement of clutch 262 operates through belt and pulley drive 279 to drive belt in the forward direction, engagement of clutch 265 operates through drive 279 to drive belt 270 in the reverse direction.

To locate the document in predetermined position on platen 35, a register 273 is provided at the platen inlet for engagement with the document trailing edge. For this purpose, control of platen belt 270 is such that following transporting of the document onto plate 35 and beyond register 273, belt 270 is reversed to carry the document backwards against register 273.

To remove the document from platen 35 following copying, register 273 is retracted to an inoperative position. Solenoid 274 is provided for moving register 273.

A document deflector 275, is provided to route the document leaving platen 35 into return chute 276. For this purpose, platen belt 270 and pinch roll pair 260, 261 are reversed through engagement of clutch 265. Discharge roll pair 278, driven by motor 236, carry the returning document into tray 233.

To monitor movement of the documents in document handler 16 and detect jams and other malfunctions, photoelectric type sensors 246 and 280, 281 and 282 are disposed along the document routes.

To align documents 2 returned to tray 233, a document patter 284 is provided adjacent one end of tray 233. Patter 284 is oscillated by motor 285.

TIMING

To provide the requisite operational synchronization between host machine 10 and controller 18 as will appear, processor or machine clock 202 is provided. Referring particularly to FIG. 1, clock 202 comprises a toothed disc 203 drivingly supported on the output shaft of main drive motor 34. A photoelectric type signal generator 204 is disposed astride the path followed by the toothed rim of disc 203, generator 204 producing, whenever drive motor 34 is energized, a pulse like signal output at a frequency correlated with the speed of motor 34, and the machine components driven therefrom.

As described, a second machine clock, termed a pitch reset clock 138 herein, and comprising timing switch 146 is provided. Switch 146 cooperates with sheet register fingers 141 to generate an output pulse once each revolution of fingers 141. As will appear, the pulse like output of the pitch reset clock is used to reset or resynchronize controller 18 with host machine 10.

Figure 17:
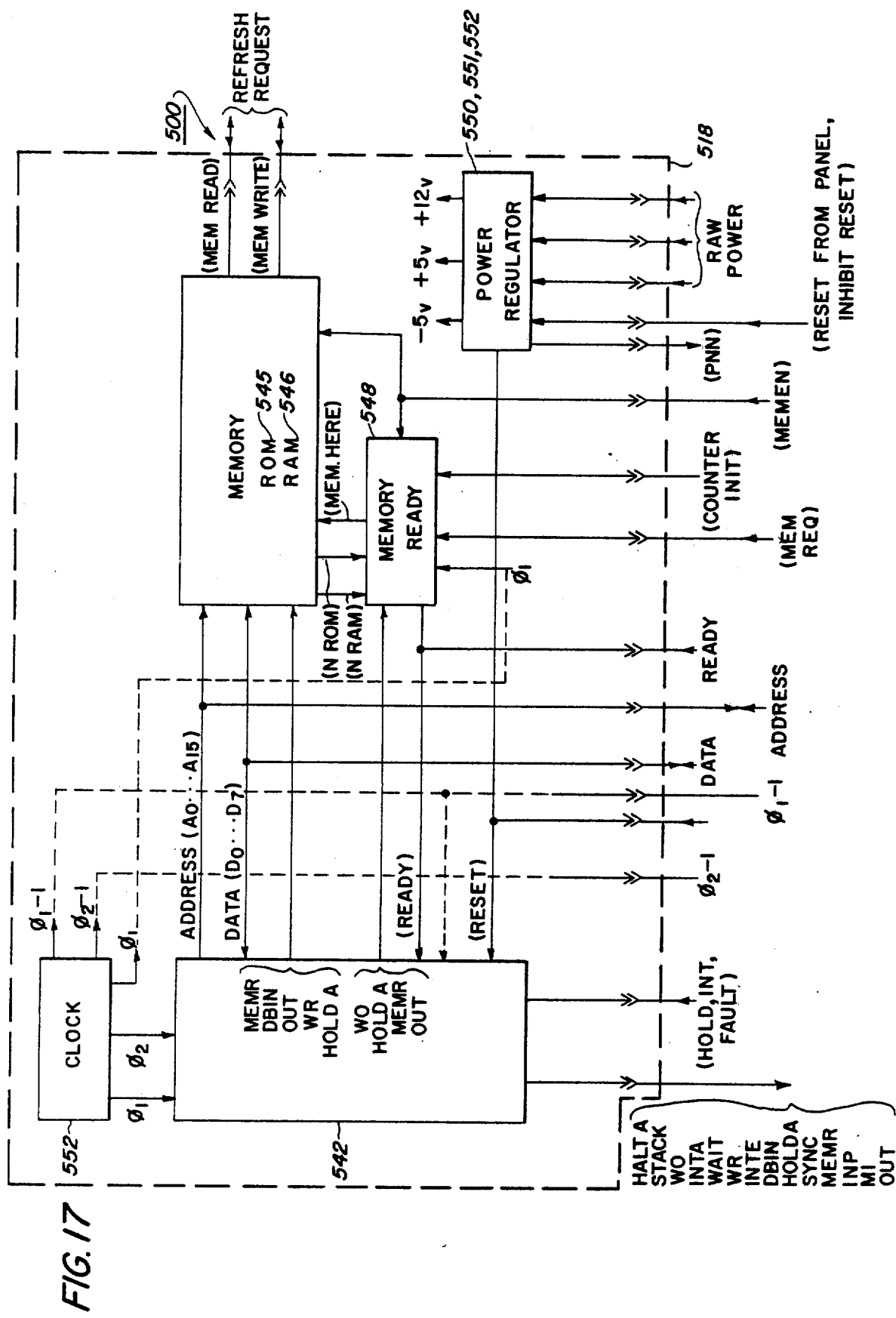
FIG. 17 is a block diagram of the controller CPU.

Referring to FIG. 15, a document handler clock 286 consisting of apertured disc 287 on the output shaft of document handler drive motor 236 and cooperating photoelectric type signal generator 288 is provided. As in the case of machine clock 202, document handler clock 286 produces an output pulse train from which components of the document handler may be synchronized. A real time clock such as clock 552 of FIG. 17, is utilized to control internal operations of the controller 18 as is known in the art.

CONTROLLER

Figure 16:
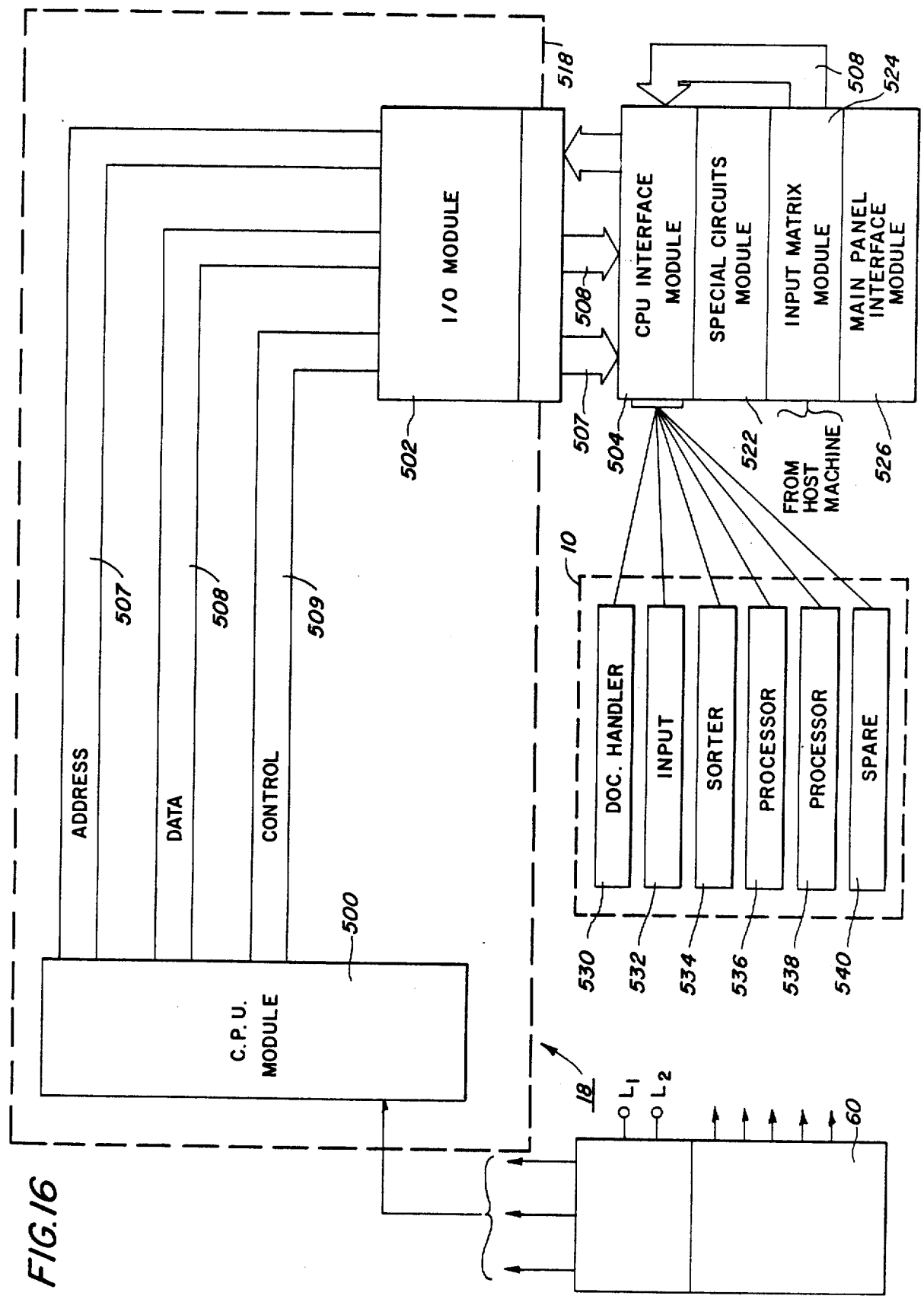
FIG. 16 is a block diagram of the controller for the apparatus shown in FIG. 1.

Referring to FIG. 16, controller 18 includes a Central Processor Unit (CPU) Module 500, Input/Output (I/O) Module 502, and interface 504. Address, Data and Control Buses 507, 508, 509 respectively operatively couple CPU Module 500 and I/O Module 502. CPU Module 500 I/O Module 502 are disposed within a shield 518 to prevent noise interference.

Interface 504 couples I/O Module 502 with special circuits module 522, input matrix module 524, and main panel interface module 526. Module 504 also couples I.O Module 502 to operating sections of the machine, namely, document handler section 530, input section 532, sorter section 534 and processor sections 536, 538. A spare section 540, which may be used for monitoring operation of the host machine, or which may be later utilized to control other devices, is provided.

Referring to FIGS. 17, 18, CPU module 500 comprises a processor 542 such as an Intel 8080 microprocessor manufactured by Intel Corporation, Santa Clara, Cal. 16K Read Only Memory (herein ROM) and 2K Random Access Memory (herein RAM) sections 545, 546, Memory Ready section 548, power regulator section 550, and onboard clock 552. Bipolar tri-state buffers 510, 511 in Address and Data buses 507, 508 disable the bus on a Direct Memory access (DMA) signal (HOLDA) as will appear. While the capacity of memory sections 545, 546 are indicated throughout as being 16K and 2K respectively, other memory sizes may be readily contemplated.

Figure 19A:
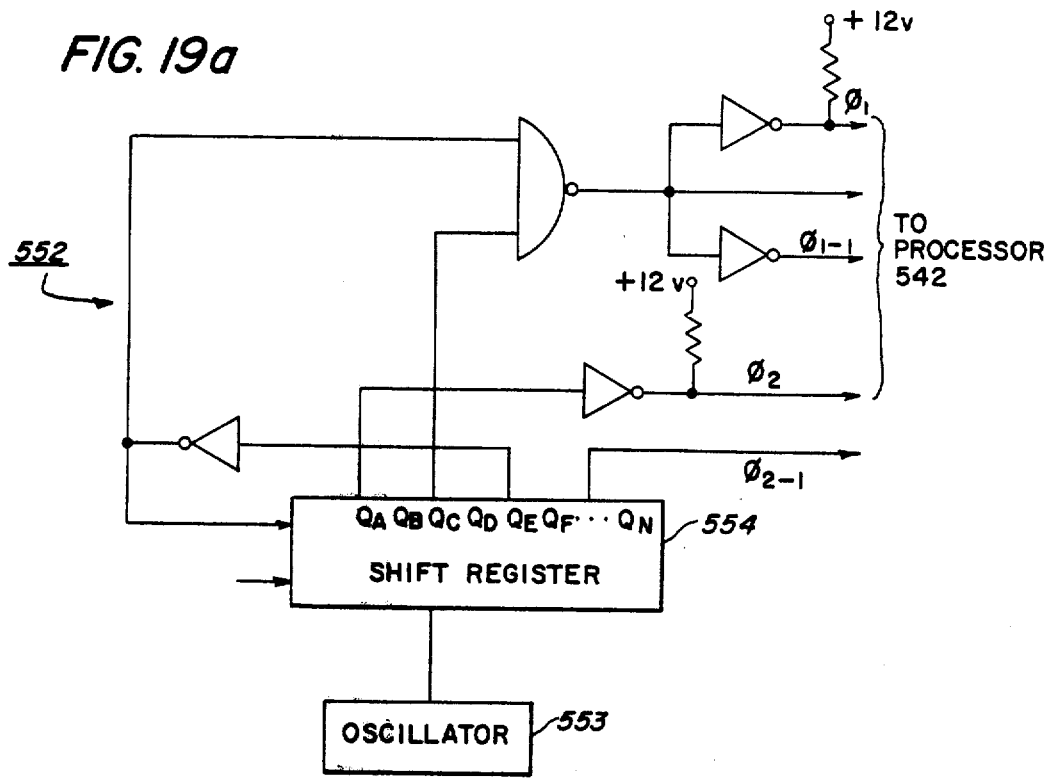
FIG. 19a is a logic schematic of the CPU clock.
Figure 19B:
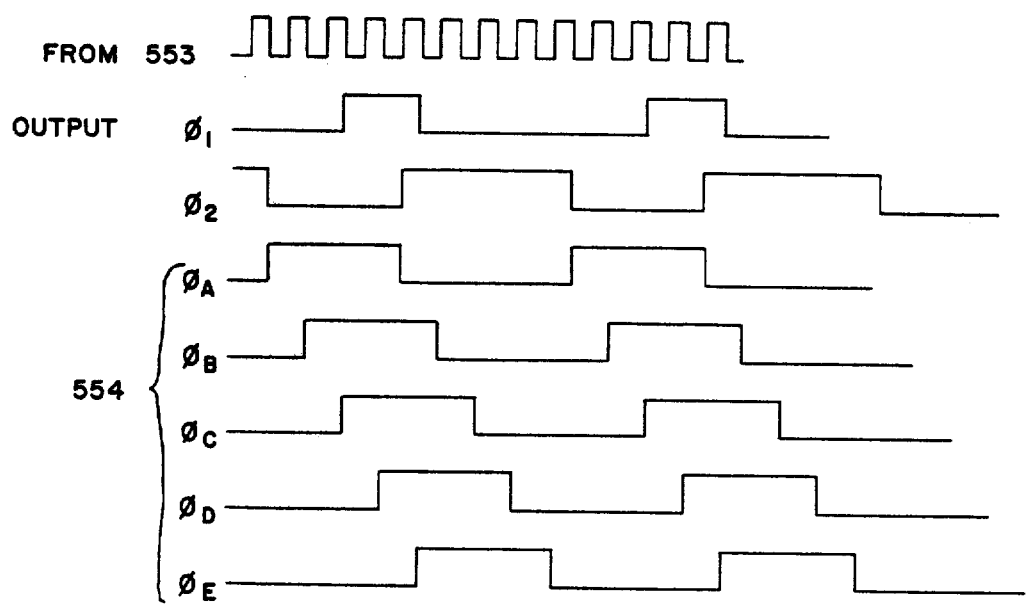

Referring particularly to FIG. 19, clock 552 comprises a suitable clock oscillator 553 feeding a multi-bite (Qa-Qn) shift register 554. Register 554 includes an internal feedback path from one bit to the serial input of register 554. Output signal waveforms $\phi_1$, $\phi_2$, $\phi_{1-1}$ and $\phi_{2-1}$ are produced for use by the system.

Figure 20:
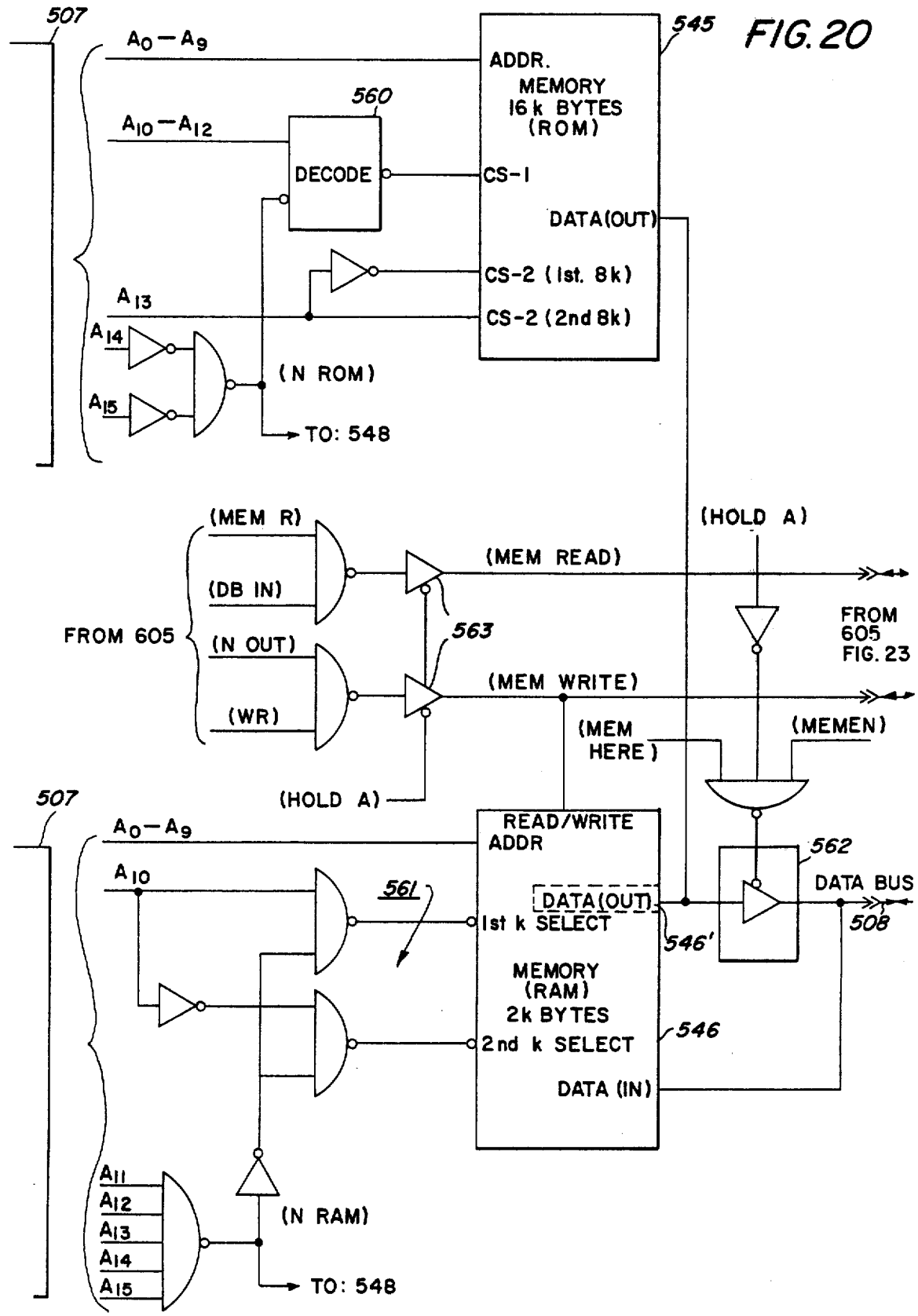
FIG. 20 is a logic schematic of the CPU memory.

Referring to FIG. 20, the memory bytes in ROM sections 545 are implemented by address signals (A0–A15) from processor 542, selection being effected by 3 to 8 decode chip 560 controlling chip select 1 (CS-1) and a 1 bit selection (A13) controlling chip select 2(CS-2). The most significant address bits (A14, A15) select the first 16K of the total 64 bytes of the addressing space. The memory bytes in RAM section 546 are implemented by Address signals (A0–A15) through selector circuit 561. Address bit A 10 serves to select the memory bank while the remaining five most significant bits (A11–A15) select the last 2K bytes out of the 64K bytes of addressing space. RAM memory section 546 includes a 40 bit output buffer the output of which is tied together with the output from ROM memory section 545 and goes to tri-state buffer 562 to drive Data bus 508. Buffer 562 is enabled when either memory section 545 or 546 is being addressed and either a (MEM READ) or DMA (HOLD A) memory request exists. An enabling signal (MEMEN) is provided from the machine control or service panel (not shown) which is used to permit disabling of buffer 562 during servicing of CPU Module 500. Write control comes from either processor 542 (MEM WRITE) or from DMA (HOLD A) control. Tri-state buffers 563 permit Refresh Control 605 of I/O Module 502 to access MEM READ and MEM WRITE control channels directly on a DMA signal (HOLD A) from processor 542 as will appear.

Figure 21:
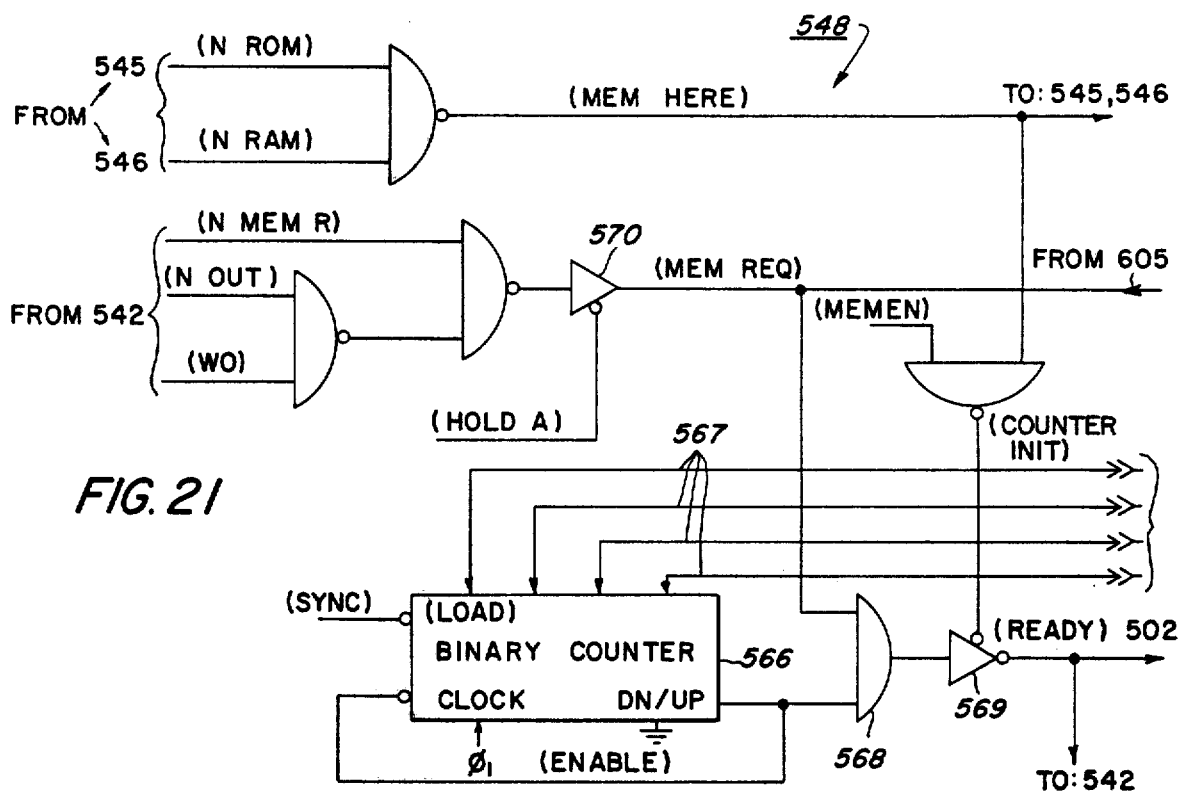
FIG. 21 is a logic schematic of the CPU memory ready.

Referring to FIG. 21, memory ready section 548 provides a READY signal to processor 542. A binary counter 566, which is initialized by a SYNC signal ($\phi$,) to a prewired count as determined by input circuitry 567, counts up at a predetermined rate. At the maximum count, the output at gate 568 comes true stopping the counter 566. If the cycle is a memory request (MEM REQ) and the memory location is on board as determined by the signal (MEM HERE) to tri-state buffer 569, a READY signal is sent to processor 542. Tri-state buffer 570 in MEM REQ line permits Refresh Control 605 of I/O Module 502 to access the MEM REQ channel directly on a DMA signal (Hold A) from processor 542 as will appear.

Figure 22A:
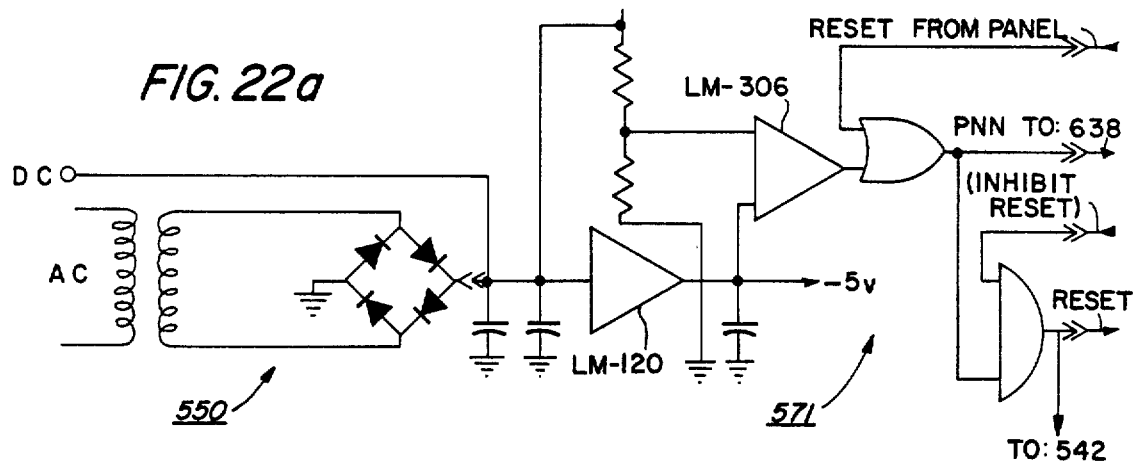
FIGS. 22a, 22b, 22c are logic schematics of the CPU power supply stages.
Figure 22B:
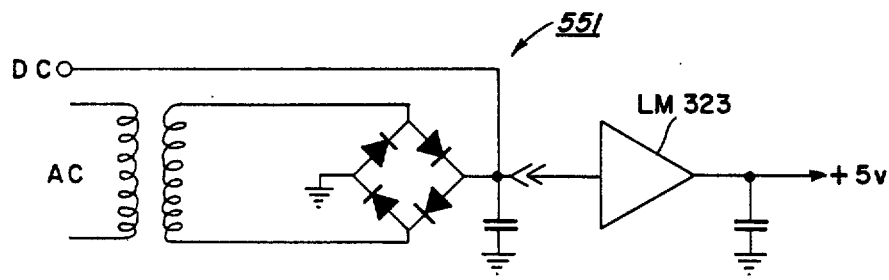
Figure 22C:
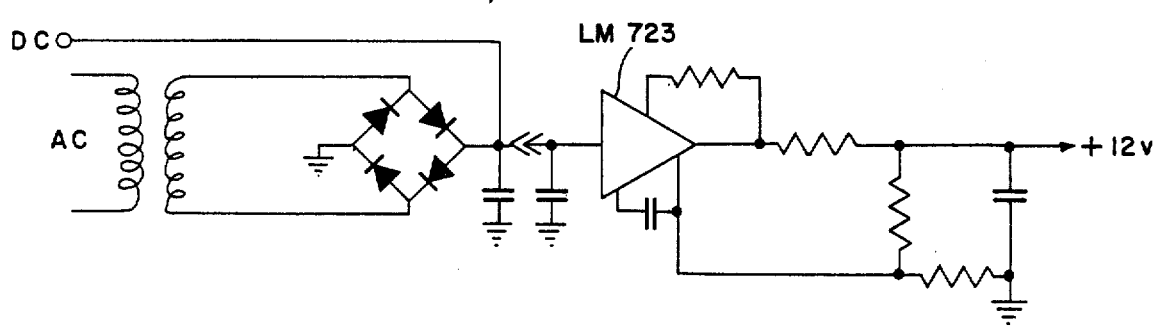

Referring to FIG. 22, power regulators 550, 551, 552 provide the various voltage levels, i.e., +5 v, +12 v, and −5 v D.C. required by the module 500. Each of the three on board regulators 550, 551, 552 employ filtered D.C. inputs. Power Not Normal (PNN) detection circuitry 571 is provided to reset processor 542 during the power up time. Panel reset is also provided via PNN. An enabling signal (INHIBIT RESET) allows completion of a write cycle in Non Volatile (N.V.) Memory 610 of I/O Module 502.

Figure 18A:
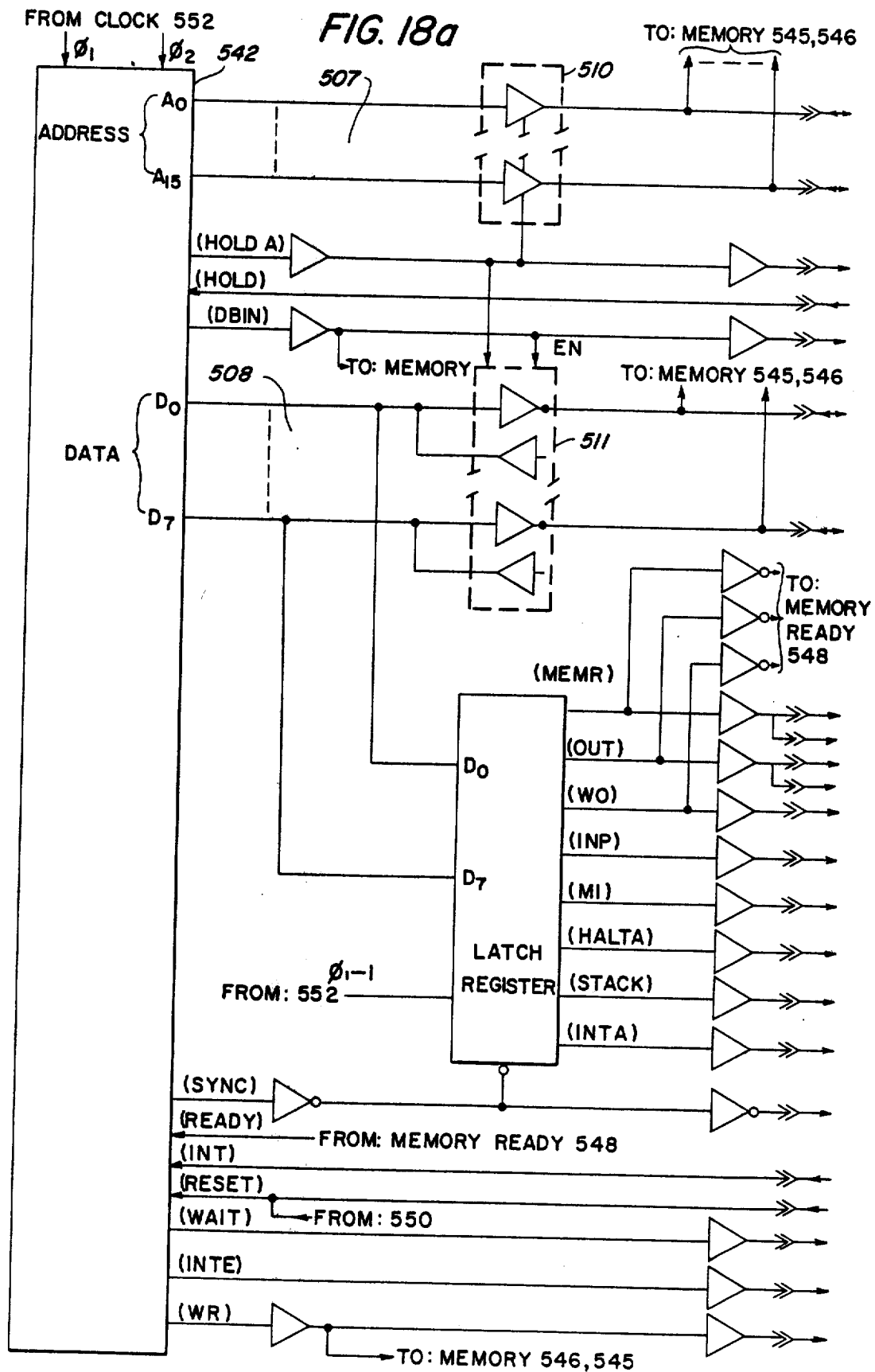
FIG. 18a is a block diagram showing the CPU microprocessor input/output connections.
Figure 23B:
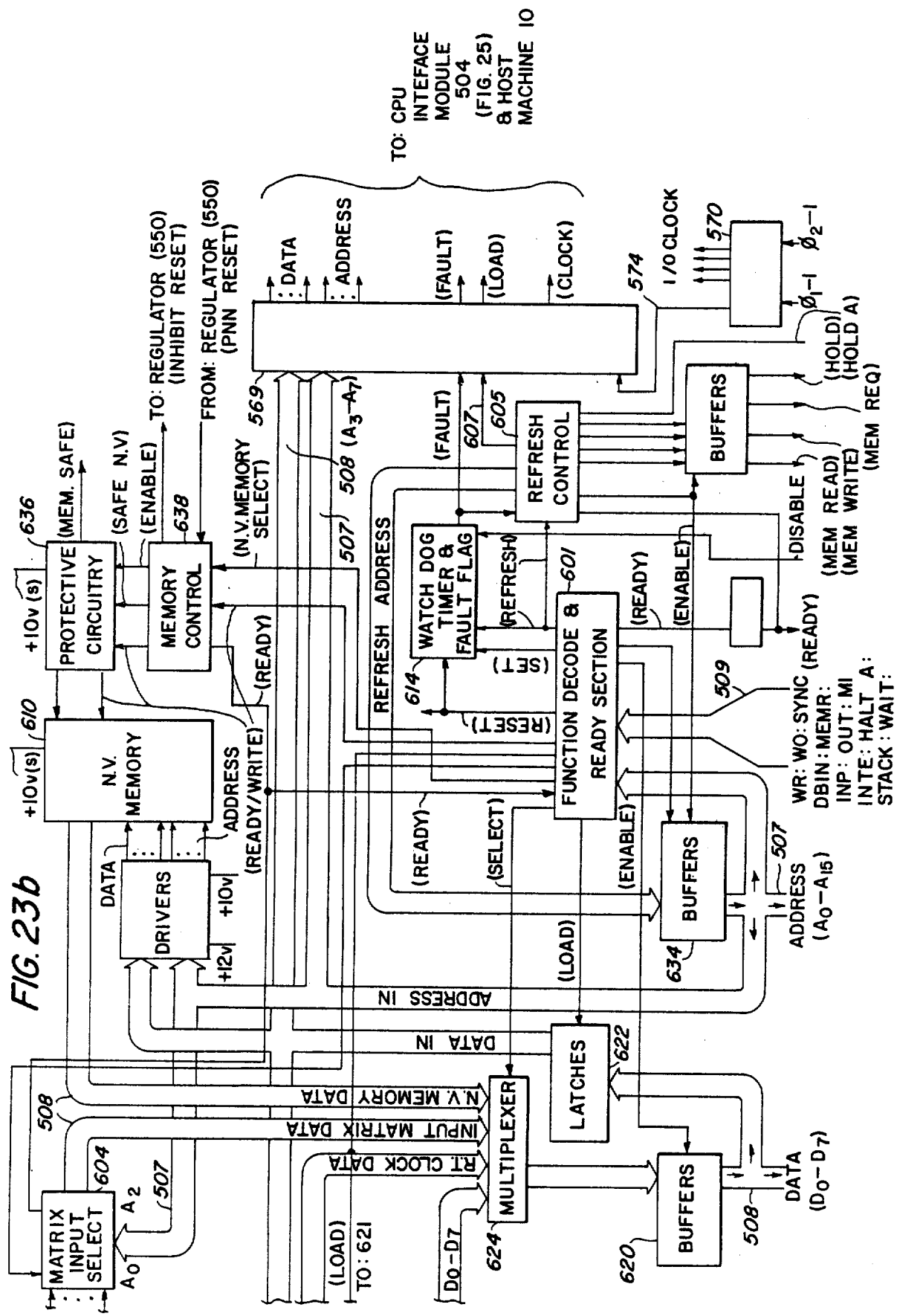

Referring to FIGS. 18, 20, 21, and the DMA timing chart (FIG. 18a) data transfer from RAM section 546 to host machine 10 is effected through Direct Memory Access (DMA), as will appear. To initiate DMA, a signal (HOLD) is generated by Refresh Control 605 (FIG. 23a). On acceptance, processor 542 generates a signal HOLD ACKNOWLEDGE (HOLD A) which works through tri-state buffers 510, 511 and through buffers 563 and 570 to release Address bus 507, Data bus 508 and MEM READ, MEM WRITE, and MEM REQ channels (FIGS. 20, 21) to Refresh Control 605 of I/O Module 502.

Referring to FIG. 23, I/O Module 502 interfaces with CPU module 500 through bi-directional Address, Data and Control buses 507, 508, 509. I/O Module 502 appears to CPU module 500 as a memory portion. Data transfers between CPU and I/O modules 500, 502, and commands to I/O module 502 except for output refresh are controlled by memory reference instructions executed by CPU module 500. Output refresh which is initiated by one of several uniquely decoded memory reference commands, enables Direct Memory access (DMA) by I/O module 502 to RAM section 546.

I/O module 502 includes Matrix Input select 604 (through which inputs from the host machine 10, are received), Refresh Control 605, Nonvolatile (NV) memory 610, Interrupt Control 612, Watch dog Timer and failure Flag 614 and clock 570.

A Function Decode Section 601 receives and interprets commands from CPU section 500 by decoding information on address bus 507 along with conrol signals from processor 542 on control bus 509. On command, decode section 601 generates control signals to perform the function indicated. These functions include (a) controlling tri-state buffers 620 to establish the direction of data flow in Data bus 508; (b) strobing data from Data bus 508 into buffer latches 622; (c) controlling multiplexer 624 to put data from Interrupt Control 612, Real Time clock register 621, Matrix Input Select 604 or N.V. memory 610 onto data bus 508; (d) actuating refresh control 605 to initiate a DMA operation; (e) actuating buffers 634 to enable address bits A0–A7 to be sent to the host machine 10 for input matrix read operations; (f) commanding operation of Matrix Input Select 604; (g) initiating read or write operation of N.V. memory 610 through Memory Contol 638; (h) loading Real Time clock register 621 from data bus 508; and (i) resetting the Watch Dog timer or setting the Fault Failure flag 614. In addition, section 601 includes logic to control and synchronize the READY control line to CPU module 500, the READY line being used to advise module 500 when data placed on the Data bus by I/O module 502 is valid.

Watch dog timer and failure flag 614, which serves to detect certain hardwired and software malfunctions, comprises a free running counter which under normal circumstances is periodically reset by an output refresh command (REFRESH) from Function Decode Section 601. If an output refresh command is not received within a preset time interval (i.e. 25 m sec) a fault flip flop is set and a signal (FAULT) sent to the host machine 10. The signal (FAULT) also raises the HOLD line to disable CPU Module 500. Clearing of the fault flip flop may be by cycling power or generating a signal (RESET). A selector (not shown) may be provided to disable (DISABLE) the watch dog timer when desired. The fault flip flop may also be set by a command from the CPU Module to indicate that the operating program detected a fault.

Matrix input select 604 has capacity to read up to 32 groups of 8 discrete inputs from host machine 10. Lines $A_3$ through $A_7$ of Address bus 507 are routed to host machine 10 via CPU interface Module 504 to select the desired group of 8 inputs. The selected inputs from machine 10 are received via Input Matrix Module 524 (FIG. 28) and are placed by matrix 604 onto data bus 508 and sent to CPU Module 500 via multiplexer 624. Bit selection is effected by lines $A_0$ through $A_2$ of Address bus 507.

Output refresh control 605, when initiated, transfers either 16 or 32 sequential words from RAM memory output buffer 546' to host machine 10 at the predetermined clock rate in line 574. Direct Memory access (DMA) is used to facilitate transfer of the data at a relatively high rate. On a Refresh signal from Function Decode Section 601, Refresh Control 605 generates a HOLD signal to processor 542. On acknowledgement (HOLD A) processor 542 enters a hold condition. In this mode, CPU Module 500 releases address and data buses 507, 508 to the high impedance state giving I/O module 502 control thereover. I/O module 502 then sequentially accesses the 32 memory words from output buffer 546' (REFRESH ADDRESS) and transfers the contents to the host machine 10. CPU Module 500 is dormant during this period.

A control signal (LOAD) in line 607 along with the predetermined clock rate determined by the clock signal (CLOCK) in line 574 is utilized to generate eight 32 bit serial words which are transmitted serially via CPU Interface Module 504 to the host machine remote locations where serial to parallel transformation is performed. Alternatively, the data may be stored in addressable latches and distributed in parallel directly to the required destinations.

Figure 24:
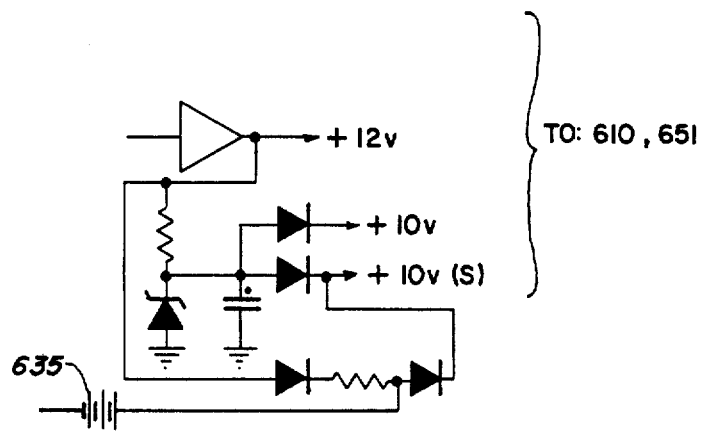
FIG. 24 is a logic schematic of the nonvolatile memory power supply.

N.V. memory 610 comprises a predetermined number of bits of nonvolatile memory stored in I/O module 502 under Memory Control 638. N.V. memory 610 appears to CPU module 500 as part of the CPU module memory complement and therefore may be accessed by the standard CPU memory reference instruction set. Referring particularly to FIG. 24, to sustain the contents of N.V. memory 610 should system power be interrupted, one or more rechargeable batteries 635 are provided exterior to I/O module 502. CMOS protective circuitry 636 couples batteries 635 to memory 610 to preserve memory 610 on a failure of the system power. A logic signal (INHIBIT RESET) prevents the CPU Module 500 from being reset during the N.V. memory write cycle interval so that any write operation in progress will be completed before the system is shut down.

For tasks that require frequent servicing, high speed response to external events, or synchronization with the operation of host machine 10, a multiple interrupt system is provided. These comprise machine based interrupts, herein referred to as Pitch Reset interrupt and the Machine interrupt, as well as a third clock driven interrupt, the Real Time Interrupt.

Referring particularly to FIGS. 23(a) and 34, the highest priority interrupt signal, Pitch reset signal 640, is generated by the signal output of pitch reset clock 138. The clock signal is fed via optical isolator 645 and digital filter 646 to edge trigger flip flop 647.

The second highest priority interrupt signal, machine clock signal 641, is sent directly from machine clock 202 through isolation transformer 648 to a phase locked loop 649. Loop 649, which serves as bandpath filter and signal conditioner, sends a square wave signal to edge trigger flip flop 651. The second signal output (LOCK) serves to indicate whether loop 649 is locked onto a valid signal input or not.

The lowest priority interrupt signal, Real Time Clock signal 643, is generated by register 621. Register 621 which is loaded and stored by memory reference instructions from CPU module 500 is decremented by a clock signal in line 643 which may be derived from I/O Module clock 570. On the register count reaching zero, register 621 sends an interrupt signal to edge trigger flip flop 656. A spare interrupt 642 is also provided.

Setting of one or more of the edge trigger flip flops 647, 651, 654, 656 by the interrupt signals 640, 641, 642, 643 generates a signal (INT) via priority chip 659 to processor 542 of CPU Module 500. On acknowledgement, processor 542, issues a signal (INTA) transferring the status of the edge flip flops 647, 651, 654, 656 to a four bit latch 660 to generate an interrupt instruction code (RESTART) onto the data bus 508.

Each interrupt is assigned a unique RESTART instruction code. Should an interrupt of higher priority be triggered, a new interrupt signal (INT) and RESTART instruction code are generated resulting in a nesting of interrupt software routines whenever the interrupt recognition circuitry is enabled within the CPU 500. Priority chip 659 serves to establish a handling priority in the event of simultaneous interrupt signals in accordance with the priority schedule described.

Once triggered, the edge trigger flip flop 647, 651, 654 or 656 must be reset in order to capture the next occurrence of the interrupt associated therewith. Each interrupt subroutine serves, in addition to performing the functions programmed, to reset the flip flops (through the writing of a coded byte in a uniquely selected address) and to re-enable the interrupt (through execution of a re-enabling instruction). Until re-enabled, initiation of a second interrupt is precluded while the first interrupt is in progress.

Lines 658 permit interrupt status to be interrogated by CPU module 500 on a memory reference instruction.

I/O Module 502 includes a suitable pulse generator or clock 570 for generating the various timing signals required by module 502. Clock 570 is driven by the pulse-like output $\phi_{1-1}, \phi_{2-1}$ of processor clock 552 (FIG. 19a). As described, clock 570 provides a reference clock pulse (in line 574) for synchronizing the output refresh data and is the source of clock pulses (in line 643) for driving Real Time register 621.

Figure 26:
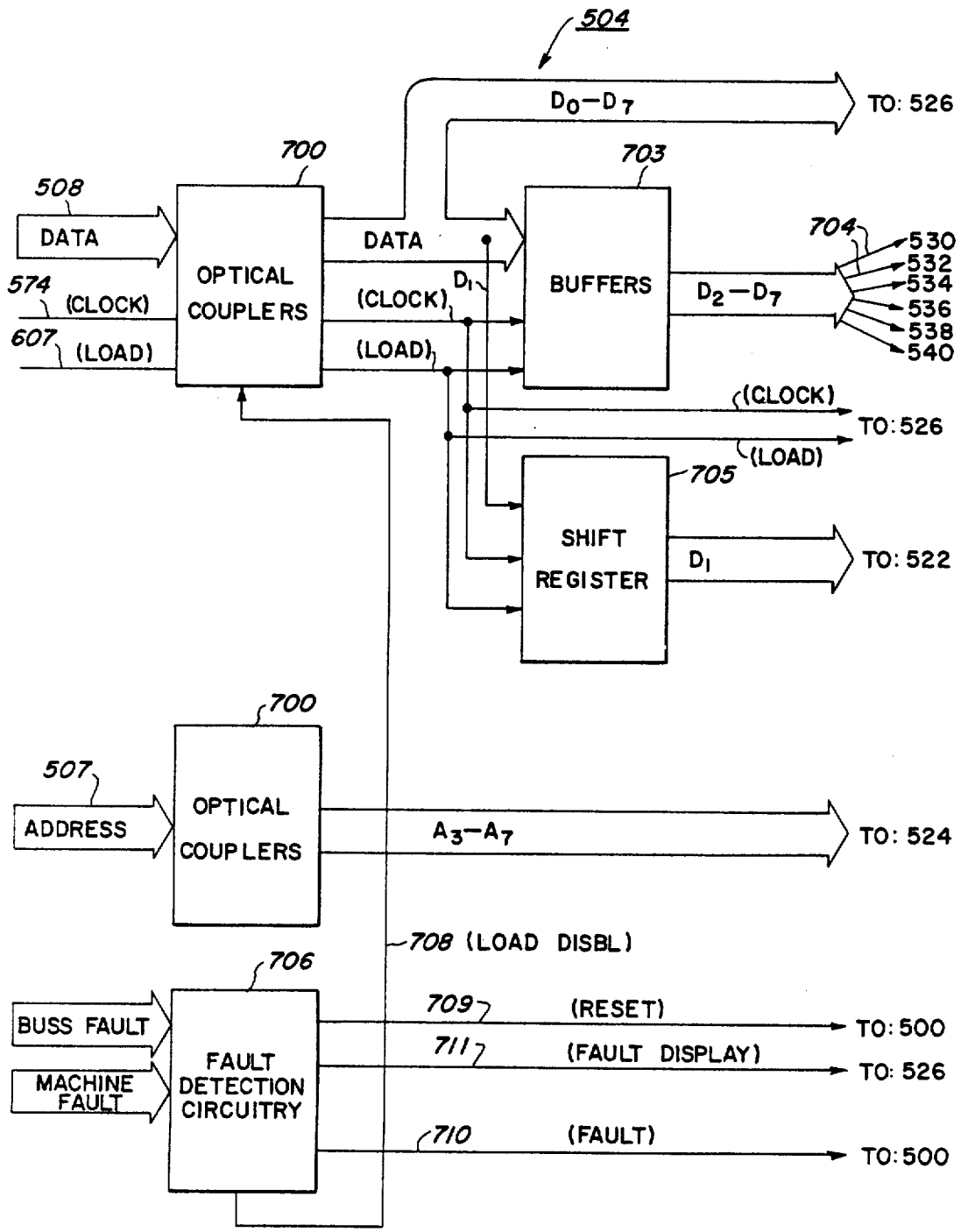
FIG. 26 is a block diagram of the CPU interface module.

CPU interface module 504 interfaces I/O module 502 with the host machine 10 and transmits operating data stored in RAM section 546 to the machine. Referring particularly to FIG. 25 and 26, data and address information are inputted to module 504 through suitable means such as optical type couplers 700 which convert the information to single ended logic levels. Data in bus 508 on a signal from Refresh Control 605 in line 607 (LOAD), is clocked into module 546 at the reference clock rate in line 574 parallel by bit, serial by byte for a preset byte length, with each data bit of each successive byte being clocked into a separate data channel D0–D7. As best seen in FIG. 25, each data channel D0–D7 has an assigned output function with data channel D0 being used for operating the front panel lamps 830 in the digital display, (see FIG. 32), data channel D1 for special circuits module 522, and remaining data channels D2–D7 allocated to the host machine operating sections 530, 532, 534, 536, 538 and 540. Portions of data channels D1–D7 have bits reserved for front panel lamps and digital display.

Since the bit capacity of the data channels D2–D7 is limited, a bit buffer 703 is preferably provided to catch any bit overflow in data channels D2–D7

Inasmuch as the machine output sections 530, 532, 534, 536, 538 and 540 are electrically a long distance away, i.e. remote, from CPU interface module 504, and the environment is electrically "noisy", the data stream in channels D2–D7 is transmitted to remote sections 530, 532, 534, 536, 538 and 540 via a shielded twisted pair 704. By this arrangement, induced noise appears as a differential input to both lines and is rejected. The associated clock signal for the data is also transmitted over line 704 with the line shielded carrying the return signal currents for both data and clock signals.

Data in channel $D_1$ destined for special circuits module 522 is inputted to shift register type storage circuitry 705 for transmittal to module 522. Data is also inputted to main panel interface module 526. Address information in bus 507 is converted to single ended output by couplers 700 and transmitted to Input Matrix Module 524 to address host machine inputs.

CPU interface module 504 includes fault detector circuitry 706 for monitoring both faults occurring in host machine 10 and faults or failures along the buses, the latter normally comprising a low voltage level or failure in one of the system power lines. Machine faults may comprise a fault in CPU module 500, a belt mistrack signal from sensor 27 (see FIG. 2), opening one of the machine doors or covers as reponded to by conventional cover interlock sensors (not shown), a fuser over temperature as detected by sensor 175, etc. In the event of a bus fault, a reset signal (RESET) is generated automatically in line 709 in CPU module 500 (see FIGS. 17 and 18) until the fault is removed. In the event of a machine fault, a signal is generated by the CPU in line 710 to actuate a suitable relay (not shown) controlling power to all or a portion of host machine 10. A load disabling signal (LOAD DISBL) is inputted to optical couplers 700 via line 708 in the event of a fault in CPU module 500 to terminate input of data to host machine 10. Other fault conditions are monitored by the software background program. In the event of a fault, a signal is generated in line 711 to the digital display on control console 800 (via main panel interface module 526) signifying a fault.

Figure 27:
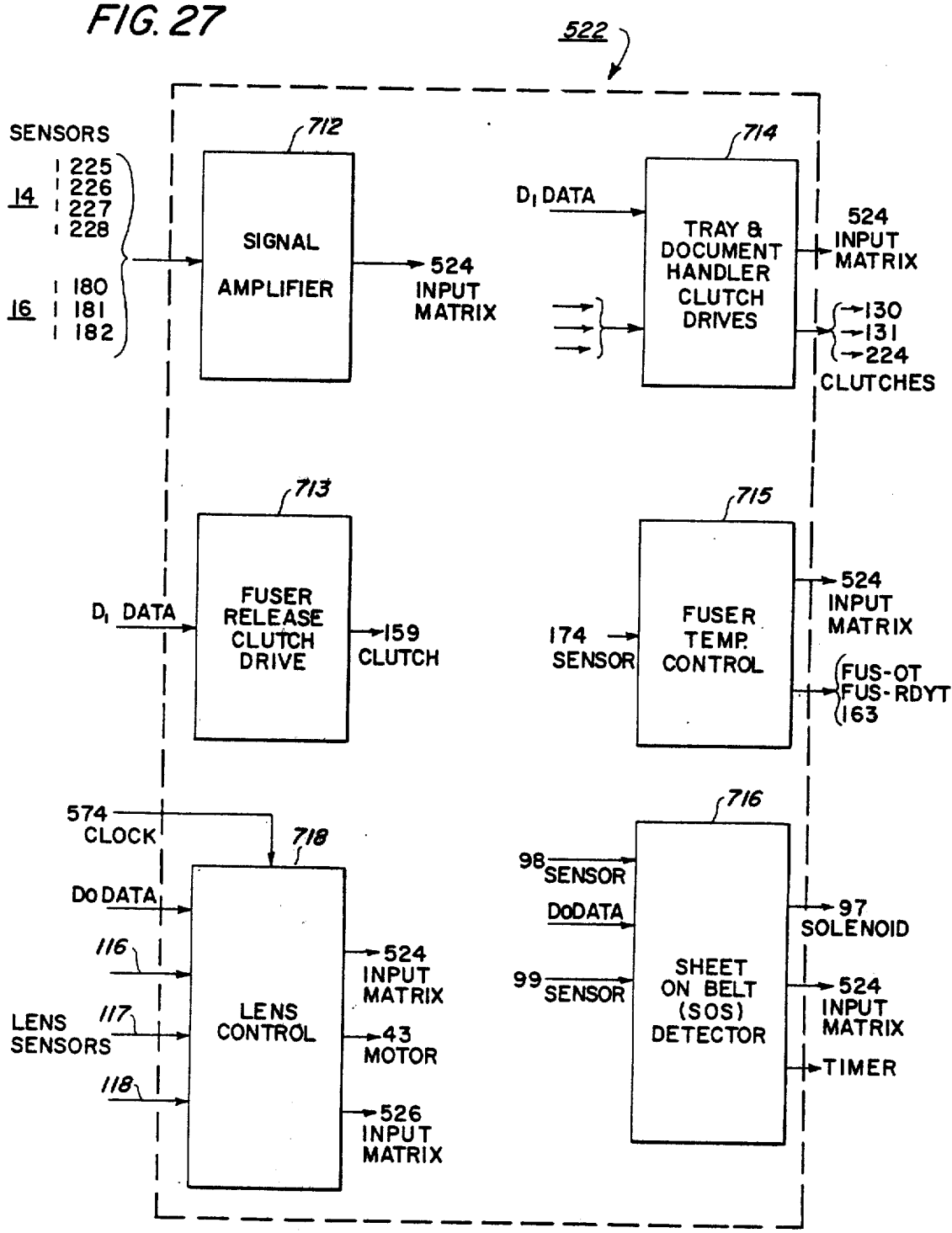
FIG. 27 is a block diagram of the apparatus special circuits module.

Referring particularly to FIGS. 25 and 27, special circuits module 522 comprises a collection of relatively independent circuits for either monitoring operation of and/or driving various elements of host machine 10. Module 522 incorporates suitable circuitry 712 for amplifying the output of sensors 225, 226, 227, 228 and 280, 281, 282 of sorter 14 and document handler 16 respectively; circuitry 713 for operating fuser release clutch 159; and circuitry 714 for operating main and auxiliary paper tray feed roll clutches 130, 131 and document handler feed clutch 244.

Additionally, fuser detection circuitry 715 monitors temperature conditions of fuser 150 as responded to by sensor 174. On overheating of fuser 150, a signal (FUS-OT) is generated to turn heater 163 off, actuate clutch 159 to separate fusing and pressure rolls 160, 161; trigger trap solenoid 158 to prevent entrance of the next copy sheet into fuser 150, and initiate a shutdown of host machine 10. Circuitry 715 also cycles fuser heater 163 to maintain fuser 150 at proper operating temperatures and signals (FUS-RDUT) host machine 10 when fuser 150 is ready for operation.

Circuitry 716 provides closed loop control over sensor 98 which responds to the presence of a copy sheet 3 on belt 20. On a signal from sensor 98, solenoid 97 is triggered to bring deflector 96 into intercepting position adjacent belt 20. At the same time, a backup timer (not shown) is actuated. If the sheet is lifted from the belt 20 by deflector 96 within the time allotted, a signal from sensor 99 disables the timer and a misstrip type jam condition of host machine 10 is declared and the machine is stopped. If the signal from sensor 99 is not received within the allotted time, a sheet on selenium (SOS) type jam is declared and an immediate machine stop is effected.

Circuitry 718 controls the position (and hence the image reduction effected) by the various optical elements that comprise main lens 41 in response to the reduction mode selected by the operator and the signal inputs from lens position responsive sensors 116, 117, 118. The signal output of circuitry 718 serves to operate lens drive motor 43 as required to place the optical elements of lens 41 in proper position to effect the image reduction programmed by the operator.

Figure 28:
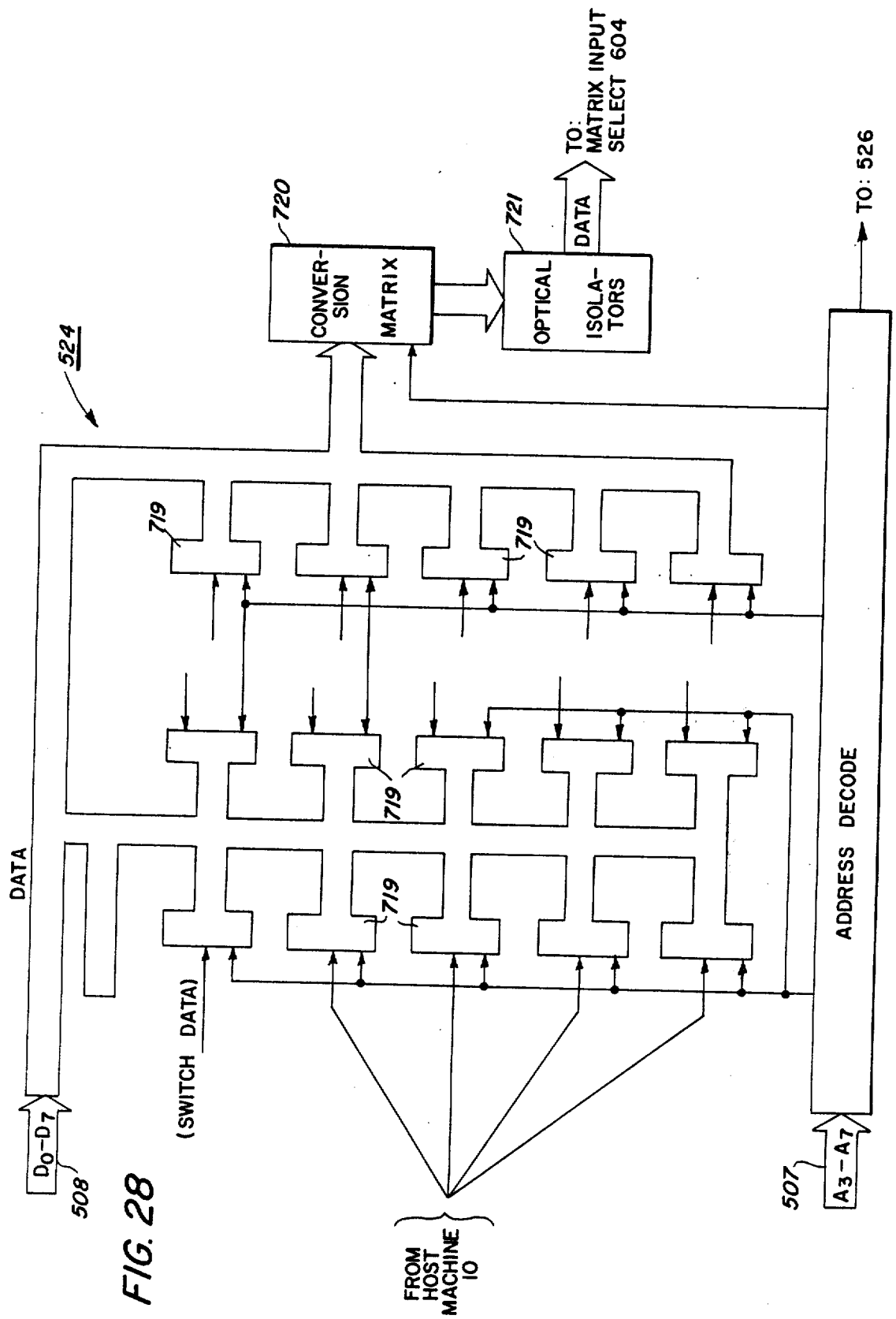
FIG. 28 is a block diagram of the main panel interface module.

Referring to FIG. 28, input matrix module 524 provides analog gates 719 for receiving data from the various host machine sensors and inputs (i.e. sheet sensors 135, 136; pressure sensor 157; etc), module 524 serving to convert the signal input to a byte oriented output for transmittal to I/O module 502 under control of Input Matrix Select 604. The byte output of module 524 is selected by address information inputted on bus 507 and decoded on module 524. Conversion matrix 720, which may comprise a diode array, converts the input logic signals of "0" to logic "1" true. Data from input matrix module 524 is transmitted via optical isolators 721 and Input Matrix Select 604 of I/O module 502 to CPU Module 500.

Referring particularly to FIG. 29, main panel interface module 526 serves as interface between CPU interface module 504 and operator control console 800 for display purposes and as interface between input matrix module 524 and the console switches. As described, data channels D0-D7 have data bits in each channel associated with the control console digital display or lamps. This data is clocked into buffer circuitry 723 and from there, for digital display, data in channels D1-D7 is inputted to multiplexer 724. Multiplexer 724 selectively multiplexes the data to HEX to 7 segment converter 725. Software controlled output drivers 726 are provided for each digit which enable the proper display digit in response to the data output of converter 725. This also provides blanking control for leading zero suppression or inter digit suppression.

Buffer circuitry 723 also enables through anode logic 728 the common digit anode drive. The signal (LOAD) to latch and lamp driver control circuit 729 regulates the length of the display cycle.

For console lamps 830, data in channel D0 is clocked to shift register 727 whose output is connected by drivers to the console lamps. Access by input matrix module 524 to the console switches and keyboard is through main panel interface module 526.

The machine output sections 530, 532, 534, 536, 538, 540 are interfaced with I/O module 502 by CPU interface module 504. At each interrupt/refresh cycle, data is outputted to sections 530, 532, 534, 536, 538, 540 at the clock signal rate in line 574 over data channels D2,D3,D4,D5,D6,D7 respectively.

Referring to FIG. 30, wherein a typical output section i.e. document handler section 530 is shown, data inputted to section 530 is stored in shift register/latch circuit combination 740, 741 pending output to the individual drivers 742 associated with each machine component. Preferably d.c. isolation between the output sections is maintained by the use of transformer coupled differential outputs and inputs for both data and clock signals and a shielded twisted conductor pair. Due to transformer coupling, the data must be restored to a d.c. waveform. For this purpose, control recovery circuitry 744, which may comprise an inverting/non-inverting digital comparator pair and output latch is provided.

The LOAD signal serves to lockout input of data to latches 741 while new data is being clocked into shift register 740. Removal of the LOAD signal enables commutation of the fresh data to latches 741. The LOAD signal also serves to start timer 745 which imposes a maximum time limit within which a refresh period (initiated by Refresh Control 605) must occur. If refresh does not occur within the prescribed time limit, 745 generates a signal (RESET) which sets shift register 740 to zero.

With the exception of sorter section 534 discussed below, output sections 532, 536, 538 and 540 are substantially identical to document handler section 530.

Referring to FIG. 31 wherein like numbers refer to like parts, to provide capacity for driving the sorter deflector solenoids 221, a decode matrix arrangement consisting of a Prom encoder 750 controlling a pair of decoders 751, 752 is provided. The output of decoders 751, 752 drive the sorter solenoids 221 of upper and lower bin arrays 210, 211 respectively. Data is inputted to encoder 750 by means of shift register 754.

Referring now to FIG. 32, control console 800 serves to enable the operator to program host machine 10 to perform the copy run or run desired. At the same time, various indicators on console 800 reflect the operational condition of machine 10. Console 800 includes a bezel housing 802 suitably supported on host machine 10 at a convenient point with decorative front or face panel 803 on which the various machine programming buttons and indicators appear. Programming buttons include power on/off buttons 804, start print (PRINT) buttons 805, stop print (STOP) button 806 and keyboard copy quantity selector 808. A series of feature select buttons consisting of auxiliary paper tray button 810, two sided copy button 811, copy lighter button 814, and copy darker button 815, are provided.

Additionally, image size selector buttons 818, 819, 820; multiple or single document select buttons 822, 823 for operation of document handler 16; and sorter sets or stacks buttons 825, 826 are provided. An on/off service selector 828 is also provided for activation during machine servicing.

Indicators comprise program display lamps 830 and displays such as READY, WAIT, SIDE 1, SIDE2, ADD PAPER, CHECK STATUS PANEL, PRESS FAULT CODE, QUANTITY COMPLETED, CHECK DOORS, UNLOAD AUX TRAY, CHECK DOCUMENT PATH, CHECK PAPER PATH, JOB INCOMPLETE and UNLOAD SORTER. Other display information may be envisioned.

MACHINE OPERATION

As will appear, host machine 10 is conveniently divided into a number of operational states. The machine control program is divided into background routines and Foreground routines with operational control normally residing in the Background routine or routines appropriate to the particular machine state then in effect. The output buffer 546' of RAM memory section 546 is used to transfer/refresh control data to the various remote locations in host machine 10, control data from both Background and Foreground routines being inputted to buffer 546' for subsequent transmittal to host machine 10. Transmittal/refresh of control data presently in output buffer 546' is effected through Direct Memory access (DMA) under the aegis of a Machine Clock interrupt routine.

Foreground routine control data which includes a Run Event Table built in response to the particular copy run or runs programmed, is transferred to output buffer 546' by means of a multiple prioritized interrupt system wherein the Background routine in process is temporarily interrupted while fresh Foreground routine control data is inputted to buffer 546' following which the interrupted Background routine is resumed.

The operating program for host machine 10 is divided into a collection of foreground tasks, some of which are driven by the several interrupt routines and background or non-interrupt routines. Foreground tasks are tasks that generally require frequent servicing, high speed response, or synchronization with the host machine 10. Background routines are related to the state of host machine 10, different background routines being performed with different machine states. A single background software control program (STCK) composed of specific sub-programs associated with the principal operating states of host machine 10 is provided. A byte called STATE contains a number indicative of the current operating state of host machine 10. The machine STATES are as follows:

| STATE NO. | MACHINE STATE | CONTROL SUBR. |
|---|---|---|
| 0 | Software Initialize | INIT |
| 1 | System Not Ready | NRDY |
| 2 | System Ready | RDY |
| 3 | Print | PRINT |
| 4 | System Running, Not Print | RUNNPRT |
| 5 | Service | TECHREP |

Referring to FIG. 33, each STATE is normally divided into PROLOGUE, LOOP and EPILOGUE sections. As will be evident from the exemplary program STCK reproduced in TABLE I, entry into a given STATE (PROLOGUE) normally causes a group of operations to be performed, these consisting of operations that are performed once only at the entry into the STATE. For complex operations, a CALL is made to an applications subroutine therefor. Relatively simpler operations (i.e. turning devices on or off, clearing memory, presetting memory, etc.) are done directly.

Once the STATE PROLOGUE is completed, the main body (LOOP) is entered. The program (STCK) remains in this LOOP until a change of STATE request is received and honored. On a change of STATE request, the STATE EPILOGUE is entered wherein a group of operations are performed, following which the STATE moves into the PROLOGUE of the next STATE to be entered.

Referring to FIG. 34 and the exemplary program (STCK) in TABLE I. On actuation of the machine POWER-ON button 804, the software Initialize STATE (INIT) is entered. In this STATE, the controller is initialized and a software controlled self test subroutine is entered. If the self test of the controller is successfully passed, the System Not Ready STATE (NRDY) is entered. If not, a fault condition is signaled.

In the System Not Ready STATE (NRDY), background subroutines are entered. These include setting of Ready flags, control registers, timers, and the like; turning on power supplies, the fuser, etc., initializing the Fault Handler, checking for paper jams (left over from a previous run), door and cover interlocks, fuser temperatures, etc. During this period, the WAIT lamp on console 800 is lit and operation of host machine 10 precluded.

When all ready conditions have been checked and found acceptable, the controller moves to the system ready state (RDY). The READY lamp on console 800 is lit and final ready checks made. Host Machine 10 is now ready for operation upon completion of input of a copy run program, loading of one or more originals 2 into document handler 16 (if selected by the operator), and actuation of START PRINT button 805. As will appear hereinafter, the next state is PRINT wherein the particular copy run programmed is carried out.

While the machine is completing a copy run, the controller normally enters the Run Not Print state (RUNNPRT) where the controller calculates the number of copies delivered, resets various flags, stores certain machine event information in the memory, as well as generally conditioning the machine for another copy run, if desired. The controller then returns to the System Not Ready state (NRDY) to recheck for ready conditions prepatory for another copy run, with the same state sequence being repeated until the machine is turned off by actuation of POWER OFF button 804 or a malfunction inspired shutdown is triggered. The last state (TECH REP) is a machine servicing state wherein certain service routines are made available to the machine/repair personnel, i.e. Tech Reps.

Referring particularly to FIG. 32 and Tables II, III, IV, V, VI and VII, the machine operator uses control console 800 to program the machine for the copy run desired. Programming may be done during either the System Not Ready (NRDY) or System Ready (RDY) states, although the machine will not operate during the System Not ready state should START PRINT button 805 be pushed. The copy run includes selecting (using keyboard 808) the number of copies to be made, and such other ancillary program features as may be desired, i.e. use of auxiliary paper tray 102, (push button 810), image size selection (push buttons 818, 819, 820) document handler/sorter selection (push buttons 822, 823, 825, 826), copy density (push buttons 814, 815), duplex or two sided copy button 811, etc. On completion of the copy run program, START PRINT button 805 is actuated to start the copy run programmed (presuming the READY lamp is on and an original or originals 2 have been placed in tray 233 of document handler 16 if the document handler has been selected).

With programming of the copy run instructions, controller 18 enters a Digit Input routine in which the program information is transferred to RAM section 546. The copy run program data passes via Main Panel Interface Module 526 to Input Matrix Module 524 and from there is addressed through Matrix Input Select 604, Multiplexer 624, and Buffers 620 of I/O Module 502 to RAM section 546 of CPU Module 500.

On entering PRINT STATE, a Run Event Table (FIG. 35) comprised of Foreground tasks is built for operating in cooperation with the background tasks the various components of host machine 10 in an integrated manner to produce the copies programmed. The run Event Table is formed by controller 18 through merger of a Fixed Pitch Event Table (TABLE II) (stored in ROM 545 and Non Volatile Memory 610) and a Variable Pitch Event Table (TABLE III) in a fashion appropriate to the parameters of the job selected.

The Fixed Pitch Event Table (TABLE II) is comprised of machine events whose operational timing is fixed during each pitch cycle such as the timing of bias to transfer roll 75, (TRN 2 CURR), actuating toner concentration sensor 65 (ADC ACT), loading roll 161 of fuser 150 (FUS*LOAD), and so forth, irrespective of the particular copy run programmed. The Variable Pitch Table (TABLE III) is comprised of machine events whose operational timing varies with the individual copy run programmed, i.e. timing of pitch fade-out lamp 44 (FO*ONBSE) and timing of flash illumination lamps 37 (FLSH BSE). The variable Pitch Table is built by the Pitch Table Builder (TABLE IV) from the copy run information programmed in by controller 18 (using the machine control program stored in ROM section 545 and Non-Volatile Memory 610), coupled with event address information from ROM section 545, sorted by absolute clock count (via the routine shown in TABLE V), and stored in RAM section 546 (via the routine shown in TABLE VI). The Fixed Pitch Event Table and Variable Pitch Table are merged with the relative clock count differences between Pitch events calculated to form a Run Event Table (TABLE VII).

Figure 35:
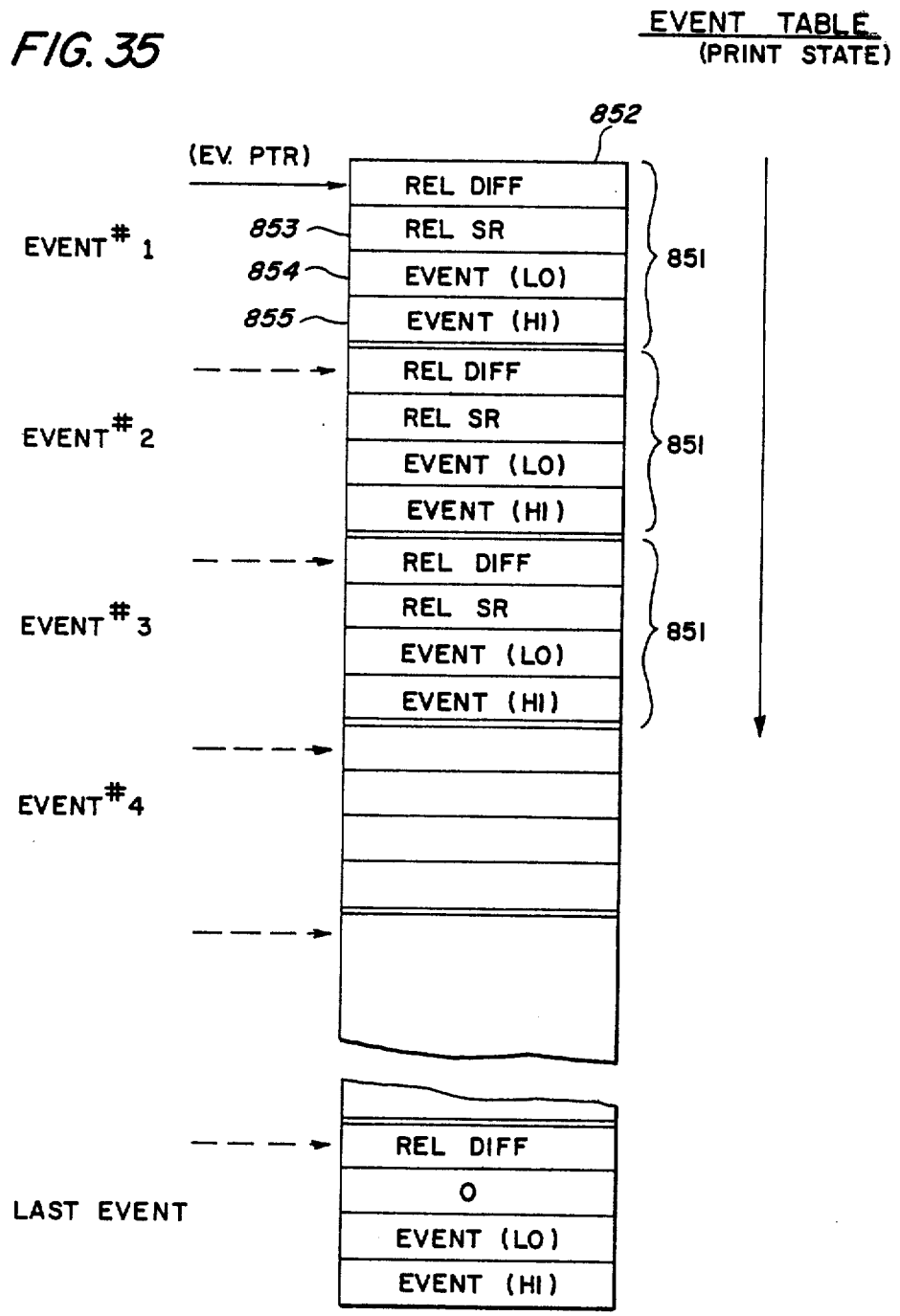
FIG. 35 is a view showing the event table layout.

Referring particularly to FIG. 35, the Run Event Table consists of successive groups of individual events 851. Each event 851 is comprised of four data blocks, data block 852 containing the number of clock pulses (from machine clock 202) to the next scheduled pitch event (REL DIFF), data block 853 containing the shift register position associated with the event (REL SR), and data blocks 854, 855 (EVENT LO) (EVENT HI) containing the address of the event subroutine.

In machine states other than PRINT, data blocks 852, 853 (REL DIFF) (REL SR) are set to zero. Data blocks 854, 855 hold the address information for the Non-Print state event.

Control Data in the Run Event Table represents a portion of the foreground tasks and is transferred to the output buffer 546' of RAM memory section 546 by the Pitch Reset and Machine Clock interrupt routines. Other control data, representing foreground tasks not in the Run Event Table is transferred to RAM output buffer 546' by the Real Time Clock interrupt routine. Transfer of the remainder of the control data to output buffer 546' is by means of background (non-interrupt) routines.

Transfer of control data from output buffer 546' of RAM memory section 546 to the various locations in host machine 10 is through output Refresh via Direct Memory access (DMA) in response to machine clock interrupt signals as will appear. The interrupt routines are initiated by the respective interrupt signals.

Referring particularly to FIGS. 23 and 35-37 and TABLES VII, VIII the interrupt having the highest priority, the Pitch Reset interrupt (signal 640) is operable only during the PRINT state, and occurs once each revolution of sheet register fingers 141 as responded by sensor 146 of pitch reset clock 138. At each pitch reset interrupt signal, after a determination of priority by Priority Chip 659 in the event of multiple interrupt signals, an interrupt signal (INT) is generated. The acknowledgement signal (INTA) from processor 542 initiates the pitch reset interrupt routine.

On entering the pitch reset routine, the interrupt is re-enabled and the contents of the program working registers stored. A check is made to determine if building of the Run Event Table is finished. Also checks are made to insure that a new shift register schedules have been built and at least 910 clock counts since the last pitch reset have elasped. If not, an immediate machine shutdown is initiated.

Presuming that the above checks are satisfactory, the shift register pointer (SR PTR), which is the byte variable containing the address of a pre-selected shift register position (SR O), is decremented by one and adjusted for overflow and the shift register contents are updated with a byte variable (SR+VALUV) containing the new shift register value to be shifted in following the pitch reset interrupt. The event pointer (EV*PTR), a two byte variable containing the full address of the next scheduled event, is reset to Event #1. The count in the C register equals the time to the first event.

Machine Cycle Down, Normal Down, and Side One Delay checks are made, and if negative, the count on a cycle counter (CYC UP CT) is checked. If the count is less than a predetermined control count (i.e. 5), the counter (CYC UP CT) is incremented by one. When the count on the cycle up counter equals the control count, an Image Made Flag is set.

If a Normal Down, Cycle Down, or Side One Delay has been initiated, the cycle up counter (CYC UP CT) is reset to a preset starting count (i.e. 2). The pitch reset interrupt routine is exited with restoration of the working registers and resetting of pitch reset flip flop 647.

The Machine Clock Interrupt routine, which is second in priority, is operative in all operational states of host machine 10. Although nominally driven by machine clock 202, which is operative only during Print state when processor main drive motor 34 is energized, machine clock pulses are also provided by phase locked loop 649 when motor 34 is stopped.

Referring particularly to FIG. 38 and TABLE IX, entry to the Machine Clock interrupt routine there shown is by a signal (INTA) from processor 542 following a machine control interrupt signal 642 as described earlier. On entry, the event control register (C REG) is obtained and the working register contents stored. The C REG is decremented by one, the register having been previously set to a count corresponding to the next event in the Event Run Table.

The control register (C REG) is checked for zero. If the count is not zero and is an odd number, an output refresh cycle is initiated to effect transfer/refresh of data in RAM output buffer 546' to host machine 10. If the number is even, or following an output refresh, the interrupt system is re-enabled, the machine clock interrupt flip flop 651 is reset and the working registers are restored. Return is then made to the interrupted routine.

If the control register (C REG) count is zero, the Event Pointer (EV*PTR), which identifies the clock count (in data block 852) for the next scheduled event (REL DIFF), is loaded and the control register (C REG) reset to a new count equal to the time to the next event. The Event Pointer (EV*PTR) is incremented to the relative shift register address for the event (REL SR, data block 853), and the shift register address information is set in appropriate shift registers (B, D, E, A registers).

The event Pointer (EV*PTR) is incremented successively to the event subroutine address information (EVENT LO) (EVENT HI) in the Event Run Table, and the address information therefrom loaded into a register pair (D & E registers). The Event Pointer (EV PTR) is incremented to the first data block (REL DIFF) of the next succeeding event in the Run Event Table, saved, and the register pair (H & L registers) that comprise the Event Pointer are loaded with the event subroutine address from the register pair (D & E registers) holding the information. The register pair (D & E registers) are set to the return address for the Event Subroutine. Using the address information, the Event Subroutine is called and the subroutine data transferred to RAM output buffer 546' for transfer to the host machine on the next Output Refresh.

Following this, the Machine Clock interrupt routine is exited as described earlier.

The Output Refresh cycle alluded to earlier functions, when entered, to transfer/refresh data from the output buffer of 546' RAM section 546 of host machine 10. Direct Memory Access (DMA) is used to insure a high data transfer rate.

On a refresh, Refresh Control 605 (see FIG. 23) raises the HOLD line to processor 542, which on completion of the operation then in progress, acknowledges by a HOLD A signal. With processor 542 in a hold mode and Address and Data buses 507, 508 released to I/O Module 502 (through operation of tri-state buffers 510, 511, 563, 570), the I/O module then sequentially accesses the output buffer 546' of RAM section 546 and transfers the contents thereof to host machine 10. Data previously transferred is refreshed.

The Real Time Interrupt, which carries the lowest priority, is active in all machine states. Primarily, the interrupt acts as an interval timer by decrementing a series of timers which in turn serve to control initiation of specialized subroutines used for control and error checking purposes.

Figure 39B:
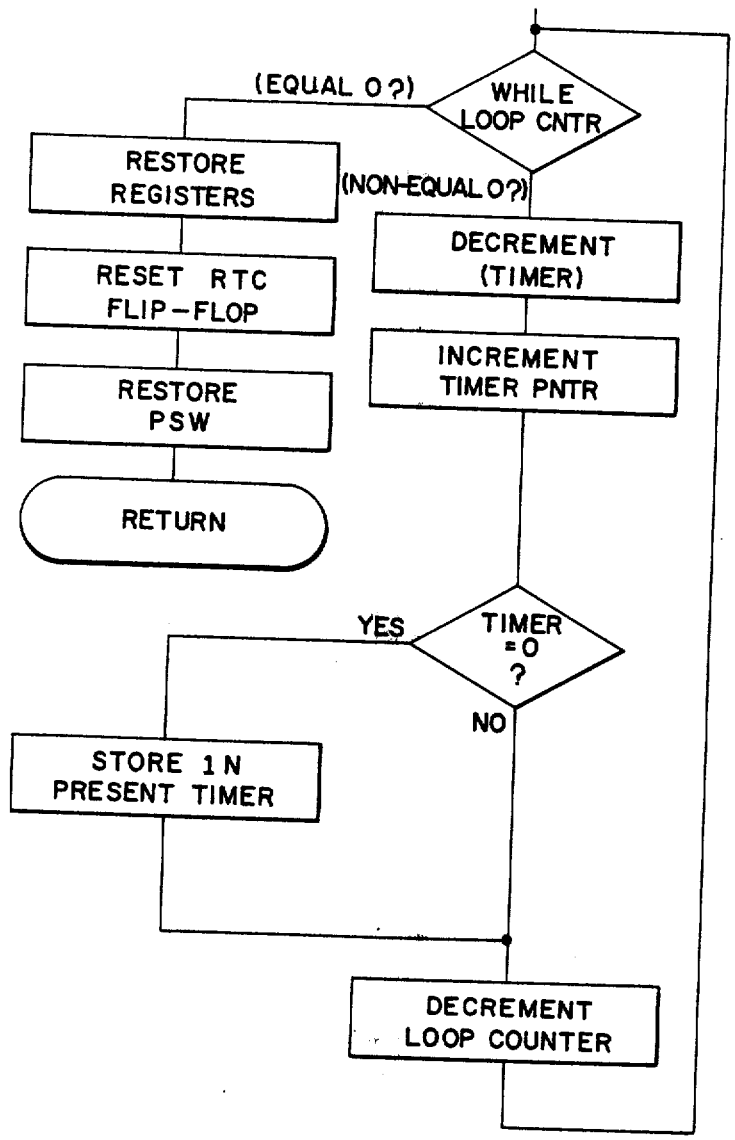

Referring particularly to FIG. 39 and TABLE X, the Real Time interrupt routine is entered in the same manner as the interrupt routines previously described, entry being in response to a specific RESTART instruction code assigned to the Real Time interrupt. On entry, the interrupt is re-enabled and the register contents stored. The time pointer (PNTR) for the first class of timers (i.e. 10 msec TIMERS) is loaded, and a loop counter identifying the number of timers of this class (i.e. 10 msec TIMERS) preset. A control register (E REG) is loaded and a timer decrementing loop is entered for the first timer. The loop decrements the particular timer, increments the timer pointer (PNTR) to the location of the next timer in this class, checks the timer count, and decrements the loop counter. The decrementing loop routine is repeated for each timer in the class (i.e. 10 msec TIMERS) following which a control counter (CNTR) for the second group of timers (i.e. 100 msec TIMERS) is decremented by one and the count checked.

The control counter (CNTR) is initially set to a count equal to the number of times the first timer interval is divisible into the second timer interval. For example, if the first class of timers are 10 msec timers and the second timer class are 100 msec timers, the control counter (CNTR) is set at 10 initially and decremented on each Real Time interrupt by one down to zero.

If the count on the control counter (CNTR) is not zero, the registers are restored, Real Time interrupt flip flop 856 reset, and the routine exited. If the count on the control counter is zero, the counter is reloaded to the original maximum count (i.e. 10) and a loop is entered decrementing individually the second group of timers (i.e. 100 msec TIMERS). On completion, the routine is exited as described previously.

In the following TABLES:

"@"-is used to indicate flags, counters and subroutine names.

"#"-is used to indicate input signals.

"$"-is used to indicate output signals.

":"-is used to indicate macro instructions, system subroutines, system flags, and data, etc.

For further explanation of the mnemonics and particular instructions utilized by the following routines, the reader is directed to Intel Corporation's Prgramming Manual for the 8080 Microcomputer System.

TABLE I

```
 99                                  ;NAR
100                                  ;
101                                  ;
102                                  ;     INITIALIZE   STATE
103                                  ;
104                                  ; INITI SUBROUTINE
105                                  ;
106                                  ; INITIALIZE STATE- EXECUTED AFTER EACH START OR RESTART.  SETS
107                                  ; ALL POINTERS, FLAGS, AND DATA TO INITIAL VALUES REQUIRED TO
108                                  ; START EXECUTION OF ANY CONTROL ALGORITHMS.  ALWAYS EXITS TO
                                     ; 'NOT READY' STATE.
110                                  ;     EPILOG
112    05 C0000    3E0A      A   INITI   MVI      A,10
113    05 00002    3252FD    N           STA      DIVO:10                 INITIALIZE TO 10
114    05 00005    32F5FC    N           STA      SLAHTOGL                INITIALIZE TO 10
115    05 00008    211907    N           LXI      H,EVSTBY1               H&L= ADDR OF STBY EVENT TABLE
116    05 0000B    2264FD    N           SHLD     EV2PTR:                 SAVE FOR MACH CLK ROUTINE
117    05 0000E    21FFFF    A           LXI      H,X!FFFF!               INIT INSTRUMENTATION REMOTE
118    05 00011    2272FB    N           SHLD     INSOPTR                   ADDR PNTR TO END OF RAM
119    05 00014    21FFFF    A           LXI      H,ADH60RMT-1            SET PNTR TO RAM CNTRL TABLE
120    05 00017    2275FB    N           SHLD     TARQSTRT                SAVE PNTR
121    05 0001A    3E7F      A           MVI      A,X!7F!                 INIT TO UN-BYPASS
122    05 0001C    32A0FC    N           STA      JAH2BYPS
                                                                          ALL JAM SHS
124                                  ;
125                                  ; TIMER INITIALIZATION
126                                  ; MUST BE DONE BEFORE ANY TIMERS CAN BE USED
127    05 0001F    211FF9    A           LXI      H,AVAIL1==8+X!1F!       SET H&L TO END OF AVAIL1 TABLE
128    05 00022    36FF      A           MVI      M,X!FF!                 STORE X!FF! IN LAST TABLE ADDR
129    05 00024    3E1F      A           MVI      A,31                    SET A-REG TO VALUE TO BE STORED
130                                      REPEAT
131    05 00026    2D        A            DCR     L                       STEP TO NEXT TABLE LOCATION
132    05 00027    77        A            MOV     M,A                     STORE INITIALIZATION VALUE
133    05 00028    3D        A            DCR     A                       STEP TO NEXT VALUE
134    05 00029    C22600    A           UNTIL:   CC,Z,S                  IS INITIALIZATION COMPLETE
135    05 0002C    2120FE    A           LXI      H,ADR(DATA,TIME:OUT)    TO INITIALIZE TIME:OUT TABLE
136    05 0002F    225FFD    N           SHLD     INPTR:                  SET IN/OUT POINTERS TO
137    05 00032    2261FD    N           SHLD     OUTPTR:                   BEGINNING OF TIME:OUT TABLE
139                                  ;
140                                  ; INITIALIZE SPOOL
141                                  ; POINTERS
142    05 00035    2140FE    A           LXI      H,ADR(DATA,SPL1TBL)     SET PNTRS
143    05 00038    226AFD    N           SHLD     SPL:IN                                TO START
144    05 0003B    226CFD    N           SHLD     SPL:OUT                                        OF TABLE
146                                  ;
147                                  ; CHECK IF PAPER WAS PRESENT WHEN POWER WENT DOWN
148    05 0003E    3AC9E2    A   RNVNIB  MVBJAMRM                         A = JAM INFO FROM POWER DOWN
149    05 00041    OF        A           RRC                              SET CARRY TO FDR JAM INFO
150    05 00042    D25A00    N           IF1      CC,C,S                  WAS THERE PAPER IN FDR AREA
151    05 00045    47        A            MOV     B,A                     YES, SAVE JAM INFO
152    05 00046    213CFD    A            SFBIT,P FDRSAJAM,FDRBMJAM       SET FEEDER JAMS
       05 00049    3E0C      A
       05 0004B    B6        A
       05 0004C    77        A
153    05 0004D    2121F9    A            SFBIT,P ON=X82,ON=X83           SIGNAL TRANSPT CL'RANCE REQ'D
       05 00050    3E03      A
       05 00052    B6        A
       05 00053    77        A
154    05 00054    3E80      A            SFLG    CLPQREQD                TELL FLT HNDLR CLEARANCE REQD
       05 00056    3267F4    A
155    05 00059    78        A            MOV     A,B                     RESTORE THE A-REG
156                                      ENDIF
157    05 0005A    OF        A           RRC                              SET CARRY TO IMEDOON!
158    05 0005B    D27100    N           IF1      CC,C,S                  WAS THERE AN IMEDOON!
160    05 0005E    2EFF      A           MVI      L,MSK(FBIT,L8PR8FLT,JAM28FLT,JAM38FLT,JAM48FLT,J
161                                                                       JAM58FLT,JAM68FLT,RET18FLT,RET28FLT)
162                                                                       SETS ALL JAM FBITS IN REG-L
163    05 00060    2603      A           MVI      H,MSK(FBIT,S0S8JAM,MISSTRIP)
165    05 00062    2238FD    N           SHLD     ADR(FBYT,PAP11)         SETS ADDITIONAL FBITS IN H
166    05 00065    3E80      A           SFLG     CLRQREQD                MOVE FBITS INTO FBYTES
       05 00067    3267F4    A                                            TELL FLT HNDLR CLEARANCE REQD
167    05 0006A    2120F9    A           SFBIT,P  TSQFUS,TSBX82           TURN ON UNDEDICATED MAP LAMPS
       05 0006D    3E21      A
       05 0006F    B6        A
       05 00070    77        A
168                                      ENDIF
169                                      IF1      XBYT,A,AND,!            IS EITHER SRT JAM FLAG SET
170    05 00071    E60C      A                    MSK(NVBIT,NVBLOW8J,NVBUP8J),NZ 'IN NVNIB
       05 00073    CA8A00    N
171                                          IF1  XBYT,A,EQ,!             YES, ARE BOTH SET
172    05 00076    FE0C      A                    MSK(NVPIT,NVBLOW8J,NVBUP8J)
       05 00078    C28300    N
173    05 00078    3E80      A                 SFLG    TWORACT            TELL SRT THAT THERE WAS A JAM
       05 0007D    3261F4    A
174    05 00080    C38700    N           ELSE:
175    05 00083    OF        A               RRC                          GET NVBLOW8J TO SIGN BIT &
176                                           IDIREAD  NVBLOW8J
177    05 00084    3237F4    A               MODFLG   LOW8MOD             TELL SRT IF UP OR LOW JAM
178                                      ENDIF
179    05 00087    CD0000    N           CALL     JAMBSET                 LET SRT SET JAM FLAGS & LAMPS
```

```
180             ENDIF
181  05 0008A  3E80   A    SFLG      SRT&RDY                   SIGNAL SRT NOT IN USE (READY)
     05 0008C  328CF7 A
182  05 0008F  3287F7 A    MODFLG    PROG&RDY                  SET PROG ROUTINE READY
183  05 00092  3268F4 A    MODFLG    2SOBENAB                  ALLOW SELECTION OF DUPLEX MODE
184  05 00095  3EF2   A    MVI       A,X'F2'                   RE-ENABLE
185  05 00097  3200E6 A    STA       RSINTFF1                           INTERRUPT
186  05 0009A  FB     A    EI                                           SYSTEM
187  05 0009B  CD0000 N    SOBIT,S   NPF0&BH,24V&SPL           PF8 OFF (INVT'D) & 24V ON
     05 0009E  02     A
     05 0009F  E&80   A
     05 000A1  EE80   A
188  05 000A3  CD0000 N    STIMR     FLT&DLY,25000,FLT&CHK     START LENS FAULT TIMER
     05 000A6  12     A
     05 000A7  FA     A
     05 000A8  00C0   N
189  05 000AA  CD0000 N    CALL      DOCACLP                   INITIALIZE DOCNUM TO 1      (1)
190  05 000AD  3274FC N    STA       OF&DIGIT                  ENABLE '0' IN QTY FLASHED   (2)
191  05 000B0  3E08   A    MVI       A,HSK(FBIT,POP&RS)        TELL FLT ASSUME
192  05 000B2  3286FC N    STA       XP&PREV                            BRUSH HOUSE OPN
193  05 000B5  3E02   A    MVI       A,INRDY                   INIT STCK
194  05 000B7  3254FD N    STA       ISTATEI                            SYNCRONIZED BACKGROUND
195  05 000BA  3253FD N    STA       STATE1                                      CONTROL LOOP
196  05 000BD  CD3702 N    CALL      NRDY:PEL                  INIT CONTROL TO NOT-READY STATE

198                    *****************************************************
199                    *                                                   *
200                    *   SYCRONIZED  BACKGROUND  CONTROL  LOOPS          *
201                    *                                                   *
202                    *****************************************************

204                    *   PRIORITIES:
205                    *       FIRST    10MS TIME OUT REQUESTS
206                    *       SECOND   10MS CALLS
207                    *       THIRD    SPOOLED CALLS
208                    *       FOURTH   20MS CALLS
209                    *       FIFTH    100MS CALLS
210                    *       SIXTH    100MS TIME OUT REQUESTS 212  05 000C0  2151FD A    LXI       H,ADR(DATA,SB:RQST)       SET MEM PNTR TO SB BYTE
213                         REPEAT                             LOOP-3 FROM HLT ON ALL INTER'S
214                          REPEAT                            LOOP-2 BACK AFTER EACH 100MS
215                           REPEAT                           LOOP-1 BACK AFTER EACH 20MS
216  05 000C3  7E     A       MOV       A,M                    A = SYNC BKGND REQUESTS FROM RTC
217                            ID:READ SB:RQST
218  05 000C4  07     A       RLC                              TEST FOR 10MS
219  05 000C5  D2F700 N       IF:       CC,C,S                           SB REQUEST

220                    *                                       TIMER SERVICE REQUESTS
221                    *                                       'CALLS TIMED OUT TIMER SUBRS
222                    *                                       USING WRAP AROUND TABLE AND
223                    *                                       IN/OUT PNTRS = RTCI CCTS
224                    *                                       INPTR: & ENTERS CALL ADDR
225
226
227  05 000C8  3A5FFD N       WHILE:    XBYT,INPTR:,NE,OUTPTR: ARE PNTRS AT SAME TABL
     05 000CB  2161FD N
     05 000CE  8E     A
     05 000CF  CAE500 N         MOV     L,M                    SET L-REG TO ADDR(L) IN TABLE
228  05 000D2  6E     A         MVI     H,HADR(DATA,TIME:OUT)  MEM PNTR NOW SET TO
229  05 000D3  26FE   A         MOV     E,H                    MOVE CALL ADDR(L) TO E
230  05 000D5  5E     A         INX     H                      STEP TO NEXT TABLE BYTE
231  05 000D6  23     A         MOV     D,M                    MOVE CALL ADDR(H) TO D
232  05 000D7  56     A         INX     H                      STEP TO NEXT TABLE BYTE
233  05 000D8  23     A         MOV     A,L                    PREPARE TO UPDATE PNTR
234  05 000D9  7D     A         ID:READ TIME:OUT               DYNAMIC TABLE CONTAINING ADDRS
235                             MROBYT  A,AND,J                ADJUST FOR END OF TABLE
236                                                            TIME:MSK
237  05 000DA  E62F   A         STA     ADR(DATA,OUTPTR:)      PNTR TO ADDR OF LAST SE
238  05 000DC  3261FD A         CALL    DE:IND                 DO TIMEOUT CALL
239  05 000DF  CD0000 N       ENDWHILE                         YES, ALL TIME OUTS SERVICED
240  05 000E2  C3C800 N                                        END TIMER SECTION
241
242  05 000E5  2A55FD N       IHLD      10:CALLS               GET PROPER 10MS CALL TABLE
243  05 000E8  CDC000 N       CALL      HL:IND                 DO 10MS CALLS
244  05 000EB  2151FD A       LXI       H,ADR(DATA,SB:RQST)    SET MEM PNTR TO SB BYTE
245  05 000EE  F3     A       DI
246  05 000EF  7E     A       MODBYT    M,AND, 10:RQST         REMOVE 10MS REQUEST
     05 000F0  E67F   A
     05 000F2  77     A
                              ID:ALTR   SB:RQST
247                           EI                               (WATCH OUT FOR UNPRINTABLE NOT)
248  05 000F3  FB     A                                        DO ANY SPOOLED ROUTINES
249  05 000F4  C31501 N      ELSE:
250  05 000F7  3A6AFD N        IF:      XBYT,SPL:IN,NE,SPL:OUT
     05 000FA  216CFD N
     05 000FD  BE     A
     05 000FE  CA1101 N
251  05 00101  6E     A         MOV     L,M
252  05 00102  26FE   A         MVI     H,HADR(DATA,SPL:TBL)
253  05 00104  5E     A         MOV     E,M
254  05 00105  23     A         INX     H
255  05 00106  56     A         MOV     D,M
256  05 00107  23     A         INX     H
257  05 00108  7D     A         MOV     A,L
258  05 00109  E66F   A         MROBYT  A,AND,SPL:MSK
259  05 0010B  326CFD A         STA     ADR(DATA,SPL:OUT)
260  05 0010E  CD0000 N         CALL    DE:IND
261                           ENDIF
262  05 00111  2151FD A         LXI     H,ADR(DATA,SB:RQST)
263  05 00114  7E     A         MOV     A,M
264                           ENDIF
265                           ID:READ   SB:RQST
```

```
266  05 00115  07       A
267  05 00116  07       A
268  05 00117  024201   N
269  05 00119  2A59FD   N
270  05 0011D  5E       A
271  05 0011E  23       A
272  05 0011F  7E       A
     05 00120  FEFF     A
     05 00122  C23701   N
273  05 00125  2A57FD   N
274  05 00128  2259FD   N
275  05 0012B  2151FD   A
276  05 0012E  F3       A
277  05 0012F  7E       A
     05 00130  E6BF     A
     05 00132  77       A
278
279  05 00133  FB       A
280  05 00134  C34201   N
281  05 00137  56       A
282  05 00138  23       A
283  05 00139  2259FD   N
284  05 0013C  CD0000   N
285  05 0013F  2151FD   A
286
287
288  05 00142  7E       A
     05 00143  E640     A
     05 00145  C2C300   N
289
290  05 00148  7E       A
     05 00149  E620     A
     05 0014B  CA9E01   N
291
292  05 0014E  2A5CFD   N
293  05 00151  5E       A
294  05 00152  23       A
295  05 00153  7E       A
     05 00154  FEFF     A
     05 00156  C29301   N
296  05 00159  2A5BFD   N
297  05 0015C  225DFD   N
298
299
300
301
302
303
304
305
306
307
308
309  05 0015F  2130FA   N
310  05 00162  1614     A
312
314  05 00164  3A45FD   A
     05 00167  E640     A
     05 00169  CA6E01   N
315
316  05 0016C  1611     A
317
318
319
320  05 0016E  7E       A
     05 0016F  A7       A
     05 00170  CA8201   N
321  05 00173  35       A
322  05 00174  C28201   N
323  05 00177  D5       A
324  05 00178  E5       A
325  05 00179  24       A
326  05 0017A  5E       A
327  05 0017B  24       A
328  05 0017C  56       A
329  05 0017D  CD0000   N
330  05 00180  E1       A
331  05 00181  D1       A
332
333
334
335  05 00182  23       A
336  05 00183  15       A
337  05 00184  C26E01   N
338
339  05 00187  2151FD   A
340  05 0018A  F3       A
341  05 0018B  7E       A
     05 0018C  E6DF     A
     05 0018E  77       A
342
343  05 0018F  FB       A
344  05 00190  C39E01   N
345  05 00193  56       A
346  05 00194  23       A
347  05 00195  2250FD   N
```

```
        RLC
        RLC
        IF:      CC,C,S              TEST FOR 20MS SB REQUEST
            LHLD     20PNTR          SET MEM PTR TO CALL IN 20MS TAB
            MOV      E,H             MOVE CALL ADDR(L) TO E
            INX      H               STEP MEM PTR TO ADDR(H)
            IF:      XBYT,H,EQ,X'FF' IS POINTER AT END OF TABLE

LHLD     20IPNTR         YES, SET MOVING POINTER
                SHLD     20PNTR           BACK TO BEGINNING OF TABLE
                LXI      H,ADR(DATA,SBIRQST)  SET MEM PNTR TO
                DI
                MODBYT   M,AND, 20IRQST  REMOVE 20MS REQUEST

IO:ALTR  SBIRQST
                EI
            ELSE:
                MOV      D,M             NO, MOVE CALL ADDR(H) TO D
                INX      H               STEP TO NEXT CALL IN TABLE
                SHLD     20PNTR          SAVE FOR NEXT LOOP-1
                CALL     DE:IND
                LXI      H,ADR(DATA,SBIRQST) SET MEM PNTR TO SB BY
            ENDIF
        ENDIF
        UNTIL:   XBYT,H,AND, 20IRQST,Z  MORE 20MS CALLS TO DO  (LOOP-1)

IO:READ  SBIRQST
        IF:      XBYT,H,AND, 100IRQST,NZ TEST FOR 100MS SB REQUEST

IO:READ  SBIRQST
            LHLD     100PNTR         SET MEM PNTR TO CALL IN 100 TAB
            MOV      E,H             MOVE CALL ADDR(L) TO E
            INX      H               STEP MEM PNTR TO ADDR(H)
            IF:      XBYT,H,EQ,X'FF' IS PNTR AT END OF TABLE

LHLD     100IPNTR        YES, SET MOVING PNTR BACK
                SHLD     100PNTR          TO BEGINNING OF TABLE

100MS TIMER SERVICE
                                     DECREMENTS TIMERS AND CALLS
                                     SUBROUTINE REQUESTED WHEN
                                     TIMER TIMES OUT
                                     USES 3 TABLES ON 3 CONSECUTIVE
                                     RAM PAGES -100ICNT W/TIMER
                                               -100ILS W/ADDR(L)
                                               -100ILS W/ADDR(H)
                                     ADDR IS FOR REQUESTED SUBR

LXI      H,100ICNT       STARTING ADDR OF 100MS TIMERS
            MVI      D,100ITMAX      D-REG SET TO QTY OF 100MS THRS

CONDITIONAL HOLD OF 100MS THRS

IF:      FBIT,STDBPNB,T IS STAND-BY RELAY OPEN

MVI      D,100ITMAX; YES, HOLD SPECIFIED NUMBER
                                     -HOLDTMRS   OF TIMERS
            ENDIF

REPEAT                   LOOP TO DECR & SERVICE TIMEOUTS
                IF:      VBYT,M,NZ   IS TIMER ACTIVE

DCR      M           DECR TIMER
                    IF:      CC,Z,S      HAS TIMER TIMED OUT
                        PUSH     D           SAVE # TIMERS TO SERVICE
                        PUSH     H           SAVE ADDR OF CURRENT TIMER
                        INR      H           STEP TO NEXT RAM PAGE
                        MOV      E,M         MOVE CALL ADDR(L) TO E
                        INR      H           STEP TO NEXT RAM PAGE
                        MOV      D,M         MOVE CALL ADDR(H) TO D
                        CALL     DE:IND
                        POP      H           RECALL ADDR OF CURRENT THR
                        POP      D           RECALL NUMBER OF TIMERS
                                             YET TO BE SERVICED
                    ENDIF
                ENDIF
                INX      H           STEP TO NEXT TIMER ADDR
                DCR      D           DECR NUMBER OF 100MS TIMERS
            UNTIL:   CC,Z,S          HAVE ALL TIMERS BEEN SERVICED
                                     END 100MS TIMER SECTION
            LXI      H,ADR(DATA,SBIRQST) SET MEM PNTR TO SB BYTE
            DI
            MODBYT   M,AND, 100IRQST REMOVE 100MS REQUEST

IO:ALTR  SBIRQST
            EI
        ELSE:
            MOV      D,M             NO, MOVE CALL ADDR(H) TO D
            INX      H               STEP PNTR TO NEXT CALL
            SHLD     100PNTR         SAVE FOR NEXT LOOP-2
```

```
348   05 00198   CD0000   N                       CALL      DEIIND
349   05 0019B   2151FD   A                       LXI       H,ADR(DATA,SB:RCST)    SET MEM PNTR TO SB BYTE
350                                             ENDIF
351                                           ENDIF
352   05 0019E   7E       A                  UNTIL:  VBYT,H,Z                      MORE SB CALLS TO DO  (LOOP-2)
      05 0019F   A7       A
      05 001A0   C2C300   N
353                                           IDIREAD   SB:RCST
354   05 001A3   76       A                       HLT                              COOL IT UNTIL INTERRUPT RESTART
355   05 001A4   CAC300   N                  UNTIL:   CC,Z,C                       HAS INTERRUPT RTC (LOOP-3)
356   05 001A7   F3       A                       DI                               ONLY KIDDING BEFORE, BUT THIS
357   05 001A8   76       A                       HLT                              TIME REALLY STOP (ABORT)
358
360                                         *   SUBR TO SET CALL TABLE POINTERS
361                                         *   CALLED BY EACH STATE PRELOG
362                                         *
363                                         *   POSITION SBITABLE POINTER
364
365   05 001A9   3A53FD   N   SBIPNTRS LDA        STATE:                           WHAT STATE IS WANTED
366   05 001AC   110600   A                  LXI        D,X'06'                    LOAD DEE WITH SKIP NUMBER
367   05 001AF   210501   N                  LXI        H,SBITABLE-X'06'           HEL-6'<' TABLE ADDR
368                                         REPEAT
369   05 001B2   19       A                      DAD         D                     SKIP THREE WORDS
370   05 001B3   3D       A                      DCR         A                     DECR STATE LOOP COUNTER
371   05 001B4   F2B201   N                  UNTIL:  CC,S,S                        IS POINTER AT CORRECT STATE
372                                         *
373                                         *   TRANSFER ADDRS TO VARIABLE SB POINTERS
374                                         *
375   05 001B7   1155FD   N                      LXI        D,10ICALLS             SET DEE TO FIRST OF SB PNTRS
376   05 001BA   0602     A                      MVI        B,2                    LOAD 10ICALLS
377   05 001BC   CDCE01   N                      CALL       MVIWORDS               & 20IPNTR
378   05 001BF   2B       A                      DCX        H                      ADJUST 'FROM' PNTR
379   05 001C0   2B       A                      DCX        H                      BACK 1 WORD
380   05 001C1   0602     A                      MVI        B,2                    LOAD 20PNTR
381   05 001C3   CDCE01   N                      CALL       MVIWORDS               & 100IPNTR
382   05 001C6   2B       A                      DCX        H                      ADJUST 'FROM' PNTR
383   05 001C7   2B       A                      DCX        H                      BACK 1 WORD
384   05 001C8   CDCC01   N                      CALL       MVIWORD                LOAD 100PNTR
385                                             ID:ALTR    10ICALLS,20IPNTR,20PNTR,&   DATA WORDS MODIFIED
386                                                        100IPNTR,100PNTR            BY THIS SUBR
387   05 001CB   C9       A                      RET
388                                         *NAR
389                                         *
390                                         *   MVIWORD/MVIWORDS SUBROUTINES
391                                         *
392                                         *   SUBR TO TRANSFER WORDS (2BYTES) FROM MEMORY POINTED TO BY <H&L>
393                                         *   TO MEMORY POINTED TO BY <D&E>. CALL MVIWORD FOR 1 TRANSFER,
394                                         *   AND CALL MVIWORDS (WITH B-REG # WORDS TO TRANSFER) FOR
395                                         *   MULTIPLE TRANSFERS.  USES ALL BUT C-REG.
396                                         *
397   05 001CC   0601     A   MVIWORD  MVI        B,1                              B= # WORDS TO BE MOVED
398                               MVIWORDS REPEAT
399   05 001CE   7E       A                      MOV        A,M                    A= 1ST 'FROM' BYTE
400   05 001CF   12       A                      STAX       D                      STORE IN 1ST 'TO' LOCATION
401   05 001D0   23       A                      INX        H                      ADVANCE 'FROM'
402   05 001D1   13       A                      INX        D                      AND 'TO' PNTRS
403   05 001D2   7E       A                      MOV        A,M                    A= 2ND 'FROM' BYTE
404   05 001D3   12       A                      STAX       D                      STORE IN 2ND 'TO' LOCATION
405   05 001D4   23       A                      INX        H                      ADVANCE 'FROM'
406   05 001D5   13       A                      INX        D                      AND 'TO' PNTRS
407   05 001D6   05       A                      DCR        B                      DECRM # OF WORDS CNTR
408   05 001D7   C2CE01   N                  UNTIL:  CC,Z,S                        LOOP UNTIL ALL WORDS TRANSFERRD
409   05 001DA   C9       A                      RET
410
411                                         *   TABLE OF SB CALL POINTERS
412                                         *   FOR EACH STATE
413                                         *
414   05 001DB   0906     N   SBITABLE DW        COMP10
415   05 001DD   0A06     N                  DW        COMP20
416   05 001DF   1206     N                  DW        COMP100

417   05 001E1   B105     N                  DW        TREP10
418   05 001E3   B5C5     N                  DW        TREP20
419   05 001E5   C305     N                  DW        TREP100
420   05 001E7   4202     N                  DW        NRDY10
421   05 001E9   4602     N                  DW        NRDY20
422   05 001EB   5202     N                  DW        NRDY100
423   05 001ED   AF02     N                  DW        RDY10
424   05 001EF   B302     N                  DW        RDY20
425   05 001F1   BFC2     N                  DW        RDY100
426   05 001F3   AB03     N                  DW        PRNT10
427   05 001F5   B203     N                  DW        PRNT20
428   05 001F7   C803     N                  DW        PRNT100
429   05 001F9   1905     N                  DW        RUNN10
430   05 001FB   1D05     N                  DW        RUNN20
431   05 001FD   2F05     N                  DW        RUNN100

433
434                                         *   SUBR TO DO EPILOGS & PROLOGS LAST CALL IN EVERY 100MS TABLE
435                                         *
436   05 001FF   2153FD   A   STAT:CHG LXI        H,ADR(DATA,STATE:)               A= PRESENT STATE # IF UNCHANGED
437   05 00202   7E       A                  MOV        A,M                        OR NEXT STATE IF CHANGED
438   05 00203   23       A                  INX        H                          H&L= ADDR 'FORMER STATE' GLOBAL
439   05 00204   BE       A                  IF:        XBYT,A,NE,M                HAS THERE BEEN A STATE CHANGE
      05 00205   CA3602   N
                                                   ID:READ    STATE:,:STATE:
440   05 00208   46       A                      MOV        B,M                    YES, B= FORMER STATE
441   05 00209   77       A                      MOV        M,A                    UPDATE 'FORMER' TO 'PRESENT'
442                                             ID:ALTR    :STATE:
443
444   05 0020A   78       A                  CASE:      VBYT,B                     DO EPILOG FOR FORMER STATE
      05 0020B   111F02   N
```

```

05 0020E    FE06    A
        05 00210    CD0000  N
445     05 00213    1806    N                   C,0     COMP;EPL           COMPONENT CONTROL STATE
446     05 00215    DB05    N                   C,1     TREP;EPL           TECH REP STATE
447     05 00217    7A02    N                   C,2     NRDY;EPL           NOT-READY STATE
448     05 00219    E302    N                   C,3     RDY;EPL            READY STATE
449     05 0021B    E603    N                   C,4     PRNT;EPL           PRINT STATE
450     05 0021D    4105    N                   C,5     RUNN;EPL           SYSTEM RUNNING, NOT PRINT STATE
451                                             ENDCASE
452     05 0021F    3A53FD  N           CASE:   VBYT,STATEI                DO PROLOG FOR PRESENT STATE
        05 00222    113602  N
        05 00225    FE06    A
        05 00227    CD0000  N
453     05 0022A    FF05    N                   C,0     COMP;PRL           COMPONENT CONTROL STATE
454     05 0022C    A505    N                   C,1     TREP;PRL           TECH REP STATE
455     05 0022E    3702    N                   C,2     NRDY;PRL           NOT-READY STATE
456     05 00230    A602    N                   C,3     RDY;PRL            READY STATE
457     05 00232    1603    N                   C,4     PRNT;PRL           PRINT STATE
458     05 00234    0B05    N                   C,5     RUNN;PRL           SYSTEM RUNNING, NOT PRINT STATE
459                                             ENDCASE
460                                             ENDIF
461     05 00236    C9      A           RET                                RETURN TO 100 MSEC SYNC BKGND
463                                     *NAR
464                                     *
465                                     *       N O T    R E A D Y    S T A T E
466                                     *
467                                     *       NOT READY STATE- EXECUTES AFTER INITIALIZE UNTIL ALL READY CONDITIONS
468                                     *       ARE MET.  THIS STATE CAN ALSO BE ENTERED FROM 'RUN NOT PRINT','READY'
469                                     *       AND 'TECH REP'.  CONTROL EXITS TO EITHER 'READY' OR 'TECH REP' STATES.
471                                     *       PROLOG
473     05 00237    CDA901  N           NRDY;PRL CALL   SBIPNTRS           SYNC BKG PNTRS TO NEW STATE
474     05 0023A    CD0000  N                   STIMR   INSTSTMR,1000,NEXTOFLT   UPDATES INST FLT CODE IN STBY
        05 0023D    49      A
        05 0023E    64      A
        05 0023F    0000    N
475     05 00241    C9      A           RET
477                                     *       CALLS FOR NOT READY 10 MS SYN BACKGROUND
479     05 00242    CD0000  N           NRDY10  CALL    ADHBCTRL
480     05 00245    C9      A           RET
482                                     *       CALLS FOR NOT READY 20 MS SYN BACKGROUND
484     05 00246    0000    N           NRDY20  DW      NRDYBSWS
485     05 00248    0000    N                   DW      HNDELVPS
486     05 0024A    0000    N                   DW      DSPLBCTL
487     05 0024C    0000    N                   DW      LMPBCTRL
488     05 0024E    0000    N                   DW      INSTRU
489     05 00250    FFFF    A                   DW      X'FFFF'            END OF TABLE
491                                     *       CALLS FOR NOT READY 100 MS SYN BACKGROUND
493     05 00252    0000    N           NRDY100 DW      NRILKBCK
494     05 00254    0000    N                   DW      REDBBGND
495     05 00256    0000    N                   DW      DVLBDUMP
496     05 00258    0000    N                   DW      RECAPER
497     05 0025A    0000    N                   DW      BINFCHK
498     05 0025C    0000    N                   DW      MINIPHSI            1
499     05 0025E    0000    N                   DW      BILBJMPB            2
500     05 00260    0000    N                   DW      FUSBROUT
501     05 00262    0000    N                   DW      FLTB100             1
502     05 00264    0000    N                   DW      FLTBCTFL            2
503     05 00266    0000    N                   DW      FLTBCLRM            3
504     05 00268    0000    N                   DW      PROG2SJM
505     05 0026A    0000    N                   DW      PSCBSTBY
506     05 0026C    0000    N                   DW      XMMBSTBY
507     05 0026E    0000    N                   DW      JAMBRST
508     05 00270    0000    N                   DW      KEYBCNTR
509     05 00272    0000    N                   DW      TSTBLPB
510     05 00274    84C2    N                   DW      NRDY;CHG           TEST IF OK TO
511     05 00276    FF01    N                   DW      STAT;CHG                         LEAVE NOT READY
512     05 00278    FFFF    A                   DW      X'FFFF'            END OF TABLE
514     05 0027A    C0C000  N           NRDY;EPL COBIT,5 WAITB             INSURE WAIT OFF AT NRDY EXIT
        05 0027D    E3FE    A
517     05 0027F    AF      A                   CFLG    STRT;POT           DIS-ABLE TRANSFER TO 'PRINT'
        05 00280    325BF4  A
518     05 00283    C9      A           RET
520
521                                     *
522                                     *       SUBR FOR 'NOT-READY' 100MS SYNC BKGND
523                                     *       TESTS FOR CHANGE TO 'READY' OR 'TREP REP'
524     05 00284    CDCF05  N           NRDY;CHG CALL   TREP;CHG           TEST FOR STATE CHANGE TO 'TREP
525     05 00287    7E      A                   IF:     XBYT,H,'E,'TREP    DID IT CHANGE TO 'TREP STATE
        05 00288    FE01    A
        05 0028A    CA9302  N
526                                             ID;READ  STATE:
527     05 0028D    CD9402  N                   CALL    RDYTEST:           TEST ALL 'READY' FLAGS
528     05 00290    CD0B03  N                   CALL    NRDY;RDY           MOVE TO EITHER INRDY OR IRDY
529                                             ENDIF
530     05 00293    C9      A           RET
532
533                                     *       SUBR TO TEST ALL 'READY' FLAGS IN A LOOP
```

```
534
535  05 0294    2184F7    A    RDYTEST1 LXI       H,RDYFLGS1            H&L= START ADDR OF READY FLAGS
536  05 0297    0609      A             MVI       B,RDYFNUM1            B= # OF READY FLAGS TO CHK
537                                     REPEAT
538  05 0299    7E        A             MOV       A,M                   A= <PRESENT READY FLAG>
539  05 029A    07        A             RLC                             SET C IF FLAG SET (READY)
540  05 029B    DAA002    N             IFI       CC,C,C                IS PRESENT FLAG INDICATING RDY
541  05 029E    0601      A                       MVI       B,1         NO, DON'T TEST ANY FURTHER
542                                     ENDIF
543  05 02A0    23        A             INX       H                     MOVE TO NEXT FLAG LOCATION
544  05 02A1    05        A             DCR       B                     DECRM LOOP CNTR (# READY FLAGS)
545  05 02A2    C29902    N             UNTIL:    CC,Z,S                LOOP UNTIL ALL FLAGS CHKED
546                                     IDIREAD   LENS&RDY,ELV&RDY,FUS&RDY,;    FLAGS READ
547                                               PROG&RDY,ILCK&RDY,XMM&RDY,;
548                                               FLT&RDY,ADH&NMOV,SRT&RDY
549  05 02A5    C9        A             RET                             RETURN
551                              *NAR
552                              *
553                              *        READY   STATE
554                              *
555                              *        READY STATE- EXECUTES WHEN MACHINE IS READY TO GO INTO PRINT STATE,
556                              *        CONTROL CAN GO BACK TO 'NOT READY' OR GO TO 'TECH REP' IF REQUIRED,
558                              *        PROLOG
560  05 02A6    C00000    N    RDY1PRL  SOBIT,S   READY&
     05 02A9    E701      A
561  05 02AB    CDA901    N             CALL      SB;PNTRS              SYNC BKG PNTRS TO NEW STATE
562  05 02AE    C9        A             RET
564                              *        CALLS FOR READY 10MS SYN BACKGROUND
566  05 02AF    C00000    N    RDY10    CALL      ADH&CTRL
567  05 02B2    C9        A             RET
569                              *        CALLS FOR READY 20MS SYN BACKGROUND
571  05 02B3    0000      N    RDY20    DW        RDY&SWS
572  05 02B5    0000      N             DW        MN&ELV&S
573  05 02B7    0000      N             DW        DSPL&CTL
574  05 02B9    0000      N             DW        LMP&CTRL
575  05 02BB    0000      N             DW        INSTRU
576  05 02BD    FFFF      A             DW        X'FFFF'               END OF TABLE
578                              *        CALLS FOR READY 100MS SYN BACKGROUND
580  05 02BF    0000      N    RDY100   DW        BIN&CHK               1
581  05 02C1    0000      N             DW        MINIPHS1              2
582  05 02C3    0000      N             DW        BIL&JMP&
583  05 02C5    0000      N             DW        NVL&DUMP
584  05 02C7    0000      N             DW        RECAPEP
585  05 02C9    0000      N             DW        FUS&ROUT
586  05 02CB    0000      N             DW        FLT&100               1
587  05 02CD    0000      N             DW        FLT&CTRL              2
588  05 02CF    0000      N             DW        NRILK&CK
589  05 02D1    0000      N             DW        RED&BG&D
590  05 02D3    0000      N             DW        PSD&STPY
591  05 02D5    0000      N             DW        XMM&STPY
592  05 02D7    0000      N             DW        JAM&RST
593  05 02D9    0000      N             DW        KEY&CNTR
594  05 02DB    0000      N             DW        TST&LP&
595  05 02DD    E9C2      N             DW        RDY1CHG               TEST IF OK TO
596  05 02DF    FFC1      N             DW        STAT1CHG                            LEAVE READY
597  05 02E1    FFFF      A             DW        X'FFFF'               END OF TABLE
599                              *        EPILOG
601  05 02E3    C00000    N    RDY1EPL  COBIT,S   READY&
     05 02E6    E7FE      A
602  05 02E8    C9        A             RET
604                              *        CHANGE OF STATE ROUTINES
606                              *
607                              *        SUBR FOR 'READY' 100MS SYNC BKGND
608                              *        TESTS FOR CHANGE TO 'NOT-READY' OR 'TECH REP'
609                              *
610  05 02E9    CDCF05    N    RDY1CHG  CALL      TREP1CHG              TEST FOR STATE CHANGE TO 1TREP
611  05 02EC    7E        A             IFI       XBYT,M,NE,1TREP       DID IT CHANGE TO 1TREP STATE
     05 02ED    FE01      A
     05 02EF    CA0A03    N
612                                     IDIREAD   STATE1
613  05 02F2    C09402    N             CALL      RDYTEST1              TEST ALL 'READY' FLAGS
614  05 02F5    CD0A03    N             CALL      NRDYIRDY              MOVE TO EITHER INRDY OR IRDY
615  05 02F8    3A5BF4    A             IFI       FLG,STRT1PRT,T        IS START PRINT REQUESTED
     05 02FB    07        A
     05 02FC    D20403    N                       LXI       H,ADR(DATA,STATE1)   SET MEM PNTR
616  05 02FF    2153FD    A                       IFI       XBYT,M,EQ,1RDY       OK TO GO TO PRINT
617  05 0302    7E        A
     05 0303    FE03      A
     05 0305    C20A03    N
618                                               IDIREAD   STATE1
619  05 0308    3604      A                       MVI       M,1PRNT              CHG TO PRT STATE
620                                               IDIALTR   STATE1
621                                     ENDIF
622                                     ENDIF
623                                     ENDIF
624  05 030A    C9        A             RET
626                              *
627                              *        SUBR TO USE INFO FROM 'RDYTEST' AND EXECUTE THE PROPER CHANGE OF STATE
```

```
628
629   05 0030B   2153FD   A   NRDY:RDY  LXI      H,ADR(DATA,STATE!)            SET MEM PNTR
630   05 0030E   3603     A             MVI      M,!RDY                        ASSUME GOING TO 'READY' STATE
631                                     IDIALTR  STATE!
632   05 00310   DA1503   N             IFI      CC,C,C                        ARE ALL 'READY' FLAGS SET
633   05 00313   3602     A             MVI      M,!NRDY                       NO, MOVE TO 'NOT-READY' STATE
634                                     IDIALTR  STATE!
635                                     ENDIF
636   05 00315   C9       A             RET

638                       *WAR
639                       *
640                       *    P R I N T    S T A T E
641                       *
642                       *    PRINT STATE- EXECUTES WHILE MACHINE IS PRODUCING COPIES,
643                       *    ENTERED FROM 'READY' AND EXITS TO 'RUN NOT PRINT'.
645                       *    PROLOG
647   05 00316   2160FE   N   PRNT:PRL  CLR!MEM  16,SHIFTREG                   CLEAR SHIFT REGISTER
      05 00319   0610     A
      05 0031B   C00000   N
648   05 0031E   3E60     A             MVI      A,LADR(DATA,SHIFTREG)         FORCE SHIFT REG TO START AT
649   05 00320   3263FD   A             STA      ADR(DATA,SR!PTR!)             BEGINNING OF SHIFTREG TABLE
650                                     CLR!MEM  SDI@DLY-TIME@DNI+1,,          CLEAR THE FOLLOWING FLAGS
651   05 00323   21A7F4   A                      ADR(FLG,TIME@DNI)
      05 00326   0609     A
      05 00328   C00000   N
652                                     IDICLR   TIME@DN!,IMED@DN!,,
653                                              CYCL@DN!,NORM@DN!,QMIK!OUT!,!
654                                              IMGMADE!,SDI@TIM@,SDI@DLY
655   05 0032B   3E80     A             SFLG     91O9CD@ME                     ALLOW FIRST PITCH RESET
      05 0032D   326FF4   A
656   05 00330   AF       A             XRA      A
657   05 00331   3266FD   N             STA      CYCUPCT!                      ·INIT CYCLE-UP CNTR TO 0
658   05 00334   3269FD   N             STA      SR@VALU!                      INIT 'NEW SR VALUE' TO 0
659   05 00337   3250FA   N             STA      PLL@INFD                      INIT PLL SHUTDOWN CONTROL TO 0
660   05 0033A   326BFD   N             STA      SMPL&CT!                      INIT SAMPLE COPY CNTR TO 0
661   05 0033D   3E03     A             MVI      A,3
662   05 0033F   3267FD   N             STA      NO!MGCT!                      INIT 'NO IMAGE CNTR' TO 3
663   05 00342   C00000   N             CALL     SRSK                          SHIFT REG SCHEDULER (INIT SR#0)
664   05 00345   C00000   N             CALL     TIM@M@D                       CALC SHIFTED IMAGE VALUES    (1)
665   05 00348   C00000   N             ST!MR    935!TMR,810,RETURN!           SET 'OVER-RUN EVENT' TIMER   (2)
      05 0034B   22       A
      05 0034C   51       A
      05 0034D   0000     N
666   05 0034F   CDC0C0   N             CALL     TBLD@PPT
667   05 00352   CD0000   N             S@BIT,S  PRNT@RLY,PR@COOL              BUILD NEW PITCH TABLE        (3)
      05 00355   02       A                                                    PRINT RELAY & COOLING FAN ON
      05 00356   EA08     A
      05 00358   F608     A
668   05 0035A   AF       A             CTIMR    PR@COOL                       CLEAR COOLING FAN TIMER
      05 0035B   3232FA   N
669   05 0035E   CD0000   N             C@BIT,S  NPFO@ON                       TURN OFF PFO (INVERTED DRIVER)
      05 00361   E47F     A
670   05 00363   3AE0F4   A             IFI      FLG,ADH@SELC,T
      05 00366   07       A
      05 00367   D27003   N
671   05 0036A   C00000   N             CALL     ADH@MGTN
672   05 0036D   C37503   N             ELSE!
673   05 00370   3E80     A             SFLG     ADH@NTEN
      05 00372   32CCF4   A
674                                     ENDIF
675   05 00375   C00000   N             CALL     TRMF@@D
676   05 00378   C00000   N             CALL     PAP@SIZE                      CHK PAPER WIDTH FOR FUSER    (1)
677   05 0037B   C00000   N             CALL     EDGEFF@                       CHK WHICH EDGE FADE OUT      (2)
678   05 0037E   C00000   N             CALL     PAP@PPL3
679   05 00381   C00000   N             CALL     PROG@UP                       PROG INITIALIZATION SUBR
680   05 00384   C00000   N             CALL     PROC@UP!
681   05 00387   CDC0C0   N             CALL     FDR@P@T                       CHECK FEEDER SELECTION
682   05 0038A   CD0000   N             CALL     BLG@OKPT                      READ BILLING BREAK-POINTS
683   05 0038D   C0C000   N             CALL     DO@ELV                        CAUSE ELV TO EXECUTE
684   05 00390   3A54F4   A             IFI      FLG,SRT&SEL,T                 IS SORTER BEING USED
      05 00393   07       A
      05 00394   D29F03   N
685   05 00397   C00000   N             CALL     SRT!INIT                      INITIALIZE SORTER JAM DETECT
686                                     MVI      A,MSK(NV@IT,NV@FJAM,,         SETS ALL 4 JAM CONDITIONS
687   05 0039A   3E0F     A                      NV@IMED,NV@LOW@J,NV@UP@J)
688   05 0039C   C3AA03   N             ELSE!
689   05 0039F   3AC9E2   A             RNV!!B   NV@JAM@N                      READ SAVED PREVIOUS SRT JAMS
690                                     MODBYT   A,OR,MSK(NV@IT,,              & SET IMED ON K FOR JAM
691   05 003A2   F603     A                      NV@FJAM,NV@IMED)
692                                     ENDIF
693   05 003A4   32C9E2   A             LNV!!B   NV@JAM@N                      STORE IN CASE OF PWR ON
694                                     IDIALTR  NV@FJAM,NV@IMED,NV@LOW@J,,    SEE ABOVE IF!/ELSE!
695                                              NV@UP@J
696   05 003A7   CDA901   N             CALL     SB!PNTPS                      SYNC BKG PNTRS TO NEW STATE
697   05 003AA   C9       A             RET

699                       *    CALLS FOR PRINT 10 MS SYN BACKGROUND
701   05 003AB   C00000   N   PRNT10    CALL     ADH@CTPL
702   05 003AE   C0C004   N             CALL     PRT!!MD
703   05 003B1   C9       A             RET

705                       *    CALLS FOR PRINT 20 MS SYN BACKGROUND
707   05 003B2   0000     N   PRNT20    DW       PRT@SW@
708   05 003B4   0000     N             DW       TON@DIS
709   05 003B6   0000     N             DW       PAP@TGL3
710   05 003B8   0000     N             DW       LMP@CTPL
```

```
711  05 003BA  0000  N         DW     FCRSBKFD
712  05 003BC  0000  N         DW     SRRTERR
713  05 003BE  0000  N         DW     FLVEPRNT
714  05 003C0  0000  N         DW     SOSBJHOT
715  05 003C2  0000  N         DW     DSPLECTL
716  05 003C4  0000  N         DW     INSTRU
717  05 003C6  FFFF  A         DW     X'FFFF'              END OF TABLE

719                            *      CALLS FOR PRINT 100 MS SYN BACKGROUND 721  05 003C8  0000  N  PRNT100 DW    RILKSCK
722  05 003CA  0000  N         DW     2SDBRUN
723  05 003CC  0000  N         DW     LITESOFF
724  05 003CE  0000  N         DW     XMMSPRNT
725  05 003D0  0000  N         DW     FUSSRDUT
726  05 003D2  0000  N         DW     READYBCK
727  05 003D4  0000  N         DW     JAMBRST
728  05 003D6  0000  N         DW     MINIPHER
729  05 003D8  4F06  N         DW     SMPLRCPY
730  05 003DA  0000  N         DW     RXCYCLDN              STUB IN US IMG
731  05 003DC  0000  N         DW     KEYSCNTR
732  05 003DE  0000  N         DW     YSTBLP4
733  05 003E0  2C04  N         DW     PRTICHG               TEST IF OK TO
734  05 003E2  FF01  N         DW     STATICHG                        LEAVE PRINT
735  05 003E4  FFFF  A         DW     X'FFFF'              END OF TABLE

737                            *      EPILOG 739  05 003E6  CD0000 N PRNTIEPL CALL AXDEPTY              (1)
740  05 003E9  CD0000 N         CALL  FDMREPL3             (2)
741  05 003EC  CD0000 N         CALL  FDASEPL3             (3)
742  05 003EF  CD0000 N         CALL  TRNREPL3
743  05 003F2  CD0000 N         CALL  DVLBNRDY
744                             CBBIT,S FUSSCRPL,FUSSLOAD,ILLMSSPL,,
745  05 003F5  CD0000 N                 FFASIL,EFOS1265,SMPLSCPY,READYS
     05 003F8  07     A
     05 003F9  E6F7   A
     05 003FB  EDFD   A
     05 003FD  F2F7   A
     05 003FF  ECF7   A
     05 00401  EBF7   A
     05 00403  E2FE   A
     05 00405  E7FE   A
746  05 00407  CD0000 N         SBBIT,S NPFOSON            TURN OFF PFO (INVERTED DRIVER)
     05 0040A  E4B0   A
747  05 0040C  AF     A         CFLG    ELVBAUTO           DISABLE AUTO-TRAY SWITCHING
     05 0040D  3222F4 A
748  05 00410  CD0000 N         CALL    PAPSEPL3
749  05 00413  CD1704 N         CALL    ABORT
750  05 00416  C9     A         RET

752                             *
753                             *      SUBROUTINE
754                             *

756  05 00417  F3     A  ABORT  DI                         TURN OFF INTERRUPT SYSTEM
757  05 00418  AF     A         CFLG    TBLDSFIN           SIGNAL NEW PITCH TABLE REQ'D
     05 00419  3250F4 A
758  05 0041C  211937 N         LXI     H,EVBSTBYI         ADDR OF STBY EVENT TABLE
759  05 0041F  2264FD N         SHLD    EVBPTP1            SAVE FOR MACH CLK ROUTINE
760  05 00422  CD0000 N         CBBIT,S BTRSLOAD,PRNTSRLY  UN-LOAD BTR & DROP PRINT RELAY
     05 00425  02     A
     05 00426  E17F   A
     05 00428  EAF7   A
761  05 0042A  FB     A         EI
762  05 0042B  C9     A         RET
764  05 0042C  3A66FD N  PRTICHG IF!    XBYT,CYCUPCT1,EQ,2 CHECK FOR PROLOG 2 OR CYCLE OUT
     05 0042F  FEC2   A
     05 00431  C23C04 N
765  05 00434  3E8C   A         SFLG    PRTSPRO2           YES, SET 'PRINT PROLOG 2' FLAG
     05 00436  3271F4 A
766  05 00439  C37004 N         ORIF!   XBYT,A,EQ,3        NO, IS CYCLE UP CNTR=3
     05 0043C  FEC3   A
     05 0043E  C27004 N
767  05 00441  3A71F4 A         ANDIF!  FLG,PRTSPRO2,T     YES, AND IS PROLOG 2 FLAG SET
     05 00444  07     A
     05 00445  D27004 N
768  05 00448  AF     A         CFLG    PRTSPR2            YES, OR PROLOG 2 AND CLR FLAG
     05 00449  3271F4 A
769                             *
770                             *      PRINT STATE BACKGROUND- PROLOG 2
771                             *
772  05 0044C  CD0000 N         CALL    PAPAPRL2           RETN XPORT OFF IF NOT SIDE 1
773  05 0044F  CD0000 N         CALL    PROGBUP2
774  05 00452  3AADF4 A         IF!     FLG,IMGMADE1,T     HAS 1ST IMAGE BEEN MADE
     05 00455  07     A
     05 00456  D25C04 N
775  05 00459  CD0000 N            CALL PROGBUP            YES, CALL PROG INITIALIZATION
776                             ENDIF
777  05 0045C  3A57FA N         IF!     VBYT,MINIBYTE,NZ   IS MINI-PHYSICAL ACTIVE
     05 0045F  A7     A
     05 00460  CA7004 N
778  05 00463  AF     A         CFLG    DSPLBIST           YES, ENABLE DISPLAY UPDATE
     05 00464  329AF4 A
779  05 00467  3C     A         INR     A                  DISPLAY QUANTITY
780  05 00468  3250FA N         STA     DSPLBST1           COMPLETE
781  05 0046B  3EC6   A         MVI     A,6                SET DOCUMENT TOTAL TO
782  05 0046D  326FFA N         STA     DOCBTOTL           6 FOR AOH DOCUMENT CHECK
783                             ENDIF
784                             ENDIF
```

```
784                                    •      END PROLOG2
785
786
787                                    •
788                                    •      BUILD FLAG BYTE
789                                    •
790
791   05 00470   0608   A                     MVI       B,8                      NUMBER OF FLAGS REQ'D
792   05 00472   AF     A                     XRA       A                        CLEAR A-REG
793   05 00473   57     A                     MOV       D,A                      CLEAR D-REG
794   05 00474   21A9F4 A                     LXI       H,ADR(FLG,IMED&DNI)      STARTING ADDR OF PRTICHG FLAGS
795                                           REPEAT
796   05 00477   7E     A                       MOV     A,M                      LOAD A W/CONTENTS OF FLAG ADDR
797   05 00478   07     A                       RLC                              ROTATE FLAG(D7) INTO CARRY
798   05 00479   7A     A                       MOV     A,D                      LOAD A W/FLAGS BILT INTO BYTE
799   05 0047A   17     A                       RAL                              PUT FLAG IN DO & SHIFT LEFT
800   05 0047B   57     A                       MOV     D,A                      SAVE RESULT IN D-REG
801   05 0047C   23     A                       INX     H                        STEP TO NEXT FLAG
802   05 0047D   05     A                       DCR     B                        DECR NUMBER OF FLAGS REQ'D
803   05 0047E   C27704 N                     UNTIL!    CC,Z,S                   LOOP UNTIL ALL FLAGS IN BYTE
804                                           ID:READ   IMED&DNI,CYCL&DNI,NORM&DNI,,    FLAGS READ
805                                                     DWIK:OUT,IMGMADE,SD1&TIMO,,
806                                                     SD1&DLY,ADH&SELC
807
808                                    •
809                                    •      TEST FOR STATE CHANGE TO IRUNN
810   05 00481   3A67FD N                     LDA       NBIMGCT1                 MOV CURRENT NO IMAGE COUNTER
811   05 00484   5F     A                     MOV       E,A                      TO THE E-REG
812   05 00485   060E   A                     MVI       B,14                     LOOP CNTR FOR STATE CHG TESTS
813   05 00487   21E104 N                     LXI       H,CYC1OUT                TABLE ADDR OF PRTICHG TESTS
814                                           REPEAT
815   05 0048A   7A     A                       MOV     A,D                      MOV FLAG BYTE TO THE A-REG
816   05 0048B   A6     A                     MODBYT    A,AND,M                  MASK FOR DESIRED FLAGS
817   05 0048C   23     A                       INX     H                        STEP TO STATUS TEST
818   05 0048D   AE     A                     MODBYT    A,XOR,M                  TEST FLAG STATUS
819   05 0048E   C29F04 N                     IF!       CC,Z,S                   DID TEST PASS
820   05 00491   23     A                         INX   H                        YES, STEP TO NBIMGCT1 TEST
821   05 00492   7E     A                         IF!   XBYT,E,GE,M              IS NBIMGCT1 AT CORRECT VALUE
      05 00493   BE     A
      05 00494   DA9E04 N
822   05 00497   3E05   A                             MVI      A,IRUNN           YES, CHANGE STATE
823   05 00499   3257FD N                             STA      STATE1            TO RUN NOT PRINT
824   05 0049C   0601   A                             MVI      B,1               FORCE END OF TESTS (EARLY OUT)
825                                                 ENDIF
826   05 0049E   2B     A                           DCX        H                 ADJ PNTR BACK TO NO IMG TEST
827                                                 ENDIF
828   05 0049F   23     A                         INX   H                        STEP OVER NO IMG TEST
829   05 004A0   23     A                       INX     H                        STEP TO MASK FOR NEXT TEST
830   05 004A1   05     A                       DCR     B                        DECR LOOP COUNTER
831   05 004A2   C28A04 N                     UNTIL!    CC,Z,S                   ALL TESTS COMPLETE OR STATE CHG
832
833   05 004A5   7A     A                     MOV       A,D                      MOV FLAG BYTE TO A-REG
834   05 004A6   E662   A                     MODBYT    A,AND,061D5101           MASK AND TEST FOR FLAGS TRUE
835                                           ID:READ   NORM&DNI,CYCL&DNI,SD1&DLY         FROM ABOVE BYTE BUILD
836   05 004A8   CAFF04 N                     IF!       CC,Z,C                   ARE ANY FLAGS TRUE
837   05 004AB   2166FD .A                      LXI     H,ADR(DATA,CYCUPCT1)     PREPARE TO TEST OR MODIFY
838   05 004AE   7E     A                       IF!     XBYT,M,GF,3              HAS PROG PUSHED IT TO 0
      05 004AF   FE03   A
      05 004B1   DAB604 N
839
840   05 004B4   3602   A                         ID:READ   CYCUPCT1
841                                                 MVI       M,2               NO, FORCE CYCLE-UP MODE AGAIN
842                                               ID:ALTR     CYCUPCT1
843   05 004B6   CD0000 N                       ENDIF
      05 004B9   F2F7   A                       COBIT,S   ILLM&SPL               ILLH SPL OFF DURING DEAD CYCLE
844   05 004BB   AF     A
      05 004BC   324CF4 A                       CFLG      SMPL&FLG               CANCEL SAMPLE COPY SEQUENCE
845
846   05 004BF   C9     A                     ENDIF
                                              RET 848
849   05 004C0   3AA9F4 A              PRTIIMD IF!       FLGS,IMED&DNI,AND,,      IS IMEDIATE DOWN REQUESTED
      05 004C3   215DF4 A                                TBLDIFIN,T              AND HAS PROB BEEN DETECTED
      05 004C6   A6     A
      05 004C7   F2D004 N
850   05 004CA   CD1704 N                      CALL     AR@3T
851   05 004CD   C3E004 N                      OR:IF!   FLG,TIMF&DNI,T           IF TIMED DWN REQ'D DROP OUT
      05 004D0   3447F4 A
      05 004D3   07     A
      05 004D4   D2F004 N
852   05 004D7   21E1FF A                      COBIT    BTP&LOAD                 BIAS TRANS ROLL (ASAP)
      05 004DA   3E7F   A
      05 004DC   F3     A
      05 004DD   46     A
      05 004DE   77     A
      05 004DF   F8     A
853                                            ENDIF
854   05 004E0   C9     A                      RET
856
857                                    •
858                                    •
859                                    •              TABLE OF FLAG STATUS TESTS
860                                    •              AND NO IMAGE COUNTER VALUES
861                                    •              USED TO DETERMINE IF STATE
862                                    •              SHOULD CHANGE FROM PRINT TO
863                                    •              RUN NOT PRINT
864                                    •
865                                    •
866                                    •
867                                    •
```

```
868  05 004E1  48    A  CYCIOUT  DB   06103            X 1 X X 0 X X X   00    1
869  05 004E2  40    A           DB   06
870  05 004E3  00    A           DB   0
871  05 004E4  5C    A           DB   061C4103I02      X 1 X 0 1 1 X X   16    2
872  05 004E5  4C    A           DB   06103102
873  05 004E6  10    A           DB   16
874  05 004E7  5C    A           DB   06104103102      X 1 X 0 1 0 X X   11    3
875  05 004E8  4B    A           DB   06103
876  05 004E9  0B    A           DB   11
877  05 004EA  68    A           DB   06105103         X 0 1 X 0 X X X   00    4
878  05 004EB  20    A           DB   05
879  05 004FC  00    A           DB   0
880  05 004ED  75    A           DB   06105104102100   X 0 0 0 X 1 X 0   36    5
881  05 004EE  04    A           DB   02
882  05 004EF  24    A           CB   36
883  05 004F0  75    A           DB   06105104102100   X 0 0 0 X 1 X 1   20    6
884  05 004F1  05    A           DA   02100
885  05 004F2  14    A           DB   20
886  05 004F3  70    A           DB   06105104103102100 X 0 1 0 1 1 X 0  36    7
887  05 004F4  2C    A           DB   05103102
888  05 004F5  24    A           DB   36
889  05 004F6  70    A           DB   06105104103102100 X 0 1 0 1 1 X 1  20    8
890  05 004F7  20    A           CB   05103102100
891  05 004F8  14    A           DB   20
892  05 004F9  75    A           DB   06105104102100   X 0 0 0 X 0 X 0   21    9
893  05 004FA  00    A           DB   0
894  05 004FB  15    A           DB   21
895  05 004FC  70    A           DB   06105104103102100 X 0 1 0 1 0 X 0  21    10
896  05 004FD  2B    A           DB   05103
897  05 004FE  15    A           DB   21
898  05 004FF  75    A           DB   06105104102100   X 0 0 0 X 0 X 1   13    11
899  05 00500  01    A           DB   00
900  05 00501  0D    A           DB   13
901  05 00502  70    A           DB   06105104103102100 X 0 1 0 1 0 X 1  13    12
902  05 00503  29    A           DB   05103100
903  05 00504  00    A           DB   13
904  05 00505  10    A           CB   04                X X X 1 X X X X  11    13
905  05 00506  10    A           DB   04
906  05 00507  0B    A           CB   11
907  05 00508  80    A           DB   07                1 X X X X X X X  00    14
908  05 00509  A0    A           CB   07
909  05 0050A  00    A           DB   0

912                              *NAR
913                              *
914                              *     R U N    N 0 T    P R I N T    S T A T E
915                              *
916                              *     RUN NOT PRINT- EXECUTES WHILE MACHINE IS COMPLETING A COPY RUN.
917                              *     ENTERED FROM 'PRINT' AND EXITS TO 'NOT READY'.
919                              *     PROLOG 921  05 0050B  C00000  N  RUNNIPRL CALL  DOBELV                      CAUSE ELV TO EXECUTE
922  05 0050E  C00000  N           STIMR  RUNNITMR,2500,RUNNBCHG     STAY IN RUNN 2.5 SEC
     05 00511  2F      A
     05 00512  FA      A
     05 00513  7505    N
923  05 00515  CDA901  N           CALL   SBIP4TRS                   SYNC BKG PNTRS TO NEW STATE
924  05 00518  C9      A           RET

926                              *     CALLS FOR RUN NOT PRINT 10 MS SYN BACKGROUND 928  05 00519  CD0000  N  RUNN10   CALL   ADMBCTRL
929  05 0051C  C9      A           RET

931                              *     CALLS FOR RUN NOT PRINT 20 MS SYN BACKGROUND 933  05 0051D  0000    N  RUNN20   DW     RUNNBSWS
934  05 0051F  0000    N           DW     SORTERS
935  05 00521  0000    N           DW     SBSOJMOT
936  05 00523  0000    N           DW     FLV2PRNT
937  05 00525  0000    N           DW     LMPBCTRL
938  05 00527  0000    N           DW     PAPBTGL4
939  05 00529  0000    N           DW     DSPLBCTL
940  05 0052B  0000    N           DW     INSTRU
941  05 0052D  FFFF    A           DW     X'FFFF'                     END OF TABLE

943                              *     CALLS FOR RUN NOT PRINT 100 MS SYN BACKGROUND 945  05 0052F  0000    N  RUNN100  DW     JAMBRST
946  05 00531  0000    N           DW     RILKECK
947  05 00533  0000    N           DW     FUSBRDUT
948  05 00535  0000    N           DW     PSDBRUN
949  05 00537  0000    N           DW     XMMBPRNT
950  05 00539  0000    N           DW     LITEBOFF
951  05 0053B  0000    N           DW     TSTBLP4
952  05 0053D  FF01    N           DW     STATICHG                    TEST IF OK TO LEAVE RUN NOT PRT
953  05 0053F  FFFF    A           DW     X'FFFF'                     END OF TABLE 955  05 00541  CD0000  N  RUNNIEPL CALL   DELBCK                      CALC COPIES DELIVERED
956  05 00544  CD0000  N           CALL   PAPBEPL4                    'RUNNPRT' PAPER PATH MOP UP SUB
957  05 00547  CDC000  N           CALL   MOTBOFF                     TURN OFF SORTER MOTORS
958  05 0054A  C00000  N           CALL   DOBELV                      CAUSE ELV TO EXECUTE
959  05 0054D  AF      A           CFLG   AXFDBFLT                    RESET FOR USE DURING NEXT RUN
     05 0054E  323FF4  A
     05 00551  2123FC  A  CFBIT,P  TFBXMMO                            STOP BLINKING OF XMM 'OTHER'
960  05 00554  3EFE    A
     05 00556  A6      A
     05 00557  77      A
961  05 00558  CD0000  N  COBIT,S  SBSBSMFL
     05 0055B  ECFD    A
```

```
962  05 0055D  CD7805  N          CALL    NVBJAM
963  05 00560  CD0000  N          CALL    RCPBSTPE              STORE RECAP DATA IN RAM
964  05 00563  C00000  N          CALL    ADH3MRTF
965  05 00566  3E0R    A          MVI     A,B
966  05 00568  3295FA  N          STA     CORLCNT               SET COUNTER FOR 7 TIMEOUTS
967  05 0056B  C00000  N          CALL    PR3FAN
968  05 0056E  CD0000  N          CALL    FLT3EPLS              (1)
969  05 00571  CDC000  N          CALL    HIST&FLE              (2) LOG HISTORY DATA FOR RUN
970  05 00574  C9      A          RET                           (3)

972  05 00575  2153F0  N  RUNN@CHG LXI    H,STATE1              SET HEL TO ADDR OF STATE1
973  05 00578  3602    A          MVT     M,INRDY               CHANGE STATE1 TO NOT READY
974                                        IDIALTR STATE1
975  05 0057A  C9      A          RET 977  05 0057B  3A66F4  A  NVBJAM  RFLG    UPBJAM                LOAD A WITH SRT UPPER JAM FLAG
     05 0057E  07      A                                        & SAVE IT IN THE CARRY BIT
978
979  05 0057F  3A36F4  A          LOAFLG  LOWBJAM               LOAD A WITH SRT LOWER JAM FLAG
980  05 005A2  17      A          RAL                           & MOVE CARRY &
981  05 005A3  17      A          RAL
982  05 005A4  07      A          RLC                           LOWBJAM INTO THEIR POSITIONS
983  05 005A5  07      A          RLC
984
985  05 005A6  E60C    A          MODBYT  A,AND,MSK(NVBIT,      MASK FOR DESIRED BITS
986  05 005A8  47      A                  NV3LOW3J,NV3UP3J)
987  05 005A9  3AA9F4  A          MOV     B,A                   & SAVE IT IN THE B-REG
     05 005AC  07      A          IF:     FLG,IMFD3DN1,T        WAS THERE AN IMED ON CONDITION
     05 005AD  029605  N
988  05 005B0  78      A          MOV     A,B                   YES,RESTORE A-REG
989                                        MODBYT A,RR,MSK(NVBIT,NV3FJAM, & SET NV JAM BITS
990  05 005B1  F603    A                           NVBIMED)
991  05 005B3  C3A105  N          ELSE:
992  05 005B6  3A3CF0  A            IF:   FBITS,FDR3AJAM,OR,FDRBMJAM,T IS EITHER JAM CONDITION TRUE
     05 005B9  E60C    A
     05 005BB  CA9F05  N
993  05 005BE  37      A                  STC                   YES,SET CARRY
994                                        ENDIF
995  05 005BF  17      A                  RAL                   ROTATE INTO DO
996  05 005C0  B0      A                  MODBYT  A,OR,B        'OR' IN SRT JAM BITS
997                                        ENDIF
998  05 005C1  32C9E2  A  WNVNI0  NVBJAM@N
999                                        IDIALTR NVBFJAM,NVBIMED,NVBLOWBJ,NVBUP3J
1000 05 005A4  C9      A          RET                           RETURN TO STATE CHECKER
1002                              *NAR
1003                              *
1004                              *       T E C H   R E P   S T A T E
1005                              *
1006                              *       THE TECH REP STATE IS ENTERED WHEN THE SERVICE KEY IS ON IN
1007                              *       'NOT READY' & 'READY' STATES. THIS ALLOWS THE TECH REP TO PERFORM SUCH
1008                              *       TASKS AS ACCESS NON-VOLATILE MEMORY & COMPONENT CONTROL.
1010                              *
1011                              *       PROLOG
1012                              *
1013 05 005A5  CD0000  N  TREP1PRL CBBIT,S WAIT,S                INSURE WAIT OFF AT TREP ENTRANC
     05 005A8  E9FE    A
1014 05 005AA  CD0000  N          CALL    DGN3PRL               DIAGNOSTIC PROLOG
1015 05 005AD  CDA901  N          CALL    SB:PNTRS              SYNC BKG PNTRS TO NEW STATE
1016 05 005B0  C9      A          RET

1019                              *       CALLS FOR TECH REP 10MS SYN BACKGROUND
1021 05 005B1  C00000  N  TREP10  CALL    ADH3CTRL
1022 05 005B4  C9      A          RET

1024                              *       CALLS FOR TECH REP 20MS SYN BACKGROUND
1026 05 005B5  0000    N  TREP20  DW      TREP3SWS
1027 05 005B7  0000    N          DW      MN3FLV3S
1028 05 005B9  0000    N          DW      LMP3CTRL
1029 05 005BB  0000    N          DW      DSPL3CTL
1030 05 005BD  0000    N          DW      DGN3BKG
1031 05 005BF  0000    N          DW      INSTRU
1032 05 005C1  FFFF    A          DW      X'FFFF'               END OF TABLE

1034                              *       CALLS FOR TECH REP 100MS SYN BACKGROUND
1036 05 005C3  0000    N  TREP100 DW      MRILKRCK
1037 05 005C5  0000    N          DW      2S0DSTPY
1038 05 005C7  0000    N          DW      XMM3STPY
1039 05 005C9  0000    N          DW      REDD3GND
1040 05 005CB  0000    N          DW      RIN3CHK
1041 05 005CD  0000    N          DW      JAM3RST
1042 05 005CF  0000    N          DW      DVL3DUMP
1043 05 005D1  0000    N          DW      FUS3RDUT
1044 05 005D3  0000    N          DW      TST3LP4
1045 05 005D5  DF05    N          DW      TREP:CHG              TEST IF OK TO
1046 05 005D7  FF01    N          DW      STAT:CHG                              LEAVE TREP REP
1047 05 005D9  FFFF    A          DW      X'FFFF'               END OF TABLE

1049                              *
1050                              *       EPILOG  (TECH REP STATE)
1051                              *
1052 05 005DB  CD0000  N  TREP:EPL CALL   DGN3EPL               DIAGNOSTIC EPILOG
1053 05 005DE  C9      A          RET

1055                              *       CHANGE OF STATE CHECK
1057 05 005DF  2153F0  A  TREP:CHG LXI    H,ADR(DATA,STATE1)    PREPARE FOR POSSIBLE STATE CHG
1058 05 005E2  7E      A          IF:     XBYT,M,NE,ICOMP       DO NOT CHG STATE IF IN COMP
     05 005E3  FE00    A
```

```
         05 005E5   CAFE05  N
1059     05 005E8   3A49F4  A        IF:      FLG,SERBACT,T         IF SERVICE KEY IS ON AND IF
         05 005EB   07      A
         05 005EC   D2FC05  N
1060     05 005EF   3A20FC  A        ANDIF:   FBIT,DGNBPRTS,F       IN DIAG PRINT PROGRAM
         05 005F2   E6C2    
         05 005F4   C2FC05  N                                       CHG TO TREP STATE
1061     05 005F7   3601    A                 MVI      M,:TREP      IF KEY IS TURNFD OFF
1062     05 005F9   C3FE05  N        ELSE:                          CHG TO NOT READY STATE
1063     05 005FC   36C2    A                 MVI      M,:NRDY
1064                                 ENDIF
1065                                          IO:ALTR  STATE:
1066                                 ENDIF
1067     05 005FE   C9      A        RET
```

TABLE II

```
 96                                  •       FIXED PITCH EVENT TABLE
 97                                  •
 98                                  •       EVENTS MUST BE IN SEQUENTIAL ORDER STARTING
 99                                  •       WITH THE EVENT CLOSES TO PITCH RESET FIRST
100                                  •
101                                  •       THERE CAN BE NO MORE THAN 256 COUNTS BETWEEN EVENTS
102                                  •
103                                  •       FORMAT OF EVENTS FOR EVENT TABLE
104                                  •
105                                  •       EVENT    X,Y,Z
106                                  •       WHERE:
107                                  •       X = ABSOLUTE COUNTS FROM RESET
108                                  •       Y = SHIFT REGISTER NEEDED IN EVENT
109                                  •       Z = EVENT NAME
110                                  •
111                                  •
112                                  •       PITCH EVENTS
113                                  •
114                                          TABLE
115      05 0001E   0200    A                EVENT    2,3,TRN2CURR
         05 00020   03      A
         05 00021   0000    N
116      05 00023   0300    A                EVENT    3,2,ADCBACT
         05 00025   02      A
         05 00026   0000    N
117      05 00028   0400    A                EVENT    4,3,FDR5AFLT
         05 0002A   03      A
         05 0002B   0000    N
118      05 0002D   0700    A                EVENT    7,0,SPLYSBON
         05 0002F   00      A
         05 00030   0000    N
119      05 00032   0800    A                EVENT    8,2,FDR1AXFD
         05 00034   02      A 05 00035   0000    N
120      05 00037   0A00    A                EVENT    10,3,FUSBLOAD
         05 00039   03      A
         05 0003A   0000    N
121      05 0003C   3000    A                EVENT    48,8,DECGBINV        DECISION GATE FOR INVTD COPIES
         05 0003E   08      A
         05 0003F   0000    N
122      05 00041   3600    A                EVENT    54,5,FUSBNTLD        FUSER LOADED TEST
         05 00043   05      A
         05 00044   0000    N
123      05 00046   5500    A                EVENT    85,3,FOR6MFLT
         05 00048   03      A
         05 00049   0000    N
124      05 0004B   5900    A                EVENT    89,2,FDR2MNFD
         05 0004D   02      A
         05 0004E   0000    N
125      05 00050   5D00    A                EVENT    93,8,JAM6BNON        PAPER PATH JAM SW PITCH EVENT
         05 00052   08      A
         05 00053   0000    N
126      05 00055   7600    A                EVENT    118,9,JAMSBINV       PAPER PATH JAM SW PITCH EVENT
         05 00057   09      A
         05 00058   0000    N
127      05 0005A   7800    A                EVENT    120,0,FSHBOFF
         05 0005C   00      A
         05 0005D   0000    N
128      05 0005F   8700    A                EVENT    135,0,PROGBHST       PROG HISTORY FILE UPDATE
         05 00061   00      A
         05 00062   0000    N
129      05 00064   8F00    A                EVENT    143,6,JAM4BCHK       PAPER PATH JAM SW PITCH EVENT
         05 00066   06      A
         05 00067   0000    N
130      05 00069   AA00    A                EVENT    170,10,RET2BCHK      PAPER PATH JAM SW PITCH EVENT
         05 0006B   0A      A
         05 0006C   0000    N
131      05 0006E   CF00    A                EVENT    207,3,SOSBCLN
         05 00070   03      A
         05 00071   0000    N
132      05 00073   D100    A                EVENT    209,2,TRNSCURR
         05 00075   02      A
         05 00076   0000    N
133      05 00078   E300    A                EVENT    227,5,JAM3BCHK       PAPER PATH JAM SW PITCH EVENT
         05 0007A   05      A
         05 0007B   0000    N
134      05 0007D   0901    A                EVENT    265,2,FDR3,EOG       ENABLE AUX FDR WT SENSOR
         05 0007F   02      A
         05 00080   0000    N
```

| | | | | | | |
|---|---|---|---|---|---|---|
| 135 | 05 00082 | 0B01 | A | EVENT | 267,4,JAM2øCHK | PAPER PATH JAM SW PITCH EVENT |
| | 05 00084 | 04 | A | | | |
| | 05 00085 | 0000 | N | | | |
| 136 | 05 00087 | 0E01 | A | EVENT | 270,8,RET1øCHK | PAPER PATH JAM SW PITCH EVENT |
| | 05 00089 | 08 | A | | | |
| | 05 0008A | 0000 | N | | | |
| 137 | 05 0008C | 6901 | A | EVENT | 361,3,TRN3DTCK | |
| | 05 0008E | 03 | A | | | |
| | 05 0008F | 0000 | N | | | |
| 138 | 05 00091 | 6C01 | A | EVENT | 364,2,FDR4MEDG | ENABLE MAIN WT SENSOR |
| | 05 00093 | 02 | A | | | |
| | 05 00094 | 0000 | N | | | |
| 139 | 05 00096 | B901 | A | EVENT | 441,9,JAM6øINV | PAPER PATH JAM SW PITCH EVENT |
| | 05 00098 | 09 | A | | | |
| | 05 00099 | 0000 | N | | | |
| 140 | 05 0009B | C201 | A | EVENT | 450,4,FUSøUNLD | |
| | 05 0009D | 04 | A | | | |
| | 05 0009E | 0000 | N | | | |
| 141 | 05 000A0 | C301 | A | EVENT | 451,2,TRN1ROLL | |
| | 05 000A2 | 02 | A | | | |
| | 05 000A3 | 0000 | N | | | |
| 142 | 05 000A5 | F401 | A | EVENT | 500,0,DPHøSMPL | |
| | 05 000A7 | 00 | A | | | |
| | 05 000A8 | 0000 | N | | | |
| 143 | 05 000AA | 0E02 | A | EVENT | 526,3,TRN4DTCK | |
| | 05 000AC | 03 | A | | | |
| | 05 000AD | 0000 | N | | | |
| 144 | 05 000AF | 1B02 | A | EVENT | 539,0,DVLVøøFF | TURN OFF VAR DFNS DEVELOPERS |
| | 05 000B1 | 00 | A | | | |
| | 05 000B2 | 00C0 | N | | | |
| 145 | 05 000B4 | 5802 | A | EVENT | 600,0,PILøPLØP | TEST FOR PLATEN OPEN (BLG) |
| | 05 000B6 | 00 | A | | | |
| | 05 000B7 | 0000 | N | | | |
| 146 | 05 000B9 | 7602 | A | EVENT | 630,5,INVTRCTL | INVTR GATE & RETURN CONTROL |
| | 05 000BB | 05 | A | | | |
| | 05 000BC | 0000 | N | | | |
| 147 | 05 000BE | 8A02 | A | EVENT | 650,6,DECGøNøN | DECISION GATE FOR NON-INVTD |
| | 05 000C0 | 06 | A | | | |
| | 05 000C1 | 0000 | N | | | |
| 148 | 05 000C3 | 9A02 | A | EVENT | 666,0,JAMøDLY | |
| | 05 000C5 | 00 | A | | | |
| | 05 000C6 | 0000 | N | | | |
| 149 | 05 000C8 | BC02 | A | EVENT | 700,7,JAM5øNøN | PAPER PATH JAM SW PITCH EVENT |
| | 05 000CA | 07 | A | | | |
| | 05 000CB | 0000 | N | | | |
| 150 | 05 000CD | 2003 | A | EVENT | 800,0,PROGMODE | |
| | 05 000CF | 00 | A | | | |
| | 05 000D0 | 0000 | N | | | |
| 151 | 05 000D2 | 2203 | A | EVENT | 802,0,FSHøENB | |
| | 05 000D4 | 00 | A | | | |
| | 05 000D5 | 0000 | N | | | |
| 152 | 05 000D7 | 5003 | A | EVENT | 848,0,DVBøVAR | TURN ON VARIABLE-BIAS DEVELOPER |
| | 05 000D9 | 00 | A | | | |
| | 05 000DA | 0000 | N | | | |
| 153 | 05 000DC | 5203 | A | EVENT | 850,4,SRSKøEV | INIT SRSK & SRT MOTOR |
| | 05 000DE | 04 | A | | | |
| | 05 000DF | 0000 | N | | | |
| 154 | 05 000E1 | 5403 | A | EVENT | 852,0,PECØFFEV | TURN OFF POST EXP, CøRøTRøN |
| | 05 000E3 | 00 | A | | | |
| | 05 000E4 | 0000 | N | | | |
| 155 | 05 000E6 | 8C03 | A | EVENT | 908,0,PECONEV | TURN ON POST EXP COROTRON |
| | 05 000E8 | 00 | A | | | |
| | 05 000E9 | 0000 | N | | | |
| 156 | 05 000EB | 8EC3 | A | EVENT | 910,0,910øEV | |
| | 05 000ED | 00 | A | | | |
| | 05 000EE | 0000 | N | | | |
| 157 | 05 000F0 | 90C3 | A | EVENT | 912,0,DGNøHCNT | |
| | 05 000F2 | 00 | A | | | |
| | 05 000F3 | 0000 | N | | | |
| 158 | 05 000F5 | A703 | A | EVENT | 935,0,ØVERøRUN | |
| | 05 000F7 | 00 | A | | | |
| | 05 000F8 | 0000 | N | | | |
| 159 | | | | ENDTABLE | | |

<u>TABLE III</u>

| | | | | | | |
|---|---|---|---|---|---|---|
| 71 | | | | • | | |
| 72 | | | | • | VARIABLE PITCH EVENT TABLE | |
| 73 | | | | • | | |
| 74 | | 00000001 | | FLSHøBSE | EQU | 1 |
| 75 | | 00000019 | | FØBONHSE | EQU | 25 |
| 76 | | 00000064 | | FØBNFFBS | EQU | 100 |
| 77 | 05 00000 | 0100 | A | RØMØFSH | DW | FLSHøBSE |
| 78 | 05 00002 | 00 | A | | DB | 0 |
| 79 | 05 00003 | 0000 | N | | DW | FSHØON |
| 80 | 05 00005 | 6400 | A | REMØOFF | DW | FØBOFFBS |
| 81 | 05 00007 | 00 | A | | DB | 0 |
| 82 | 05 00008 | 0000 | N | | DW | FØBOFF |
| 83 | 05 0000A | 1900 | A | RØMØON | DW | FØBONBSE |
| 84 | 05 0000C | 00 | A | | DB | 0 |

```
85   05 0000D   0000    N                DW      F0R0N
86   05 0000F   01C0    A    ROM@FSHS    DW      FLSH@BSE
87   05 00011   00      A                DB      0
88   05 00012   0000    N                DW      FSH@ON@S
89   05 00014   6400    A    ROM@0FFS    DW      F0@0FFES
90   05 00016   00      A                DB      0
91   05 00017   0000    N                DW      F0@0FF@S
92   05 00019   1900    A    ROM@0NS     DW      F0@0NBSE
93   05 0001B   00      A                DB      0
94   05 0001C   0000    N                DW      F0@0N@S
95
```

TABLE IV

```
161      00000396                 BASE@CNT  SET    918              #CLK CNTS/PITCH
162      0000038E                 SAFE@CNT  SET    910              MIN # CLK CNTS/PITCH
163
164                         *           PITCH TABLE BUILDER
165                         *
166                         *           BUILD VARIABLE PITCH EVENT TABLE INTO RAM
167                         *           FROM ROM DATA + REDUCTION ADJUST & F0 TRIM
168                         *
169  05 000FA  2A0000   N    TBLD@PRT  LHLD   ROM@FSH            H&L= BASE CNT OF FLASH
170  05 000FD  EB       A              XCHG                      D&E= BASE CNT OF FLASH
171  05 000FE  2A9AFC   N              LHLD   1FLSH@ON           H&L= RED ADJ
172  05 00101  19       A              DAD    D                  H&L= BASE + ADJ
173  05 00102  2244FC   N              SHLD   RAM@FSH            RAM@FSH = BASE + ADJ
174                         *
175  05 00105  2A0500   N              LHLD   ROM@0FF            H&L= BASE CNT OF F0 OFF
176  05 00108  EB       A              XCHG                      D&E= BASE CNT OF F0 OFF
177  05 00109  2A9CFC   N              LHLD   1F0@0FF            H&L= RED ADJ + TRIM ADJ
178  05 0010C  19       A              DAD    D                  H&L= BASE + ADJ
179  05 0010D  2249FC   N              SHLD   RAM@0FF            RAM@0FF = BASE + ADJ
180                         *
181  05 00110  2A0A00   N              LHLD   ROM@0N             H&L= BASE CNT OF F0 ON
182  05 00113  EB       A              XCHG                      D&E= BASE CNT OF F0 ON
183  05 00114  2A9EFC   N              LHLD   1F0@0N             H&L= RED ADJ + TRIM ADJ
184  05 00117  19       A              DAD    D                  H&L= BASE + ADJ
185  05 00118  CDEA02   N              CALL   @N@MOD             CALL MOD ROUTINE TO MOD IF<0
186  05 0011B  224EFC   N              SHLD   RAM@0N             RAM@0N = RESULTS OF ABOVE
187                         *
188  05 0011E  3A31F4   A              IF!    FLG,IMG@SFT,T      IS THERE IMAGE SHIFT
     05 00121  07       A
     05 00122  D25601   N
189  05 00125  3E06     A                MVI    A,6              YES,# OF VAR EVENTS TO USE = 6
190  05 00127  47       A                MOV    B,A              SET UP B-REG FOR LOOP CONTROL
191  05 00128  3262FA   N                STA    TBLD@NUM         STORE # OF VAR EVENTS
192  05 0012B  3D       A                DCR    A                SET UP # OF TIMES TO GO
193  05 0012C  3263FA   N                STA    TBLD@TMP         THRU SORT
194                         *
195  05 0012F  2A0F00   N                LHLD   ROM@FSHS         UPDATE ROM@FSHS TO
196  05 00132  EB       A                XCHG                    INCLUDE RED MODE ADJ + SHIFT
197  05 00133  2AA0FC   N                LHLD   2FLSH@ON         ADJ AND SAVE FOR THE
198  05 00136  19       A                DAD    D                IMAGE SHIFT
199  05 00137  2253FC   N                SHLD   RAM@FSHS         FLASH EVENT
200                         *
201  05 0013A  2A1400   N                LHLD   ROM@0FFS         UPDATE ROM@0FFS TO INCLUDE
202  05 0013D  EB       A                XCHG                    RED MODE ADJ + TRIM ADJ +
203  05 0013E  2AA2FC   N                LHLD   2F0@0FF          SHIFT ADJ AND SAVE
204  05 00141  19       A                DAD    D                FOR THE IMAGE SHIFT
205  05 00142  2258FC   N                SHLD   RAM@0FFS         FADE OUT EVENT
206                         *
207  05 00145  2A1900   N                LHLD   ROM@0NS          UPDATE ROM@0NS TO INCLUDE
208  05 00148  EB       A                XCHG                    RED MODE ADJ + TRIM ADJ +
209  05 00149  2AA4FC   N                LHLD   2F0@0N           SHIFT ADJ
210  05 0014C  19       A                DAD    D
211  05 0014D  CDEA02   N                CALL   @N@MOD           CALL MOD ROUTINE TO MOD IF <0
212  05 00150  2250FC   N                SHLD   RAM@0NS          SAVE THE RESULTS
213                         *
214  05 00153  C36001   N              ELSE:
215  05 00156  3E03     A                MVI    A,3              IF IMAGE SHIFT NOT SET
216  05 00158  47       A                MOV    B,A              #OF VAR EVENTS TO USE = 3

217  05 00159  3262FA   N                STA    TBLD@NUM         SET UP B-REG FOR LOOP CONTROL
218  05 0015C  3D       A                DCR    A                STORE # OF VAR EVENTS & SETUP
219  05 0015D  3263FA   N                STA    TBLD@TMP         #OF TIMES TO GO THRU SORT
220                                   ENDIF
221

440                         *          SUBROUTINE TO DETERMINE IF MODIFIED F0 ON EVENT
441                         *          CLK COUNT IF CLK COUNT RESULTS ARE NEGATIVE OR 0
442                         *
443
444  05 002EA  7C       A    @N@MOD    MOV    A,H                A= MS PART OF ABS CLK COUNT
445  05 002EB  07       A              RLC                       CARRY= SIGN OF ABS CLK COUNT
446  05 002EC  D20203   N              IF!    CC,C,S             IS THE ABS CLK CNT NEG
447  05 002EF  119603   N                LXI    D,BASE@CNT       YES,ADD # CLK COUNTS PER PITCH
448  05 002F2  19       A                DAD    D                TO NEG #
449  05 002F3  11AE03   N                IF!    XWRD,H,GE,SAFE@CNT  IS RESULTS GE SAFE # CLK/PITCH
     05 002F6  C00000   N
     05 002F9  0AFF02   N
450  05 002FC  210100   A                  LXI    H,1            YES,MOVE TO TURN ON LATER
451                                   ENDIF
452  05 002FF  C30F03   N              OR!F!  X&RD,H,EQ,0        IF RESULTS = 0, MOVE LATER IN
     05 00302  110000   A
     05 00305  C00000   N
     05 00308  C20E03   N
453  05 0030B  210100   A                LXI    H,1              PITCH BECUASE EVENT MUST BE > 0
454                                   ENDIF
455  05 0030E  C9       A              RET
456                                   END
```

CONTROL SECTION SUMMARY: 01 00000 PT 0   02 00000 PT 0   03 00000 PT 0   04 0FF04 PT 2
                         05 0030F PT 1
* NO UNDEFINED SYMBOLS
*   ERROR SEVERITY LEVEL: 0
* NO ERROR LINES

TABLE V

```
                                    SORTS VARIABLE RAM EVENT TABLE BY
                                    ABS CLK COUNT & LOWEST ENDS IN EVBRAM

SORTS ONLY 1ST 3 IF NO IMAGE SHIFT, OTHERWISE SORTS ALL 6

258  05 0017E  2144FC  N         LXI      H,EVBRAM                   H&L= ADDR OF TOP OF VAR RAM TBL
259  05 00181  3A63FA  N         WHILE:   XBYT,TBLDBTMP,NE,0         TIMES TO GO THRU OUTER LOOP
     05 00184  FE00    A
     05 00186  CAF001  N
260  05 00189  3253FA  N                  STA      INRLPBCT          INTER LOOP CNT=OUTER LOOP CNT
261  05 0018C  3E80    A                  SFLG     TBLDBIST          SET 1ST FLAG FOR THIS POSITION
     05 0018E  325EF4  A
262  05 00191  2252FB  N                  SHLD     FIXBADDR          ADDR OF POSITION TO FILL
263  05 00194  B7      A                  ORA      A                 CLEAR Z CONDITION BIT
264  05 00195  CAEF01  N                  WHILE:   CC,Z,C
265  05 00198  5E      A                           MOV     E,M       E= LS PART OF ABS CLK COUNT
266  05 00199  23      A                           INX     H
267  05 0019A  56      A                           MOV     D,M       D= MS PART OF ABS CLK COUNT
268  05 0019B  D5      A                           PUSH    D         STORE ABS CLK CNT OF FILL POS
269  05 0019C  3A5EF4  A                           IF:     FLG,TBLDBIST,T   IS IT 1ST TIME FOR THIS POS
     05 0019F  07      A
     05 001A0  D2AE01  N
270  05 001A3  AF      A                               CFLG    TBLDBIST    YES, CLEAR ITS FLAG
     05 001A4  325EF4  A
271  05 001A7  23      A                               INX     H           AND INCREMENT
272  05 001A8  23      A                               INX     H           POINTER TO LS PART OF
273  05 001A9  23      A                               INX     H           ABS CLK COUNT OF NEXT
274  05 001AA  23      A                               INX     H           EVENT
275  05 001AB  C30601  N                           ELSE:
276  05 001AE  2A5CFB  N                               LHLD    VARBADDR    H&L= ADDR
277  05 001B1  23      A                               INX     H           OF LS PART OF
278  05 001B2  23      A                               INX     H           ABS CLK COUNT TO
279  05 001B3  23      A                               INX     H           COMPARE TO FILL
280  05 001B4  23      A                               INX     H           POSITION
281  05 001B5  23      A                               INX     H
282                                                ENDIF
283  05 001B6  225CFB  N                           SHLD    VARBADDR        STORE POINTER TO COMPARE EVENT
284  05 001B9  5E      A                           MOV     E,M             E= LS PART OF COMPARE ABS CLK
285  05 001BA  23      A                           INX     H
286  05 001BB  56      A                           MOV     D,M             D= MS PART OF COMPARE ABS CLK
287  05 001BC  E1      A                           POP     H               H&L= ABS CLK COUNT OF FILL POS
288  05 001BD  E0      A                           IF:     XWRD,D,LT,H     IS CLK OF COMPARE < FILL
     05 001BE  CD0000  N
     05 001C1  D2E501  N
289  05 001C4  2A5CFB  N                               LHLD    VARBADDR    YES, SWITCH THE 2 EVENTS
290  05 001C7  EB      A                               XCHG                D&E= ADDR LOWER CLK VALUE
291  05 001C8  2A52FB  N                               LHLD    FIXBADDR    H&L= ADDR LARGER CLK VALUE
292  05 001CB  3EFB    A                               MVI     A,=5        INITIALIZE LOOP COUNTER TO 5
293  05 001CD  3265FA  N                               STA     TSWBNUM     WHICH = # OF ITEMS TO MOVE
294  05 001D0  B7      A                               ORA     A           CLEAR Z CONDITION BIT
295  05 001D1  CAE501  N                               WHILE:  CC,Z,C
296  05 001D4  1A      A                                       LDAX    D   A= CONTAINS OF COMPARE EVENT
297  05 001D5  46      A                                       MOV     B,M B= CONTAINS OF FILL EVENT
298  05 001D6  77      A                                       MOV     M,A UPDATE FILL POS
299  05 001D7  78      A                                       MOV     A,B UPDATE COMPARE POS
300  05 001D8  12      A                                       STAX    D   WITH NEW VALUE
301  05 001D9  13      A                                       INX     D   MOVE POINTERS TO
302  05 001DA  23      A                                       INX     H   NEXT ITEM
303  05 001DB  3A65FA  N                                       LDA     TSWBNUM  INC MOVE
304  05 001DE  3C      A                                       INR     A        LOOP CONTROL
305  05 001DF  3265FA  N                                       STA     TSWBNUM  COUNTER
306  05 001E2  C30101  N                                   ENDWHILE
307                                               ENDIF
308  05 001E5  2153FA  N                           DECBYT  INRLPBCT        DECRM INNER LOOP CNTR
     05 001E8  35      A
309  05 001E9  2A52FB  N                       ENDWHILE
310  05 001EC  C39501  N                       LHLD    FIXBADDR            H&L= ADDR OF FILL POSITION
311  05 001EF  110500  A                       LXI     D,5                 MOVE H&L TO LOOK AT NEXT EVENT
312  05 001F2  19      A                       DAD     D                   POSITION TO FILL
313  05 001F3  3A63FA  N                       LDA     TBLDBTMP            DECREMENT # OF EVENTS
314  05 001F6  3D      A                       DCR     A                   TO SORT
315  05 001F7  3263FA  N                       STA     TBLDBTMP
316  05 001FA  C38101  N                   ENDWHILE
```

TABLE VI

```
                                    MOVE THE SR# & EVENT ADDR FROM ROM TABLE
                                    TO RAM TABLE. MOVES ONLY THE FIRST 3 IF
                                    NO IMAGE SHIFT, OTHERWISE MOVES ALL 6

228  05 00160  1144FC  N         LXI      D,RAMBFSH                  D&E = ADDR OF RAM TABLE
229  05 00163  210000  N         LXI      H,ROMBFSH                  H&L = ADDR OF ROM TABLE
230  05 00166  B0      A         ORA      A                          CLEAR Z CONDITION BIT
231  05 00167  CA7E01  N         WHILE:   CC,Z,C
232  05 0016A  23      A                  INX     H
233  05 0016B  23      A                  INX     H                  INCREMENT H&L AND D&E
234  05 0016C  13      A                  INX     D                  POINTERS OVER THE
235  05 0016D  13      A                  INX     D                  ABS CLK COUNT
236  05 0016E  7E      A                  MOV     A,M
237  05 0016F  12      A                  STAX    D                  LOAD A WITH SR#
238  05 00170  23      A                  INX     H                  STORE SR# IN RAM TABLE
                                                                     MOVE POINTERS TO LS
```

```
239  05 00171  13      A          INX     D              ADDR OF EVENT
240  05 00172  7C      A          MOV     A,H            LOAD A WITH LS ADDR OF EVENT
241  05 00173  12      A          STAX    D              & STORE IT IN RAM TABLE
242  05 00174  23      A          INX     H              MOVE POINTERS TO MS
243  05 00175  13      A          INX     D              ADDR OF EVENT
244  05 00176  7E      A          MOV     A,M            MOVE MS ADDR OF EVENT
245  05 00177  12      A          STAX    D              TO RAM
246  05 00178  23      A          INX     H              MOVES POINTERS TO
247  05 00179  13      A          INX     D              LS PART OF ABS CLK COUNT
248  05 0017A  05      A          DCR     B              DECREMENT LOOP COUNTER
249  05 0017B  C36701  N          ENDWHILE
250                            .
                                                   TABLE VII
318                            .
319                            .          MERGE VARIABLE PITCH EVENT TABLE & FIXED EVENT
320                            .          TABLE CALCULATING THE REL DIFFERENCE WITH THE
321                            .          RESULTS GOING INTO THE RUN EVENT TABLE
322                            .
323  05 001FD  2A44FC  N          LHLD    FV@RAM         INITIALIZE VAR@CLK TO ABS CLK
324  05 00200  225EFB  N          SHLD    VAR@CLK        COUNT OF 1ST VAR PITCH EVENT
325  05 00203  2144FC  N          LXI     H,EV@RAM       INITIALIZE VAR@ADDR TO ADDR OF
326  05 00206  225CFB  N          SHLD    VAR@ADDR       1ST VAR PITCH EVENT
327  05 00209  211E00  N          LXI     H,EV@RAM       INITIALIZE FIX@ADDR TO ADDR OF
328  05 0020C  2252FB  N          SHLD    FIX@ADDR       1ST FIXED PITCH EVENT
329  05 0020F  3E80    A          SFLG    TBLD@1ST       NOTES 1ST EVENT TO RUN TABLE
     05 00211  325EF4  A
330  05 00214  3E2C    A          MVI     A,TABLENUM     INITIALIZE TSW@NUM TO # OF
331  05 00216  3265FA  N          STA     TSW@NUM        EVENTS IN FIXED PITCH TABLE
332  05 00219  2A1E00  N          LHLD    FV@ROM         INITIALIZE ORE WITH ABS CLOCK
333  05 0021C  EB      A          XCHG                   COUNT OF 1ST FIXED EVENT
334  05 0021D  AF      A          CFLG    VAR@DONE       FLAG DENOTES VAR EVENTS
     05 0021E  3259F4  A
335  05 00221  3A59F4  A          WHILE:  FLG,VAR@DONE,F WHILE THERE ARE MORE VAR EVENTS
     05 00224  07      A
     05 00225  DA6F02  N
336  05 00228  2A5EFB  N          IF:     XWRD,VAR@CLK,LE,D  IS VAR CLK CNT <= FIXED CLK CNT
     05 0022B  C0C000  N
     05 0022E  DA3402  N
     05 00231  C25902  N
337  05 00234  2A5CFB  N                  LHLD    VAR@ADDR    YES, H&L= VAR EVENT ADDR
338  05 00237  CD9302  N                  CALL    TBLD@UPD    PLACE VAR EVENT AT END RUN TBL
339  05 0023A  3A62FA  N                  LDA     TBLD@NUM    DECREMENT # OF
340  05 0023D  3D      A                  DCR     A           VARIABLE EVENTS LEFT
341  05 0023E  3262FA  N                  STA     TBLD@NUM    TO MERGE
342  05 00241  C24C02  N                  IF:     CC,Z,S      DID TBLD@NUM GO TO 0
343  05 00244  3E80    A                          SFLG    VAR@DONE    YES,DENOTE NO MORE VAR EVENTS
     05 00246  3259F4  A
344  05 00249  C35602  N                  ELSE:
345  05 0024C  225CFB  N                          SHLD    VAR@ADDR    STORE ADDR OF NEXT VAR EVENT
346  05 0024F  5E      A                          MOV     E,M         UPDATE VAR@CLK TO
347  05 00250  23      A                          INX     H           VALUE OF ABS CLK COUNT
348  05 00251  56      A                          MOV     D,M         OF PRESENT VARIABLE
349  05 00252  EB      A                          XCHG                EVENT
350  05 00253  225EFB  N                          SHLD    VAR@CLK
351                                        ENDIF
352  05 00256  C36602  N                  ELSE:
353  05 00259  2A52FB  N                          LHLD    FIX@ADDR    IF FIXED TABLE CLK COUNT IS
354  05 0025C  CD9302  N                          CALL    TBLD@UPD    LESS THEN VAR TABLE UPDATE THE
355  05 0025F  2252FB  N                          SHLD    FIX@ADDR    RUN TABLE WITH THAT EVENT
356  05 00262  2165FA  N                          LXI     H,TSW@NUM   UPDATE TO NEXT FIXED EVENT
357  05 00265  35      A                          DCR     M           DECREMENT # OF FIXED EVENTS
358                                        ENDIF                      LEFT
359  05 00266  2A52FB  N                  LHLD    FIX@ADDR
360  05 00269  5E      A                  MOV     E,M             UPDATE DBL TO =
361  05 0026A  23      A                  INX     H               ABS CLK CNT VALUE
362  05 0026B  56      A                  MOV     D,M             OF PRESENT FIXED TABLE
363  05 0026C  C32102  N          ENDWHILE
364  05 0026F  3EFF    A          MVI     A,X'FF'         CLEAR Z CONDITION
365  05 00271  B7      A          ORA     A               BIT FOR LOOP
366  05 00272  2A52FB  N          LHLD    FIX@ADDR        NO MORE VAR EVENTS, USE FIXED
367  05 00275  CA8402  N          WHILE:  CC,Z,C          DONE WITH FIXED TABLE 368  05 00278  CD9302  N                  CALL    TBLD@UPD    NO,UPDATE RUN TABLE
369  05 0027B  EB      A                  XCHG                SAVE H&L IN D&E
370  05 0027C  2165FA  N                  LXI     H,TSW@NUM   DECREMENT # OF FIXED
371  05 0027F  35      A                  DCR     M           EVENTS LEFT
372  05 00280  EB      A                  XCHG                RESTORE H&L
373  05 00281  C37502  N          ENDWHILE
374  05 00284  2A58FB  N          LHLD    P@TBL@A             H&L=ADDR OF LAST MS ADDR IN RUN
375  05 00287  2B      A          DCX     H                   MOVE H&L POINTER BACK TO POINT
376  05 00288  2B      A          DCX     H                   AT THE BEGINNING OF THE LAST
377  05 00289  2B      A          DCX     H                   EVENT (OVER@RUN) & STORE IT
378  05 0028A  2264FD  N          SHLD    EV@PTR1             FOR MACH CLK INTERRUPT HANDLER
379  05 0028D  3E80    A          SFLG    TBLD@FIN            DENOTES PITCH TABLE IS COMPLETE
     05 0028F  3250F4  A
380  05 00292  C9      A          RET

382                            .
383                            .          SUBROUTINE TO CALCULATE REL DIFFERENCE BETWEEN
384                            .          2 EVENTS & MOVE REST OF TABLE TO RUN TABLE
385                            .
386  05 00293  3A5EF4  A  TBLD@UPD IF:    FLG,TBLD@1ST,T   THIS IS THE FIRST EVENT
     05 00296  07      A
     05 00297  D2AF02  N
387  05 0029A  AF      A                  CFLG    TBLD@1ST     YES, CLR FLAG TO KEEP OUT
     05 0029B  3259F4  A
                                                               A= LS OF 1ST EVENT ABS CLK CNT
388  05 0029E  7E      A                  MOV     A,M          USED AT PITCH RESET
389  05 0029F  3251FA  N                  STA     EV@1@TIM     E=LS OF 1ST EVENT ABS CLK CNT
390  05 002A2  5F      A                  MOV     E,A          H&L=ADDR OF MS ABS CLK CNT
391  05 002A3  23      A                  INX     H            D=MS OF 1ST EVENT ABS CLK CNT
392  05 002A4  56      A                  MOV     D,M
```

```
393  05 002A5  EB       A    XCHG                        D&E= ADDR OF MS ABS CLK CNT
394  05 002A6  2256F8   N    SHLD    LCLK8CNT            STORE ABS CLK OF 1ST EVENT
395  05 002A9  21E8FE   N    LXI     H,EV&BASE1          H&L = ADDR OF RUN TABLE
396  05 002AC  C3D802   N  ELSE:
397  05 002AF  5E       A    MOV     E,M                 E=LS CLK CNT OF NEW EVENT
398  05 002B0  23       A    INX     H                   H&L= ADDR OF MS ABS CLK CNT
399  05 002B1  56       A    MOV     D,M                 D=MS CLK CNT OF NEW EVENT
400  05 002B2  F5       A    PUSH    H                   SAVE ADDR OF MS ABS CLK CNT
401  05 002B3  2A56F8   N    IF:     XWRD,LCLK8CNT,GE,D  IS LAST CLK CNT GE NEW CLK CNT
     05 002B6  C00000   N
     05 002B9  DAC502   N
402  05 002BC  23       A      INX     H                 H&L= LAST CLK CNT + 1
403  05 002BD  2256F8   N      SHLD    LCLK8CNT          STORE IT FOR NEXT TIME
404  05 002C0  3E01     A      MVI     A,1               PUT THIS EVENT AT THE NEXT CLK
405  05 002C2  C3CC02   N    ELSE:
406  05 002C5  45       A      MOV     B,L               B=LS CLK CNT OF LAST EVENT
407  05 002C6  EB       A      XCHG                      H&L=ABS CLK CNT OF NEW EVENT
408  05 002C7  2256F8   N      SHLD    LCLK8CNT          STORE IT FOR THE NEXT TIME
409  05 002CA  7D       A      MOV     A,L               A=LS CLK CNT OF NEW EVENT
410  05 002CB  90       A      SUB     B                 FIND DIFF (ONLY NEED LS IF CLK
411                                                      CNTS BETWEEN EVENTS <256)
412  05 002CC  D1       A    ENDIF
                             POP     D                   D&E=ADDR OF MS OF CLK OF NEW EV
413  05 002CD  2A58F8   N    LHLD    PBTBL8A             H&L= ADDR OF END OF LAST RUN EV
414  05 002D0  2B       A    DCX     H                   MOVE H&L POINTER
415  05 002D1  2B       A    DCX     H                   TO REL DIFF OF LAST
416  05 002D2  2B       A    DCX     H                   EVENT IN RUN TABLE
417  05 002D3  77       A    MOV     M,A                 MOVE REL DIFF TO RUN TABLE
418  05 002D4  23       A    INX     H                   INCREMENT RUN TABLE
419  05 002D5  23       A    INX     H                   POINTER OVER LAST
420  05 002D6  23       A    INX     H                   EVENT
421  05 002D7  23       A    INX     H
422                        ENDIF
423  05 002D8  23       A    INX     H                   H&L= ADDR OF SR# IN RUN TABLE
424  05 002D9  13       A    INX     D                   D&E= ADDR OF SR#
425  05 002DA  1A       A    LDAX    D                   MOVE SR# FROM TABLE TO
426  05 002DB  77       A    MOV     M,A                 RUN TABLE
427  05 002DC  23       A    INX     H                   MOVE POINTERS TO LS 8 BITS
428  05 002DD  13       A    INX     D                   OF EVENT ADDR
429  05 002DE  1A       A    LDAX    D
430  05 002DF  77       A    MOV     M,A                 MOVE LS 8 BITS OF ADDR
431  05 002E0  23       A    INX     H                   MOVES POINTER TO MS 8 BITS
432  05 002E1  13       A    INX     D                   OF EVENT ADDR
433  05 002E2  1A       A    LDAX    D                   MOVES MS 8 BITS OF ADDR
434  05 002E3  77       A    MOV     M,A 435  05 002E4  2258F8   N    SHLD    PBTBL8A             STORE ADDR OF RUN TABLE
436  05 002E7  13       A    INX     D                   POINTER TO LS 8 BITS OF CLK CNT
437  05 002E8  EB       A    XCHG                        H&L= ADDR OF LS 8 BITS OF CLK
438  05 002E9  C9       A    RET

440                        *
441                        *    SUBROUTINE TO DETERMINE IF MODIFIED FB ON EVENT
442                        *    CLK COUNT IF CLK COUNT RESULTS ARE NEGATIVE OR 0
443                        *
444  05 002EA  7C       A  ONBMBD MOV   A,H              A= MS PART OF ABS CLK COUNT
445  05 002EB  07       A    RLC                         CARRY= SIGN OF ABS CLK COUNT
446  05 002EC  D20203   N    IF:     CC,C,S             IS THE ABS CLK CNT NEG
447  05 002EF  119603   A      LXI     D,BASE8CNT       YES,ADD # CLK COUNTS PER PITCH
448  05 002F2  19       A      DAD     D                TO NEG #
449  05 002F3  118E03   A      IF:     XWRD,H,GE,SAFE8CNT  IS RESULTS GE SAFE # CLK/PITCH
     05 002F6  C00000   N
     05 002F9  DAFF02   N
450  05 002FC  210100   A        LXI     H,1             YES,MOVE TO TURN ON LATER
451                          ENDIF
452  05 002FF  C30E03   N    ORIF:   XWRD,H,EQ,0        IF RESULTS = 0, MOVE LATER IN
     05 00302  110000   A
     05 00305  C00000   N
     05 00308  C20E03   N
453  05 0030B  210100   A      LXI     H,1              Pitch Because Event Must be > 0
454                        ENDIF
455  05 0030E  C9       A    RET
456                        END
```

CONTROL SECTION SUMMARY: 01 00000   PT 0   02 00000   PT 0   03 00000   PT 0   04 OFFD8   PT 2
                         05 0030F   PT 1

* NO UNDEFINED SYMBOLS
* ERROR SEVERITY LEVEL: 0
* NO ERROR LINES

TABLE VIII

```
219
220                        *    PITCH RESET INTERRUPT HANDLER
221

223  06 000F9  FB       A  RSET:   EI                    RE-ENABLE INTERRUPTS
224  06 000FA  F5       A          PUSH    PSW           SAVE A-REG & CONDITION BITS
225  06 000FB  3A50F4   A          IF:     FLG,TBLD8FIN,T  IS PITCH TABLE BUILD FINISHED
     06 000FE  0,       A
     06 000FF  D26201   N
226  06 00102  E5       A          PUSH    H             SAVE H&L
227                                IF:     FLGS,SR8DONE,   YES, IS THERE A NEW SR VALUE
228  06 00103  3A4DF4   A                  AND,910BDONE,T  YES, DID 910 EVENT GET DONE
     06 00106  216FF4   A
     06 00109  A6       A
     06 0010A  F25501   N
229  06 0010D  AF       A          CFLG    910DONE       YES, RESET & MACH CLK TIMING OK
     06 0010E  326FF4   A
230  06 00111  324DF4   A          MODFLG  SR8DONE       CLR FLAG UNTIL NEXT SR EVENT
231  06 00114  2163F0   A          LXI     H,ADR(DATA,SR8PTR)  LOAD RELATIVE
232  06 00117  7E       A          MOV     A,M                   PNTR TO SR #0
```

```
233  06 00118  C60F    A          MODBYT   A,ADD,15                       MOVE PNTR BACK
234  06 0011A  E66F    A          MODBYT   A,AND,SR9ADJ1                         BY 1 (CIRCULAR)
235  06 0011C  77      A          MOV      M,A                            SAVE NEW REL SR PNTR IN SR&PTR1
236  06 0011D  26FE    A          MVI      H,HADR(DATA,SHIFTREG)          H&L= ABS ADDR
237  06 0011F  6F      A          MOV      L,A                                   OF SR #0
238  06 00120  3A69FD  A          LDA      ADR(DATA,SR&VALU1)             A= NEW SR VALUE FROM SRSK
239  06 00123  77      A          MOV      M,A                            UPDATE CONTENTS OF SR#0
240  06 00124  3A51FA  A          LDA      ADR(DATA,MCLK:CNT)             INIT MCLKCNT
241  06 00127  326EFD  A          STA      ADR(DATA,MCLK:CNT)                    TO 1ST EVENT TIME
242  06 0012A  21E8FE  A          LXI      H,ADR(DATA,EVBASE1)            INIT EV&PTR1
243  06 0012D  2264FD  A          SHLD     ADR(DATA,EV&PTR1)                     TO 1ST EVENT ADDR
244                               IF1      FLGS,NORMSDN1,J                IS NORMAL SHUTDOWN REQUESTED
245                                        AND,CYCL&DN1,J                 NO, IS CYCLE-DOWN REQUESTED
246  06 00130  3AA8F4  A                   AND,SD1&DLY,F                  NO, IS PROC DEAD CYCLING
     06 00133  21AAF4  A
     06 00136  B6      A
     06 00137  E1AFF4  A
     06 0013A  B6      A
     06 0013B  FA5201  N          LXI      H,ADR(DATA,CYCUPCT1)           NO, LOAD CYCLE-UP CNTR
247  06 0013E  2166FD  A          IF1      XBYT,M,NE,5                    IS PROC IN CYCLE-UP MODE
248  06 00141  7E      A
     06 00142  FE05    A
     06 00144  CA5201  N                   IF1      XBYT,A,EQ,4           YES, IS IT RDY TO MAKE 1ST IMG
249  06 00147  FE04    A                   SFLG     IMGMADE1              YES, SIGNAL 1ST IMAGE MADE
     06 00149  C25101  N
250  06 0014C  3E80    A
     06 0014E  32ADF4  A
251                                        ENDIF
252  06 00151  34      A                   INR      M                     INCRM CYCLE-UP CNTR (UNTIL= 5)
253                               ENDIF
254                               ELSE1                                   NEW SR VALUE NOT AVAILABLE
255  06 00152  C36101  N          SFLG     IMED&DN1                       REQUEST AN IMED SHUTDOWN
256  06 00155  3E80    A
     06 00157  32A9F4  A
257  06 0015A  2132FD  A          SFBIT,P  E&PRBFLT                       SIGNAL EARLY PITCH RESET FAULT
     06 0015D  3E40    A
     06 0015F  B6      A
     06 00160  77      A
                                  ENDIF
258                               POP      H                              RESTORE H&L
259  06 00161  E1      A          ENDIF
260                               MVI      A,RSETFF1                      RESET PITCH RESET
261  06 00162  3EFE    A          STA      ADR(EQU,RSINTFF1)                     INT FLIP-FLOP
262  06 00164  3200E6  A          POP      PSW                            RESTORE A-REG & CONDITION BITS
263  06 00167  F1      A          RET                                     RETURN TO INTERRUPTED ROUTINE
264  06 00168  C9      A
```

TABLE IX

```
57                                *
58                                * MACHINE CLOCK INTERRUPT HANDLER
59                                *
61       06 00028                 ORIGIN   X'38'                          INTERRUPT TRAP CELL LOCATION 64   06 00038  F5      A    MCLK1 PUSH     PSW                            SAVE A-REG & CONDITION CODES
65   06 00039  3A6EFD  A          LDA      ADR(DATA,MCLK:CNT)             IS THERE
66   06 0003C  3D      A          DCR      A                                     A PITCH
67   06 0003D  C26600  N          IF1      CC,Z,S                                       EVENT TO DO
68   06 00040  E5      A                   PUSH     H                     YES, SAVE
69   06 00041  D5      A                   PUSH     D                                ALL REMAINING
70   06 00042  C5      A                   PUSH     B                                           PEGS
71   06 00043  2A6EFD  A                   LHLD     ADR(DATA,EV&PTR1)     H&L= 1ST LOC OF NEXT PE TO DO
72   06 00046  7E      A                   MOV      A,M                   SAVE RELATIVE DIFFERENTIAL TO
73   06 00047  326EFD  A                   STA      ADR(DATA,MCLK:CNT)       NEXT EVENT (# CLOCK COUNTS)
74   06 0004A  23      A                   INX      H                     MOVE PNTR TO REL SR IN TABLE
75   06 0004B  3A63FD  A                   LDA      ADR(DATA,SR&PTR1)     LOAD REL POSITION OF SR #0
76   06 0004E  86      A                   MODBYT   A,ADD,M               C= LS PORTION OF ADDR OF THE
77   06 0004F  E66F    A                   MODBYT   A,AND,SR9ADJ1            REQUESTED SHIFT REGISTER
78   06 00051  4F      A                   MOV      C,A                      POSITION (FOR USE WITHIN PE)
79   06 00052  06FE    A                   MVI      B,HADR(SHIFTREG)      B&C= ADDR REQUESTED SR POSITION
80   06 00054  0A      A                   LDAX     B                     A= <REQUESTED SR POSITION>
81   06 00055  23      A                   INX      H                     E= LS PORTION OF ADDR OF THE
82   06 00056  5E      A                   MOV      E,M                      REQUESTED PITCH EVENT
83   06 00057  23      A                   INX      H                     D= MS PORTION OF ADDR OF THE
84   06 00058  56      A                   MOV      D,M                      REQUESTED PITCH EVENT
85   06 00059  23      A                   INX      H                     SAVE PNTR TO
86   06 0005A  2264FD  A                   SHLD     ADR(DATA,EV&PTR1)              NEXT PITCH EVENT
87   06 0005D  CD0000  N                   CALL     DELIND                VECTOR TO REQUESTED PITCH EVENT
88   06 00060  C1      A                   POP      B                     RESTORE
89   06 00061  D1      A                   POP      D                             SAVED
90   06 00062  E1      A                   POP      H                                    REGISTERS
91   06 00063  C37000  N          ELSE1
92   06 00066  326EFD  A                   STA      ADR(DATA,MCLK:CNT)    NO PE, SAVE DECRM'D 'MCLKCNT'
93   06 00069  0F      A                   RRC                            IS IT TIME FOR
94   06 0006A  D27000  N                   IF1      CC,C,S                        A REFRESH
95   06 0006D  3202E6  A                            REFRESH               YES, REFRESH REMOTES (1 MSEC)
96                                         ENDIF
97                                ENDIF
98   06 00070  FB      A          EI                                      RE-ENABLE INTERRUPT SYSTEM
99   06 00071  3EFD    A          MVI      A,MCLKFF1                      RESET MCLK
100  06 00073  3200E6  A          STA      ADR(EQU,RSINTFF1)                    INTERRUPT FLIP-FLOP
101  06 00076  F1      A          POP      PSW                            RESTORE A-REG & CONDITION CODES
102  06 00077  C9      A          RET                                     RETURN TO INTERRUPTED ROUTINE
```

TABLE X

```
139
140                              * REAL TIME CLOCK INTERRUPT HANDLER
141                              *
143   06 00081   F8      A   RTC: EI                                    RE-ENABLE INTERRUPTS
144   06 00082   F5      A        PUSH    PSW                           SAVE A-REG & CONDITION BITS
145   06 00083   3EF7    A        MVI     A,RTCFF:                      RESET RTC
146   06 00085   3200E6  A        STA     ADR(EQU,RSINTFF:)                    INTERRUPT FLIP-FLOP
147   06 00088   D5      A        PUSH    D                             SAVE D&E REGS
148   06 00089   E5      A        PUSH    H                             SAVE H&L REGS
149   06 0008A   C5      A        PUSH    B                             SAVE 'B' REGISTER
150                              *
151   06 0008B   2150FD  N        DECBYT  GLB:TIMR                      DECREMENT THE CLOCK CELL
      06 0008E   35      A
152   06 0008F   7E      A        MOV     A,M                           A = <GLBTIMR>  ( 0 TO 255 )
153   06 00090   23      A        INX     H                             MEM. PTR. TO SB:RQST BYTE
154   06 00091   F601    A        IF:     XBYT,A,AND,X'01',NZ           IS IT 20 MSEC TIME YET
      06 00093   CA9D00  N
155   06 00096   7E      A            MODBYT  M,BR,10:RQST+20:RQST      YES - BOTH 10 AND 20 BKGD
      06 00097   F6C0    A
      06 00099   77      A
156   06 0009A   C3A100  N        ELSE:
157   06 0009D   7E      A            MODBYT  M,BR,10:RQST              NO - 10 BKGD ONLY
      06 0009E   F680    A
      06 000A0   77      A
158                              ENDIF
159   06 000A1   23      A        INX     H                             MEM. PTR. TO DIV0:10 CNTR
160   06 000A2   35      A        DCR     M                             DECREMENT 10 TO 0 COUNTER
161   06 000A3   C2A000  N        IF:     CC,Z,S                        HAS 100 MSEC PASSED
162   06 000A6   360A    A            MVI     M,10                      YES - RESET THE 10 TO 0 COUNTER
163   06 000A8   2B      A            DCX     H                         MEM. PTR. BACK TO SB:RQST
164   06 000A9   7E      A            MODBYT  M,BR,100:RQST             ADD 100 BKGD TO REQUEST BYTE
      06 000AA   F620    A
      06 000AC   77      A
165                              ENDIF
166                              REPEAT
167   06 000AD   2150FD  N           LXI     H,GLB:TIMR                 NOW CHECK FOR TIME OUTS
168   06 000B0   46      A           MOV     B,M                        LOAD 'B' WITH QUANTITY TO LOOK
169   06 000B1   16FB    A           MVI     D,COUNT:                   FOR (CLOCK CELL VALUE)
170   06 000B3   CD0000  N           CALL    FIND:LOC                   SET 'D' FOR TABLE TO SEARCH
171   06 000B6   CAF000  N           IF:     CC,Z,C                     GO LOOK IN ACTIVE LIST
172   06 000B9   E5      A               PUSH    H                      HAS A MATCH BEEN FOUND
173   06 000BA   26FC    A               MVI     H,ID:                  YES - SAVE LOCATION ON STACK
174   06 000BC   5E      A               MOV     E,M                    SEGWAY MEM PTR TO ID: TABLE
175   06 000BD   1600    A               MVI     D,0                    NOW ASSEMBLE
176   06 000BF   21C8F4  A               LXI     H,TMR:FLGS             ADDRESS OF TIMER
177   06 000C2   19      A               DAD     D                      FLAG INTO THE
178   06 000C3   0600    A               MVI     B,0                    MEMORY POINTER
179   06 000C5   F3      A               DI                             GET SET TO CLEAR THE FLAG
180   06 000C6   7E      A               MOV     A,M                    NO INTERRUPTIONS NOW, PLEASE
181   06 000C7   07      A               RLC                            GET FLAG
182   06 000C8   D2EC00  N               IF:     CC,C,S                 INTO THE CARRY BIT
183   06 000CB   70      A                   MOV     M,B                IS FLAG SET
184   06 000CC   FB      A                   EI                         YES - RESET AND NOW
185   06 000CD   E1      A                   POP     H                  EVERYBODY CAN INTERRUPT AGAIN
186   06 000CE   26FD    A                   MVI     H,LS:ADDR          LOCATION FROM STACK TO MEM PTR
187   06 000D0   5E      A                   MOV     E,M                SEGWAY MEM PTR TO LS: TABLE
188   06 000D1   24      A                   INR     H                  GET LS TIME-OUT ADDRESS
189   06 000D2   56      A                   MOV     D,M                SEGWAY MEM PTR TO MS: TABLE
190   06 000D3   45      A                   MOV     B,L                GET MS TIME-OUT ADDRESS
191   06 000D4   2A5FFD  N                   LHLD    IN:PTR:            LOCATION TO 'B' TEMPORARILY
192   06 000D7   73      A                   MOV     M,E                STUFF TIME-OUT ADDRESS INTO
193   06 000D8   23      A                   INX     H                  INTO TABLE OF TIME-OUT
194   06 000D9   72      A                   MOV     M,D                ADDRESSES THAT IS CHECKED
195   06 000DA   23      A                   INX     H                  FOR ENTRIES EVERY 10 MSECONDS
196   06 000DB   70      A                   MOV     M,B                BY THE STATE CHECKER
      06 000DC   E62F    A                   MODBYT  L,AND,TIMEIMSK     FORCE A CIRCULAR TABLE
      06 000DE   6F      A
197   06 000DF   225FFD  N                   SHLD    IN:PTR:            SAVE NEW ADDRESS LOCATION
198   06 000F2   58      A                   MOV     E,B                LOCATION BACK TO 'E'
199   06 000E3   CD0000  N                   CALL    DEACTIV:           TAKE OUT OF ACTIVE TIMER LIST
200   06 000E6   CD0000  N                   CALL    PUT:               AND MAKE LOCATION AVAILABLE
201   06 000E9   C3EE00  N               ELSE:                          * * * FLAG IS NOT SET SO
202   06 000EC   FB      A                   EI                         LET INTERRUPTIONS OCCUR
203   06 000ED   E1      A                   POP     H                  MAKE THE STACK RIGHT AND
204                                      ENDIF                          FORCE NON-ZERO CONDITION TO
205   06 000EE   F601    A                   MODBYT  A,BR,1             STAY IN UNTIL LOOP
206                                  ENDIF
207   06 000F0   C2A000  N       UNTIL:  CC,Z,S                         * * * NO MATCH - RTC COMPLETE
208                                                                     WILL FALL THROUGH THIS CRACK
209   06 000F3   E1      A        POP     H                             RESTORE THE
210   06 000F4   44      A        MOV     B,H                           'B' REGISTER
211   06 000F5   E1      A        POP     H                             RESTORE H&L REGS
212   06 000F6   D1      A        POP     D                             RESTORE D&E REGS
213   06 000F7   F1      A        POP     PSW                           RESTORE A-REG & CONDITION CODES
214   06 000F8   C9      A        RET                                   RETURN TO 'FLOAT' BACKGROUND
215                              *
```

TABLE XI

MEMORY CHECKSUM COMPARISON TEST

```
38                               *
39                               *
40                               *
41                               *   ADDS THE CONTENTS OF MEMORY & COMPARES
42                               *   IT TO THE CHECK SUM
43   05 00000   AF      A   BUSNORM: XRA     A
44   05 00001   3258E3  A            MOVBYT  NVSERV:1                   CLEAR LOOP TEST NV MEMORY
     05 00004   OF      A
```

```
     05 C0005    0F        A
     05 00006    CF        A
     05 0C007    0F        A
     05 00008    3259E3    A                  CMA                                ACTIVATE ARPM
45   05 0C0C8    2F        A                  MODFLG    ARPMBACT
46   05 C000C    32FFF7    A       SEC@STRT   DI
47   C5 C000F    F3        A                  LXI       H,CHECKSUM               INITIALIZE ADDRESS POINTER
48   05 00010    21F07F    A                  LXI       D,0                      ACCUMULATING CHECKSUM
49   05 00013    110000    A                  MOV       B,D                      REGISTERS SET TO 0
50   05 00016    42        A                  REPEAT
51                                              DCX     H                        POINT TO NEXT ADDRESS
52   05 00017    2B        A                    IF:     XBYT,H,GE,X'80'          IS BYTE POSITIVE OR NEGATIVE
53   05 00018    7E        A
     05 00019    FE80      A
     C5 C001B    DA3100    N                      MODBYT   B,ADD,A               NEGATIVE - SUBTRACT
54   C5 C001E    80        A
     C5 C001F    47        A                      IF:     CC,C,C                 IF NO CARRY
55   05 C0020    DA2E00    N                         MODBYT  E,ADD,X'FF'         ADD X'FF' TO E REG
56   05 C0023    7B        A
     05 C0024    C6FF      A
     05 C0026    5F        A                         IF:   CC,C,C                IF NO CARRY FROM SUM OF E+X'FF'
57   05 00027    DA2E00    N                            MODBYT  D,ADD,X'FF'      ADD X'FF' TO D REG
58   05 C002A    7A        A
     C5 C002B    C6FF      A
     05 C002D    57        A
59                                                 ENDIF
60                                             ENDIF
61   05 C002E    C33700    N                  ELSE:                              POSITIVE - ADDITION
62   05 C0031    80        A                      MODBYT   B,ADD,A               B REG = SUM OF B+A(NEW DATA)
     05 C0032    47        A
63   C5 C0033    D23700    N                      IF:     CC,C,S                 IF CARRY BIT IS SET
64   05 C0036    13        A                         INX    D                    INCREMENT D+E REG
65                                                 ENDIF
66                                             ENDIF
67   05 00037    3E01      A                  MVI       A,1                      RESET WATCHDOG
68   05 00039    3201E6    A                  STA       SS&BYT                   TURN ON LEDS
69   05 C003C    3E00      A                  MVI       A,LED1&LED2&LED3&LED4    ENABLE WATCHDOG
70   05 C003E    3201E6    A                  STA       SS&BYT                   IF ADDRESS NOT ZERO - LOOP
71   05 C0041    7C        A                  UNTIL:    XBYT,H,OR,L,Z
     05 C0042    B5        A
     05 C0043    C21700    N
72   05 00046    2AFD7F    A                  LHLD      CHECKSUM                 LINKER CHECKSUM TO H+L
73   05 00049    7C        A                  IF:       XBYT,H,EQ,E
     05 0004A    BB        A
     05 0004B    C27A00    N
74   05 0C04E    7D        A                  ANDIF:    XBYT,L,EQ,D
     05 C004F    BA        A
     05 CC050    C27A00    N
75   C5 CC053    3AFF7F    A                  ANDIF:    XBYT,CHECKSUM+2,EQ,B
     05 C0056    B8        A
     05 C0057    C27A00    N
76   05 0005A    3AFF7F    A                  IF:       FLG,ARPMBACT,F           IS ARPM DISABLED
     05 C005D    07        A
     05 C005E    DA6A00    N
77   05 00061    3E08      A                  MVI       A,NONE&LED2              YES AND CHECKSUM PASSED WHICH
78   05 C0063    3201E6    A                  STA       SS&BYT                   MEANS ARPM IS BAD
79   05 00066    76        A                  HLT
80   05 00067    C37700    N                  ELSE:
81   05 C006A    3E01      A                  MVI       A,1
82   05 C006C    3201E6    A                  STA       SS&BYT                   RESET WATCHDOG TIMER
83   05 C006F    3201E6    A                  STA       SS&BYT                   INHIBIT WATCHDOG
84   05 00072    3E07      A                  MVI       A,NONE&LED1              PRESET LED1 ON IN CASE RAM TEST
85   05 C0074    3203E6    A                  STA       SS&BYT+2                 GETS LOST
86                                             ENDIF
87   05 00077    C38E00    N                  ORIF:     FLG,ARPMBACT,T           CHECKSUM IS BAD, IS ARPM ACTIVE
     05 0007A    3AFF77    A
     05 C007D    07        A
     05 C007E    D28800    N
88   05 C0081    AF        A                  CFLG      ARPMBACT                 YES, DISABLE ARPM AND
     05 0C082    32FFF7    A                  JMP       SEC@STRT                 DO CHECKSUM AGAIN
89   05 C0085    C3CF00    N                  ELSE:
90   05 00088    C38E00    N                  JMP       CPUBFAIL                 ARPM IS OFF AND CHECKSUM
91   05 C008B    C39304    N                                                     IS BAD SO CPU/MEM PWB BAD
92
93                                             ENDIF
```

TABLE XII

OUTPUT DRIVER STUCK CHECK

```
104                                *     PART 1    CHECK IF ANY OUTPUT DRIVERS ARE STUCK AT '1' OR '0'
105                                *               CHECK IF ANY CELLS ARE STUCK AT '1' OR '0'
106                                *               USES CHECKER BOARD PATTERN
107                                *
108                                *
109                                *                                             INTERRUPTS ARE NOT CONNECT YET
110                                                                              STARTING ADDR OF FLAGS & RAM
111  05 0008E    2100F4    A                  LXI       H,X'F400'                START OF CHECKER BOARD PATTERN
112  05 00091    16AA      A                  MVI       D,X'AA'
113  05 00093    1E55      A                  MVI       E,X'55'
114                                            REPEAT
115  05 00095    72        A                    MOV     H,D                      STORING X'AA' IN EVEN ADDR
116  05 00096    23        A                    INX     H
117  05 00097    73        A                    MOV     H,E                      & X'55' IN ODD ADDR
118  05 00098    23        A                    INX     H
119  05 00099    7C        A                  UNTIL:    XBYT,H,EQ,0              LOOP THRU 2K OF RAM
     05 C009A    FE00      A
     05 0009C    C29500    N                  *
120
```

```
121   05 0009F   01A500   N            LXI      B,$+6           SAVE RETURN ADDR IN B&C
122   05 000A2   C3E204   N            JMP      CHECKCMP        & BRANCH TO SUB-ROUTINE
123   05 000A5   01A800   N            LXI      B,$+6           TEST AGAIN TO BE SURE NO DATA
124   05 000A8   C3E204   N            JMP      CHECKCMP        WAS LOST ON PREVIOUS READ
125
126                              .     FORM THE COMPLEMENT CHECKER BOARD PATTERN
127
128   05 000AB   2100F4   A            LXI      H,X'F400'       STARTING ADDR OF FLAGS & RAM
129   05 000AE   1655     A            MVI      D,X'55'         1ST PART OF CHECKER BOARD
130   05 000B0   1EAA     A            MVI      E,X'AA'         2ND PART OF CHECKER BOARD
131                                    REPEAT
132   05 000B2   72       A               MOV   H,D             STORING X'55' IN EVEN ADDR
133   05 000B3   23       A               INX   H
134   05 000B4   73       A               MOV   H,E             & X'AA' IN ODD ADDR
135   05 000B5   23       A               INX   H
136   05 000B6   7C       A            UNTIL:   XBYT,H,EQ,0     LOOP THRU 2K OF RAM
      05 000B7   FE00     A
      05 000B9   C2B200   N
137
138   05 000BC   01C200   N            LXI      B,$+6           SAVE RETURN ADDR IN B&C
139   05 000BF   C3E204   N            JMP      CHECKCMP        & JMP TO SUB-ROUTINE
140   05 000C2   01C800   N            LXI      B,$+6           TEST AGAIN TO BE SURE NO DATA
141   05 000C5   C3E204   N            JMP      CHECKCMP        WAS LOST ON PREVIOUS READ
142   05 000C8   01CE00   N            LXI      B,$+6           SAVE RETURN ADDR IN B&C
143   05 000CB   C3CEC5   N            JMP      RAMBZERO        JUMP TO CLEAR RAM
145
146                                    PART2
147                              .     CHECK FOR ANY SHORT OR OPEN ADDR LINES
148                              .     OR DECODE PROBLEMS
149
150   05 000CE   1100F4   A            LXI      D,X'F400'       STARTING ADDR OF FLAGS & RAM
151                                    REPEAT
152   05 000D1   3EFF     A               MVI   A,X'FF'         LOAD A-REG WITH NON-ZERO
153   05 000D3   12       A               STAX  D               & STORE IN TEST LOCATION
154   05 000D4   010A00   N               LXI   B,$+6           SAVE RETURN ADDR IN B&C
155   05 000D7   C3C803   N               JMP   ADDRCHK         & JMP TO SUB-ROUTINE
156   05 000DA   AF       A               XRA   A               ZERO PRESENT
157   05 000DB   12       A               STAX  D               TEST LOCATION
158   05 000DC   13       A               INX   D               CHANGE LS & NEXT TO LS ADDR BIT
159                                       REPEAT
160   05 000DD   3EFF     A                  MVI   A,X'FF'      OF SCRATCH PAD RAM ADDR
161   05 000DF   12       A                  STAX  D            STORES X'FF' IN TEST LOCATION
162   05 000E0   01E600   N                  LXI   B,$+6        SAVE RETURN ADDR IN B&C
163   05 000E3   C3C803   N                  JMP   ADDRCHK      & JMP TO TEST SUB-ROUTINE
164   05 000E6   AF       A                  XRA   A
165   05 000E7   12       A                  STAX  D            CLEARS TEST LOCATION
166   05 000E8   7B       A                  MOV   A,E          ROTATES 1 THRU
167   05 000E9   07       A                  RLC                LOWER BYTE OF
168   05 000EA   5F       A                  MOV   E,A          SCRATCH PAD RAM ADDR
169   05 000EB   D20000   N               UNTIL: CC,C,S         LOOP WALKS A 1 THRU LOWER BYTE
170   05 000EE   1E00     A               MVI   E,0             DONE WITH LOWER BYTE OF ADDR
171   05 000F0   14       A               INR   D               CHANGE 1ST BIT IN HIGHER ADDR
172   05 000F1   3EFF     A               MVI   A,X'FF'         LOADS TEST LOCATION
173   05 000F3   12       A               STAX  D               WITH X'FF'
174   05 000F4   01FA00   N               LXI   B,$+6           SAVE RETURN ADDR IN B&C
175   05 000F7   C3C803   N               JMP   ADDRCHK         & JMP TO TEST SUB-ROUTINE
176   05 000FA   AF       A               XRA   A
177   05 000FB   12       A               STAX  D               CLEARS TEST LOCATION
178   05 000FC   14       A               INR   D               CHANGE 2 BITS IN HIGHER ADDR
179   05 000FD   3EFF     A               MVI   A,X'FF'         STORE X'FF'
180   05 000FF   12       A               STAX  D               IN TEST LOCATION
181   05 00100   010601   N               LXI   B,$+6           SAVE RETURN ADDR IN B&C
182   05 00103   C3CA03   N               JMP   ADDRCHK         & JMP TO TEST SUB-ROUTINE
183   05 00106   AF       A               XRA   A
184   05 00107   12       A               STAX  D               CLEARS TEST LOCATION
185   05 00108   14       A               INR   D               INC D-REG OVER LS 2 BITS #1
186   05 00109   14       A               INR   D               INC D-REG TO LS 2 BITS=0
187   05 0010A   7A       A            UNTIL: XBYT,D,LT,X'F4'   LOOP FOR FLAG & RAM ADDR
      05 0010B   FEF4     A
      05 0010D   D20100   N 188   05 00110   3EFF     A            MVI      A,X'FF'         RAM TEST LEAVES ARPM DISABLED
189   05 00112   32FFF7   A            MODFLG   ARPMBACT        RE-ENABLE ARPM
190   05 00115   31E8FE   N            LXI      SP,STKBASE:     INIT STACK PNTR TO HOME
191   05 00118   2153FD   A            LXI      H,STATE:        INIT 'STATE:' TO
192   05 0011B   3606     A            MVI      M,:INIT                                 'INIT' STATE
```

TABLE XIII

```
820
821
822                              .     CHECK CHECKER BOARD PATTERN
823
824   05 004E2   2100F4   A   CHECKCMP LXI      H,X'F4C0'       STARTING ADDR OF FLAGS & RAM
825                                    REPEAT
826   05 004E5   7E       A               MOV   A,M             A-REG = EVEN ADDR FLAG VALUE
827   05 004E6   AA       A               XRA   D               COMPARES WITH WHAT IT SHOULD BE
828   05 004E7   07       A               RLC                   ROTATES MS BIT(FLAG) INTO CARRY
829   05 004E8   DA9304   N               JC    CPUBFAIL        CARRY SET IF BITS WERE .NE.
830   05 004EB   23       A               INX   H               H&L POINT TO NEXT STEP
831   05 004EC   7E       A               MOV   A,M             A-REG = ODD ADDR FLAG VALUE
832   05 004ED   AB       A               XRA   E               COMPARES WITH WHAT IT SHOULD BE
833   05 004EE   07       A               RLC                   ROTATES MS BIT(FLAG) INTO CARRY
834   05 004EF   DA9304   N               JC    CPUBFAIL        CARRY SET IF BITS WERE .NE.
835   05 004F2   23       A               INX   H
836   05 004F3   7C       A            UNTIL:   XBYT,H,GE,X'F8' LOOP THRU 1K OF FLAG
      05 004F4   FEF8     A
      05 004F6   DAE504   N
837
838                                    REPEAT
839   05 004F9   7A       A               MOV   A,D             D-REG=WHAT SHOULD BE AT 1ST ADD
840   05 004FA   BE       A               CMP   M               CHECK 1ST ADDR
841   05 004FB   C29304   N               JNZ   CPUBFAIL        IF IT IS DIFFERENT ABORT TEST
842   05 004FE   2F       A               CMA                   GET READY TO COMPARE NEXT ADDR
843   05 004FF   23       A               INX   H               (COMPLEMENT FOR CHECKER BOARD)
      05 00500   BE       A               CMP   M               COMPARE TO SEE IF MEMORY IS OK
```

```
844   05 00501   C29304  N              JNZ     CPUSFAIL              ABORT TEST IF MEMORY IS WRONG
845   05 00504   23      A              INX     H                     GET READY FOR
846   05 00505   7C      A       UNTIL: XBYT,H,EQ,0                   LOOP THRU 2K OF RAM
      05 00506   FE00    A
      05 00508   C2F904  N
847   05 00508   60      A              MOV     H,B                   LOAD HEL WITH PEE WHICH
848   05 0050C   69      A              MOV     L,C                   IS THE RETURN ADDR &
849   05 0050D   E9      A              PCHL                          RETURN TO CALLING PROGRAM
850                                   .
851                                   .
852                                   .     ZERO 2K SCRATCH PAD RAM & 1K FLAGS
853                                   .
854   05 0050E   2100F4  A       RAMZERO LXI   H,FLGBASE:
855   05 00511   1600    A              MVI     D,0
856                                     REPEAT
857   05 00513   72      A              MOV     M,D
858   05 00514   23      A              INX     H
859   05 00515   7C      A       UNTIL: XBYT,H,EQ,0
      05 00516   FE00    A
      05 00518   C21305  N
860   05 0051B   60      A              MOV     H,B                   LOAD HEL WITH PEE WHICH
861   05 0051C   69      A              MOV     L,C                   IS THE RETURN ADDR &
862   05 0051D   E9      A              PCHL                          RETURN TO CALLING PROGRAM
863                                   .
864                                   .
```

TABLE XIV

ADDRESS CHECK

```
618                                   .
619                                   .     SUB-ROUTINE CHECKS SCRATCH PAD RAM ADDR
620                                   .     OR FLAG RAM ADDR
621                                   .     BY WALKING A 1 THRU ITS ADDR LINES
622                                   .
623   05 003CB   7A      A       ADDR&CHK IF: XBYT,D,LT,X'F8'          IS IT A FLAG ADDR
      05 003CC   FEF8    A
      05 003CE   D21404  N
624   05 003D1   21C0F4  A              LXI     H,X'F4C0'             YES,START AT BEGINNING OF FLAGS
625   05 003D4   7E      A              MOV     A,M                   A=REG CONTAINS OF CHECK LOC
626   05 003D5   07      A              RLC                           CARRY=MS BIT(FLAG) OF CHECK LOC
627   05 003D6   C2E103  N              IF:     CC,C,S                ALL FLAGS SHOULD BE CLEAR, IF
628   05 003D9   31CF03  N                     LXI     SP,$+6         NOT,SAVE RETURN ADDR & JMP TO
629   05 003DC   C36804  N                     JMP     FADDR&C        TEST IF THIS WAS THE TEST LOC
630   05 003DF   62      A                     MOV     H,D            SUB-ROUTINE RETURNS ONLY IF IT
631   05 003E0   6B      A                     MOV     L,E            WAS TEST LOC, THUS RESTORE HEL
632                                            ENDIF                  TO DEE BECAUSE RET USED HEL
633   05 003E1   23      A              INX     H                     CHANGES LS & NEXT TO LS BITS
634                                     REPEAT                        LOOP UNTIL 1 WALKED THRU LOWER
635   05 003E2   7E      A              MOV     A,M                   BYTE OF FLAG ADDR,A=<CHECK LOC>
636   05 003E3   07      A              RLC                           CARRY= FLAG
637   05 003E4   D2EF03  N              IF:     CC,C,S                IF FLAG WAS SET
638   05 003E7   31ED03  N                     LXI     SP,$+6         SAVE RETURN ADDR & JMP TO TEST
639   05 003EA   C36804  N                     JMP     FADDR&C        IF THIS WAS THE TEST LOC
640   05 003ED   62      A                     MOV     H,D            SUB-ROUTINE RETURNS ONLY IF IT
641   05 003EE   6B      A                     MOV     L,E            WAS TEST LOC, THUS RESTORE HEL
642                                            ENDIF                  TO DEE BECAUSE RET USED HEL
643   05 003EF   7D      A              MOV     A,L                   WALK 1 THRU
644   05 003F0   07      A              RLC                           LOWER BYTE OF
645   05 003F1   6F      A              MOV     L,A                   FLAG RAM ADDR
646   05 003F2   D2E203  N       UNTIL: CC,C,S
647   05 003F5   2E00    A              MVI     L,0                   DONE WITH LOWER BYTE
648   05 003F7   24      A              INR     H                     CHANGE LS BIT IN HIGHER ADDR
649   05 003F8   7E      A              MOV     A,M                   A=<CHECK LOC>
650   05 003F9   07      A              RLC                           CARRY= FLAG OF CHECK LOC
651   05 003FA   D20504  N              IF:     CC,C,S                IF FLAG WAS SET
652   05 003FD   310304  N                     LXI     SP,$+6         SAVE RETURN ADDR & JMP TO TEST
653   05 00400   C36804  N                     JMP     FADDR&C        IF THIS WAS THE TEST LOC
654   05 00403   62      A                     MOV     H,D            SUB-ROUTINE RETURNS ONLY IF IT
655   05 00404   6B      A                     MOV     L,E            WAS TEST LOC, THUS RESTORE HEL
656                                            ENDIF                  TO DEE BECAUSE RET USED HEL
657   05 00405   24      A              INR     H                     H=X'F6'
658   05 00406   7E      A              MOV     A,M                   A=<CHECK LOC>
659   05 00407   07      A              RLC                           CARRY = FLAG OF CHECK LOC
660   05 00408   D21104  N              IF:     CC,C,S                IF FLAG WAS SET
661   05 0040B   311104  N                     LXI     SP,$+6         SAVE RETURN ADDR & JMP TO TEST
662   05 0040E   C36804  N                     JMP     FADDR&C        IF THIS WAS THE TEST LOC
663                                            ENDIF                  TO DSE BECAUSE RET USED HEL
664   05 00411   C35F04  N              ELSE:
665   05 00414   2100F8  A              LXI     H,X'F800'             STARTING ADDR SCRATCH PAD RAM
666                                     REPEAT                        LOAD FOR THE DIFFERENT ADD LINE
667   05 00417   AF      A              XRA     A                     CLEARS A-REG
668   05 00418   BE      A              IF:     XBYT,A,NE,M           WAS MEMORY = 0
      05 00419   CA2404  N
669   05 0041C   312204  N                     LXI     SP,$+6         NO, SAVE RETURN ADDR & JMP TO
670   05 0041F   C36204  N                     JMP     ADDR&CHP       TEST IF THIS WAS THE TEST LOC
671   05 00422   62      A                     MOV     H,D            SUB-ROUTINE RETURNS ONLY IF IT
672   05 00423   6B      A                     MOV     L,E            WAS TEST LOC, THUS RESTORE HEL
673                                            ENDIF                  TO DEE BECAUSE RET USED HEL
674   05 00424   23      A              INX     H                     CHANGES LS & NEXT TO LS BITS
675   05 00425   AF      A              XRA     A                     CLEARS CARRY FOR WHILE LOOP
676                                     REPEAT                        LOOP UNTIL 1 WALKED THRU LOWER
677   05 00426   AF      A              XRA     A                     BYTE OF SCRATCH PAD MEMORY ADDR
678   05 00427   BE      A              IF:     XBYT,A,NE,M           IS LOC=0
      05 00428   CA3304  N
679   05 0042B   313104  N                     LXI     SP,$+6         NO, SAVE RETURN ADDR & JMP TO
680   05 0042E   C36204  N                     JMP     ADDR&CHP       TEST IF THIS WAS THE TEST LOC
681   05 00431   62      A                     MOV     H,D            SUBROUTINE RETURNS ONLY IF IT
682   05 00432   6B      A                     MOV     L,E            WAS TEST LOC, THUS RESTORE HEL
683                                            ENDIF                  TO DEE BECAUSE RET USED HEL
684   05 00433   7D      A              MOV     A,L                   WALK 1 THRU
685   05 00434   07      A              RLC                           LOWER BYTE OF
686   05 00435   6F      A              MOV     L,A                   SCRATCH PAD RAM ADDR
```

```
687  05 00436  D22604  N          UNTIL:   CC,C,S                  DONE WITH LOWER BYTE
688  05 00439  2E00    A          MVI      L,0                     CHANGE 1ST BIT OF HIGHER ADDR
689  05 0043B  24      A          INR      H                       CLEAR A-REG
690  05 0043C  AF      A          XRA      A                       WAS TEST LOC = 0
691  05 0043D  BE      A          IF:      XBYT,A,NE,M
     05 0043E  CA4904  N
692  05 00441  314704  N                   LXI      SP,$+6         NO, SAVE RETURN ADDR & JMP TO
693  05 00444  C36204  N                   JMP      ADDR8CHP       TEST IF THIS WAS THE TEST LOC
694  05 00447  62      A                   MOV      H,D            SUB-ROUTINE RETURNS ONLY IF IT
695  05 00448  6B      A                   MOV      L,E            WAS TEST LOC, THUS RESTORE H&L
696                                ENDIF                           TO D&E BECAUSE RET USED H&L
697  05 00449  24      A          INR      H                       CHANGE 2 BITS IN HIGHER ADDR
698  05 0044A  AF      A          XRA      A
699  05 0044B  BE      A          IF:      XBYT,A,NE,M             CHECK FOR LOC = 0
     05 0044C  CA5704  N
700  05 0044F  315504  N                   LXI      SP,$+6         IT WAS = 0,SAVE RETURN ADDR &
701  05 00452  C36204  N                   JMP      ADDR8CHP       JMP TO TEST IF THIS WAS OK
702  05 00455  62      A                   MOV      H,D            SUB-ROUTINE RETURNS ONLY IF IT
703  05 00456  6B      A                   MOV      L,E            WAS TEST LOC, THUS RESTORE H&L
704                                ENDIF                           TO D&E BECAUSE RET USED H&L
705  05 00457  24      A          INR      H                       INC H-REG TO LS 2 BITS= 1
706  05 00458  24      A          INR      H                       INC H-REG TO LS 2 BITS= 0
707  05 00459  7C      A          UNTIL:   XBYT,H,LT,X'F8'
     05 0045A  FEF8    A
     05 0045C  D21704  N
708                      ENDIF
709  05 0045F  60      A          MOV      H,B                     LOAD H&L WITH P&E WHICH
710  05 00460  69      A          MOV      L,C                     IS THE RETURN ADDR &
711  05 00461  E9      A          PCHL                             RETURN TO CALLING PROGRAM
713
714                    .   CHECKS TO SEE IF ADDR WHOSE CONTAINS
715                    .   NOT = 0 IS ADDR UNDER TEST
716                    .
717  05 00462  7E      A  ADDR8CHP IF:     XBYT,M,NE,X'FF'          IS STOP ADDR CONTAINS = X'FF'
     05 00463  FEFF    A
     05 00465  CA6804  N
718  05 00468  C39304  N                   JMP      CPUSFAIL       NO, MUST BE AN ERROR
719                      ENDIF
720
721                    .   ALSO CHECKS TO SEE IF ADDR WHOSE
722                    .   FLAG WAS SET IS ADDR UNDER TEST
723                    .
724  05 0046B  7C      A  FADDR8C  IF:     XBYT,H,NE,D              H MUST EQUAL D OR ITS AN ERROR
     05 0046C  BA      A
     05 0046D  CA7304  N
725  05 00470  C39304  N                   JMP      CPUSFAIL
726                      ENDIF
727  05 00473  7D      A          IF:      XBYT,L,NE,E              L MUST EQUAL E OR ITS AN ERROR
     05 00474  BB      A
     05 00475  CA7804  N
728  05 00478  C39304  N                   JMP      CPUSFAIL
729                      ENDIF
730  05 0047B  210000  A          LXI      H,0                     PLACE RETURN ADDR IN SP-REG
731  05 0047E  39      A          DAD      SP                      INTO H&L & PERFORMS
732  05 0047F  E9      A          PCHL                             A RETURN
```

TABLE XV

```
194                    .
195                    .   NON-VOLATILE MEMORY TEST
196                    .
197                    .
198                    .
199                    .
200                    .
201        00000200        NVMBLEN: EQU    512                     LENGTH OF NVM
202
203  05 00110  3AC8E2  A  NVMBTEST RNVNIB  NVMBTST1                A= <FIRST NVM TEST ADDR>
204  05 00120  47      A           MOV     B,A                     SAVE CONTENTS OF 1ST TEST LOC
205  05 00121  3A55E3  A           RNVNIB  NVMSTST2                A= <OF COMPLEMENT OF NVMBTST1>
206  05 00124  FE0A    A           IF:     XBYT,A,EQ,X'0A'         HAS 2ND TEST LOC RETAIN CONST
     05 00126  C23201  N
207  05 00129  78      A           ANDIF:  XBYT,B,EQ,X'05'         YES, 1ST TEST LOC RATAIN CONST
     05 0012A  FE05    A
     05 0012C  C23201  N
208  05 0012F  C33C01  N           ELSE:
209  05 00132  CD0000  N                   CALL     RESET8NV       PUT INITIAL SETTINGS IN NV
210                    .   DO NOT FIX BATTERY CONSTANTS SO FAILURE RE OCCURS
211                    .   UNTIL DGN 32 IS EXECUTED BY TECH REP
212  05 00135  2132FD  A                   SFBIT,P  NVMBBATF       NVM BATTERY FAILURE
     05 00138  3E02    A
     05 0013A  B6      A
     05 0013B  77      A
213                      ENDIF
214  05 0013C  3AFBE3  A           IF:     NVNIB,NVMTBACT,NZ       YES,NVM TEST ACTIVE WHEN PWR ON
     05 0013F  A7      A
     05 00140  CA5901  N
215  05 00143  CD0000  N                   RNVBYT   LO8NVM         YES,RESTORE THE NIBBLE THAT WAS
     05 00146  FF      A
     05 00147  E3      A
216  05 00148  6F      A                   MOV      L,A            UNDER TEST WHEN PWR WENT DOWN
217  05 00149  3AFDE3  A                   RNVNIB   HI8NVM         TO ITS ORIGINAL VALUE THAT IT
218  05 0014C  E601    A                   ANI      X'01'          (INSURES ADDR WITHIN NVM RANGE)
219  05 0014E  C6E2    A                   ADI      NVMBASE1+*-8   HAD BEFORE TESTING THAT LOC
220  05 00150  67      A                   MOV      H,A            BY GET THE NIBBLE ADDR THAT WAS
221  05 00151  3AFCE3  A                   RNVNIB   SAVEDNIB       UNDER TEST INTO H&L & ITS VALUE
222  05 00154  77      A                   MOV      H,A            FROM NVM & THEN STORE SAVE VAL
223  05 00155  AF      A                   XRA      A              SINCE K19 HAS BEEN RESTORED
224  05 00156  32FBE3  A                   WNVNIB   NVMTBACT       CLEAR PWR ON DURING TEST FLAG
225                      ENDIF
226  05 00159  3E10    A           MVI     A,X'10'                 TEST EACH DATA LINE FOR SHORTS
227  05 00158  21FFE3  A           LXI     H,NVMBASE1+NVMBLEN1-1   TO EACH OTHER BY ROTATING A '1'
228  05 0015E  0F      A           RRC                             THRU THE NIBBLE AT X'E3FF'
229  05 0015F  DA7001  N           WHILE:  CC,C,C
230  05 00162  77      A                   MOV      M,A
```

```
231   05 C0163   BE        A         IF:       XBYT,A,NE,H              IF MEMORY NOT THE SAME AS THE
      C5 00164   CA6C01    N                   MOV      B,A             A-REG SAVE THE A-REG & SET
232   05 C0167   47        A                   JMP      IOP&FAIL
233   05 C0168   C3A004    N                   MOV      A,B
234   05 0016B   78        A         ENDIF
235                                            RRC
236   C5 0016C   OF        A         ENDWHILE
237   05 0016D   C35F01    N         MVI       B,4                      # OF LOC RESERVED FOR NVM TEST
238   05 C0170   0604      A         BRA       R                        CLEAR Z CONDITION BIT
239   05 C0172   80        A         REPEAT
240                                            CALL     TEST&NIB        WITHOUT SETTING THE NVMT&ACT
241   05 00173   C01E05    N         DCX       H                        FLAG
242   05 00176   23        A         DCR      B
243   05 00177   05        A         UNTIL:    CC,Z,S                   TEST THE 4 NUM RESERVE LOC
244   05 00178   F27301    N         WHILE:    XBYT,H,GE,NVMBASE+++-8   LOOP FOR ALL NVM LOCATIONS
245   05 C017B   7C        A
      05 0C17C   FEE2      A
      05 0017E   DAA801    N                   MOV      A,M             SAVE NIB IN TEST LOC
246   05 00181   7E        A                   WNVNIB   SAVE&NIB        IN SAVE&NIB NVM LOC
247   05 C0182   32FCE3    A                   MOV      A,L             SAVE LS BYTE OF TEST ADDR (L)
248   05 00185   7D        A                   WNVBYT   L&DNVM
249   05 00186   32FEE3    A
      05 00189   OF        A
      C5 0018A   OF        A
      05 C018B   OF        A
      05 J018C   OF        A
      05 0018D   32FFE3    A                                             FIND MS BYTE OF THE REL TEST
250   05 00190   7C        A         MOV       A,H                      ADDR & SAVE IT AS A NIBBLE
251   05 00191   33FDE3    A         WNVNIB    HIENVM                   SET BIT TO INDICATE THAT THE
252   05 00194   3E01      A         MVI       A,1                      TEST ADDR HAS BEEN SAVED
253   05 00196   32F8E3    A         WNVNIB    NVMT&ACT                 TEST ADDR UNDER TEST
254   05 00199   C01E05    N         CALL      TEST&NIB                 RESTORE ADDR UNDER TEST TO
255   05 0C19C   3AFCE3    A         RNVNIB    SAVE&NIB                 ORIGINAL VALUE
256   05 C019F   77        A         MOV       M,A                      CLEAR BIT TO INDICATE TEST ADDR
257   05 C01C0   AF        A         XRA       A                        CONTENTS HAS BEEN RESTORED
258   05 001A1   32F8E3    A         WNVNIB    NVMT&ACT                 DEC TO NEXT TEST LOC
259   05 C01A4   2B        A         DCX       H
260   05 001A5   C17B01    N         ENDWHILE
```

PART II

```
856                                             *
867                                             *
868                                             *         SUBROUTINE TO CHECK NVM FOR STUCK @ '0' & STUCK @'1'
869                                             *
870   05 0051E   3E0F      A         TEST&NIB MVI       A,X'OF'        LS NIBBLE = ALL 1'S
871   05 00520   77        A                   MOV      M,A            STORE IT IN LOC UNDER TEST
872   05 00521   BE        A                   IF:      XBYT,A,EQ,M    DOES MEMORY REMEMBER 1'S
      05 00522   C22C05    N
873   05 00525   BE        A                   ANDIF:   XBYT,A,EQ,M    A MEMORY RETAINS AFTER 1ST READ
      05 00526   C22C05    N
874   05 0C529   C32F05    N                   ELSE:                   ITS OK
875   05 0052C   C3A004    N                   JMP      IOP&FAIL
876                                             ENDIF
877   05 0052F   AF        A                   XRA      A              CLEAR A-REG TO
878   05 00530   77        A                   MOV      M,A            STORE 0'S IN TEST LOC
879   05 00531   BE        A                   IF:      XBYT,A,EQ,M    DOES MEMORY REMEMBER 0'S
      05 0C532   C23C05    N
880   05 0C535   BE        A                   ANDIF:   XBYT,A,EQ,M    & DOES IT RETAIN AFTER A READ
      05 00536   C23C05    N
881   05 00539   C33F05    N                   ELSE:                   ITS OK
882   C5 0C53C   C3A004    N                   JMP      IOP&FAIL
883                                             ENDIF
884   05 0C53F   C9        A                   RET
885                                             END
```

CONTROL SECTION SUMMARY: 01 00000   PT 0    02 00000   PT 0    03 00000   PT 0    04 OFFD8   PT 2
                         05 00540   PT 1

* NO UNDEFINED SYMBOLS
* ERROR SEVERITY LEVEL: 0
* NO ERROR LINES

TABLE XVI
ADDRESS WRAP AROUND TEST

```
262                                    ***************************************************************
263                                    *
264                                    *    SELF TEST IOPM - FAILURE OF LOOP 1 TESTS RESULT IN A CPU HALT
265                                    *  WITH 'CPU STOP' AND LEDS '1' & '2' ILLUMINATED ON ADVANCED OPERATOR PANEL
266                                    *
267                                    ***************************************************************
268   05 001A8   21E2E5    A         TSTBLP1 LXI      H,STATUS#2-5
269   05 001AB   7E        A                 MOV      A,M              IS I/O SAFE ON
270   05 001AC   07        A                 RLC
271   05 001AD   DA8301    N                 IF:      CC,C,C           SHOULD BE ON FROM END OF CKSUM
272   05 00180   C3A004    N                 JMP      IOP&FAIL
273                                          ENDIF
274   05 00183   01C1E6    A                 LXI      B,SS&BYT
275   05 C0186   AF        A                 XRA      A
276   05 00187   02        A                 STAX     B
277   C5 C0188   7E        A                 MOV      A,M              TURN OFF I/O SAFE
278   05 00189   07        A                 RLC
279   05 0018A   02C001    N                 IF:      CC,C,S           IS I/O SAFE OFF
280   05 00190   C3A004    N                 JMP      IOP&FAIL         SHOULD BE OFF
281                                          ENDIF
282   05 001C0   21CBFE    A                 LXI      H,(MAX&TIME-500)
283   05 001C3   CD8004    N                 CALL     V&DELAY          DELAY 10MS FOR TEST HARDWARE
284   05 001C6   3E01      A                 MVI      A,1
285   05 001C8   02        A                 STAX     B                TURN ON I/O SAFE
286   05 001C9   21CBFE    A                 LXI      H,(MAX&TIME-500)
287   05 001CC   CD8004    N                 CALL     V&DELAY          DELAY 10MS FOR TEST HARDWARE
288   05 001CF   CD8504    N                 CALL     SAFE&PULS        INCREMENT TEST COUNTER TO 1
289   05 001C2   2E07      A                 RIBYT    KYBD&BYT1        READ ANY INPUT BYTE
      05 001C4   CDC000    N
```

```
290   C5 C01C7    EEAA      A          MODBYT    A,XOR,X'AA'
291   05 001C9    5F        A          MOV       E,A
292   05 001DA    CD8804    N          CALL      SAFEPULS                    INCREMENT TEST COUNTER TO 2
293   05 001DD    2E07      A          RIBYT     KYBD#BYT1                   READ ANY INPUT BYTE
      05 001CF    CD0000    N
294   05 001E2    EE55      A          MODBYT    A,XOR,X'55'
295   05 001E4    B3        A          MODBYT    A,OR,E
296   05 001E5    F5        A          PUSH      PSW                         SAVE FAILED BITS FOR LATER
297                                *
298                                *   RIPPLE THROUGH INPUT MATRIX ADDRESS LINES -READ BACK AND COMPARE
299                                *
300   05 001E6    21E7E5    A          LXI       H,STATUS#2                  POINT TO ADDRESS READ BACK
301                                    REPEAT
302   05 001E9    7E        A              MOV       A,M
303   05 001EA    AD        A              MODBYT    A,XOR,L                 READ L REG BACK
304   05 001EB    E6FC      A              IF:       XBYT,A,AND,X'FC',NZ     IS L THE SAME AS READ BACK
      05 001ED    CAF301    N                                                 2LSB'S DON'T CARE-CK I/O SAFE
305                                *
306   05 001F0    C3A004    N                  JMP   IOPSFAIL
307                                        ENDIF
308   05 001F3    7D        A              MODBYT    L,SUB,X'08'             MOVE TO NEXT READ BACK LOCATION
      05 001F4    D6C8      A
      05 001F6    6F        A
309   05 001F7    E618      A              MODBYT    A,AND,X'18'
310   05 001F9    FE18      A              IF:       XBYT,A,EQ,X'18'         HIC-UP OVER STATUS 1 ADDRESS
      05 001FB    C20202    N
311   05 001FE    7D        A                  MODBYT    L,SUB,X'C8'
      05 001FF    D6C8      A
      05 00201    6F        A
312                                        ENDIF
313                                    UNTIL:    XBYT,L,EQ,STATUS#2&X'FF'    STOP WHEN 32 READS COMPLETE
      05 00202    7D        A
      05 00203    FEE7      A
      05 00205    C2E901    N
314                                *
315                                *   ADDRESS WRAP AROUND TEST IS COMPLETE
316                                *
318                                *
319                                *   START LAST BYTE OF REFRESH TEST
320                                *
321   05 00208    21FFFF    A          LXI8BYT   H,DIG&BYT2
322   05 0020B    3600      A          MVI       M,0
323                                    REPEAT
324   05 002C0    11FFE5    A              LXI       D,STATUS#1
325   05 00210    3202E6    A              REFRESH                           SEND OUT LAST BYTE OF REFRESH
326   05 00213    1A        A              LDAX      D                       PUT STATUS1 READ IN ALL
327   05 00214    BE        A              IF:       XBYT,A,NE,M
      05 00215    CA1802    N
328   05 00218    C3A004    N                  JMP   IOPSFAIL
329                                        ENDIF                             BYTE OF REFRESH
330                                *
331                                *   THIS PORTION OF THIS IOP TEST CHECKS OUT THE MOVEMENT OF A SELECTED BIT,
332                                *   DESIGNATED BY THE 3LSB'S OF THE MATRIX ADDRESS, TO D7 LOCATION
333                                *
334   05 0021B    0640      A              MVI       B,X'40'                 SET B TO HAVE D6 MASK
335                                        REPEAT
336   05 0021D    1B        A              DCX       D                       USE STATUS1 ADD TO MOVE BIT TO
337                                *                                         D7 LOCATION
338   05 0021E    7E        A              MOV       A,M
339   05 0021F    A0        A              MODBYT    A,AND,B                 IS TEST BIT 1 OR 0
340   05 00220    7E        A              MOV       A,M                     GET SHIFTED DATA BACK CONDITION
341                                *                                         CODES NOT EFFECTED
342   05 00221    C22902    N              IF:       CC,Z,S
343   05 00224    E67F      A                  ANI   X'7F'                   BIT WAS ZERO, PUT 0 IN D7
344   05 00226    C32802    N              ELSE:
345   05 00229    F680      A                  ORI   X'80'                   BIT WAS 1, PUT 1 IN D7
346                                        ENDIF
347   05 0022B    EB        A              XCHG
348   05 0022C    BE        A              IF:       XBYT,A,NE,M             DOES MODIFIED OUTPUT EQ INPUT
      05 0022D    CA3302    N
349   05 00230    C3A004    N                  JMP   IOPSFAIL
350                                        ENDIF
351   05 00233    EB        A              XCHG
352   05 00234    78        A              MOV       A,B
353   05 00235    0F        A              RRC
354   05 00236    47        A              MOV       B,A                     SHIFT MASKER RIGHT BY 1
355   05 00237    7D        A          UNTIL:    XBYT,E,AND,X'07',Z          UNTIL D0 MOVED TO D7 OK
      05 00238    E607      A
      05 0023A    C21D02    N
356   05 0023D    3AE7E5    A              LDA       STATUS#2                2LSB'S OF STATUS 2 SHOULD EQUAL
357   05 00240    AE        A              XRA       M                       LAST BYTE OF REFRESH
358   05 00241    E603      A              IF:       XBYT,A,AND,X'03',NZ
      05 00243    CA4902    N
359   05 00246    C3A004    N                  JMP   IOPSFAIL
360                                        ENDIF
361   05 00249    35        A              DCR       M                       DECREMENT LAST BYTE OF REFRESH
362   05 0024A    C2CD02    N          UNTIL:    CC,Z,S                      REPEAT 256 TIMES
363                                *
364                                *   LAST BYTE OF REFRESH TEST COMPLETE
365                                *
366                                *   START IOP INTERRUPT TEST
367                                *
```

TABLE XVII

CONTROLLER INTERFACE REFRESH TEST - PART I

```
* ***********************************************************
*                                                           *
*   SELF TEST CONTROLLER INTERFACE - FAILURE OF LOOP 2 TESTS RESULT IN   *
*   A CPU HALT WITH 'CPU STOP' AND LED 3 ILLUMINATED ON ADVANCED OPERATOR PANEL  *
*                                                           *
* ***********************************************************
```

```
376  05 0024D   CD8804    N   TST@LP2  CALL     SAF@PULS           INCREMENT TEST COUNTER TO 3
377  05 00250   21FFFF    A            LXI@BYT  H,DIG#BYT2         TO BE USED AS A COUNTER
378  05 00253   3600      A            MVI      H,0                ZERO E REG FOR FAILED BIT STORE
379  05 00255   1E00      A            MVI      E,0
380
381                                 *  START LAST BYTE OF REFRESH TEST
382                                 *
383                                    REPEAT
384  05 00257   3202E6    A              REFRESH
385  05 0025A   E5        A              PUSH    H
386  05 0025B   2E8F      A              RIBYT   ILK#B1#
     05 0025D   CD0000    N
387  05 00260   E1        A              POP     H
388  05 00261   2F        A              CMA
389  05 00262   AE        A              MODBYT  A,XOR,H            IS READBACK SAME AS OUTPUT
390  05 00263   53        A              MODBYT  E,OR,A             OR IN FAILED BITS
     05 00264   5F        A
391  05 00265   35        A              DCR     H                  DECREMENT LAST BYTE OF REFRESH
392  05 00266   C25702    N            UNTIL:   CC,Z,S              GO AROUND LOOP 256 TIMES
393
394                                 *  LAST BYTE OF REFRESH TEST COMPLETE
395                                 *
396                                 *  START ADDRESS WRAP AROUND TEST
397
398  05 00269   CD8804    N            CALL     SAF@PULS            INCREMENT TEST COUNTER TO 4
399  05 0026C   2E07      A            MVI      L,X'07'             PRESET L WITH LOWEST MATRIX ADD
400                                    REPEAT
401  05 0026E   CD0000    N              RIBYT  L                   READ INPUT BYT WITH ADDRESS
402                                                                 EQUAL TO E4+CONTENTS OF L REG
403  05 00271   AD        A              MODBYT  A,XOR,L            IS READBACK EQUAL TO ADDRESS
404  05 00272   B3        A              MODBYT  E,OR,A             OR IN ADDITIONAL FAILED BITS
     05 00273   5F        A
405  05 00274   70        A              MODBYT  L,SUB,8            MOVE TO NEXT VALID ADDRESS
     05 00275   D608      A
     05 00277   6F        A
406  05 00278   FE07      A            UNTIL:   XBYT,A,EQ,X'07'     COMPLETE 32 INPUT MATRIX READS
     05 0027A   C26E02    N
407
408                                 *  ADDRESS WRAP AROUND TEST COMPLETE
409
```

PART II

```
411                                 *
412                                 *  DECIDE WHICH PWB FAILED IF ANY
413                                 *
414  05 0027D   78        A            MOV      A,E                 GET FAILED BITS FROM STORAGE
415  05 0027E   A7        A            IF:      VBYT,A,NZ           DID SOMETHING IN LOOP 2 FAIL
     05 0027F   CA9802    N
416  05 00282   F1        A              POP    PSW                 YES, SAME BITS FAIL AS AA+55 TS
417  05 00283   F5        A              PUSH   PSW                 KEEP PUSH POP SEQUENCE OK
418  05 00284   2F        A              CMA
419  05 00285   A3        A              MODBYT A,AND,E
420  05 00286   C29502    N              IF:    CC,Z,S              ZERO IF SAME BITS AS LOOP 1
421  05 00289   7B        A              ANDIF: XBYT,E,NE,X'FF'     DID ALL BITS FAIL BOTH TESTS
     05 0028A   FEFF      A
     05 0028C   CA9502    N
422  05 0028F   C3A004    N                JMP  IOP@FAIL            COUPLER ON IOP BAD
423  05 00292   C39802    N              ELSE:
424  05 00295   C3C704    N                JMP  CTLINT@F            CONTROLLER INTERFACE BAD
425                                       ENDIF
426  05 00298   C3A002    N            ELSE:
427  05 0029B   F1        A              POP    PSW                 GET LOOP 1 INFO
428  05 0029C   F5        A              PUSH   PSW                 KEEP PUSH POP SEQUENCE OK
429  05 0029D   C20704    N              JNZ    CTLINT@F            IF ANY LOOP 1 BITS BAD MUST
430                                                                 BE CONTROLLER INTERFACE TEST
431                                                                 CIRCUITRY BAD
432                                    ENDIF
433  05 002A0   F1        A            POP      PSW
434                                 *                               DID LOOP 1 HAVE TROUBLE WITH
435                                 *                               CONSTANTS SUPPLIED BY LOOP 2
436                                 *                               YES BUT OTHER LOOP 2 TESTS
437                                 *                               PASSED SO TEST HARDWARE ON
438  05 002A1   C20704    N            JNZ      CTLINT@F            CONTROLLER INTERFACE BAD
439  05 002A4   AF        A            XRA      A
440  05 002A5   3201E6    A            STA      SS#BYT              TURN OFF IO SAFE
441                                                                 ENABLE WATCHDOG
442  05 002A8   21C8FE    A            LXI      H,(MAX@TIME-500)
443  05 002AB   CD8004    N            CALL     V@DELAY             DELAY 10MS TO RESET TST CNTR
```

TABLE XVIII

```
445  **************************************************************************
446
447                                 *  LOOP 3 SELF TEST VERIFIES DATA TRANSMISSION TO THE DIGIT DISPLAY
448
449  **************************************************************************
450  05 002AE   21FFFF    A   TST@LP3  LXI@BYT  H,DIG#PYT2          SET UP OUTPUT COUNTER
451  05 002B1   AF        A            XRA      A
452  05 002B2   77        A            MOV      M,A                 SET UP OUTPUT MEMORY AS COUNTER
453  05 002B3   11D8FF    A            LXI@BYT  D,LP4#BYT
454  05 002B6   12        A            STAX     D
455  05 002B7   3C        A            INR      A
456  05 002B8   13        A            INX      D                   MOVE TO COMPLEMENT ENABLE
457  05 002B9   12        A            STAX     D                   ENABLE FRONT PANEL REMOTE
458  05 002BA   1E00      A            MVI      E,0
459                                    REPEAT
460  05 002BC   3202E6    A              REFRESH
461  05 002BF   E5        A              PUSH    H
462  05 002C0   2E4F      A              RIBYT   DIG#BYT1            READ LOOP 3 WRAP AROUND
     05 002C2   CD0000    N
463  05 002C5   E1        A              POP     H
464  05 002C6   2F        A              CMA                         INPUTS INVERTED
465  05 002C7   AE        A              XRA     H                   IS READ BACK SAME AS OUTPUT
466  05 002C8   B3        A              MODBYT  E,OR,A              SAVE FAILED BITS IN E REG
     05 002C9   5F        A
```

```
467  05 002CA  35       A                DCR     M                  DECREMENT OUTPUT COUNTER
468  05 002CB  C28C02   N                UNTIL:  CC,Z,S             REPEAT 256 TIMES
469  05 002CE  7B       A                MOV     A,E
470  05 002CF  A7       A                ANA     A                  SET CONDITION CODES
471  05 002D0  C2A604   N                JNZ     MNPLBCK            LOOP 3 BAD USE DISPLAY
```

TABLE XIX

```
473                           ••••••••••••••••••••••••••••••••••••••••••••••••••••••••••••••
474                           •
475                           • LOOP 4 STATIC TEST VERIFIES DATA TRANSMISSION TO THE REMOTE MODULES
476                           •
477                           ••••••••••••••••••••••••••••••••••••••••••••••••••••••••••••••
478  05 002D3  2108FF  A              LXI0BYT  H,LP40BYT
479  05 002D6  36C0    A              MVI      M,0                  SET UP WRAP AROUND AS COUNTER
480  05 002D8  1E00    A              MVI      E,0                  ZERO E REG FOR FAILED BIT STORE
481                                   REPEAT
482  05 002DA  7E      A              MOV      A,M
483  05 002CB  23      A              INX      H                    MOVE TO COMPLEMENT BYTE
484  05 002DC  2F      A              CMA
485  05 002DD  77      A              MOV      M,A                  PUT COMPLEMENT IN MEMORY
486  05 002CE  2B      A              DCX      H                    GO BACK TO ORIGINAL OUTPUT BYTE
487  05 002CF  3202E6  A              REFRESH
488  05 002E2  E5      A              PUSH     H
489  05 002E3  2EF7    A              RI0BYT   REM0RET              READ WRAP AROUND
     05 003E5  C00000  N
490  05 002E8  E1      A              POP      H
491  05 002E9  AE      A              XRA      M                    DOES INPUT AND OUTPUT MATCH
492  05 002EA  B3      A              MOD0BYT  E,OR,A               SAVE FAILED BITS
     05 002EB  5F      A
493  05 002EC  35      A              DCR      M
494  05 002ED  C2DA02  N              UNTIL:   CC,Z,S               REPEAT 256 TIMES
495  05 002F0  7B      A              MOV      A,E
496  05 002F1  E60F    A              MOD0BYT  A,AND,RECAP          RECAP OUTPUT NOT CHECKED
497                           •
498                           • IF LOOP 3 AND OR LOOP 4 FAILS DECIDE WHICH PWB AT FAULT
499                           •
500                           •   CONDITION CODES LEFT FROM PREVIOUS OPERATION
501                           •
502  05 002F3  47      A              MOV      B,A                  SAVE LOOP 4 FAILURES
503  05 002F4  CD0000  N              RNV0BYT  NVSERV:1             DID RUNNING LOOP 4 TEST FAIL
     05 002F7  59      A
     05 002F8  E3      A
504  05 002F9  B0      A              MOD0BYT  B,OR,A               OR STATIC DYNAMIC FAULT
     05 002FA  47      A
505  05 002FB  3231FD  A              STAFBYT  SERV:1               TELL FAULT HANDLER
506  05 002FE  2108FF  A              LXI0BYT  H,LP40BYT
507  05 00301  A7      A              IF:      VBYT,A,NZ            ARE FAULTS PRESENT
     05 00302  CA1C03  N
508  05 00305  E6C1    A                 .IF:  XBYT,A,AND,X'01',Z   IS DO BAD
     05 00307  C21203  N
509  05 0030A  36C1    A                       MVI      M,X'01'     ENABLE REMOTE DO ONLY
510                                                                 TO USE DIGIT DISPLAY
511  05 0030C  23      A                       INX      H
512  05 0030D  3600    A                       MVI      M,0
513  05 0C30F  C31903  N                 ELSE:
514  05 00312  05      A                       DCR      B
515  05 00313  C2D004  N                       JNZ      MTX9FAIL
516                           •                                     MORE THAN ONE BIT BAD
                                                                    MUST BE MATRIX
517  05 00316  C39904  N                       JMP      MNPLI00F
518                           •                                     MAIN PANEL TO P0ARD FAILED
519                                    ENDIF                        LOOP 4 RUNNING TEST
520  05 00319  C32103  N             ELSE:
521  05 0031C  36AA    A                       MVI      M,X'AA'     INITIALIZE LOOP 4 TEST BITS
522  05 0031E  23      A                       INX      H
523  05 0031F  3655    A                       MVI      M,X'55'
524                                    ENDIF
576                           • THE LOOP 4 SELF TEST VERIFIES DATA TRANSMISSION TO THE REMOTE MODULES
577                           • USING THE WRAP AROUND BIT FROM EACH REMOTE. ANY BIT MUST FAIL TWICE IN
578                           • A ROW TO CAUSE MACHINE SHUTDOWN.
579                           • THIS TEST IS EXECUTED ONCE EVERY 100MS IN ALL STATES 581  05 00391  3A31FD  A    TST0LP4  LDAFBYT  SERV:1                IS FAULT BEING DISPLAYED
582  05 00394  A7      A             IF:      VBYT,A,Z
     05 00395  C2CA03  N
583  05 00398  2EF7    A             RI0BYT   REM0RET               READ REMOTE WRAP AROUND INPUTS
     05 0039A  C00000  N
584  05 0039D  2108FF  A             LXI0BYT  H,LP40BYT             POINTER TO WRAP AROUND OUTPUTS
585  05 003A0  AE      A             XRA      M                     LOOK FOR DIFFERENCE BETWEEN
586                                                                 INPUTS AND OUTPUTS
587  05 003A1  1168FA  N             LXI      D,LP40PREV            POINTER TO PREVIOUS FAULTS
588  05 003A4  E60F    A             MOD0BYT  A,AND,RECAP           RECAP OUTPUT NOT CHECKED
589  05 003A6  EB      A             XCHG
590  05 003A7  CAC003  N             IF:      CC,Z,C                ANY BITS DIFFERENT
591  05 003AA  47      A                      MOV      B,A          WERE FAILED BITS SAME AS
592  05 003AB  A6      A                      ANA      M            LAST TEST
593  05 003AC  70      A                      MOV      M,B          SAVE NEW FAILED BITS
594  05 003AD  CAE003  N                      IF:      CC,Z,C       SAME BIT(S) FAILED TWICE IN ROW
595  05 003B0  3258E3  A                               WNV0BYT  NVSERV:1  REMEMBER FAILED BITS
     05 003B3  0F      A
     05 003B4  0F      A
     05 003B5  0F      A
     05 003B6  0F      A
     05 003B7  3259E3  A
596  05 0033A  C30F00  N                      JMP      SEC0STRT     GO BACK AND DO SELF TESTS
597                           •
598                           • SEC0STRT ROUTINE DISABLES INTERUPTS CAUSING THE REMOTE WATCHDOG
599                           • TIMERS TO TURN OFF ALL OUTPUT BITS
600                           • ALL SELF TESTS WILL BE EXECUTED TO DETERMINE THE ORIGIN OF FAILURE
```

```
601
602
603   05 003BD   C3CA03   N              ENDIF
604   05 003C0   77       A          ELSE:
605   05 003C1   EB       A              MOV     M,A              ZERO PREVIOUS READ FAILURES
606   05 003C2   F3       A              XCHG                     HL POINTS TO ENABLE BYTE
607   05 003C3   7E       A              DI
608   05 003C4   2F       A              MOV     A,M              OUTPUT BYTES
609   05 003C5   77       A              CMA                      1 & 2
610   05 003C6   23       A              MOV     M,A              LOOP 4 TEST PASSED SET-
611   05 003C7   2F       A              INX     H                UP FOR NEXT TIME THRU
612   05 003C8   77       A              CMA
613   05 003C9   FB       A              MOV     M,A
614                                      EI
615                                  ENDIF
616   05 003CA   C9       A          ENDIF
                                     RET
```

TABLE XX

MISC. ROUTINES

```
734
735                                * WASTE TIME SUBROUTINE
736                                * TIME WASTED = (65536-HL)*20USEC
737                                * DESTROYS DE&HL RP AND LEAVES CC CARRY=1
738
739       0000FFFF          MAXSTIME  EQU      X'FFFF'
740
741   05 00480  110100   A   VSDELAY  LXI      D,X'0001'
742                                   REPEAT
743   05 00483  87       A              ORA     A                 WASTE TIME, CLEAR CARRY
744   05 00484  87       A              ORA     A
745   05 00485  7F       A              MOV     A,A               WASTE TIME
746   05 00486  19       A              DAD     D                 INCREMENT H&L UNTIL IT OVERFLOWS
747   05 00487  D28304   N            UNTIL!   CC,C,S
748   05 0048A  C9       A            RET
749
750                                * ROUTINE TO PULSE I/O SAFE LINE FROM SAFE ON-OFF-ON
751
752   05 0048B  2101E6   A   SAFBPULS LXI      H,SS&BYT
753   05 0048E  3600     A            MVI      M,0               TURN OFF I/O SAFE
754   05 00490  3601     A            MVI      M,1               TURN ON I/O SAFE
755   05 00492  C9       A            RET
756
757                                 . * STOP ON ANY CPU BOARD FAILURE
758
759   05 00493  3E07     A   CPUBFAIL MVI      A,NONE&LED1
760   05 00495  3201E6   A            STA      SS&BYT            SET FAULT FLIP/FLOP
761   05 00498  76       A            HLT
762
763                                  * STOP ON MAIN PANEL IO FAILURE
764
765   05 00499  F3       A   MNPLIOBF DI
766   05 0049A  3E01     A            MVI      A,NONE&LED1&LED2&LED3
767   05 0049C  3203E6   A            STA      SS&BYT+2          TURN ON LEDS
768   05 0049F  76       A            HLT
769
770                                  * STOP ON ANY IOPM FAILURE
771
772   05 004A0  3E03     A   IOPBFAIL MVI      A,NONE&LED1&LED2  TURN ON LEDS
773   05 004A2  3201E6   A            STA      SS&BYT            SET FAULT FLIP/FLOP
774   05 004A5  76       A            HLT
775
776                                  * BLINK DISPLAY TO DETERMINE IF MATRIX OR MAIN PANEL BOARD BAD
777
778   05 004A6  3E0C     A   MNPLBCK  MVI      A,X'0C'
779   05 004A8  32FDFF   A            STABBYT  DSPL&DIG          ENABLE THOUS/HUND DIGITS
780   05 004AB  AF       A            XRA      A
781   05 004AC  36AA     A            MVI      M,X'AA'           PUT A'S IN DISPLAY
782   05 004AE  CDB904   N            CALL     LOOPS
783   05 004B1  3655     A            MVI      M,X'55'           PUT 5'S IN DISPLAY
784   05 004B3  CDB904   N            CALL     LOOPS
785   05 004B6  C3A604   N            JMP      MNPLBCK           GO AROUND FOREVER
786                          LOOPS    REPEAT
787   05 004B9  3202E6   A            REFRESH
788   05 004BC  E5       A            PUSH     H
789   05 004BD  F5       A            PUSH     PSW               SAVE LOOP COUNTER
790   05 004BE  2E4F     A            RIBYT    DIG&BYT1          READ LOOP 3 FOR SCOPE TEST
      05 004C0  CDC000   N
791   05 004C3  F1       A            POP      PSW
792   05 004C4  2199FF   A            LXI      H,(MAXSTIME-100)  DELAY 2MS
793   05 004C7  CD8004   N            CALL     VSDELAY
794   05 004CA  E1       A            POP      H
795   05 004CB  3D       A            DCR      A
796   05 004CC  C2B904   N            UNTIL!   CC,Z,S            GO AROUND 256 TIMES
797   05 004CF  C9       A            RET
798
799                                  * STOP ON INPUT MATRIX BOARD FAILURE
800
801   05 004D0  F3       A   MTX&FAIL DI
802   05 004D1  3E09     A            MVI      A,NONE&LED2&LED3  TURN ON LEDS
803   05 004D3  3203E6   A            STA      SS&BYT+2
804   05 004D6  76       A            HLT
805
806                                  * STOP ON CONTROLLER INTERFACE BOARD FAILURE
807
808   05 004D7  F3       A   CTLINTBF DI
809   05 004D8  2101E6   A            LXI      H,SS&BYT
810   05 004DB  3600     A            MVI      M,0               ENABLE WATCHDOG
811   05 004DD  23       A            INX      H
812   05 004DE  23       A            INX      H                 MOVE TO SPARE IOP WRITE ADDR
813   05 004DF  36C0     A            MVI      M,NONE&LED3       TURN ON LEDS
814   05 004E1  76       A            HLT
815
816                                  * THIS CONTROLLER INTERFACE PWB FAILURE WILL ILLUMINATE 'CPU STOP' AND '4' ON
817                                  * ADVANCED OPERATOR LEDS
818
```

Figure 40A:
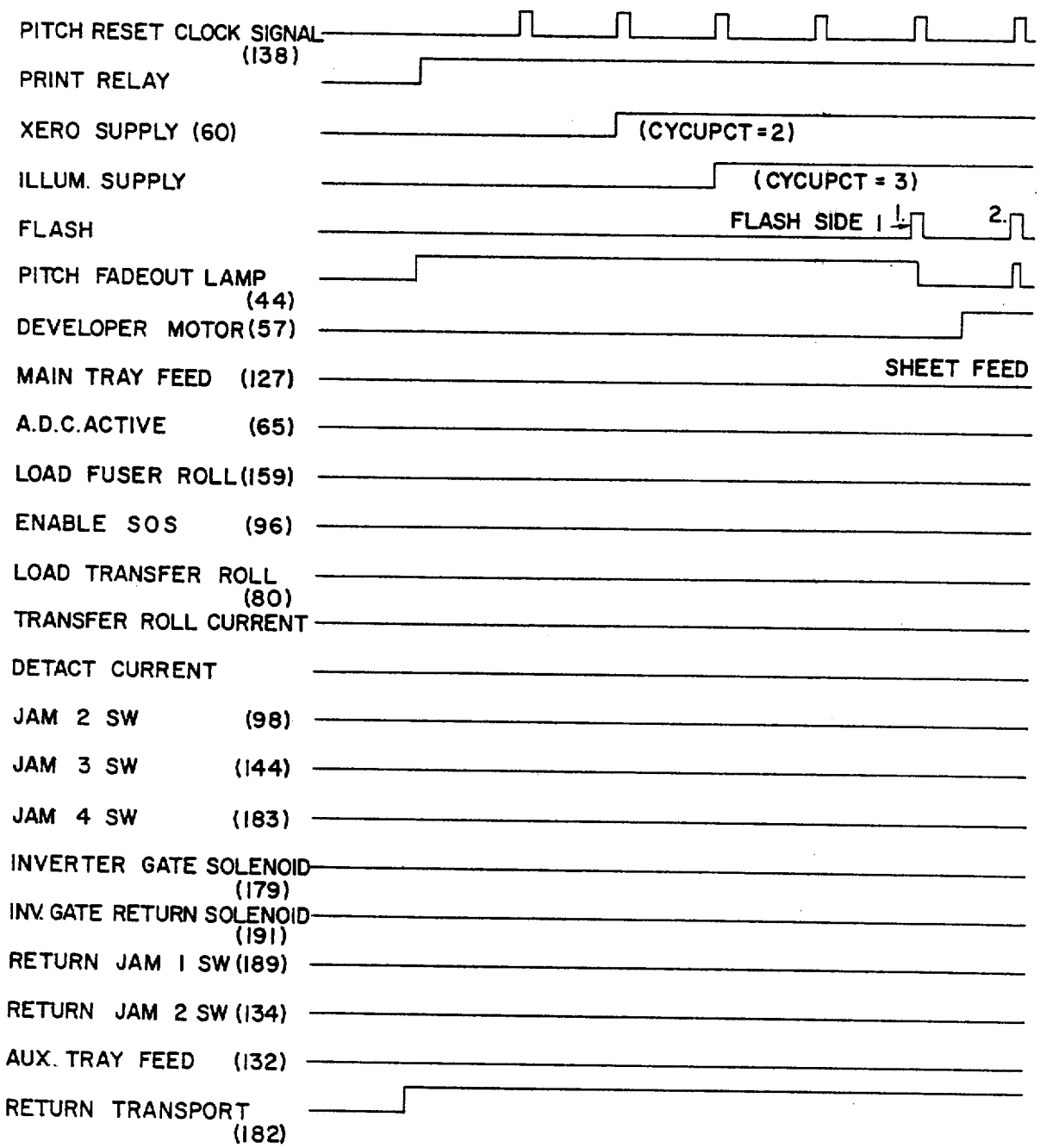
FIGS. 40a, 40b, 40c are a timing chart of the principal operating components of the host machine in an exemplary copy run.
Figure 40B:
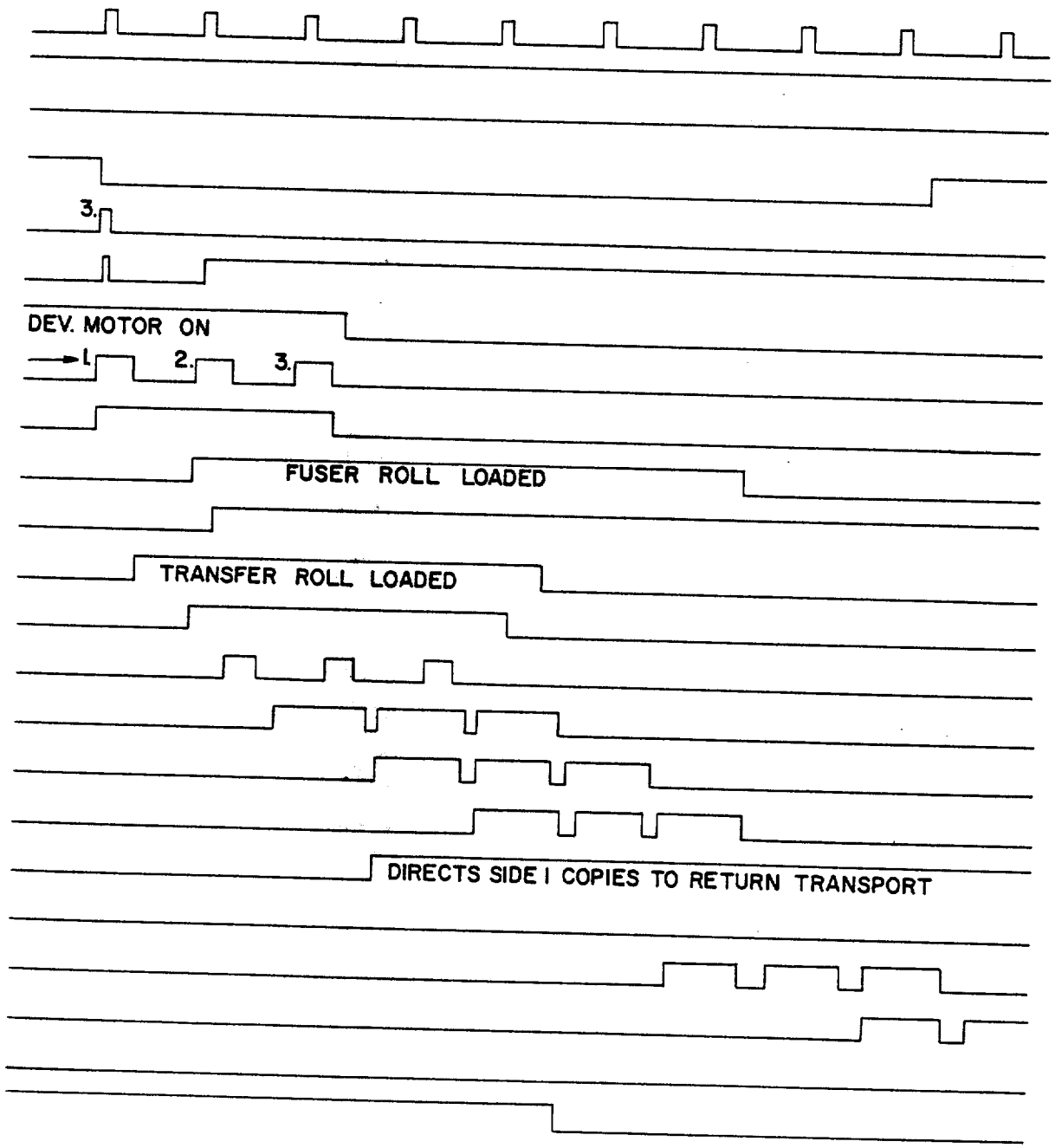
Figure 40C:
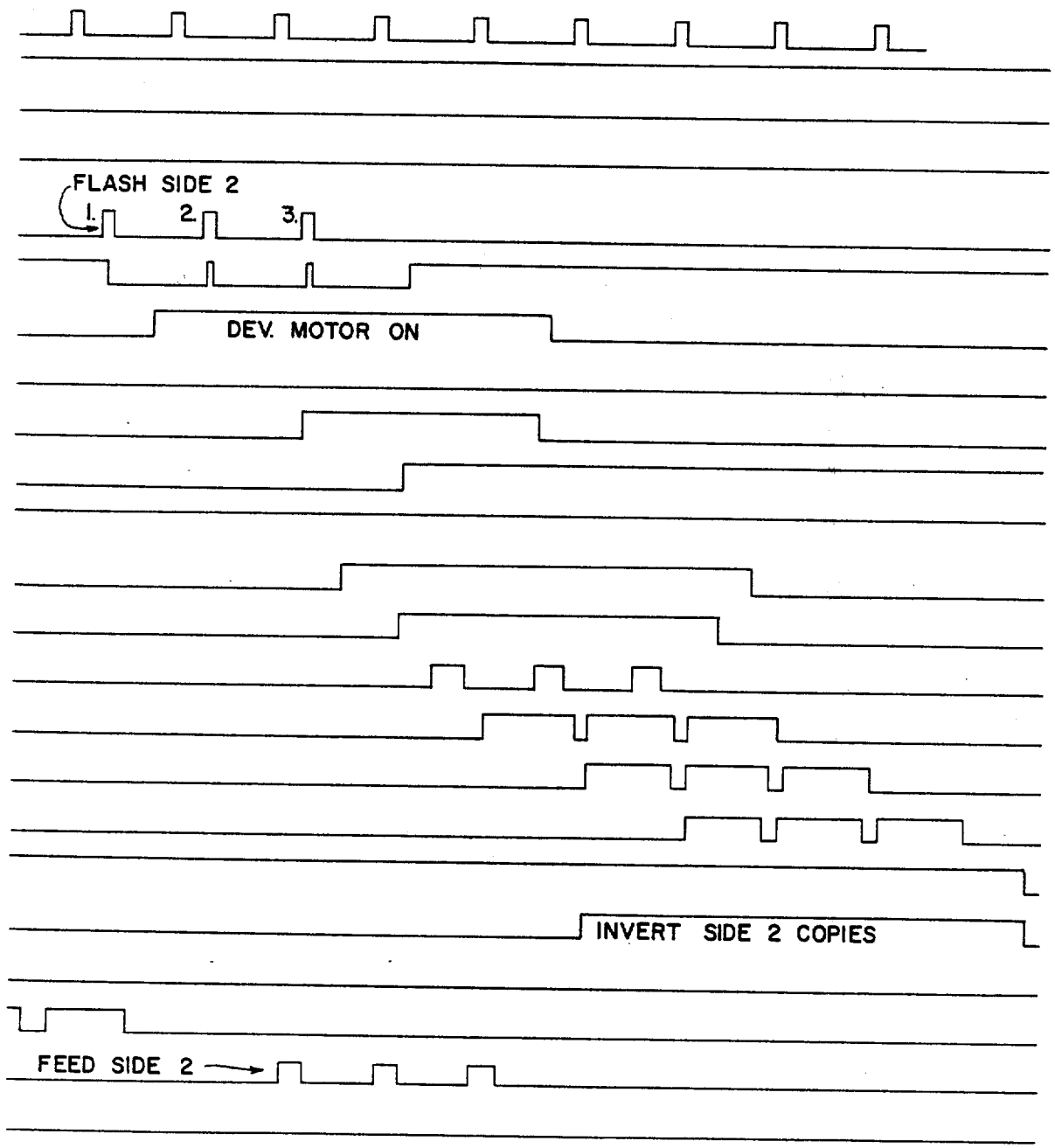

Referring particularly to the timing chart shown in FIG. 40, an exemplary copy run wherein three copies of each of two simplex or one-sided originals in duplex mode is made. Referring to FIG. 32, the appropriate button of copy selector 808 is set for the number of copies desired, i.e. 3 and document handler button 822, sorter select button 825 and two sided (duplex) button 811 depressed. The originals, in this case, two simplex or one-sided originals are loaded into tray 233 of document handler 16 (FIG. 14) and the Print button 805 depressed. On depression of button 805, the host machine 10 enters the PRINT state and the Run Event Table for the exemplary copy run programmed is built by controller 18 and stored in RAM section 546. As described, the Run Event Table together with Background routines serve, via the multiple interrupt system and output refresh (through D.M.A.) to operate the various components of host machine 10 in integrated timed relationship to produce the copies programmed.

During the run, the first original is advanced onto platen 35 by document handler 16 where, as seen in FIG. 41, three exposures (1ST FLASH SIDE 1) are made producing three latent electrostatic images on belt 20 in succession. As described earlier, the images are developed at developing station 28 and transferred to individual copy sheets fed forward (1ST FEED SIDE 1) from main paper tray 100. The sheets bearing the images are carried from the transfer roll/belt nip by vacuum transport 155 to fuser 150 where the images are fixed. Following fusing, the copy sheets are routed by deflector 184 (referred to as an inverter gate in the tables) to return transport 182 and carried to auxiliary tray 102. The image bearing sheets entering tray 102 are aligned by edge pattern 187 in preparation for refeeding thereof.

Following delivery of the last copy sheet to auxiliary tray 102, the document handler 16 is activated to remove the first original from platen 35 and bring the second original into registered position on platen 35. The second original is exposed three times (FLASH SIDE 2), the resulting images being developed on belt 20 at developing station 28 and transferred to the opposite or second side of the previously processed copy sheets which are now advanced (FEED SIDE 2) in timed relationship from auxiliary tray 102. Following transfer, the side two images are fused by fuser 150 and routed, by gate 184 toward stop 190, the latter being raised for this purpose. Abutment of the leading edge of the copy sheet with stop 190 causes the sheet trailing edge to be guided into discharge chute 186, effectively inverting the sheet, now bearing images on both sides. The inverted sheet is fed onto transport 181 and into an output receptacle such as sorter 14 where, in this example, the sheets are placed in successive ones of the first three trays 212 of either the upper of lower arrays 210,211 respectively depending on the disposition of deflector 220.

Other copy run programs, both simplex and duplex with and without sorter 14 and document handler 16 may be envisioned.

Figure 42A:
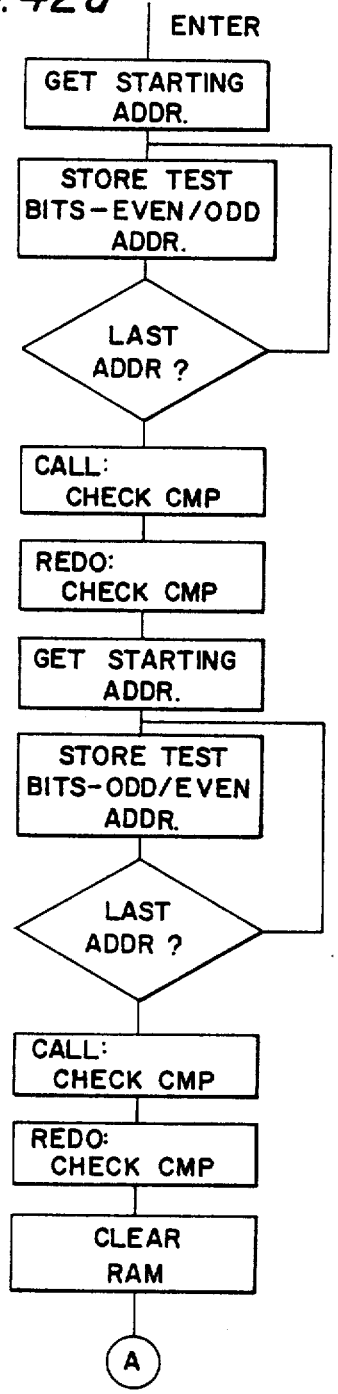
FIGS. 42a and 42b are the flow charts showing the output driver stuck test routines.
Figure 42B:
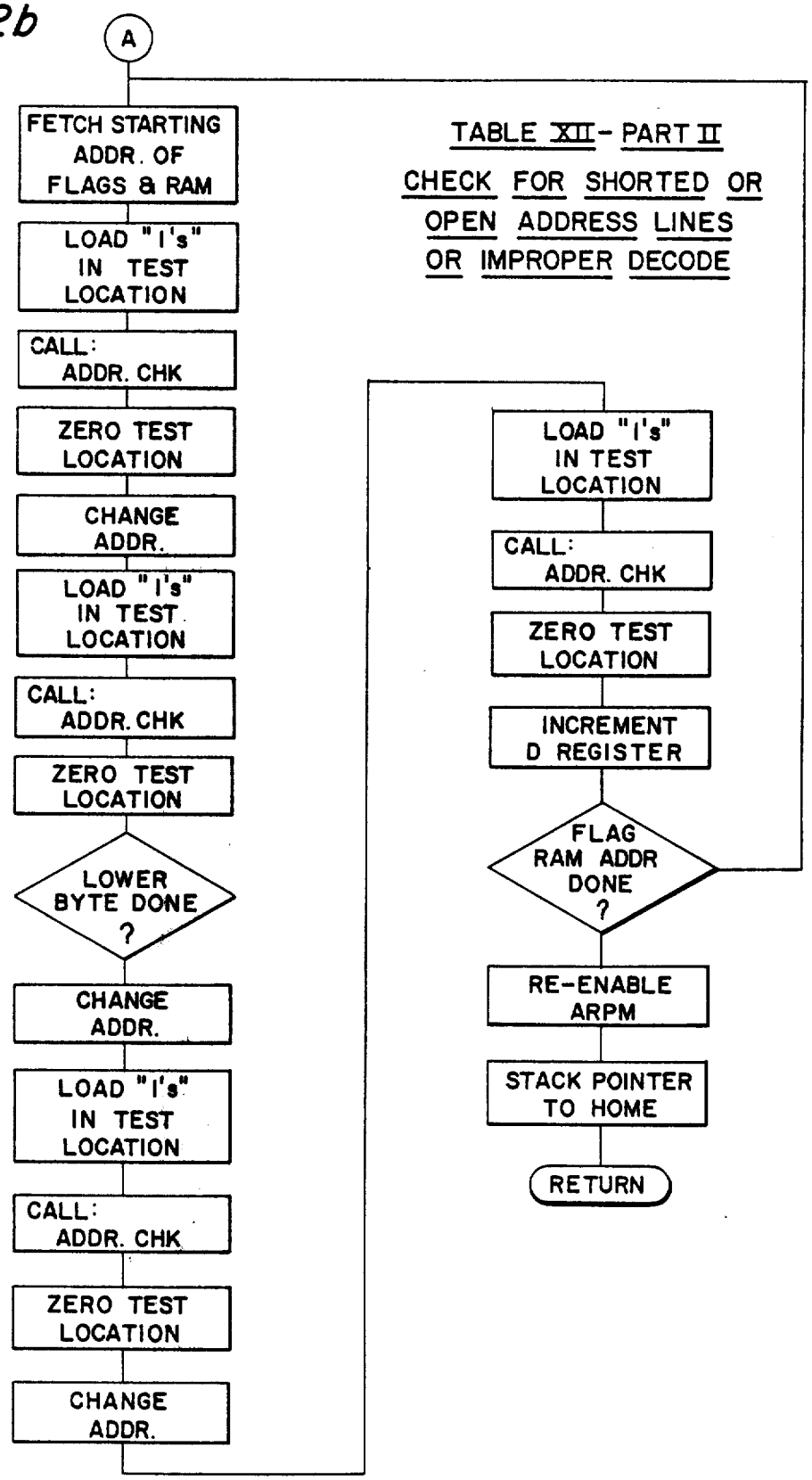
Figure 44B:
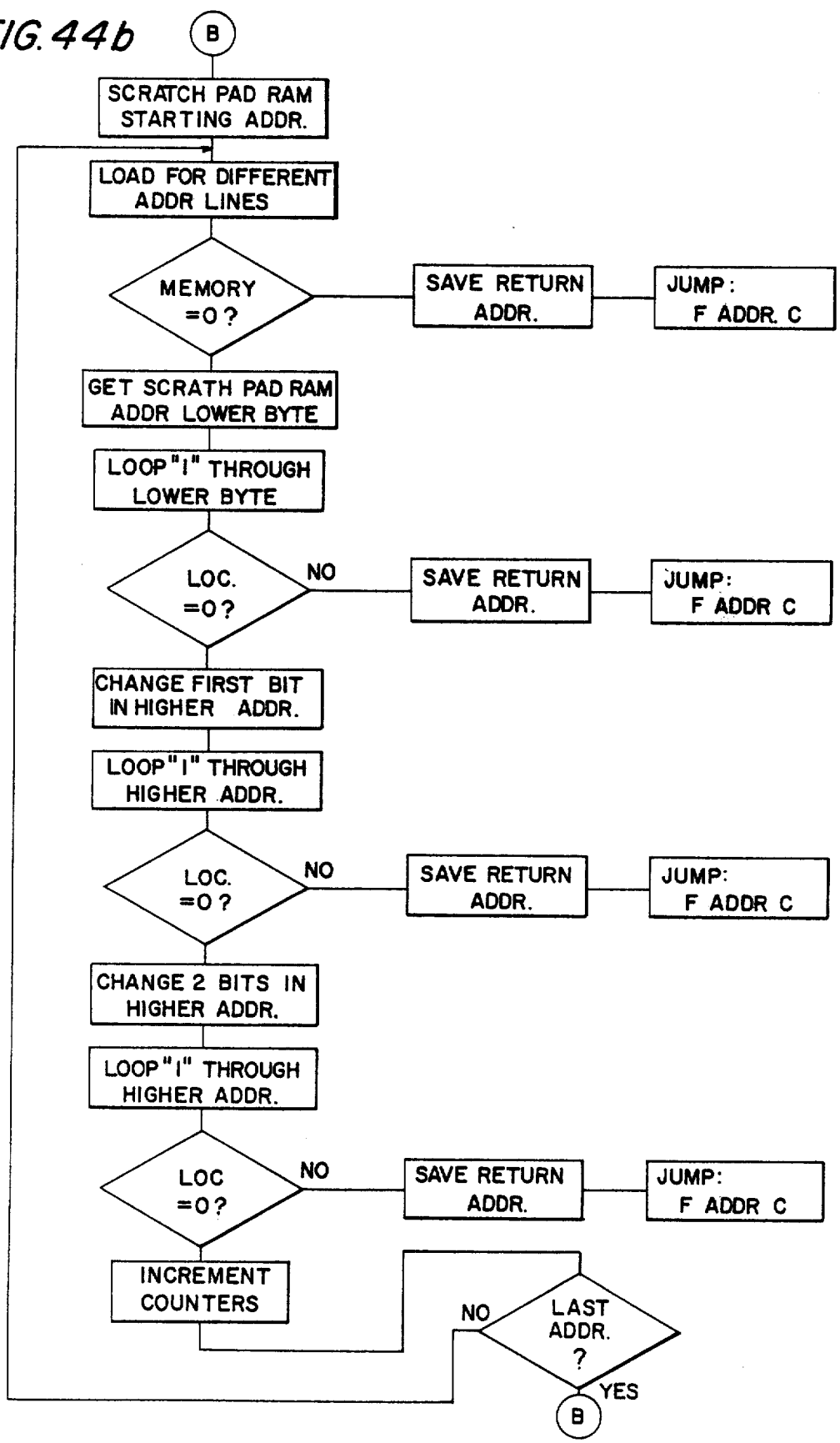
Figure 46B:
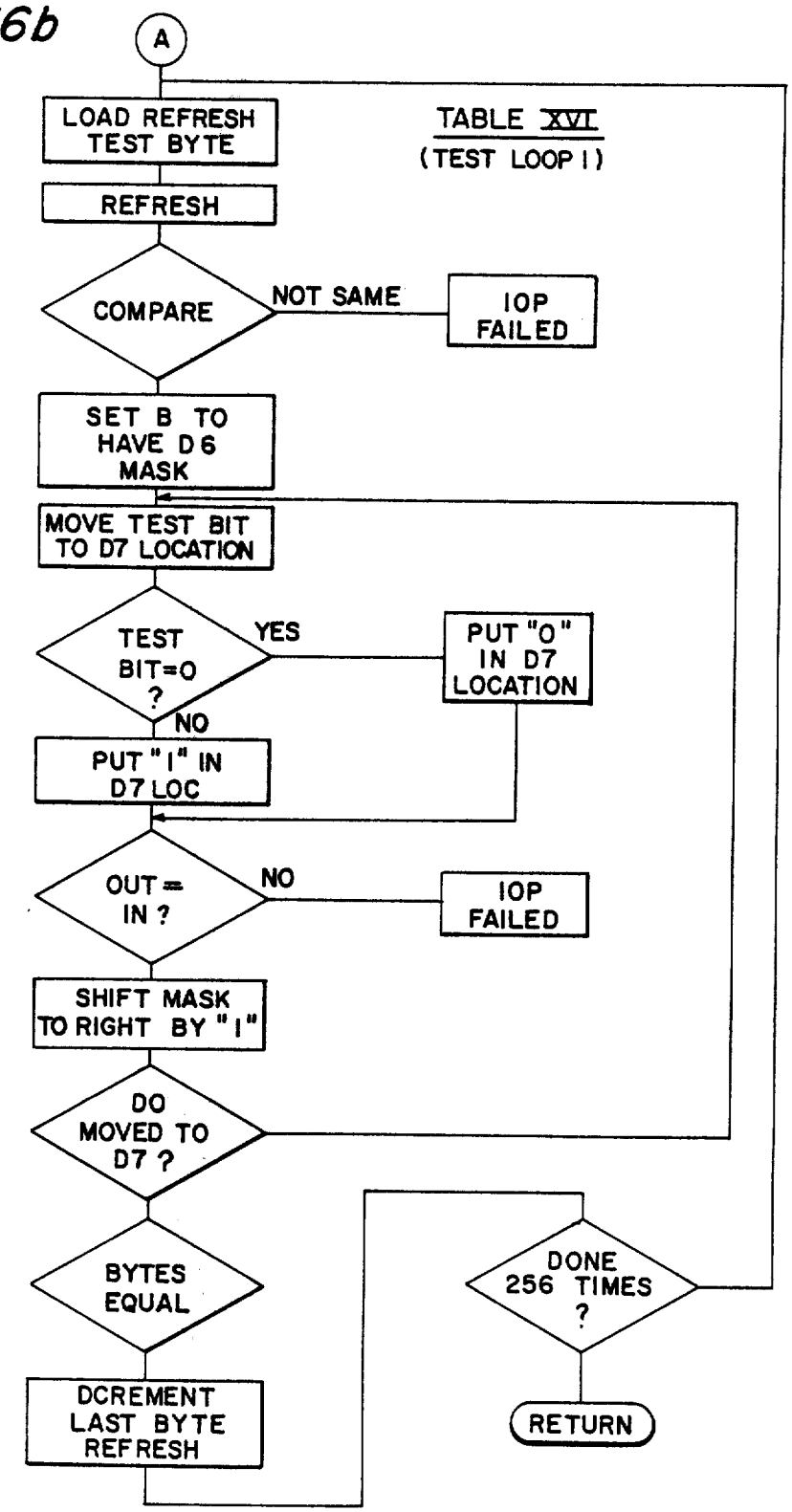
Figure 47A:
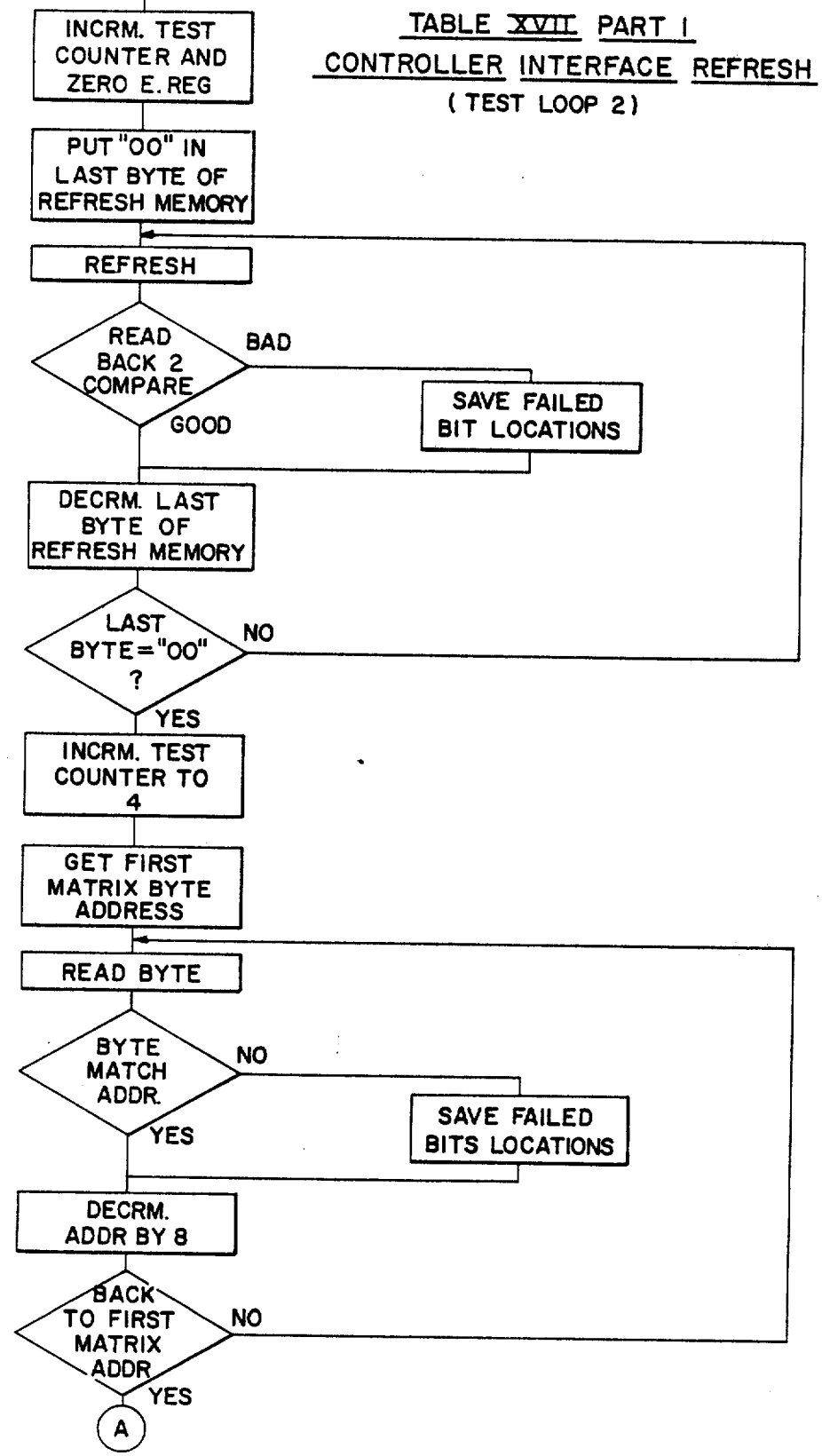
FIGS. 47a and 47b are a flow chart showing the controller interface refresh test routine.
Figure 47B:
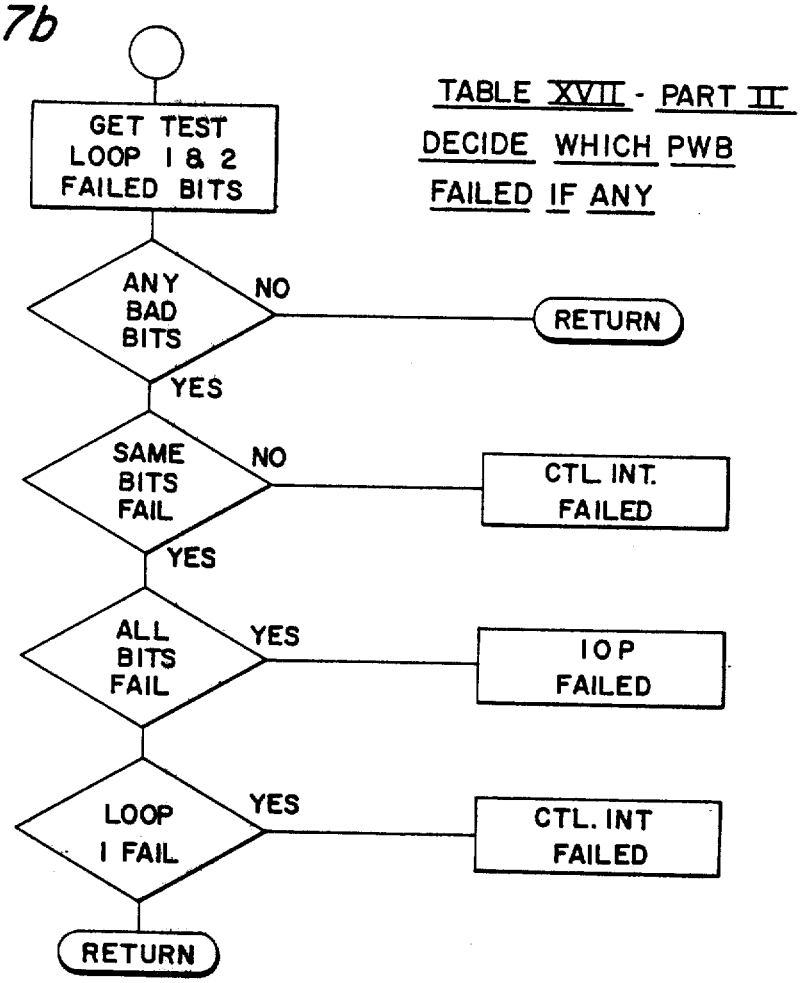
Figure 49A:
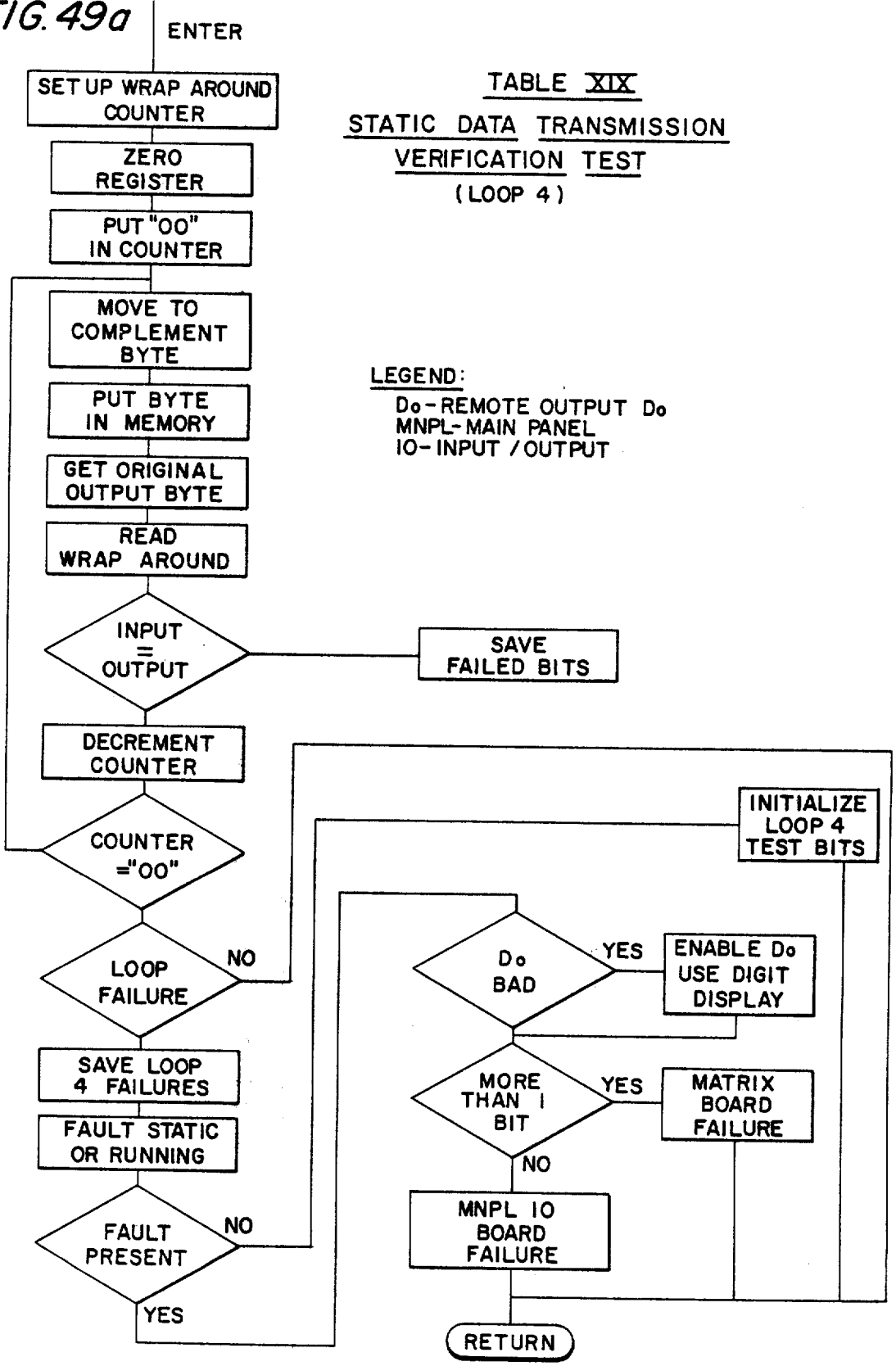
FIG. 49 is a flow chart showing the data transmission verification to remote modules routine.
Figure 49B:
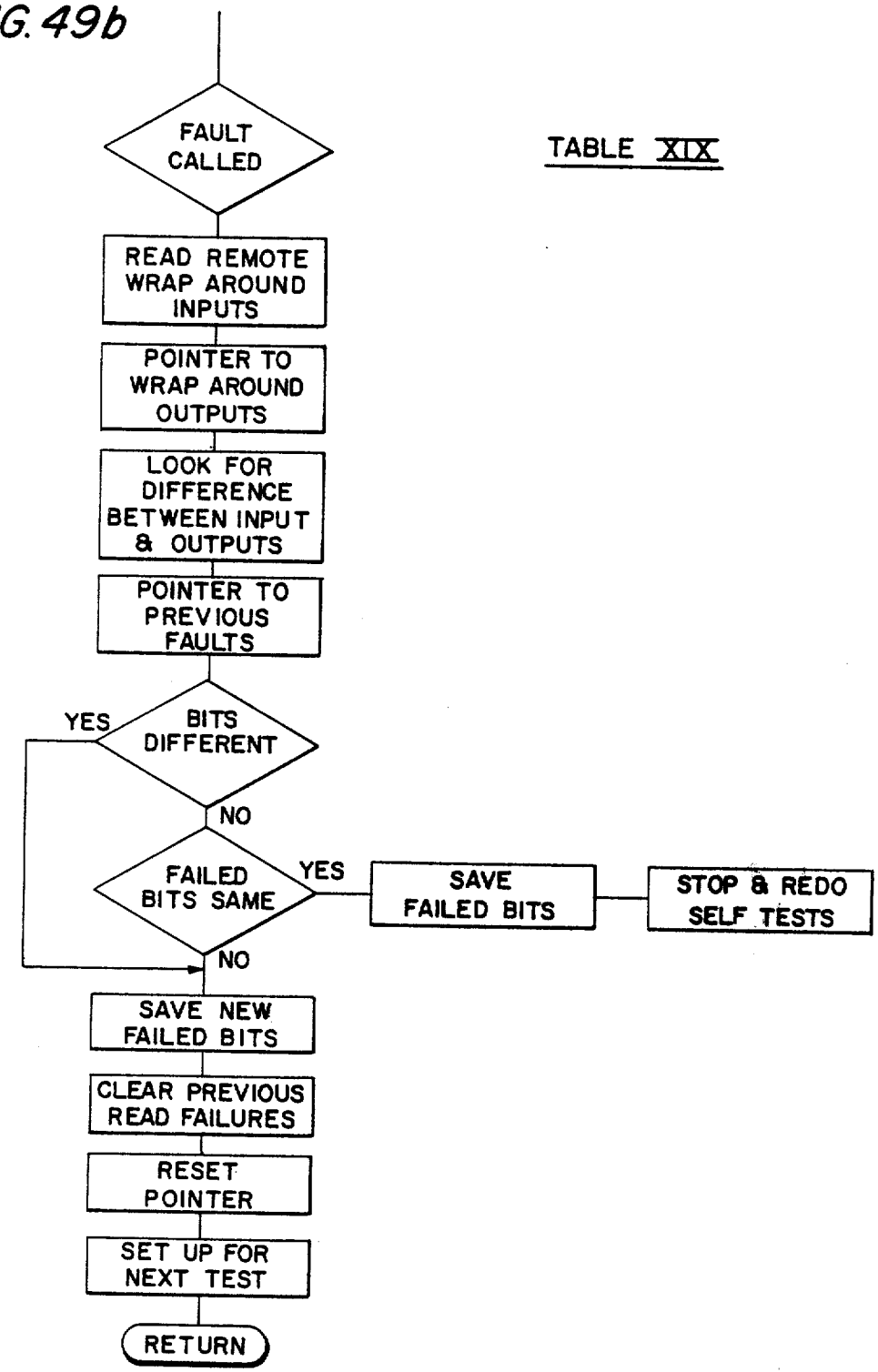

In the reproduction system 10, certaiin self test routines are provided to check operation of the system controls, memories, and data and address lines. These include Static Self Tests comprising Memory Check Sum Test (Table XI, FIG. 41); RAM Memory Test (Tables XII, XIII, XIV, and FIGS. 42, 43, 44); Non-Volatile Memory (NVM) Test (Table XV, FIG. 45); Address Wrap Around Test (Table XVI, FIG. 46); Controller Interface Refresh Test (Table XVII, FIG. 47); and Data Transmission to Digit Display Test (Table XVIII, FIG. 48). A data Transmission to Remote Modules Verifying Test (Table XIX, FIG. 49), is effected before machine startup and called periodically during machine operation. The self tests identify for the machine operator the source of the failure through display lamps, which preferably comprise Light Emitting Diodes or L.E.D.'s 860, 861, 862, 863 on operator console 800 (FIG. 23). L.E.D's 860, 861, 862, 863 correspond to L.E.D 1, L.E.D. 2, L.E.D. 3 and L.E.D. 4 found in the aformentioned Self Test tables.

In the Memory Check Sum Test (Table XI, FIG. 41), the contents of ROM memory section 545 (FIG. 17) is added and that sum is compared with a check sum count (CHECK SUM). If the numbers agree, a check is made to determine if the memory section is active. If not, the memory is bad. If the memory section is active, the normal program is continued. If the sums do not agree, a check is made to determine if the memory is active. If the memory is off, i.e. not active, the CPU memory printed wiring board (PWB) is bad. The controller failed (CPU FAIL) routine of Table XXI is called and the system shutdown. If the memory is active, the memory is disabled and the test repeated.

The check sum count (CHECK SUM) is obtained from the first run through of Memory Check Sum Comparison routine. The check sum count so obtained is stored in memory for subsequent use in this routine.

The Memory Checksum Test routine includes instructions for resetting the watch dog timer 614 each time around the test loop (RESET WATCH DOG TIMER). This is required since the total test time is greater than the time out setting of the watch dog timer. Thus, if not reset on each loop through the test, the timer 614 will time out with consequent setting of the fault flip flop and shutdown of the system.

In the RAM Memory Test (Tables XII, XIII, XIV and FIGS. 42, 43, 44) a check is run through the scratch pad and flag portions of RAM memory section 546 to see if any output drivers or cells are stuck in the binary "1" or "0" position. The first portion of the routine (FIG. 42a) follows a checkboard pattern with test bits (x'55' and x 'AA') addressed alternately to the even and odd memory addresses. A comparison check (CHECK CMP Table XIII, FIG. 43) is made comparing data sent with data received. The routine is repeated with the test data addressed in a reversed (complement) checkboard pattern.

A second portion of the RAM Memory Test (Table XII, Part II, FIG. 42b) uses the subroutine ADDR CHK (Table XIV, FIGS. 44a, 44b) to check for shorted or open address lines or decode problems by walking a binary "1" through the memory address lines and checking the return. A failure in the Output Driver Stuck check routine causes a jump to the controller failed (CPU FAIL) routine of Table XX. L.E.D. 860 is turned on to identify the fault.

The NVM memory test (Table XV, FIG. 45)) checks each data line for shorts by rotating a binary "1" therethrough. An input/output comparison of the memory is made. If the memory is not the same, a failure (IOP FAIL) is called. Using the Test Nibble (TEST NIB) subroutine of Table XV, Part II each of the non-volatile memory (NVM) locations are checked to determine if stuck in either a binary "0" or binary "1" condition. If so, the IOP failure (IOP FAIL) is called. Following this, the routine is exited.

In the address Wrap Around Test (Table XVI, FIG. 46), a first portion of the test is performed wherein a loop is made through the input matrix address lines to CPU Module 500. The data is read out and compared with the data inputted. If the comparison shows a difference, a CPU halt (IOP FAIL—Table XX) is called. A second portion of this routine checks out movement of a test bit via the input matrix address lines to a selected remote location (D7). A comparison is made between the bit input and output and a CPU halt (IOP FAIL—Table XX) is called if the bits are not the same. The IOP routine (IOP FAIL) turns L.E.D.'s 860, 861 on to identify the fault to the operator. The test is repeated until all of the matrix address lines for the remotes D0 -D7 have been checked.

The Controller Interface Refresh Test Routine (Table XVII, FIG. 47) for CPU Interface Module 504 Part I loops a test bit through each of the data lines (total 256) to the remotes D0-D7 (FIG. 25) and checks to see if the readback is the same as the output. A second portion checks the address lines (total 32) in the same manner. Part II of the routine determines the identity of the Printed Wiring Board (PWB) as fault from the test results of the Address Wrap Around Test (Table XVI) or the Controller Interface Refresh Test (Table XVII). The appropriate subroutine IOP FAIL or CTL INT@F (Table XX) is called to turn on the appropriate indicator L.E.D.'s 860, 861 or L.E.D. 863 on console 800.

In the Data Transmission to Digit Display Test Routine (Table XVIII, FIG. 48), data transmission to the Main Panel Interface Module 526, through which the digit display of control console 800 (FIG. 32) is effected, is checked by looping a test bit through the data lines D0-D7 (total 256) and reading back data sent. The data read back is compared with the data sent and any failed bits saved for use in identifying the fault.

In the Data Transmission to Remote Modules Verifying Test Routine (Table XIX, FIG. 49), a static check is made before system startup of the Input Matrix Module 524 to determine if data is being transmitted to between Module 524 and the remote modules D0-D7. In this test, a test bit is sent through each data line (total 256) and read back. A comparison is made between the bit sent and any failed bits are saved. The failed buts saved from the Data Transmission to Digit Display Test (Table XVIII) and the static Data Transmission to Remote Modules Verifying Test (Table XIX) are used in the second portion of the routine to identify either the Input Matrix Module Printed Wiring Board (PWB) or the Main Panel Interface Module PWB as the problem, and turn on the appropriate L.E.D. combination 861, 862 or 860, 861, 862.

A running check of data transmission is made peridocially during machine operation. In this check, a test bit is sent to each remote D0-D7 and a comparison is made between the bit sent and the bit returned. If the comparison shows the bit sent differs from the bit return, the failed bit is checked to see if the same bit failed earlier. Should the same bit fail twice in a row, a jump is made to the Self Test Start routine (SEC STRT—Table XI). This return disables the interrupts, allowing the watchdog timer 614, (FIG. 23) to time out and shutdown the machine. The Static Self Test Routines, which must be redone before restart of the machine 10 is allowed, locate the fault and identify the fault to the operator through the use of L.E.D.'s 860, 861, 862, 863.

The Miscellaneous Routines (Table XX) comprise subroutines called during various ones of the self test routines. These include a delay routine (V DELAY); I/O Safeline pulse routine (SAF PULS); and failure stop routines (CPU FAIL; MNPL IOF; IOP FAIL; MNPL CK: MTX FAIL; and CTL INTF).

Referring to the controller operating cycle block diagram of FIG. 34, the aforedescribed Static Self Test Routines (Tables XI through XIX) are initially performed after power to controller 18 is established (D.C. Power on). Following completion of the static portion of the Data Transmission to Remote Modules Verifying Test (Table XIX), the self test routine sequence is exited and the controller enters the software initialization (INIT) state of the state checker routine of Table I.

During machine operations, controller 18 is in one of the Software Initialization, System Not Ready, System Ready, Print, System Running Not Print, and Service states until shutdown. When the controller is in the System Not Ready, System Ready, Print, and System Running Not Print states, the running portion of the Data Transmission to Remote Modules Verifying Test, Table XIX (TST LP 4) is periodically called to verify transmission of operating data to the remotes. Where a problem is discovered, the machine is shutdown and return is made to the Static Self Test Routines, i.e. Memory Checksum Comparison, Table XI (SEC STRT), to determine where the fault lays as described.

While the invention has been described with reference to the structure disclosed, it is not confined to the details set forth, but is intended to cover such modifications or changes as may come within the scope of the following claims.

What is claimed is:

1. In an electrophotographic machine with a plurality of processing elements and with a controller having a CPU and a plurality of control modules, the controller having address and data lines for identifying a particular processing element of the electrophotographic machine and providing data flow with the particular processing element identified, the address and data lines interconnecting the CPU, the control modules, and the processing elements, the method of verifying the integrity of one of said address and data lines associated with one of said plurality of control modules comprising the steps of:

looping a test bit through one of the address and data lines, between the CPU and a first one of the plurality of control modules, reading the bit returned, comparing the returned bit with the test bit sent, looping a test bit through one of the address and data lines between the CPU, the first one of the plurality of control modules, and the second one of the plurality of control modules, reading the bit returned and comparing the bit returned with the test bit sent and declaring a fault when the returned bit differs from the test bit.

2. The method of claim 1 wherein the control modules are disposed intermediate the CPU and the processing elements of the electrophotographic machine including the step of verifying the integrity of the data lines associated with the control modules between the CPU and the processing elements.

3. The method of claim 1 including the step of determining the particular control module causing a malfunction.

4. In an electrophotographic printing machine having a plurality of machine processing elements and a controller having a CPU module, an input-output module electrically connected to the CPU module, and an interface module electrically connected to the input-output module and to the machine processing elements, the controller having address and data lines for communicating with the machine processing elements, the address and data lines interconnecting the CPU module, the input-output module and the interface module, the method of verifying the integrity of the input-output and interface modules comprising the steps of looping a test bit from the CPU module to the input-output module and back to the CPU module driving a test bit between the interface module and the input-output module and storing manifestations of failed bits, looping a test bit from the CPU module through the input-output module to the interface module and back through the input-output module to the CPU module and determining failure of either the input-output module or the interface module.

5. The method of claim 4 including the steps of sending a test bit on the address lines between the CPU module and the input-output module and returning said bit to the CPU module on the data lines from the input-output module to the CPU module, sending a test bit on the address lines from the CPU module through the input-output module to the interface module and from the interface module to the CPU module on the data line from the interface module to the CPU module.

6. In an electrophotographic machine with a controller having a CPU module and an input-output module, the controller having address and data lines for identifying a particular processing element of the electrophotographic machine and providing data flow with the particular processing element addressed, the method of verifying the integrity of one of said address or data lines comprising the steps of:

looping a test bit through said lines, reading the bit returned, comparing the returned bit with the test bit, and declaring a fault when the return signal differs from the test signal, including the steps of:

(a) sending a test bit on the data lines from the CPU to the input-output module and returning the test bit from the input-output module to the CPU module for all possible combinations of data on the data lines, (b) sending the test bit on the address lines from the CPU module to the input-output module and returning the test signals from the input-output module to the CPU module over the data lines for all possible combinations of data on the address lines.

7. The method of claim 6 wherein the controller contains an interface module, the input-output module being disposed between the CPU module and the interface module, comprising the steps of:

driving predetermined bits from the interface module to the input-output module, comparing the predetermined driven bits with the received bits, and storing the manifestation of any errors.

* * * * *